United States Patent
Goldbach et al.

(10) Patent No.: US 12,291,096 B2
(45) Date of Patent: May 6, 2025

(54) WINDOW OR SURFACE OF A VEHICLE COMPRISING AT LEAST ONE OPTOELECTRONIC COMPONENT

(71) Applicant: OSRAM Opto Semiconductors GmbH, Regensburg (DE)

(72) Inventors: Matthias Goldbach, Pentling (DE);
Stefan Groetsch, Bad Abbach (DE);
Ludwig Hofbauer, Regenstauf (DE);
Sebastian Wittmann, Regenstauf (DE);
Robert Regensburger, Kallmünz (DE);
Thomas Schwarz, Regensburg (DE);
Michael Brandl, Mintraching (DE);
Andreas Dobner, Wenzenbach (DE);
Sebastian Stigler, Obertraubling OT Scharmassing (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 0 days.

(21) Appl. No.: 17/615,396

(22) PCT Filed: Oct. 29, 2020

(86) PCT No.: PCT/EP2020/080473
§ 371 (c)(1),
(2) Date: Nov. 30, 2021

(87) PCT Pub. No.: WO2021/110332
PCT Pub. Date: Jun. 10, 2021

(65) Prior Publication Data
US 2022/0227230 A1 Jul. 21, 2022

(30) Foreign Application Priority Data

Dec. 6, 2019 (DE) .................... 10 2019 008 502.7
Dec. 6, 2019 (DE) .................... 10 2019 008 503.5
(Continued)

(51) Int. Cl.
*H01B 3/30* (2006.01)
*B60K 35/00* (2006.01)
(Continued)

(52) U.S. Cl.
CPC ............ *B60K 35/00* (2013.01); *H01B 3/30* (2013.01); *H01B 7/0018* (2013.01);
(Continued)

(58) Field of Classification Search
CPC ...... H01B 13/103; H01B 7/0018; H01B 3/30; B32B 17/1022; B32B 17/1011;
(Continued)

(56) References Cited

U.S. PATENT DOCUMENTS 8,474,860 B2 * 7/2013 Ohoka ................ B60R 21/2165
280/731
8,924,076 B2 12/2014 Boote et al.
(Continued)

FOREIGN PATENT DOCUMENTS

CN 1675446 A 9/2005
CN 108877521 A 11/2018
(Continued)

OTHER PUBLICATIONS

International Search Report and Written Opinion issued in International Patent Application No. PCT/EP2020/080473 dated May 18, 2021.

*Primary Examiner* — Tsion B Owens
(74) *Attorney, Agent, or Firm* — ArentFox Schiff LLP

(57) ABSTRACT

An optoelectronic device comprises a plurality of layer segments, in particular intermediate layer segments, arranged between a cover layer and a carrier layer. At least one optoelectronic component is arranged on at least one of the plurality of layer segments and a first and a second layer segment of the plurality of the layer segments are overlap-
(Continued)

ping each other along a first direction each forming a respective boundary region. The first layer segment comprises at least one first contact pad and the second layer segment comprises at least one second contact pad, wherein the at least one first and second contact pad are arranged in the respective boundary region facing each other and being mechanically and electrically connected. The at least one first and second contact pad each comprises a plurality of nanowires which are at least partially made of conductive material such as for example copper, gold, or nickel.

19 Claims, 67 Drawing Sheets

(30) Foreign Application Priority Data

| Dec. 6, 2019 | (DE) | .................... 10 2019 133 450.0 |
|---|---|---|
| Feb. 21, 2020 | (DK) | .......................... PA 2020 70102 |
| May 28, 2020 | (DE) | .................... 10 2020 114 328.1 |
| May 28, 2020 | (DE) | .................... 10 2020 114 336.2 |
| Aug. 11, 2020 | (DE) | .................... 10 2020 121 120.1 |
| Sep. 10, 2020 | (DE) | .................... 10 2020 123 616.6 |
| Sep. 10, 2020 | (DE) | .................... 10 2020 123 632.8 |

(51) Int. Cl.
  B60K 35/60 (2024.01)
  H01B 7/00 (2006.01)
  H01B 13/10 (2006.01)
  H10H 20/857 (2025.01)
  H10H 20/01 (2025.01)

(52) U.S. Cl.
  CPC ......... *H01B 13/103* (2013.01); *H10H 20/857* (2025.01); *B60K 35/60* (2024.01); *B60K 2360/332* (2024.01); *B60K 2360/47* (2024.01); *B60K 2360/48* (2024.01); *B60K 2360/785* (2024.01); *H10H 20/0364* (2025.01)

(58) Field of Classification Search
  CPC ........ B32B 17/10192; B32B 17/10036; B32B 17/10761; B32B 17/10495; B32B 17/10541; B32B 17/10788; B60K 35/00; B60K 2370/44; B60K 2370/785; B60K 2370/47; B60K 2370/48; B60K 2370/332; H01L 33/62; H01L 25/0753; H01L 2933/0066; B60Q 1/268; H05K 1/148; H05K 3/363; G09F 9/33; G09F 21/048
  See application file for complete search history.

(56) References Cited

U.S. PATENT DOCUMENTS

| 9,806,281 | B2 | 10/2017 | Domercq et al. |
|---|---|---|---|
| 10,395,589 | B1 | 8/2019 | Vahid Far et al. |
| 11,179,032 | B2 | 11/2021 | Chen et al. |
| 11,479,023 | B2 | 10/2022 | Berard et al. |
| 11,569,411 | B2 * | 1/2023 | Volpert ................. H01L 33/385 |
| 11,682,607 | B2 * | 6/2023 | We .......................... H01L 23/13 |
| | | | 257/734 |
| 2002/0118321 | A1 | 8/2002 | Ge |
| 2002/0140629 | A1 | 10/2002 | Sundahl |
| 2002/0149312 | A1 | 10/2002 | Roberts et al. |
| 2004/0185195 | A1 | 9/2004 | Anderson et al. |
| 2005/0238857 | A1 | 10/2005 | Day |
| 2005/0253244 | A1 | 11/2005 | Chang |
| 2006/0116046 | A1 | 6/2006 | Morley et al. |
| 2006/0275599 | A1 | 12/2006 | Lefevre |
| 2007/0014469 | A1 | 1/2007 | Paillet et al. |
| 2009/0016095 | A1 | 1/2009 | Thomas et al. |
| 2009/0021181 | A1 | 1/2009 | Brune et al. |
| 2009/0103298 | A1 | 4/2009 | Boonekamp et al. |
| 2009/0114928 | A1 | 5/2009 | Messere et al. |
| 2009/0231882 | A1 | 9/2009 | Lin et al. |
| 2009/0279295 | A1 | 11/2009 | Van Der Poel |
| 2009/0279558 | A1 | 11/2009 | Davis et al. |
| 2010/0060821 | A1 | 3/2010 | Petersen et al. |
| 2010/0140655 | A1 | 6/2010 | Shi |
| 2010/0176705 | A1 | 7/2010 | Van Herpen et al. |
| 2011/0006316 | A1 | 1/2011 | Ing et al. |
| 2011/0127552 | A1 | 6/2011 | Van Herpen et al. |
| 2011/0317417 | A1 | 12/2011 | Gourlay |
| 2013/0016494 | A1 | 1/2013 | Speier et al. |
| 2014/0091326 | A1 | 4/2014 | Tran et al. |
| 2014/0096893 | A1 | 4/2014 | Veerasamy |
| 2014/0234578 | A1 | 8/2014 | Decraye et al. |
| 2015/0239399 | A1 | 8/2015 | Tonar et al. |
| 2015/0253486 | A1 | 9/2015 | Verger et al. |
| 2015/0301175 | A1 | 10/2015 | Rao et al. |
| 2015/0308639 | A1 | 10/2015 | Keranen et al. |
| 2016/0154170 | A1 | 6/2016 | Thompson et al. |
| 2016/0313587 | A1 | 10/2016 | Linthout et al. |
| 2017/0005077 | A1 | 1/2017 | Kim et al. |
| 2017/0212633 | A1 * | 7/2017 | You ....................... G06F 3/0412 |
| 2017/0301282 | A1 | 10/2017 | Rotzoll et al. |
| 2017/0309698 | A1 | 10/2017 | Bower et al. |
| 2017/0373268 | A1 | 12/2017 | Takahashi et al. |
| 2018/0141487 | A1 | 5/2018 | Osumi et al. |
| 2018/0301594 | A1 * | 10/2018 | Bouvier ................ H01L 33/385 |
| 2018/0311935 | A1 | 11/2018 | Sahyoun et al. |
| 2018/0323180 | A1 | 11/2018 | Cok |
| 2018/0343741 | A1 | 11/2018 | Williams et al. |
| 2018/0345631 | A1 | 12/2018 | Klein et al. |
| 2018/0370195 | A1 | 12/2018 | Laluet et al. |
| 2018/0374834 | A1 | 12/2018 | Tada et al. |
| 2019/0001629 | A1 | 1/2019 | Laluet |
| 2019/0016095 | A1 | 1/2019 | Abrot et al. |
| 2019/0019968 | A1 | 1/2019 | He et al. |
| 2019/0096864 | A1 | 3/2019 | Huitema et al. |
| 2019/0134952 | A1 | 5/2019 | Varanasi et al. |
| 2019/0160792 | A1 | 5/2019 | Weber |
| 2019/0172970 | A1 | 6/2019 | Dupont et al. |
| 2019/0193376 | A1 | 6/2019 | Bauerle |
| 2019/0248122 | A1 | 8/2019 | Gillessen et al. |
| 2019/0255813 | A1 | 8/2019 | Bauerle et al. |
| 2019/0279558 | A1 | 9/2019 | Monestier et al. |
| 2019/0299852 | A1 | 10/2019 | Bauerle et al. |
| 2019/0377125 | A1 | 12/2019 | Liu et al. |
| 2020/0006456 | A1 | 1/2020 | Zhang et al. |
| 2020/0012848 | A1 | 1/2020 | Goto |
| 2020/0144228 | A1 | 5/2020 | Brick et al. |
| 2020/0269815 | A1 | 8/2020 | Day |
| 2020/0350361 | A1 * | 11/2020 | Tao ........................ G09G 3/32 |

FOREIGN PATENT DOCUMENTS

| CN | 109801568 A | 5/2019 |
|---|---|---|
| DE | 102007039416 A1 | 2/2009 |
| DE | 102012213343 A1 | 1/2014 |
| DE | 102013102003 A1 | 8/2014 |
| DE | 202015009229 U1 | 1/2017 |
| DE | 102017122852 A | 4/2019 |
| DE | 102018119376 A1 | 2/2020 |
| DE | 112018003398 T5 | 3/2020 |
| EP | 1760784 A2 | 3/2007 |
| EP | 1886804 A1 | 2/2008 |
| EP | 2412521 A1 | 2/2012 |
| EP | 2760108 A1 | 7/2014 |
| EP | 3264241 A1 | 1/2018 |
| EP | 3264242 A1 | 1/2018 |
| FR | 3044972 A1 | 6/2017 |
| JP | 08-130330 A | 5/1996 |
| JP | 10-240172 A | 9/1998 |
| JP | 2001-022300 A | 1/2001 |
| JP | 2003-337556 A | 11/2003 |
| JP | 2004-327955 A | 11/2004 |
| JP | 2005-310751 A | 11/2005 |
| JP | 2005-534612 A | 11/2005 |
| JP | 2007-073734 A | 3/2007 |

(56) References Cited

FOREIGN PATENT DOCUMENTS

| | | |
|---|---|---|
| JP | 2009-512977 A | 3/2009 |
| JP | 2009-535798 A | 10/2009 |
| JP | 2010-520627 A | 6/2010 |
| JP | 2010521353 A | 6/2010 |
| JP | 2010-170969 A | 8/2010 |
| JP | 2012-195404 A | 10/2012 |
| JP | 2014-060320 A | 4/2014 |
| JP | 2015-084374 A | 4/2015 |
| JP | 2016-167451 A | 9/2016 |
| JP | 2017-212384 A | 11/2017 |
| JP | 2019-009192 A | 1/2019 |
| JP | 2019-134025 A | 8/2019 |
| JP | 2020-017730 A | 1/2020 |
| KR | 10-2014-0071796 A | 6/2014 |
| WO | 2007093823 A1 | 8/2007 |
| WO | 2008058881 A1 | 5/2008 |
| WO | 2009087584 A1 | 7/2009 |
| WO | 2009125918 A2 | 10/2009 |
| WO | 2011158185 A1 | 12/2011 |
| WO | 2012/036081 A1 | 3/2012 |
| WO | 2014141019 A1 | 9/2014 |
| WO | 201478942 A1 | 11/2014 |
| WO | 2014178942 A1 | 11/2014 |
| WO | 2016095117 A1 | 6/2016 |
| WO | 2018025051 A1 | 2/2018 |
| WO | 2019008493 A1 | 1/2019 |
| WO | 2019/026858 A1 | 2/2019 |
| WO | 2019048893 A1 | 3/2019 |
| WO | 2019088493 A1 | 5/2019 |
| WO | 2019091728 A1 | 5/2019 |
| WO | 2019160199 A1 | 8/2019 |
| WO | 2019186513 A1 | 10/2019 |
| WO | 2020050062 A1 | 3/2020 |
| WO | 2020071815 A1 | 4/2020 |
| WO | 2019146634 A1 | 1/2021 |

* cited by examiner

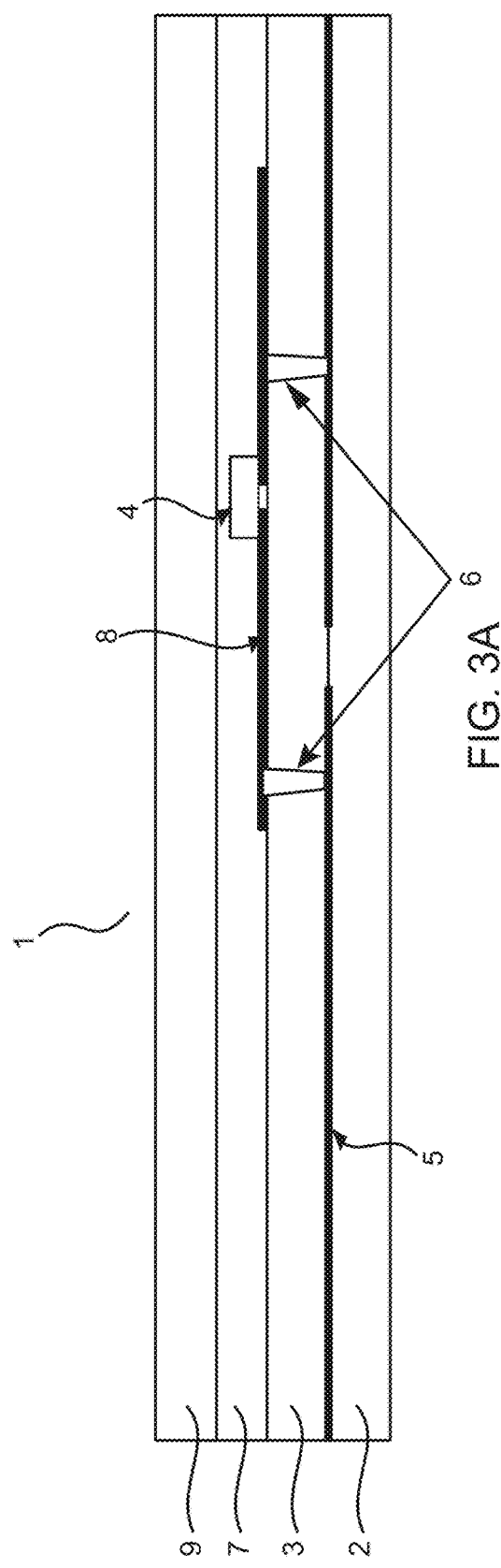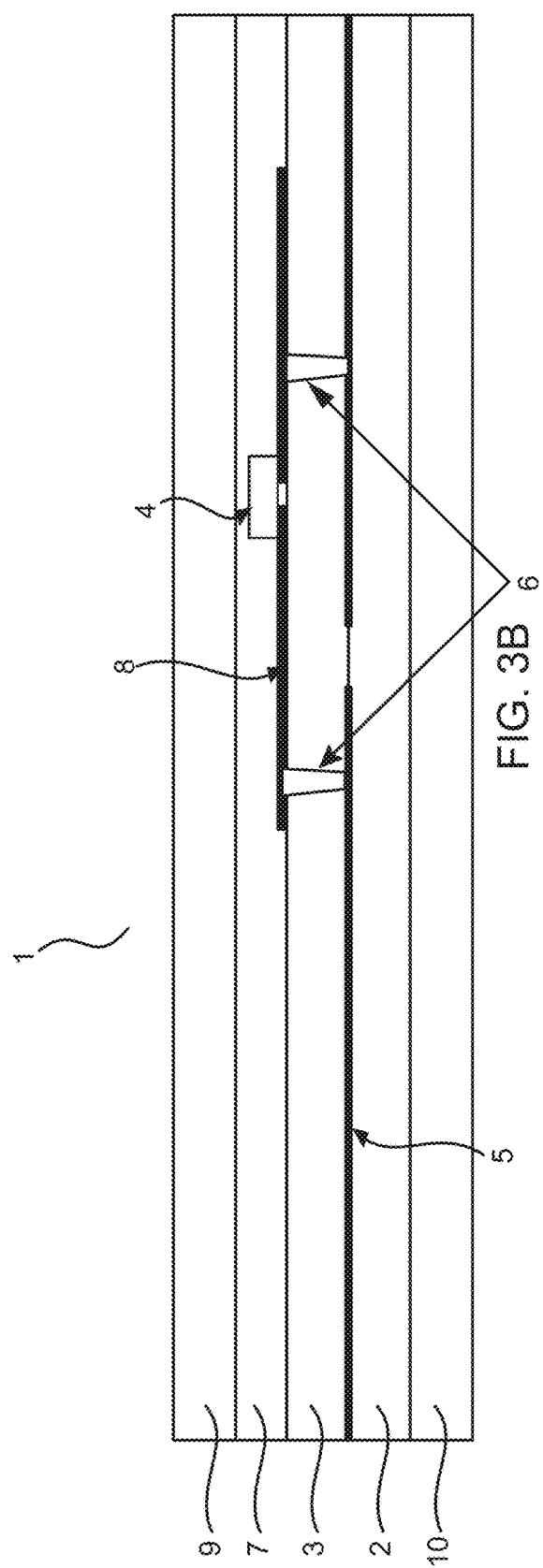

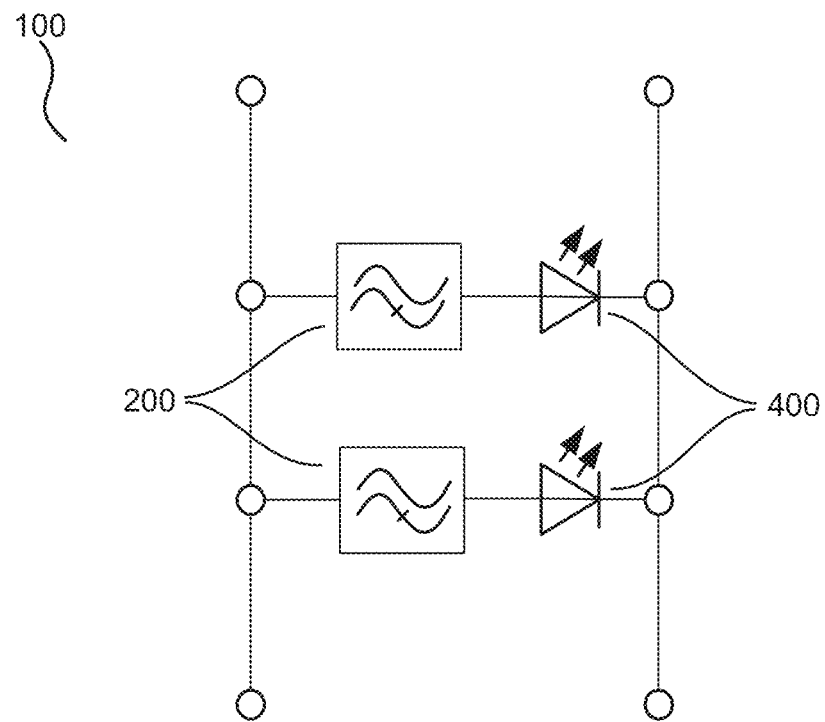
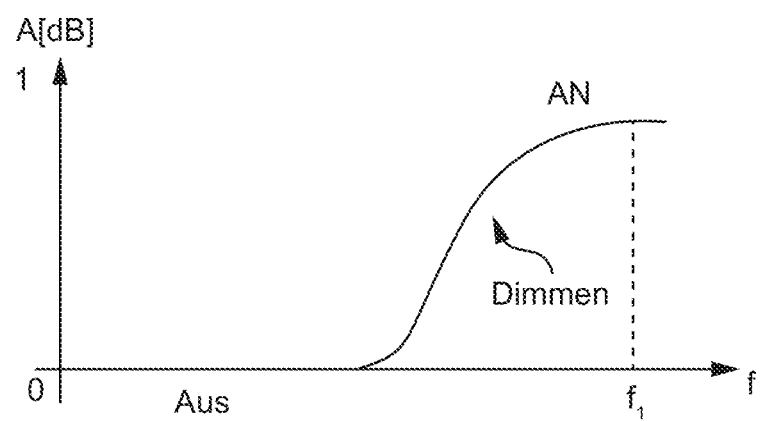
FIG. 5A

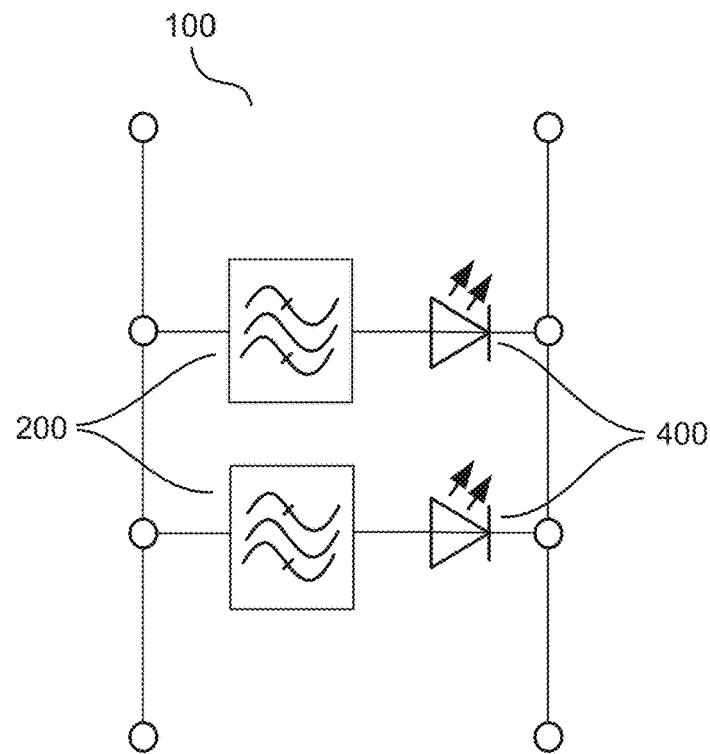
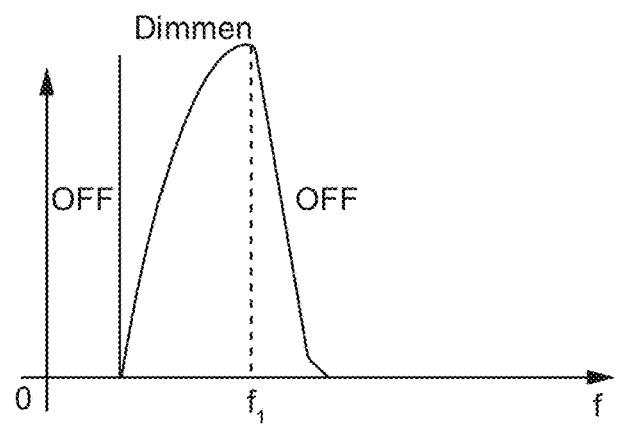
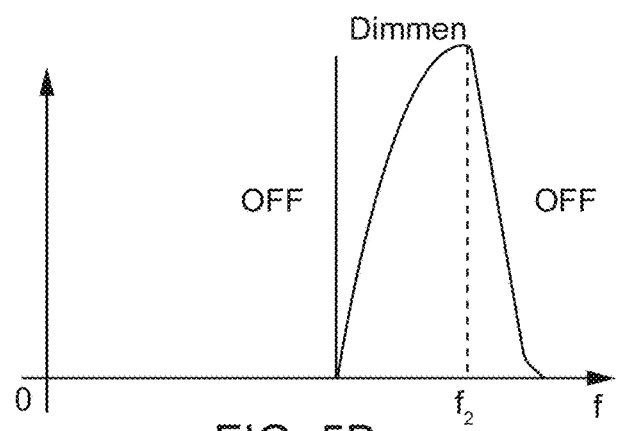
FIG. 5B

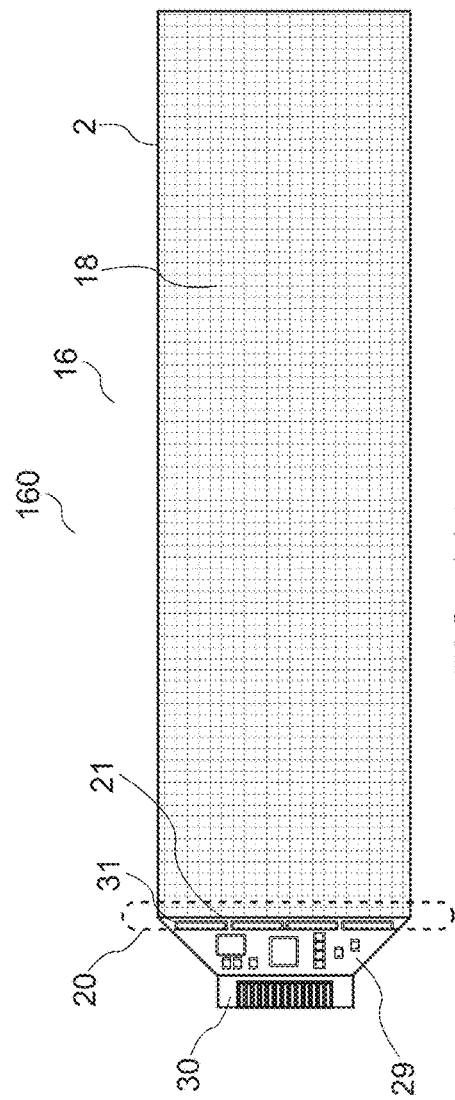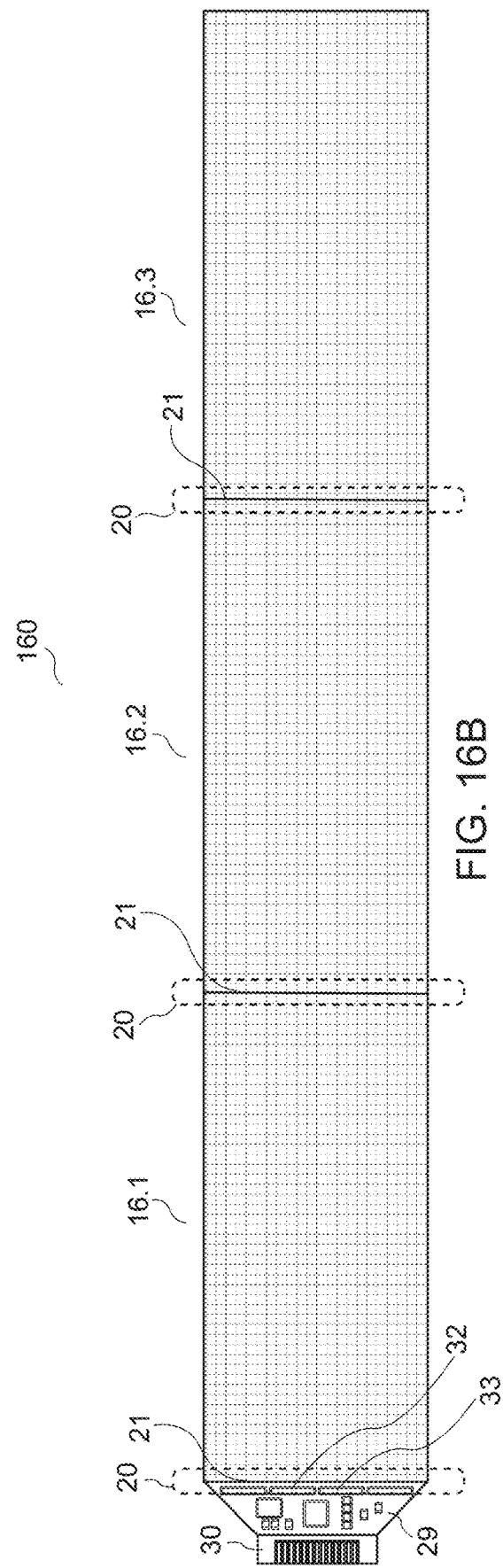

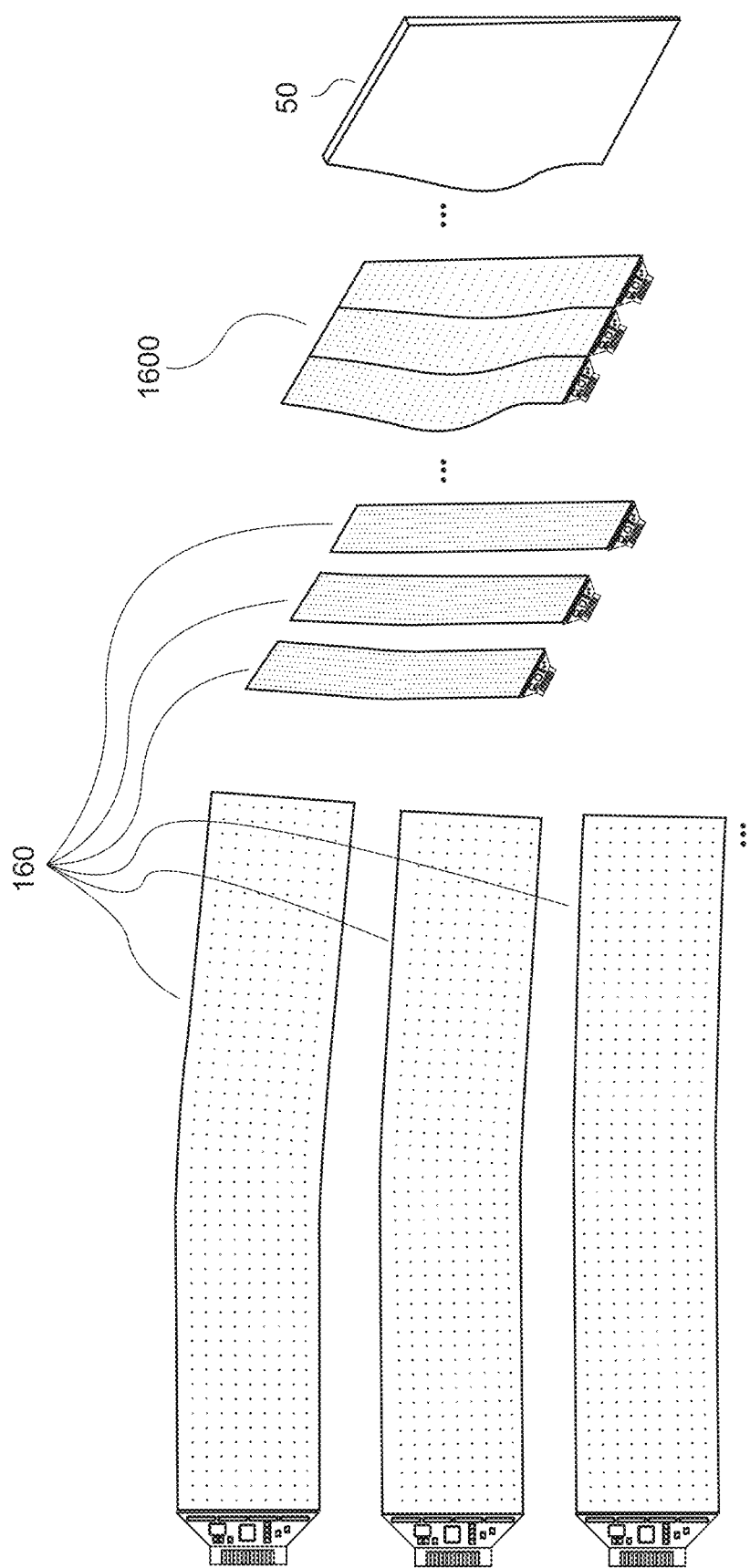

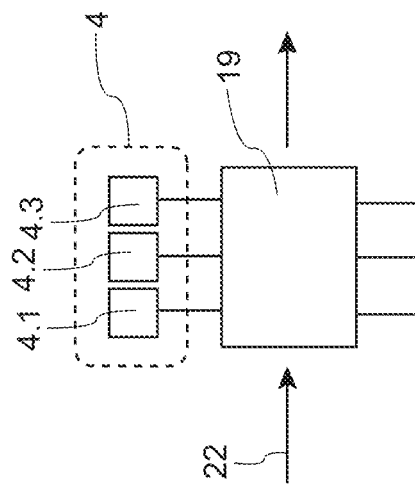
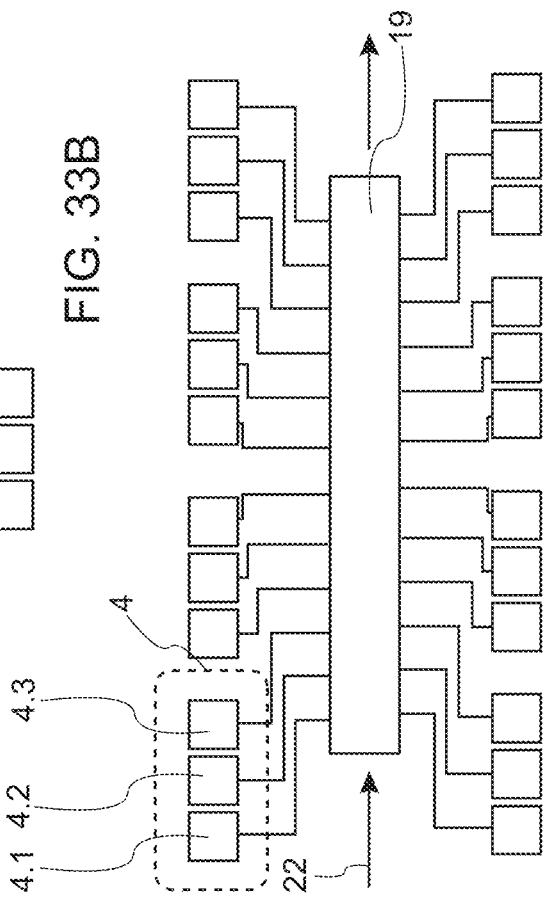
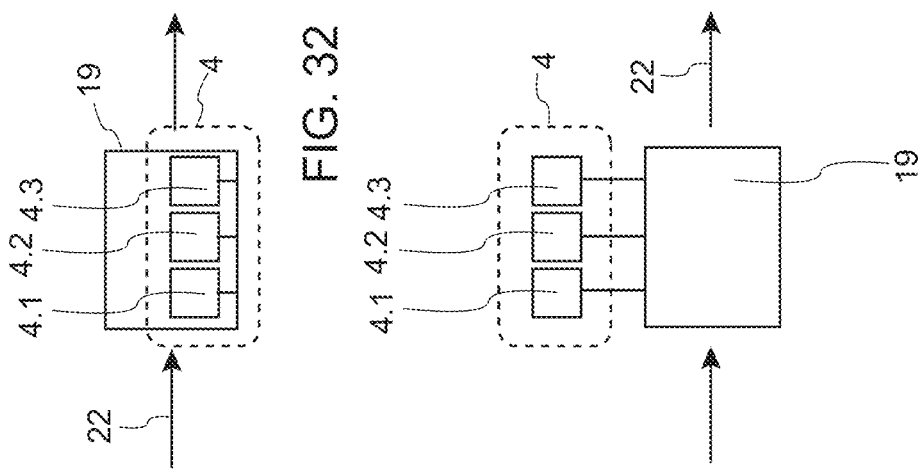

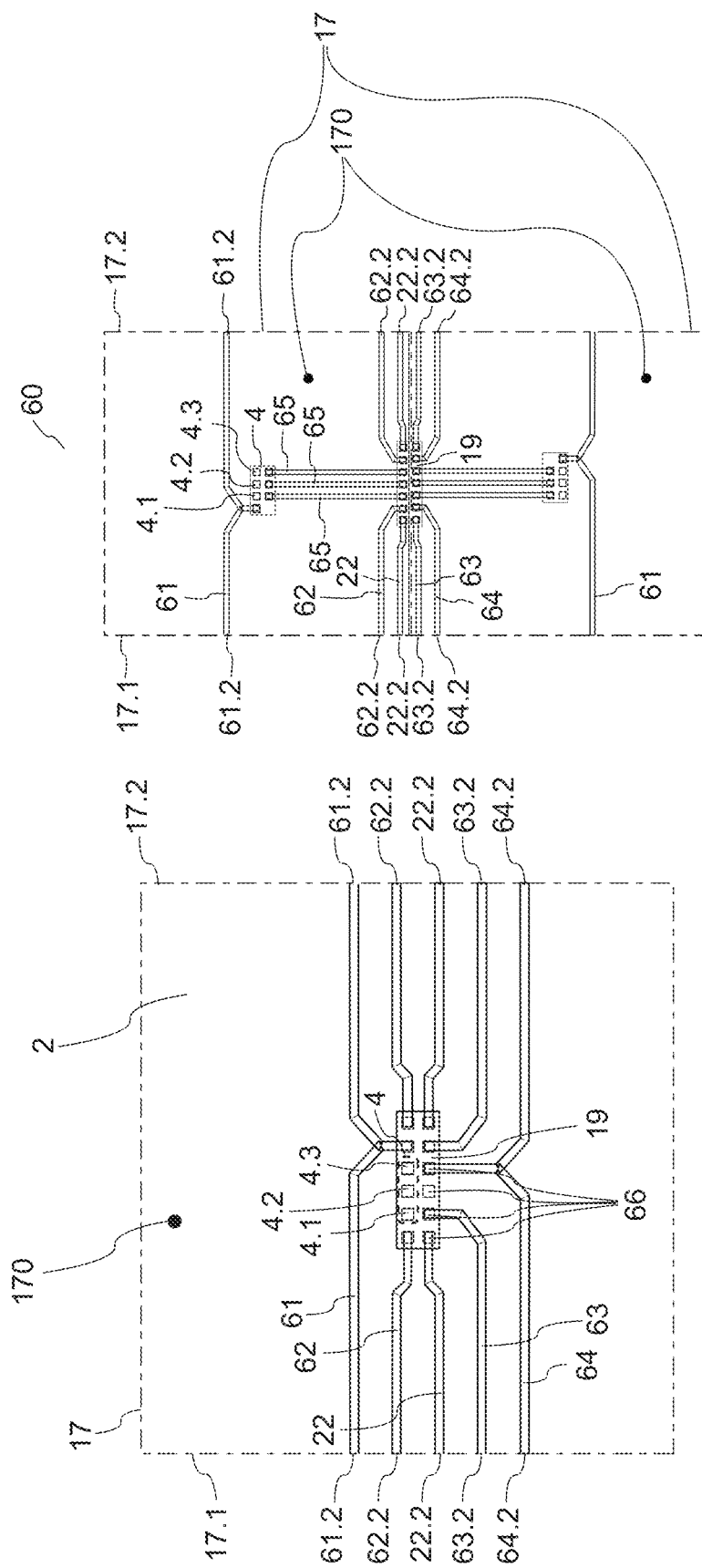

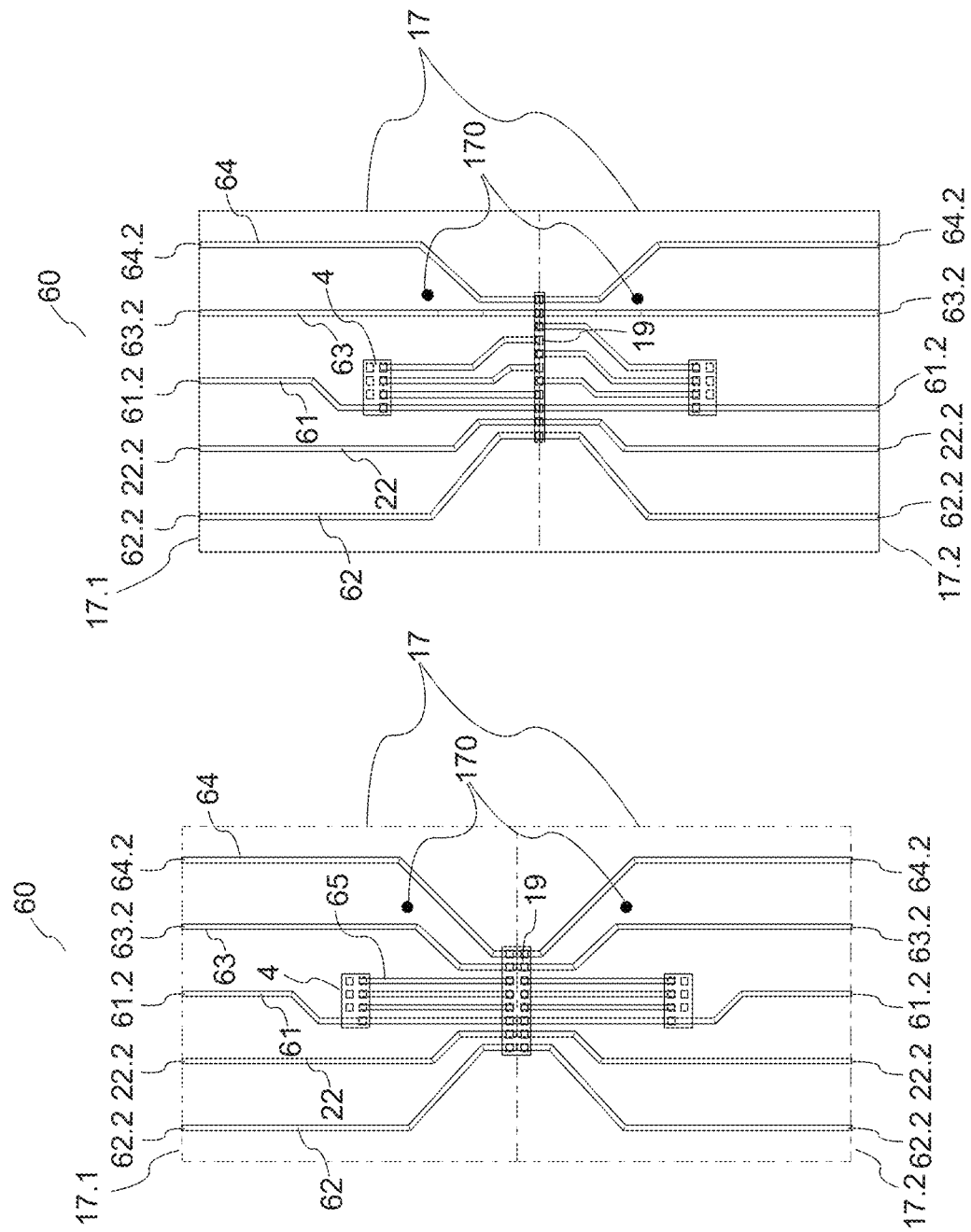

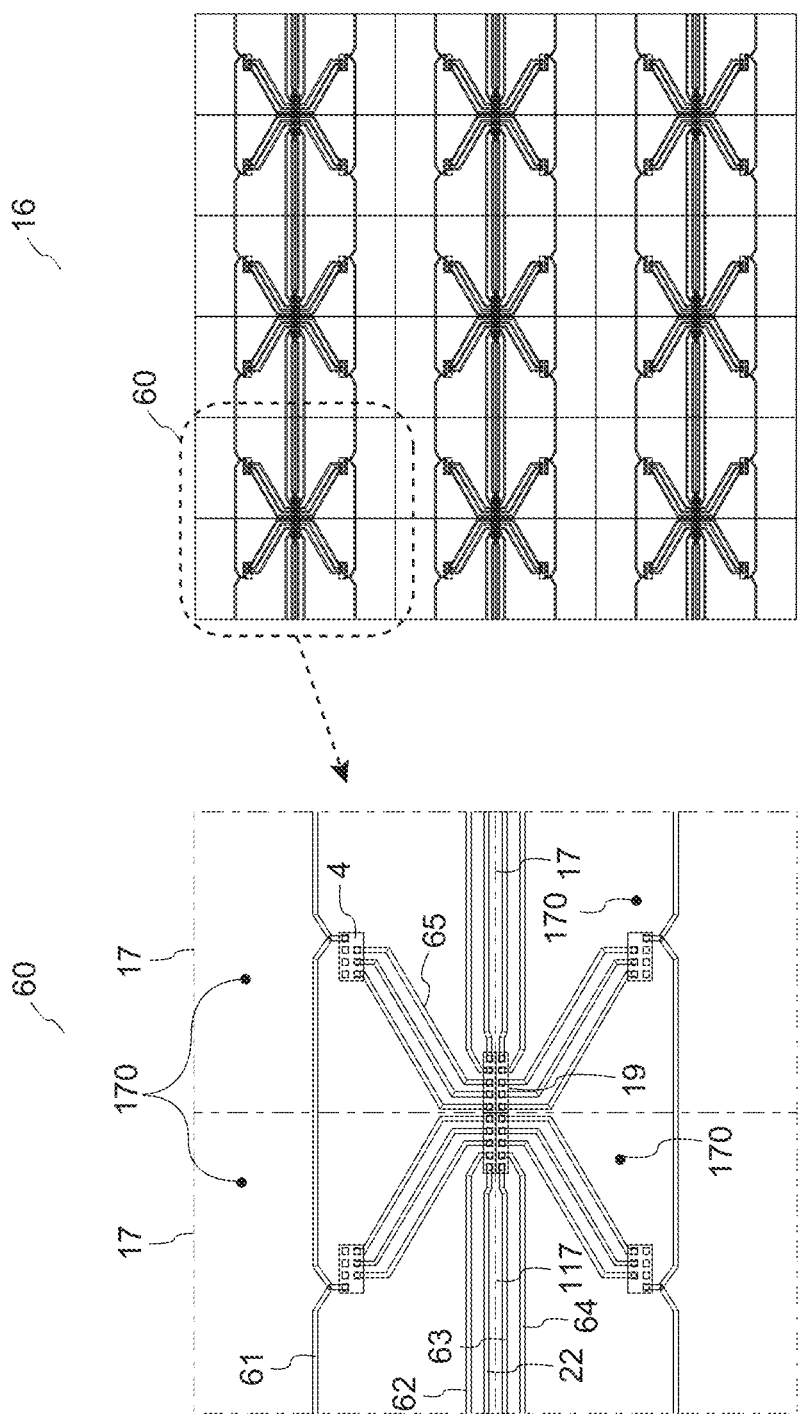

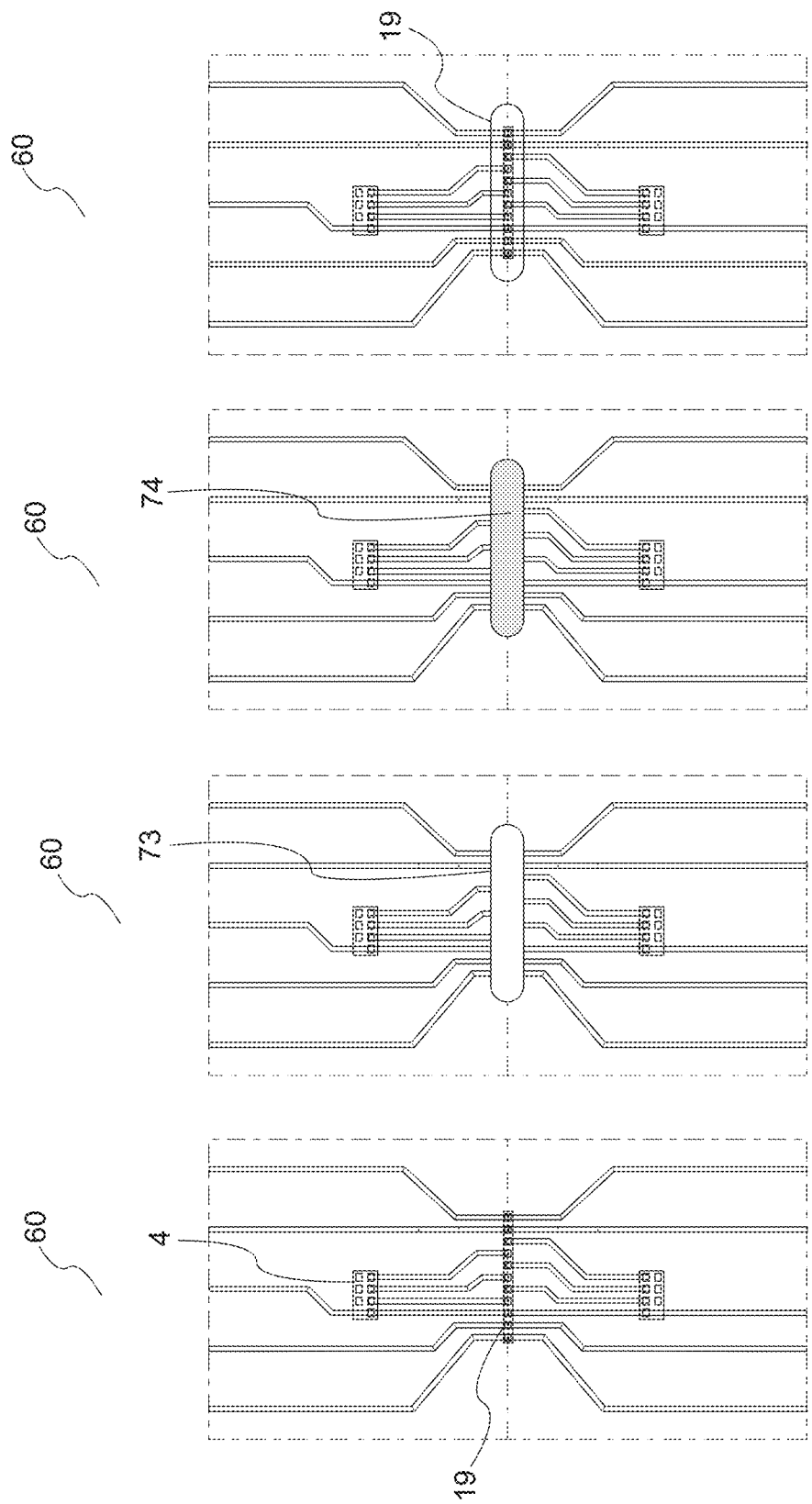

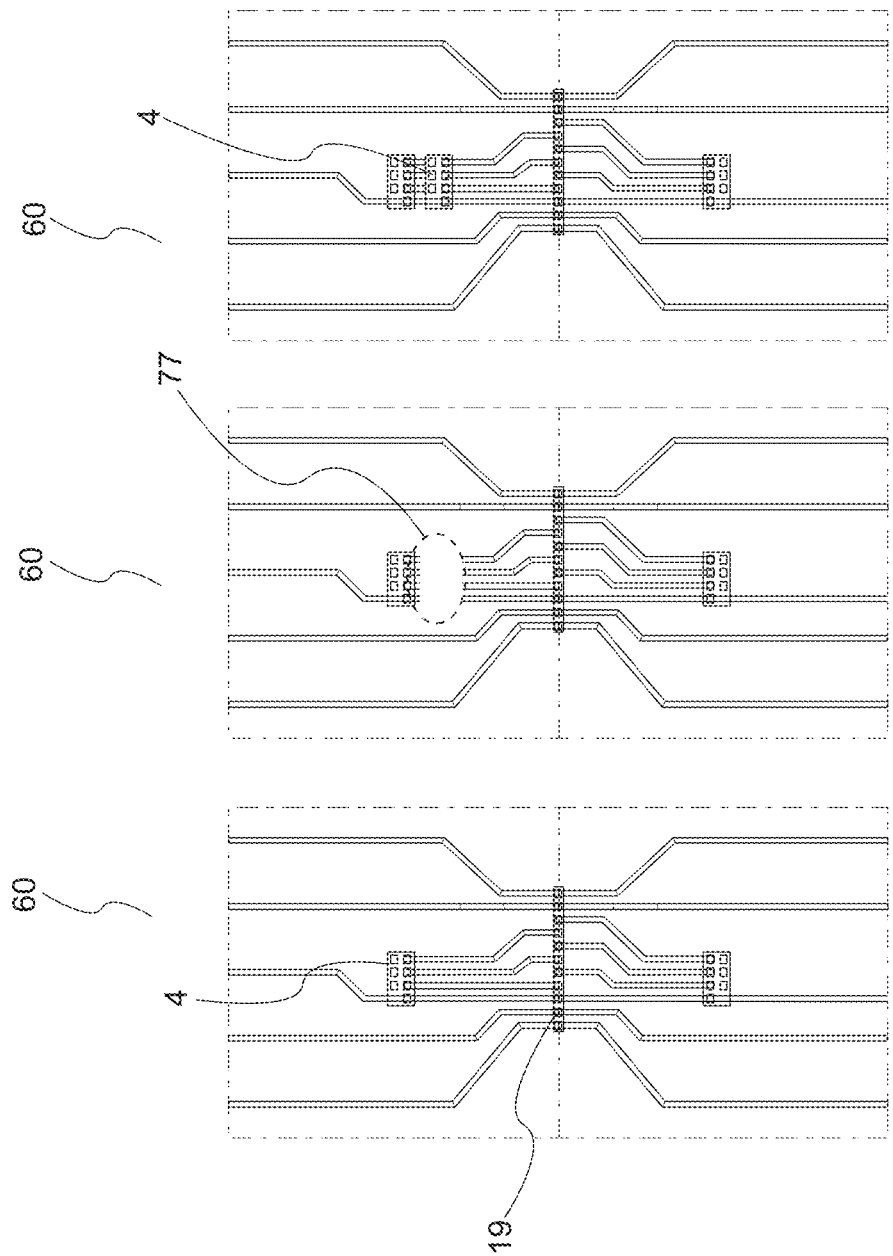

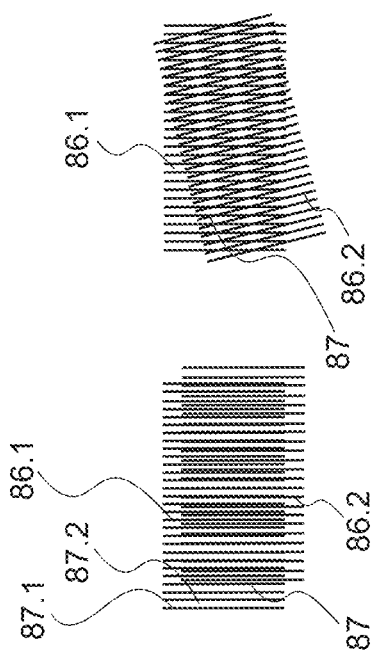
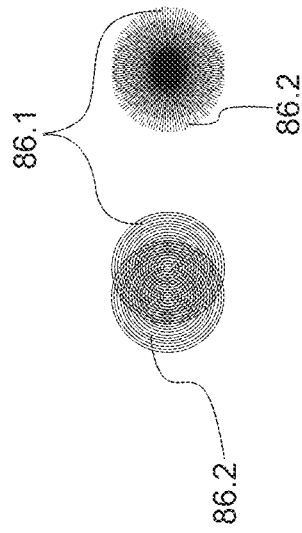
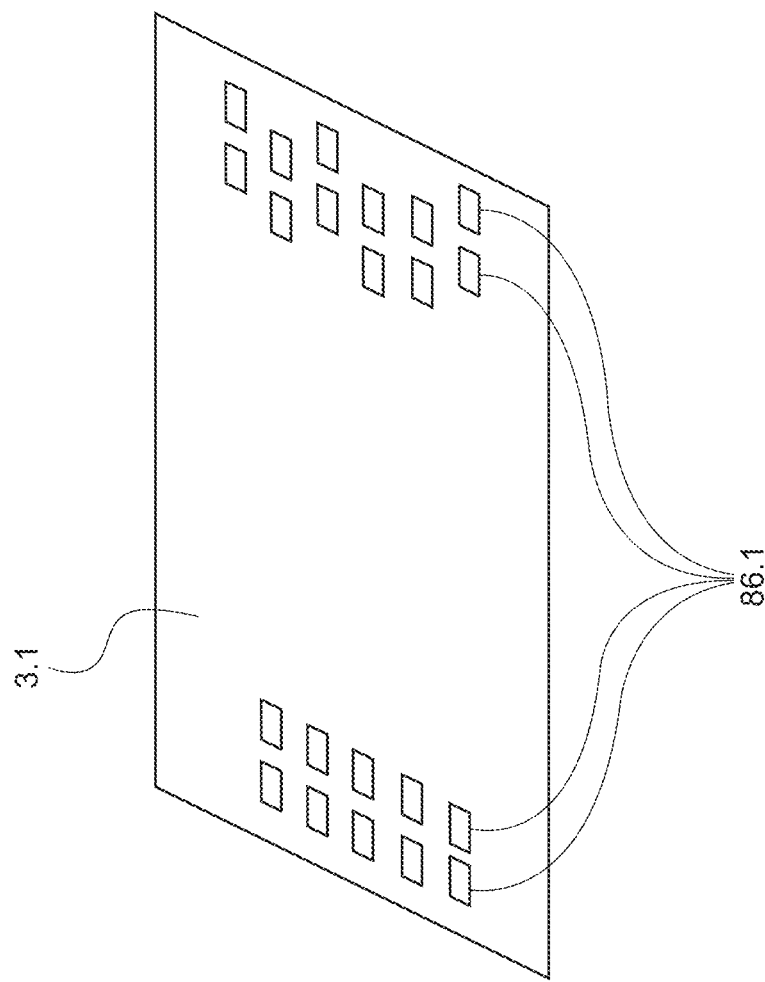

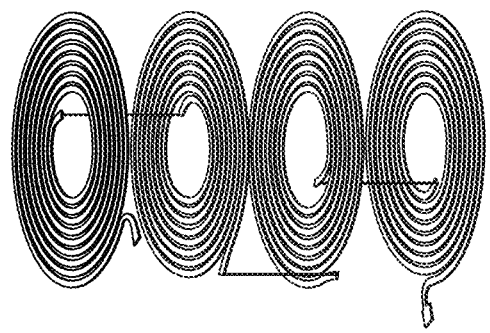
FIG. 71B
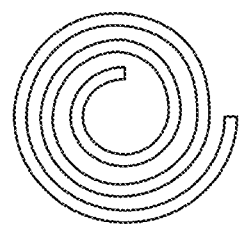
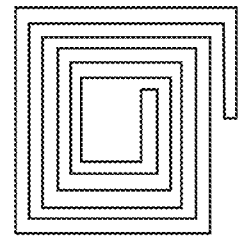
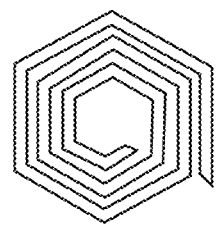
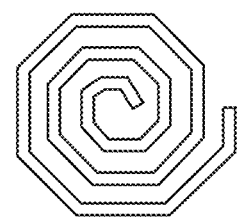
FIG. 71A

WINDOW OR SURFACE OF A VEHICLE COMPRISING AT LEAST ONE OPTOELECTRONIC COMPONENT

TECHNICAL FIELD

The present application is a U.S.C. 371 National Stage entry of PCT Application No. PCT/EP2020/080473 filed Oct. 29, 2020, which claims priority from DE application No. 10 2019 133 450.0 dated Dec. 6, 2019, DK application No. PA202070102 dated Feb. 21, 2020, DE application No. 10 2020 114 328.1 dated May 28, 2020, DE application No. 10 2020 114 336.2 dated May 28, 2020, DE application No. 10 2020 121 120.1 dated Aug. 11, 2020, DE application No. 10 2020 123 616.6 dated Sep. 10, 2020, DE application No. 10 2019 008 502.7 dated Dec. 6, 2019, DE application No. 10 2019 008 503.5 dated Dec. 6, 2019, and DE application No. 10 2020 123 632.8 dated Sep. 10, 2020, the disclosures of which are incorporated herein in their entirety.

The present invention is in the field of technologies to display information in or on a transparent window or a surface of a vehicle. In particular, the disclosure relates to a window or surface of a vehicle comprising optoelectronic components, their wiring and their addressing to display information on it.

Although the disclosure will be described primarily in relation to the windows and the outside surfaces of a car, the disclosure is not restricted to this particular type of vehicle, but may alternatively be implemented in other types of vehicles, such as trains, busses, trucks or ships.

In addition, the subject of the present disclosure can also be used in the field of buildings and houses to display information in or on correspondingly used glass panes.

BACKGROUND

LEDs oriented to radiate towards the interior of a vehicle are used to provide interior illumination, or to provide information to the driver or any passenger of the vehicle. Light sources, oriented to radiate towards the exterior of the vehicle however, provide primary signals, such as the high mounted brake light and supplemental brake/turn signal lights.

Attempts have been made to incorporate LED lighting as an integral part of components of the vehicle. A common approach has thereby been to add LEDs to the glazing of the vehicle. Attempts to incorporate LED lighting as an integral part of the outer surface of the vehicle however have not yet been made apart front lights, rear lights, high mounted brake lights and supplemental brake/turn signal lights.

Windshields for example are made from laminated glass. Laminated glass is also sometimes used for door windows, rear windows, sunroofs and panoramic roofs. Laminated glass is made by bonding two or more sheets of glass together by means of a thermoplastic bonding layer.

One approach known from WO 2019008493 A1 has been to laminate LEDs inside of vehicle glazings by laminating a sheet of a thermoplastic between two glass layers, wherein the sheet of a thermoplastic is containing LEDs and a wiring made of a fine, black, uninsulated, Tungsten wire. With the help of a CNC (computer numeric control) machine with the capability of a movement of the tool in the up/down, left/right and forwards/backwards directions (X, Y and Z) as well as a rotary axis perpendicular to the bed and a tool changer and tools to embed the wire, cut the wire, place the LED chips and connect the LED chips to the wires, it is possible to produce such a laminate.

A disadvantage of the aforementioned solution consists in that the respective electronic components are arranged adjacent the thermoplastic intermediate layer such that they rest on the intermediate layer and the intermediate layer thus compensates a thickness of the respective electronic components. Consequently, it is necessary to use electronic components that are as thin as possible in order to ensure that the intermediate layer can compensate the thickness of the electronic components. With the use of thicker electronic components, glass breakage can, occur when the intermediate layer is incapable of compensating the thickness of the electronic components and, thus, tension is generated in the panes.

An approach for an improved method for producing the laminated glass that enables the use of thicker electronics components without producing stresses in the laminated glass is known from US 2019248122 A1. The method comprises providing a first pane and a second pane, arranging a plastic film between the first pane and the second pane, and arranging an LED on a surface of the plastic film. The plastic film is locally heated into the fluid state in the region of the LED. The LED can then penetrate into the plastic film with displacement of a predefined volume and create a recess in the plastic film. Due to the displacement of the predefined volume of the plastic film in the heated state of the plastic film, it becomes advantageously possible that, in contrast to pressing the LED into the plastic film in a cold state, a total thickness of the LED and the plastic film does not exceed a safe thickness and thus the creation of stresses in the panes is avoided.

Another approach is known from DE 102017122852 A1, according to which a cover for a motor vehicle roof has a layer stack, which comprises a flatly extended disk, a flat film and an adhesive layer arranged between the disk and the film for fixing the film to the disk. In the adhesive layer, a plurality of micro light emitting diodes (micro LEDs) and electrical connections of the micro LEDs is arranged. The micro LEDs are completely embedded in the adhesive layer and light generated by the Micro-LEDs is output via the foil.

The object of the invention is thus to counteract the aforementioned problems and to provide a window of a vehicle comprising optoelectronic components which is easy and inexpensive to manufacture.

In addition, an objective of the invention is to provide a solution to incorporate LED lighting as an integral permanent part of the outer surface of a vehicle.

SUMMARY

This section provides a general summary of the disclosure, and is not a comprehensive disclosure of its full scope or all of its features.

Embodiments provide a window of a vehicle, optoelectronic circuits, in particular optoelectronic circuits for a window of a vehicle and a method for manufacturing a window of a vehicle including at least one optoelectronic component.

According to a first aspect of the present disclosure, a window of a vehicle is comprising a transparent carrier layer, a transparent dielectric layer arranged on the carrier layer and at least one first structured conductor arranged in between the carrier layer and the dielectric layer. According to this aspect, the window is further comprising at least one optoelectronic component, in particular a LED and even more particular a µ-LED, which is arranged on the surface of the dielectric layer opposite to the carrier layer. To provide an electrical connection between the at least one first structured conductor and the at least one optoelectronic component, at least one conductive via is arranged through the dielectric layer, to electrically connect the at least one first structured conductor with the at least one optoelectronic component. To protect the at least one optoelectronic component the window is further comprising a transparent covering layer arranged on the surface of the dielectric layer opposite to the carrier layer, wherein the covering layer covers the at least one optoelectronic component completely.

Transparent in this case means, that at least half of the light, shining on the layer stack passes the layers and thus a viewer of the layer would be able to look through it. In other words, more than 50% and up to 100% of the light, shining on the layer stack passes the layers and thus a viewer of the layer would be able to look through it.

By the term covers completely, the transparent covering layer arranged on the surface of the dielectric layer is meant to be covering at least the surface of the optoelectronic component opposite to the dielectric layer completely. However, the transparent covering layer can also cover the side surfaces and at least partly the bottom surface of the optoelectronic component. The surface of the covering layer opposite to the dielectric layer however is preferably smooth and even, so that for example it is possible to arrange or glue another layer onto the surface.

The window of a vehicle can for instance be a window of a car, or can be implemented in any other types of vehicles, such as trains, busses, trucks or ships. More particular, the window of a vehicle can be a windshield, a side window or a rear window of a car.

The window can thereby additionally comprise a first window layer, wherein the covering layer is attached to said first window layer. Thus, the first window layer and the carrier layer would form the outermost layers of the window. The window however can also comprise a second window layer attached to the carrier layer opposite to the dielectric layer. Thus, the first window layer and the second window layer would form the outermost layers of the window.

The at least one first structured conductor can for instance be sputtered, spined, or laminated on the carrier layer and the dielectric layer can be laminated, molded, or sprayed on this arrangement afterwards.

The carrier layer can therefore be made of glass, acrylic glass, Aluminiumoxynitride or a polymer, to on the one hand give a mechanical stability to the window, and/or a sufficient evenness on its surface to arrange the at least one first structured conductor on it, and to ensure the transparent characteristic of the layer.

The electrical connection between the conductive via and the optoelectronic component can be extended with at least one second structured conductor, which can be arranged in between the dielectric layer and the covering layer. The second structured conductor can thereby differ in the material, and/or the structure and/or the shape to the first structured conductor.

The second structured conductor and the first structured conductor can be for example formed as a trace, a wire, a thin film conductor, or any other kind of commonly known types of conductors.

The second structured conductor as well as the first structured conductor can for example be of a transparent, conductive material such as for example ITO. Due to the high resistance of such a material, it might however be advantageously to use such material for the second structured conductor only as the second structured conductor might be arranged at a closer distance than the first structured conductor and thus a transparent material might be the better choice. The first structured conductor might be advantageously of a different material such as for example copper, tungsten, gold, or any of this kind, to ensure a high conductivity of the conductor.

The optoelectronic component can be for example a Flip-Chip mountable LED, a Flip-Chip mountable µ-LED, or a pixel of at least three subpixels, wherein each subpixel is a µLED and the subpixel is configured to emit one of the colours red, green and blue. Hence, an aforementioned optoelectronic component can for example form a so-called RGB pixel.

To address the at least one optoelectronic component of the window of a vehicle, it can be advantageously, that the window of a vehicle further comprises at least one third structured conductor for the transfer of data. Apart sending a modulated electrical signal through the at least one first structured conductor or through the at least on first structured conductor and the at least on second structured conductor, a signal can also be sent via the at least one third structured conductor to address the at least one optoelectronic component.

The window of a vehicle can for instance be movable as for example a side window of a car has the ability of being opened and closed. A solid connection in between an electrical power supply of the car and the window can thus be difficult. Therefore the window can further comprise a first inductive element, which is electrically connected to the at least one first structured conductor for a contactless, more particular inductive, transfer of electrical power supply from the electrical power supply of the car to the window. This however assumes, that in closed, or in at least partly closed state of the side window, a second inductive element electrically connected to the electrical power supply of the car has to be arranged next to the first inductive element of the window in the side door of a vehicle, to contactless transfer electrical energy from a vehicle to the window. A corresponding control for contactless power transmission between the two inductive elements has additionally to be provided in a vehicle.

The window of a vehicle can further comprise various optoelectronic circuits to ensure a power supply of the optoelectronic components and a addressing of the optoelectronic components. In particular an optoelectronic circuit in a window of a vehicle can comprise at least two optoelectronic components, in particular two LEDs, which are interconnected in parallel and at least two filters, each coupled with one of the at least two optoelectronic components. The at least two filters can thereby have a defined characteristic with one filter flank which is sufficiently flat to enable a frequency dependent dimming of the regarding optoelectronic component. In other words, the two filters can each control the regarding LED with the states on and off and can dim the LED by filtering out a corresponding signal of an incoming modulated electrical signal.

The modulated electrical signal can thereby for instance be any kind of modulated electrical signal and in particular, it can be a Pulse Width Modulation (PWM) signal or a sinusoidal signal.

The aforementioned mentioned filters can for instance be high pass filters. According to a predefined value, the high-pass filter passes an electric current with a corresponding frequency or blocks the LED. According to this optoelectronic circuit, all LEDs use the same high pass filters for a global on and off state and a global dimming of the LEDs.

However, the aforementioned mentioned filters can for instance also be band pass filters, which can differentiate in the frequency band the filter passes. In other words, the two band pass filters have a different centre frequency so that different frequencies can pass the filter. In this case, the modulated electrical signal cannot be a Pulse Width Modulation (PWM) signal, but for instance a sinusoidal signal. A dimming of the LEDs is realized by the time until a predefined slope of the falling edge of the transmitted signal is reached. According to this embodiment of the optoelectronic circuit, some of the LEDs, but not necessarily all of the LEDs use different band pass filters for an individual on and off state and an individual dimming of the LEDs. This means in other words that at least two of the band pass filters have a different centre frequency so that different frequencies can pass the filter. However, it is also possible, that all of the band pass filters have a different centre frequency.

Yet another embodiment of the optoelectronic circuit can in addition to the aforementioned mentioned optoelectronic circuits further comprises an IC LED driver and a data storage. With these two additional components, it is possible to do a full addressing, dimming and colour control of each optoelectronic component with the help of Power Line Communication. Thus, the optoelectronic component can be for instance a pixel of at least three subpixels, wherein each subpixel is a LED or a µLED and the subpixel is configured to emit one of the colours red, green and blue. Hence, one pixel can form a RGB LED and the emitting light colour can be controlled individually for each pixel with the help of Power Line Communication.

An optoelectronic circuit can also comprise at least two optoelectronic components, in particular two LEDs, which are interconnected in parallel, at least one conductor for the transfer of data and at least two logic circuits connected each to one of the at least two optoelectronic components and the at least one conductor. One optoelectronic component and one logic circuit can thereby form a module, and similar to a Daisy chain, these modules are connected in series in regards of Power and Data supply. The at least two logic circuits can thereby be so called shift registers. This means, that once a signal with a defined number of bits is sent through the conductor for the transfer of data, the shift registers are filled up with the bits and once the shift register of each LED is filled up, the regarding optoelectronic component receives a signal in which intensity it should glow. Once another signal is sent through the conductor for the transfer of data, each of the bits that are first in place of the registers are "kicked" out and the registers are filled up again with "new" bits.

This has the advantage that an addressing of each optoelectronic component becomes unnecessary, as it is only necessary to know how many bits one must send through the conductor for the transfer of data to fill up the correct register with bits to provide the correct information. In addition to that, due to the serial circuit, only two first structured conductors are necessary for powering all optoelectronic components and only two conductor for the transfer of data are necessary for a communication between the optoelectronic components.

The window of a vehicle can further comprise a current source and a feedback circuitry, wherein the feedback circuitry is made of thin film technology. Each one current source is thereby coupled in series with one optoelectronic component and a feedback circuitry is connected in parallel to this. With this arrangement, each LED can be controlled individually in respect to the current running through it. The current source can be for instance a transistor and more particular a MOSFET.

To reduce the thickness of this arrangement to place it into the window it can be advantageous to have the feedback circuitry and/or the current source made of thin film technology. Thus, it can be possible to place this arrangement on the surface of the dielectric layer opposite to the carrier layer and cover it by the transparent covering layer to protect the arrangement from external influences. However it can also be an option to locate the at least one current source, which is producing the most heat of this components, outside the window to have the possibility to dimension the current source big enough to avoid overheating.

An optoelectronic circuit in particular in a window of a vehicle can also comprise at least two modules connected in series, wherein each module comprises at least one µ-controller and three optoelectronic components for emitting red, green and blue light, each switchable arranged in a current path. The optoelectronic circuit can further comprise a controllable current source coupled to the modules for providing supply current and a data generation source connected to the current source. The µ-controller is thereby configured to receive a data signal in response to a variation of the supply current and can thus address each of the three optoelectronic components for emitting red, green and blue light.

To ensure a supply current is running through each module, even though none of the three optoelectronic components (is running, at least one first diode can be arranged switchable in a current path in each module. The first diode can for instance be a so called "Zener" diode, with a "Zener" voltage that is approximately the same supply voltage as the optoelectronic components for emitting blue and green light. Hence, if none of the three optoelectronic components is running, the voltage at the "Zener" diode reaches a predefined "Zener" voltage, and the following modules in series are farther supplied with current.

As the supply voltage of the optoelectronic component for emitting red light might be lower as of the optoelectronic components for emitting blue and green light, it might be advantageous to arrange an additional diode into the current path of the optoelectronic component for emitting red light, so that the combined supply voltage meets the supply voltage of the optoelectronic components for emitting blue and green light. This means in other words, that it can be advantageous to ensure, that the three current paths of the three optoelectronic components and the current path of the "Zener" diode within each module meets an approximately identical need of supply voltage. The data generation source connected to the current source generates a modulated supply current and thus generates data signal, which can be evaluated by the µ-controllers. The supply current can thereby for instance be modulated as a Pulse Width Modulation (PWM) signal. Indeed the supply current can also be modulated as any other kind of modulated electrical signal as for example a sinusoidal signal.

To bridge a "down time" of every period of the PWM signal, it can be advantageous to arrange at least one capacitor and at least one second diode connected in series in the current path of the µ-controller of each module. This has the advantage that the capacitor stores energy to keep the µ-controller running when no current is running due to the "down time" of the modulated supply current. In combination with the second diode it is ensured, that the energy stored in the capacitor is only used by the µ-controller and not by any other electrical consumer of the module.

During each period of the PWM signal the µ-controller addresses each of the three optoelectronic components to switch them on or off in the order how the signal is provided by the data generation source. This means, that at a time only one of the three optoelectronic components can be switched on while the other two has to be switched off. However, it can also be that all of the tree optoelectronic components can be switched off and thus the current "breaks through" the "Zener" diode. According to the PWM signal, the colour mixing and the intensity of the three optoelectronic components can be individually addressed and be programmed on the μ-controller during the "down time" of the PWM signal.

Regarding the voltage network the optoelectronic circuit is connected with, it might be advantageously to implement a stepup converter into the optoelectronic circuit, to ensure, that the correct voltage is provided for the circuit.

Further embodiments of the invention provide a display comprising at least one display module each comprising at least one optoelectronic array with a plurality of optoelectronic components, each optoelectronic component associated with a pixel. The display is thereby adapted to display information in or on a transparent window or a surface, in particular 3D-shaped surface, of a vehicle. In particular, the display relates to a window or parts of a surface of a vehicle comprising optoelectronic components, their wiring and their addressing to display information on it. In addition, a method for manufacturing a display module comprising at least one optoelectronic array with a plurality of optoelectronic components, each optoelectronic component associated with a pixel is provided.

According to a first aspect, an optoelectronic array is provided comprising a transparent carrier layer with a plurality of optoelectronic components arranged on a first surface of the transparent carrier layer in a first matrix. Each of the plurality of optoelectronic components is associated with a pixel. The optoelectronic array is further comprising at least two integrated circuits, in particular μICs, arranged on the first surface of the transparent carrier layer. Each integrated circuit is thereby connected to at least one of the plurality of optoelectronic components. A first contact area is situated along a short edge of the transparent carrier layer allowing to electrically contact the optoelectronic components and the integrated circuits of the optoelectronic array. In addition, a connection for programming the optoelectronic components and the integrated circuits can also be provided with the first contact area. According to this aspect, the optoelectronic array is further comprising at least one first data line to connect the at least two integrated circuit with the first contact area. The transparent carrier layer is preferably of a planar, inexpensive, transparent and deformable, thermoplastic plastic as for example PET, PEN, PVC, or the like. However, thermosets and non-thermoformable plastics are also conceivable as for example silicone, polyurethane, or the like.

The shape of the transparent carrier layer and with it the shape of the optoelectronic array can be of any shape but has particularly the shape of a polygon and more particular the shape of a rectangle, triangle, hexagon, or the like. However, it is also conceivable that the transparent carrier layer and with it the optoelectronic array has a shape of stripes with a width of 0.1 meter to 1 meter and a length of 0.3 meter to 5 meter, more particularly a width of 0.2 meter to 0.5 meter and a length of 0.5 meter to 2 meter and even more particularly a width of 0.3 meter and a length of 1 meter to 1.5 meter.

The pixels associated with the optoelectronic components may comprise a size of less than 1 mm$^2$, particularly less than 0.5×0.5 mm$^2$ and even more particularly less than 0.25×0.25 mm$^2$. Hence, an optoelectronic array may comprise a number of pixels and with it optoelectronic components greater than 10,000, particularly greater than 100,000 and even more particularly greater than 1 million.

The optoelectronic components may comprise for example a Flip-Chip mountable LED, a Flip-Chip mountable μ-LED, or a three subcomponents, wherein each subcomponent is a μLED. The three subcomponents are thereby for example adapted to emit one of the colours red, green and blue. In other words, one of the three subcomponents is for example adapted to emit red light, one of the three subcomponents is for example adapted to emit green light and one of the three subcomponents is for example adapted to emit blue light. Hence, an aforementioned optoelectronic component can for example form a so-called RGB pixel.

The at least two integrated circuits can be arranged in a second matrix with a plurality of rows and columns. The second matrix can thereby, depending on the proportion of optoelectronic components to integrated circuits, match with the first matrix, partially match with the first matrix or not match with the first matrix.

In this regard, integrated circuit should be understood a one or more electrical components interacting together to provide a defined functionality. Integrated circuit in this disclosure can be implemented by various technologies. By combining suitable technology to provide electrical component a desired functionality can be achieved and formed on a transparent carrier layer for example.

The at least one first data line can connect the integrated circuits within one row in series with the first contact area. Hence, the integrated circuits within one row are connected in series with the first contact area similar to a daisy chain with a serial bus. The integrated circuits within one row can comprise shift registers. This means, that once a signal with a defined number of bits is sent through the at least one first data line, the shift registers are consecutively filled with the bits. Once the shift register of each integrated circuit is completely filled, the respective data word in each register corresponds to the intensity of the associated pixel. The daisy chain principle follows "first in—first out", whereas the first bit in the signal is shifted through all registers in the daisy chain until the last. Hence, in each cycle or new programming all bits in the shift registered are replaced.

This has the advantage that an addressing of each integrated circuit becomes unnecessary, as it is only necessary to know how many bits one must send through the at least one first data line to fill up the correct register with bits to provide the correct information.

The proposed approach enables to address a whole row of integrated circuits, and all the associated optoelectronic components, by use of a single serial driver unit connected to the first contact area and thus connected to the at least one first data line.

The at least one first data line can also connect the integrated circuits of at least two adjacent rows in series with the first contact area. Hence, the integrated circuits within at least two adjacent rows are connected in series with the first contact area similar to a daisy chain with a serial bus. However, it can also be conceivable if the number of adjacent rows is an even number greater than 2.

In order to check whether the information sent through the at least one first data line has arrived correctly at the integrated circuits, some aspects may provide a feedback loop by returning the at least one first data line to their starting point.

In some further aspects, each integrated circuit can be connected to more than one optoelectronic component and thus pixel.

Each integrated circuit can for example be connected to 2, 4, 6 or 8 optoelectronic components and thus pixels.

The at least one first data line can also connect the integrated circuits of one row in parallel to the first contact area, and an at least one second data line can connect the integrated circuits of one column in parallel to the first contact area. Thus, a cross matrix programming is possible. According to this aspect, it can be possible to address the rows of integrated circuits and all associated optoelectronic components, with a row driver connected to the first contact area and thus connected to the at least one first data line. The columns of integrated circuits, and with it all the associated optoelectronic components, can however be addressed with the help of for example each a column driver connected to the first contact area and thus connected to the at least one second data line.

An advantage of a cross matrix circuit is that programming can be carried out with lower frequencies at the cost of a layer wiring of at least two layers and at least one insulating layer between.

This however can be solved by placing the crossing points of the at least on first data line and the at least one second data line in the integrated circuits. The integrated circuits can have several metallization levels that can be used for this wiring. This means that a metallization of the transparent carrier layer can be carried out in only one layer without an insulating layer. Thus, a reduction of costs can be achieved.

In an aspect, the at least two integrated circuits can be implemented utilizing thin-film technology (TFT). TFT processes are inexpensive because they are processed on very large areas. Since TFTs need at least two metal levels, the crossing points of the at least on first data line and the at least one second data line can be placed within the integrated circuits without any additional effort or problem.

The at least two integrated circuits implemented utilizing thin-film technology (TFT) can in some embodiments be implemented on a surface of a carrier, for instance a transparent carrier layer. However, integrated circuits implemented in TFT technology can also be encapsulated to form a chip or other integrated component. Combinations of various technology are also possible.

Each integrated circuit can comprise a first transistor, a second transistor and a capacitor. The first transistor and the capacitor are configured to control a current through the second transistor. Thus, the second transistor is adapted to work as a controllable current source, and the first transistor and the capacitor are configured to control the current source.

In some embodiments, one or more of the integrated circuits, in particular if the integrated circuits are connected in series similar to a daisy chain, can comprise a shift register, a PWM module and a controllable current source.

According to a further aspect, a display module is provided comprising an optoelectronic array according to any of the above-described aspects. The display module is further comprising a programming area coupled to the first contact area to program the at least two integrated circuits and a connector area located adjacent to the programming area opposite the first contact area to electrically connect the display module. The connector area may be formed as a connector, for the supply of energy and for data exchange with the environment of the display module.

The programming area can be provided for programming the at least two integrated circuits as well as the programming area can be provided as a power supply of at least two integrated circuits and thus all associated optoelectronic components. The programming area may comprise at least one of the above-mentioned serial driver units and/or row drivers and/or column drivers to address the integrated circuits and thus the associated optoelectronic components of the optoelectronic array.

The at least one serial driver unit may thereby be used to address/program the integrated circuits connected in series. In addition, a first end of the at least one first data line can be connected to the at least one serial driver unit and a second end of the at least one first data line can be connected to the same serial driver unit to provide a feedback loop, in order to check whether the information sent through the at least one first data line has arrived correctly at the integrated circuits.

The at least one row driver unit may however be used to address/program the integrated circuits within a row connected to the at least one row driver unit and the at least one column driver unit may be used to address/program the integrated circuits within a column connected to the at least one column driver unit.

In some further aspects, the display module may also comprise at least two optoelectronic arrays according to any of the above-described aspects facing each other along a short edge of each of their transparent carrier layer. The at least two optoelectronic arrays are coupled with at least one electrical module to electrically interconnect the at least two optoelectronic arrays.

The least one electrical module can thereby not only be to electrically interconnect the at least two optoelectronic arrays but can be adapted to mechanically interconnect the at least two optoelectronic arrays.

For providing an electrically connection between the at least two optoelectronic arrays, the at least two optoelectronic arrays may each comprise a plurality of electrical contact pads on their transparent carrier layer along each facing short edge of the at least two optoelectronic arrays.

The at least one electrical module can in a first aspect further comprise at least one first bonding wire, to couple at least one of the plurality of electrical contact pads of each of the at least two optoelectronic arrays with one another, and a first encapsulating material. The encapsulating material may thereby cover the at least one first bonding wire, the at least one of the plurality of electrical contact pads of each of the at least two optoelectronic arrays, which are coupled with the at least one first bonding wire, as well as at least partially the at least two optoelectronic arrays. The at least one first bonding wire can comprise a material like gold, aluminum, or the like to be conceivable as an electrical connection. The encapsulating material is to protect the at least one first bonding wire from mechanical influences and can for example be molded, potted, or the like. The encapsulating material can further be adapted to mechanically interconnect the at least two optoelectronic arrays.

The least one electrical module can in a second aspect further comprise at least one first printed circuit to couple at least one of the plurality of electrical contact pads of each of the at least two optoelectronic arrays with one another, and a flextape arranged on the at least one first printed circuit opposite to the contact pads. In the broadest sense, a flextape can comprise a flexible dielectric substrate as for example PEN, PET, PI, or the like with a structured metallization/first printed circuit comprising Cu, Ni, Au, or the like. However, a rigid plate as for example made of epoxy, glass fiber composite, or the like could also be used. The electrical connection between at least one of the plurality of electrical contact pads of each of the at least two optoelectronic arrays can for example be made using low-temperature solders or adhesives as for example an anisotropic conductive film arranged on the at least one of the plurality of electrical contact pads of each of the at least two optoelectronic arrays, which are coupled with the at least one first printed circuit.

The least one electrical module can in a third aspect further comprise at least one solder ball to couple at least one of the plurality of electrical contact pads of each of the at least two optoelectronic arrays with one another. With the at least one solder ball a direct optoelectronic array to optoelectronic array contact can be provided. The solder can thereby contain any material as for example indium or bismuth with melting points below 180° C.

The least one electrical module can in a fourth aspect further comprise a filler arranged on and/or between the at least two optoelectronic arrays, as well as at least one second printed circuit to couple at least one of the plurality of electrical contact pads of each of the at least two optoelectronic arrays with one another. The at least one second printed circuit is thereby arranged on the filler and/or partially on the at least two optoelectronic arrays. The at least one second printed circuit can for example comprise sintered Nano-Ag or the like and can be applied precisely with for example an aerosol jetting or ink jetting process. However, the at least one second printed circuit can for example also comprise Cu or the like and can be specifically transferred using LIFT processes. The filler can be adapted to fill the gap between the at least two optoelectronic arrays in order to enable the at least one second printed circuit to be applied. The filler can form either a concave, flush or convex shape between and/or on top of the at least two optoelectronic arrays.

The at least one electrical module can further be formed on the first surface of each of the transparent carrier layers of the optoelectronic arrays and/or on the surface opposite to the first surface of the transparent carrier layer of the optoelectronic arrays. Thus the at least one electrical module can be formed between the at least two optoelectronic arrays and form a concave shape on top of the first surface of each of the transparent carrier layers of the optoelectronic arrays and/or on the surface opposite to the first surface of the transparent carrier layer of the optoelectronic arrays.

The mechanical connection of the at least two optoelectronic arrays can also be provided by for example welding or gluing the transparent carrier layers along their facing short edge. The joint is advantageously on the pixel boundary of each optoelectronic array, as most of the space is available there. This however may lead to small connecting surfaces with low tensile strength.

Therefore, it might for instance be conceivable that the display module is further comprising a carrier foil arranged on a surface of the transparent carrier layers of the optoelectronic arrays opposite to the first surfaces. A lamination of the carrier foil onto the at least two optoelectronic arrays a good connection quality can be provided because of the large joining surfaces. In addition, the process of lamination is a rather simple and inexpensive process.

Between the carrier foil and the transparent carrier layer the display module can further comprise an adhesive. The adhesive may for instance be conceivable as it improved the connection quality of the carrier foil and the at least two optoelectronic arrays.

However, the mechanical connection of the at least two optoelectronic arrays can also be provided by for example welding or gluing the at least two optoelectronic arrays together by overlapping the at least two optoelectronic arrays. Thus, the at least two optoelectronic arrays facing each other are overlapping each other, and an adhesive can be arranged between the overlapping parts. Such approach is technically easy to implement, but locally thickens the display module.

Thus it might be conceivable to bring the overlapping parts of the at least two optoelectronic arrays into a tapered/sharpened shape, to avoid locally thicker areas of the display module.

According to a further aspect, a display is provided comprising at least one display module according any of the above-described aspects. The display may have a three-dimensional shape (3D-shape) and may be arranged on or in a 3D-shaped chassis of for example a vehicle or may be arranged on or in a window, in particular between two glass layers of a window, in particular of a window of a vehicle.

According to yet a further aspect, a method for manufacturing a display module is provided comprising the steps:
providing at least two optoelectronic arrays according to any of the above described aspects,
cutting the at least two optoelectronic arrays into an appropriate shape,
arranging the at least two optoelectronic arrays next to each other with each the first surface facing into the same direction,
laminating a carrier foil on a surface of the at least two optoelectronic arrays opposite to the first surface,
interconnecting the at least two optoelectronic arrays electrically,
deep drawing the at least two optoelectronic arrays to obtain a 3D-shape display module.

The order of the above given steps is however not limited to how it is shown.

According to some aspects, the step of deep drawing is followed by the step of arranging, the step of arranging is then followed by the step of laminating and the step of laminating is followed by the step of interconnecting. In other words, this means that the at least two optoelectronic arrays are first 3D-shaped using a deep drawing tool/process, before being assembled (arranging+laminating+interconnecting). As due to the deep drawing process the position of the optoelectronic components of the at least two optoelectronic arrays and the thickness of the at least two optoelectronic arrays may change, the at least two 3D-shaped optoelectronic arrays may be cut out into an appropriate shape after deep drawing. This cut out may be performed by the help of for example a blade, a laser, or the like, before the optoelectronic arrays are then assembled (arranging+laminating+interconnecting). Thus, the laminating and interconnecting is performed on the 3D-shape of the optoelectronic arrays to provide a purely mechanical and/or electrical connection. However, it is also possible that only gaps between the optoelectronic arrays are closed in order to make the appearance of the display module homogeneous.

According to at least one other embodiment, the step of arranging for example is followed by the step of laminating, the step of laminating is then followed by the step of interconnecting and the step of interconnecting is followed by the step of deep drawing. In other words, this means that the at least two optoelectronic arrays are first assembled (arranging+laminating+interconnecting) before giving the assembled display module a 3D-shape with the help of a deep drawing process. This order of steps might be conceivable as the at least two optoelectronic arrays can be joined more easily in a planar state than in a preformed state. The preforming thus might result in tolerances that make exact joining the at least two optoelectronic arrays difficult.

The step of deep drawing can for example be performed with the help of a frame around the at least two optoelectronic arrays or around the assembled at least two optoelectronic arrays. Hence, the at least two optoelectronic arrays with the optoelectronic components and integrated circuits are processed after a frame is applied around the at least two optoelectronic arrays or around the assembled at least two optoelectronic arrays. The at least two optoelectronic arrays or the assembled at least two optoelectronic arrays are then 3D-shaped using a deep drawing tool/process.

The step of cutting the at least two optoelectronic arrays into an appropriate shape can be performed either before the step of deep drawing or after the step of deep drawing. However, it can be conceivable that the step of deep drawing, in particular the step of deep drawing with the help of a frame, is followed by the step of cutting the at least two optoelectronic arrays into an appropriate shape. In particular, it can be conceivable to remove the frame applied to the at least two optoelectronic arrays or to the assembled at least two optoelectronic arrays and cut the at least two optoelectronic arrays or the assembled at least two optoelectronic arrays into an appropriate shape.

The at least two optoelectronic arrays can each be provided arranged on a carrier tape. Thus, an equipping of the pixel area of each of the at least two optoelectronic arrays with the optoelectronic components and integrated circuits on the transparent carrier layer has been performed on a carrier tape. The carrier tape may thereby be a thick and hard carrier, which can be for example designed as a metal plate, glass plate, or the like. Suitable metals can thereby be for example steel, alloys, or the like, whereas suitable glasses can for example comprise silicate glasses (e.g. quartz glass, soda-lime glass), borosilicate glasses (borofloat), or the like. However, glass fiber composite materials and plastics are also conceivable as carriers, but have a significantly higher risk of warping under mechanical and thermal stress.

According to at least one other embodiment, the step of providing the at least two optoelectronic arrays arranged on a carrier tape is for example followed by the step of cutting the at least two optoelectronic arrays into an appropriate shape. In particular, cutting the at least two optoelectronic arrays into an appropriate shape may be understood as cutting off an edge area of the carrier tape comprising for example adjustment structures, test structures and markings for panel identification. This edge area is cut off by means of for example a laser, a blade, or the like. However it is preferred that the step of cutting is carried out very precisely and for example an image process is monitoring the cutting simultaneously.

The step of cutting may then be followed by the step of arranging the at least two optoelectronic arrays next to each other with each the carrier tape facing into the same direction. This however may include, that the at least two optoelectronic arrays are flipped and mounted with the first surface of the at least two optoelectronic arrays down onto a fixing table. The flip, transfer and mounting on the fixing of the at least two optoelectronic arrays table can be for example performed by vacuum. Before mounting the at least two optoelectronic arrays to the fixing table, it can be preferred, that the at least two optoelectronic arrays are adjusted to each other by means of an image process. The mounting on the fixing table ensures that the at least two optoelectronic arrays do not warp when further processing them.

The step of mounting may then be followed by a step of removing the carrier tape. This step can thereby be performed by peeling off the carrier tape, by heating a thermal release film arranged between the carrier tape and the at least two optoelectronic arrays, or by illuminating a laser release layer arranged between the carrier tape and the at least two optoelectronic arrays with a laser.

In the last mentioned two cases, no shear forces act on the at least two optoelectronic arrays. However due to a thermal expansion, in the case of a thermal release film, there is a higher risk of warping of the at least two optoelectronic arrays during thermal removal than in the case of a laser release layer. For these reasons, the step of removing the carrier tape may be preferred by the aid of a laser release layer among the variants.

The step of removing the carrier tape may then be followed by laminating a carrier foil on a surface of the at least two optoelectronic arrays opposite to the first surface and interconnecting the at least two optoelectronic arrays electrically. The vacuum fixation can be released after the step of removing or after the step of interconnecting, and the assembled at least two optoelectronic arrays can be removed from the fixing table. The assembled at least two optoelectronic arrays can then be 3D-shaped within the step of deep drawing the at least two optoelectronic arrays to obtain a 3D-shape display module.

Further embodiments of the invention provide an arrangement to control at least one optoelectronic component as well as an optoelectronic array comprising at least one respective arrangement. The optoelectronic array may thereby be part of a display module of a display, wherein the display can be adapted to display information in or on a transparent window or a surface, in particular a 3D-shaped surface, of a vehicle. In particular, the arrangement provides a wiring on a transparent carrier layer to contact and address an integrated circuit, which is connected to at least one optoelectronic component. In addition, a method to repair an arrangement or an optoelectronic array is provided.

Particularly at least one arrangement is part of an optoelectronic array, which may be part of a display module of a display. The control of a respective display/display module takes thereby preferably place from only one side of the display. The area with the required control elements and plugs can then advantageously be hidden in an application. A preferred control of the displays can be via a daisy chain network. Individual drivers, which can drive one or more pixels, can be arranged in a linear arrangement and be connected with a bus driver and a return channel can be integrated into the bus driver.

According to a first aspect, an arrangement is provided to control at least one optoelectronic component comprising a transparent carrier layer, at least one optoelectronic component and an integrated circuit, in particular a micro integrated circuit, also called µIC. The integrated circuit is arranged on an upper surface of the transparent carrier layer and is connected to the at least one optoelectronic component. The arrangement is further comprising
- at least one structured first supply line, in particular to provide an electrical supply (VDDLED) to the at least one optoelectronic component, arranged on the transparent carrier layer and electrically coupled to the at least one optoelectronic component,
- at least one structured second supply line, in particular to provide an electrical supply (VDDIC) to the integrated circuit, arranged on the transparent carrier layer and electrically coupled to the integrated circuit,
- at least one structured ground potential line, in particular to provide a ground potential (GND) to the integrated circuit, arranged on the transparent carrier layer and electrically coupled to the integrated circuit, at least one first data line arranged on the transparent carrier layer (2) to provide a data signal (DAT) to the integrated circuit, and at last one clock line (64) arranged on the transparent carrier layer to provide a clock signal (CLK) to the integrated circuit.

A μIC is a small integrated circuit, for example, with edge lengths of less than 200 μm, in particular down to less than 150 μm, in particular in the range from 120 μm to 175 μm. Another range is between 45-75 μm. This can result in a surface area from a few thousand μm² to a few hundreds of μm². For example, a μIC can have a surface area of approximately 5600 μm² with an edge length of approximately 75 μm. In some cases, a μIC has an edge length of 30 μm or less, which results in a surface area size of less than 900 μm². Typical heights of such μICs are, for example, in the range of 5 μm to 50 μm.

The transparent carrier layer is preferably of an inexpensive, transparent and deformable, thermoplastic plastic as for example PET, PEN, PVC, PVB, EVA or the like. However, thermosets and non-thermoformable plastics are also conceivable as for example silicone, polyurethane, or the like.

The optoelectronic component may comprise for example a Flip-Chip mountable LED, a Flip-Chip mountable μ-LED or three subcomponents, wherein each subcomponent is a LED or a μLED. The three subcomponents are thereby for example adapted to emit one of the colours red, green, blue, or yellow. In some embodiments, one of the three subcomponents is for example adapted to emit red light, one of the three subcomponents is for example adapted to emit green light and one of the three subcomponents is for example adapted to emit blue light. Hence, an aforementioned optoelectronic component can for example form a so-called RGB pixel.

In some embodiments, the optoelectronic component may comprise two subcomponents, wherein each subcomponent is a LED or a μLED. The two subcomponents are thereby for example adapted to emit one of the colours red, green, blue, or yellow. In some embodiments, one of the subcomponents is for example adapted to emit red light and one of the subcomponents is for example adapted to emit yellow light. In some embodiments the two subcomponents are for example adapted to emit blue light and an additional light conversion material can convert the blue light into for example red and yellow light.

In some embodiments, can be smaller than 300 μm, in particular smaller than 150 μm. With these spatial extensions, the at least one optoelectronic component is invisible for the human eye.

In some embodiments, the optoelectronic component can comprise a micro LED, also called μLED, or a μLED-chip. A μLED is a small LED, for example, with edge lengths of less than 70 μm, in particular down to less than 20 μm, in particular in the range from 1 μm to 10 μm. Another range is between 30-60 μm. This can result in a surface area from a few hundred μm² to a few tens of μm². For example, a μ-LED can have a surface area of approximately 2000 μm² with an edge length of approximately 45 μm. In some cases, a μ-LED has an edge length of 5 μm or less, which results in a surface area size of less than 30 μm². Typical heights of such μ-LEDs are, for example, in the range of 1.5 μm to 10 μm.

The shape of the integrated circuit can be of any shape but has particularly the shape of a polygon and more particular the shape of a rectangle, triangle, hexagon, or the like. However, it is also conceivable that the integrated circuit comprises the shape of a regular polygon with for example 3, 4, 6, or 8 corners.

To electrically interconnect the at least one optoelectronic component and the integrated circuit, the arrangement can further comprise at least one structured contact line. In particular, the arrangement can comprise a number of structured contact lines equal to or larger that the number of optoelectronic components associated with the integrated circuit. Even more particular the arrangement can comprise a number of structured contact lines equal to or larger than the number of optoelectronic subcomponents, associated with the integrated circuit.

To couple at least one of the at least one second supply line, the at least one ground potential line, the at least one first data line, the at least one clock line and the at least one contact line to the integrated circuit, the integrated circuit can comprise a plurality of contact pads. Thus, a contact portion of at least one of the at least one second supply line, the at least one ground potential line, the at least one first data line, the at least one clock line and the at least one contact line is in contact to at least one of the plurality of contact pads. The interconnection of at least one of the plurality of contact pads and at least one of the at least one second supply line, the at least one ground potential line, the at least one first data line, the at least one clock line and the at least one contact line can comprise a planar or flip chip interconnect.

The plurality of contact pads can further be arranged on the integrated circuit in a single row. Thus, the integrated circuit can comprise the shape of a rectangular with two sides being longer compared to the other two sides. Arranging the contact pads on the integrated circuit in only one row can be expedient, as parasitic capacities in the arrangement can be reduced with such structure. However, the integrated circuit can comprise the shape a regular polygon with for example 6 or 8 corners and the plurality of contact pads can be arranged on the integrated circuit in a single row along the side edges of the integrated circuit following the regular polygon or in form of a circle. Thus, for example parasitic capacities in the arrangement can be reduced and the interconnection of at least one of the plurality of contact pads and at least one of the at least one second supply line, the at least one ground potential line, the at least one first data line, the at least one clock line and the at least one contact line can be provided without an additional contact layer that connects for example contact pads in on inner area of the integrated circuit and bridges contact pads on an outer area of the integrated circuit.

The at least one optoelectronic component can be arranged on the transparent carrier layer with its light emitting surface facing the transparent carrier layer or with its light emitting surface facing away from the transparent carrier layer. However, one of the at least one optoelectronic component can be arranged on the integrated circuit or can be integrated in the integrated circuit. Thus, the integrated circuit may comprise respective contact pads to pick up the optoelectronic component appropriately.

The transparent carrier layer can further have a 3-dimensional shape, as the arrangement can be part of an optoelectronic array, which may be part of a display module of a display, wherein the display can be adapted to display information in or on a transparent window or a surface, in particular a 3D-shaped surface, of a vehicle. The integrated circuit may therefore also have a respective bended shape, as it is arranged on the transparent carrier layer and thus follows the 3-dimensional shape of the transparent carrier layer.

To prevent a breakage of the integrated circuit due to bending it to follow the 3-dimensional shape of the transparent carrier layer, the integrated circuit can comprise grooves on the surface facing the transparent carrier layer, or the surface opposing the transparent carrier layer, or on both surfaces. Such grooves can be expedient in order to reduce stresses that can arise in the integrated circuit due to a bending of it.

However, the 3-dimensional shaped transparent carrier layer can also comprise at least one plateau, or a flat area, wherein the integrated circuit is arranged on the at least one plateau or the flat area. Thus, the 3-dimensional shaped transparent carrier layer comprises at least one flat/planar area on its surface, wherein the integrated circuit is arranged on the at least one flat/planar area. Such a plateau or flat area may be expedient, as the integrated circuit doesn't need to comprise a bended shape as it is arranged on a flat/planar surface.

In some further aspects the arrangement is comprising an adhesive, that is fixing the at least one optoelectronic component and the integrated circuit to the transparent carrier layer. The adhesive can be arranged between the transparent carrier layer and the at least one optoelectronic component as well as between the transparent carrier layer and the integrated circuit. However, it can also be expedient that the adhesive is arranged between the transparent carrier layer and at least one of the at least one structured first supply line, the at least one structured second supply line, the at least one structured ground potential line, the at least one first data line, the at least one clock line and the at least one structured contact line.

The at least one structured first supply line and/or the at least one structured second supply line and/or the at least one structured ground potential line and/or the at least one first data line and/or the at least one clock line and/or the at least one structured contact line can be adapted as so called "Planar Interconnect on Substrate" (PICOS) contacts. Such PICOS contacts may be provided with a method according to the following steps: In a first step, a seed layer, in particular a titanium-copper alloy is applied to the surface of the optoelectronic component and/or the integrated circuit facing away from the transparent carrier layer and to at least one of the transparent carrier layer and the adhesive. A photoresist layer is then applied to the seed layer and is structured so that regions of the seed layer are exposed. The exposed areas of the seed layer are then galvanized. Copper is electrodeposited onto the exposed areas of the seed layer. The areas of the photoresist layer left by the structuring and the underlying seed layer are then removed.

Through this procedure, the optoelectronic component and/or the integrated circuit are "framed" by structured contact lines, so that it is possible to use aforementioned contacts to ensure both a mechanical stability and an electrical interconnect of the optoelectronic component and/or the integrated circuit.

In some further aspects the at least one optoelectronic component and/or the integrated circuit are arranged above contact portions of at least one of the at least one structured first supply line, the at least one structured second supply line, the at least one structured ground potential line, the at least one first data line, the at least one clock line and the at least one structured contact line and are mechanically and/or electrically coupled to the contact portions by solder bumps, µ-pillars, or metalized spikes. The solder bumps, µ-pillars, or metalized spikes can thereby for example be Indium bumps, SnBi-µPillars or Si—Au-Spikes.

For an additional mechanical stability, the arrangement can further comprise an underfill material surrounding the solder bumps, µ-pillars, or metalized spikes. Hence the underfill material can be arranged between the solder bumps, µ-pillars, or metalized spikes as well as between the at least one optoelectronic component and/or the integrated circuit and at least one of the at least one of the at least one structured first supply line, the at least one structured second supply line, the at least one structured ground potential line, the at least one first data line, the at least one clock line, the at least one structured contact line and the transparent carrier layer.

According to a further aspect, an optoelectronic array is comprising at least one arrangement according to any of the above-mentioned aspects as well as at least one pixel comprising a pixel area. The at least one optoelectronic component of the at least one arrangement is thereby associated with the at least one pixel and is arranged within the pixel area. In particular, the optoelectronic array is comprising a plurality of arrangements according to any of the above-mentioned aspects as well as a plurality of pixels each comprising a pixel area. The optoelectronic components of the plurality of arrangements are thereby associated with the plurality of pixels and are arranged within the pixel areas.

However, each optoelectronic component of the at least one arrangement can be associated with a respective pixel and can be arranged within the pixel area of the associated respective pixel. Thus, each optoelectronic component is associated with one pixel and is arranged within the pixel area of the one pixel.

Each pixel area can have a size in the range of 0.1 mm×0.1 mm to 2 mm×2 mm, more particularly in the range of 250 µm×250 µm to 1 mm×1 mm and even more particularly smaller than 1 mm×1 mm. However, according to at least one aspect the pixel area can have a size of approximately 500 µm×500 µm.

It can be particularly expedient, that an area covered by the elements of the at least one arrangement, except of the transparent carrier layer, occupy a space within the pixel area that is less than 25% of the pixel area, more particularly less than 15% of the pixel area and even more particularly less than 13% of the pixel area. In other words this means, that the area of the at least one optoelectronic component, the integrated circuit, the at least one structured first supply line, the at least one structured second supply line, the at least one structured ground potential line, the at least one first data line, the at least one clock line and the at least one structured contact line of the at least one arrangement occupy a space within the pixel area, that is less than 25%, 15% or 13% of the pixel area. It can however be even more expedient, that an area covered by the elements of the at least one arrangement, except of the transparent carrier layer, occupy a space within the pixel area that is less than 10% of the pixel area. In this context, the occupied space within the pixel area is in particular to be understood as the surface area within the pixel area, that is formed by the projected area of the at least one optoelectronic component, the integrated circuit, the at least one structured first supply line, the at least one structured second supply line, the at least one structured ground potential line, the at least one first data line, the at least one clock line and the at least one structured contact line of the at least one arrangement when viewing vertically on the pixel area.

The optoelectronic array can further be characterized in that the integrated circuit of the at least one arrangement is associated with one pixel and is arranged within the pixel area. In particular the optoelectronic array can further be characterized in that each of the at least one arrangement is associated with one pixel and is arranged within the one pixel area. This in other words can mean, that all elements of the at least one arrangement are associated with one pixel and thus are arranged within one pixel area.

According to at least this aspect, end portions of each of the at least one structured first supply line, the at least one structured second supply line, the at least one structured ground potential line, the at least one first data line and the at least one clock line of the at least one arrangement can be distributed along at least one and particularly along two opposite edges of a pixel.

The end portions can however even more particularly be distributed in a central region on at least one and particularly on two opposite edges of a pixel, wherein the central region is formed by less than 50% and particularly less than 30% of the edges' length.

The end portions can further be distributed along at least one and particularly along two opposite edges of a pixel in such, that each two adjacent end portions are arranged with an equal spacing along at least one and particularly along two opposite edges of a pixel.

The optoelectronic array can further be characterized in that the integrated circuit of the at least one arrangement is associated with two adjacent pixels and thus is arranged within the area of two adjacent pixels. In particular the optoelectronic array can further be characterized in that each of the at least one arrangement is associated with two pixels and is thus arranged within the area of the two pixels. This in other words can mean, that all elements of the at least one arrangement are associated with two pixels and are arranged the area of the two pixels.

The integrated circuit of the at least one arrangement can thereby be arranged on the adjacent edges of the two adjacent pixels and particularly be arranged in the center of the area of the two pixels.

End portions of each of the at least one structured first supply line, the at least one structured second supply line, the at least one structured ground potential line, the at least one first data line and the at least one clock line of the arrangement can thus be distributed along at least one and particularly along two opposite edges of two adjacent pixels.

The end portions of the least one structured second supply line, the at least one structured ground potential line, the at least one first data line and the at least one clock line can particularly be distributed in a central region on at least one and particularly on two opposite edges of two adjacent pixels, wherein the central region is formed by less than 20% of the edges' length.

The end portions can however even more particularly be distributed along at least one and particularly along two opposite edges of two adjacent pixels in such, that each two adjacent end portions are arranged with an substantially equal spacing along the edges.

The optoelectronic array can further be characterized in that the integrated circuit of the at least one arrangement is associated with 4, 6, or 8 adjacent pixels. The adjacent pixels are thereby particularly arranged in a matrix of 2×2, 2×3, or 2×4 pixels. The integrated circuit of the at least one arrangement can thereby for example either be arranged in the center of the matrix, or within the pixel area of only one of the 4, 6, or 8 adjacent pixels.

According to yet a further aspect, a method to repair an arrangement according to any of the above-mentioned aspects or an optoelectronic array according to any of the above-mentioned aspects is provided.

In case of a defective optoelectronic component or integrated circuit, the method can comprise the steps of, for example removing and replacing the defective component or adding a redundant component to a corresponding position of the arrangement or the optoelectronic array.

The steps of removing and replacing the defective component can thereby comprise a removing of the defective component including the adjacent conductor tracks (supply line and/or ground potential line and/or data line and/or clock line and/or contact line) by for example cutting it out with a laser. Then a new material, for example a plastic and/or an adhesive, is filled into the arisen gap, a new component is placed on a corresponding position and the component is connected to the adjacent conductor tracks by for example an additive process as for example a LIFT-off process. It can also be expedient, that the arisen gap is filled with a subassembly of a patch including a new component and respective junction points of conductor tracks. The patch can then be arranged in the arisen gap, fixed with the help of for example an adhesive and the junction points of the conductor tracks can be connected to the adjacent conductor tracks by for example an additive process as for example a LIFT-off process.

However, it can also be expedient to not remove and replace the defective component but adding a redundant component to a corresponding position of the arrangement or the optoelectronic array. The respective conductor tracks of a defective component can therefore be cut off by for example a laser. A layer of an adhesive can then be arranged on the defective component and a new component can be placed on the adhesive at the corresponding position. The new component can then be connected to the adjacent conductor tracks by for example an additive process as for example a LIFT-off process. Alternatively, the respective conductor tracks close to a defective component can be removed by for example a laser and a new component can be placed as a redundant component adjacent to the defective component. The new component can then be connected to the adjacent conductor tracks by for example an additive process as for example a LIFT-off process.

In case of a defective conductor track (supply line, ground potential line, data line, clock line or contact line) the method can comprise the step of a laser ablation of an existing conductor track as for example in the case of a short or the step of an additive manufacturing of small conductor track pieces using a LIFT-off process.

A LIFT-off process can thereby comprise the steps of liquefying small copper droplets by the help of a laser and shooting them onto a substrate. In this way, a large number of drops can be used to additively build up a conductor track.

Further embodiments of the invention provide an optoelectronic device comprising a carrier layer, a cover layer and a plurality of layer segments, in particular intermediate layer segments, being arranged between the cover layer and the carrier layer. At least one optoelectronic component is arranged on at least one of the plurality of layer segments and a first and a second layer segment of the plurality of the layer segments are arranged adjacent to each other on the carrier layer along a first direction. The first and the second layer segment are mechanically and electrically connected with each other along the first direction.

In some aspects, a third layer segment is arranged adjacent to the first layer segment along a second direction. The third layer segment is mechanically and optional electrically connected to the first layer segment along the second direction and the second direction being different to the first direction. In particular, the first and the second direction are oriented perpendicular to each other.

The layer segments allow forming a larger layer, for example a so-called intermediate layer, on the carrier layer. Thus, a large surface area that corresponds to the larger layer can be formed by use of the layer segments that are arranged adjacent to each other on the carrier layer.

The layer segments can be rather thin and flexible. Thus, they can consist of a more sensitive material, such as a foil material. Using smaller layer segments and building up a larger layer on the carrier layer from the layer segments allows simplifying the production process, since smaller size layers segments are easier to handle than a larger layer. Furthermore, it can be easier to arrange the layer segments on a curved surface of a carrier layer than a larger single layer. Using smaller layer segments and building up a larger layer on the carrier layer from the layer segments allows also simplifies a possible reworking in case of failure segments or makes reworking superfluous if only "good" segments are used for final assembly.

At least one optoelectronic component can be arranged on at least one of the layer segments. In some aspects at least one optoelectronic component is arranged on each layer segment, on a number of layer segments, or on only one layer segment. Hence, there may be layer segments with no optoelectronic component arranged on it and/or layer segments with one or more optoelectronic components arranged on it.

In some aspects, the optoelectronic device forms an at least partially transparent pane of a vehicle, particularly a windshield or a window of a vehicle. Accordingly, the pane and particularly the windshield or window comprises at least one optoelectronic component to enlighten the pane at least partially and/or to display information on at least parts of the pane.

The optoelectronic device can be part of any other surface, as for example the headliner or the outer surface of for example a vehicle. Accordingly, the optoelectronic device can have a 3-dimensional shape and/or it can be arranged on a surface that is curved. The headliner or the outer surface thus comprises at least one optoelectronic component to enlighten the headliner or the outer surface at least partially and/or to display information on at least parts of the headliner or the outer surface.

The manufacturing of small layer segments, in particular compared to complete layers of the size of for example the size of a windshield of a vehicle can be easier and more cost effective. Thus, by arranging two or more layer segments adjacent to each other on the carrier layer it is possible to provide a simpler and cost-effective method to manufacture an optoelectronic device with particularly large dimensions. Further, it can be easier to arrange layer segments adjacent to each other on the carrier layer, which has for example a 3-dimensional shape, as if the layer segments would be of the same size as the carrier layer.

In some aspects, the layer segments are arranged adjacent to each other, such that a joint region between the layer segments comprises a gap, in particular a gap with a predefined distance between two adjacent edges of the layer segments.

In some aspects, the optoelectronic device comprises an electric bridging element, which extends between two adjacent layer segments, in particular extends over the joint region between two layer segments, to at least electrically connect the two layer segments. In some aspects, each of the two layer segments comprises a conductor layer segment and the electric bridging element interconnects the conductor layer segments of the two layer segments. In other words, an electric bridging element can extend between the first layer segment and the second layer segment, which is adjacent to the first layer segment. The first layer segment comprises a first conductor layer segment and the second layer segment comprises a second conductor layer segment. The electric bridging element interconnects the first conductor layer segment with the second conductor layer segment.

In some aspects, each layer segment is at least electrically connected by at least an electric bridging element to an adjacent layer segment. Accordingly, the conductor layer segments on the layer segments can be connected with the conductor layer segments on the other layer segments by use of electric bridging elements. Thus, the electric bridging elements interconnect conductor layer segments, which are arranged on the layer segments.

In some aspects, the layer segments are at least partially transparent.

In some aspects, the layer segments comprise or consist of a material such as polyethylene terephthalate (PET). However, the layer segments can comprise or consist of any other plastic, particularly any other resin, that has preferably a strong binding, optical clarity, adhesion to many surfaces, toughness and flexibility.

In some aspects, the layer segments can be laminated or fixed by an adhesive to the carrier layer. Thus, a mechanical connection between the layer segments can for example be provided by the fixation of the layer segments on the carrier layer.

In some aspects, the carrier layer and/or the cover layer is at least partially transparent.

In some aspects, the carrier layer and/or the cover layer comprises or consists of polyvinyl butyral (PVB) or ethylene-vinyl acetate (EVA). Particularly, the carrier layer and/or the cover layer can be a foil of a foil material, such as polyvinyl butyral (PVB) or ethylene-vinyl acetate (EVA). A foil is elastic and can adapt to non-planar contours or shapes.

In some aspects, at least one of the layer segments, the cover layer and the carrier layer can be at least partially transparent. The optoelectronic device can therefore be at least partially transparent.

In some aspects, the at least one optoelectronic component can be an LED that is a volume emitter or surface emitter. The at least one optoelectronic component can be controlled individually. Thus, a light distribution can be controlled in the optoelectronic device. The individual control of the at least one optoelectronic component can for example be achieved by individually controlling the electric current that is provided to each optoelectronic component. An LED can form a pixel or a subpixel and emit light of a selected colour, such as for example an RGB-Pixel.

In some aspects, the at least one optoelectronic component, in particular LED, can be smaller than 300 µm, in particular smaller than 150 µm. With these spatial extensions, at least one optoelectronic component is invisible for the human eye.

In some aspects, a micro LED, also called µLED, or a µLED-chip is used as optoelectronic component. A µLED is a small LED, for example, with edge lengths of less than 70 µm, in particular down to less than 20 µm, in particular in the range from 1 µm to 10 µm. Another range is between 10-30 µm. This can result in a surface area from a few hundred µm$^2$ to a few tens of µm$^2$. For example, a µ-LED can have a surface area of approximately 60 µm$^2$ with an edge length of approximately 8 µm. In some cases, a µ-LED has an edge length of 5 µm or less, which results in a surface area size of less than 30 µm². Typical heights of such µ-LEDs are, for example, in the range of 1.5 µm to 10 µm.

A micro light emitting diode chip, also called µLED-chip, can be used as optoelectronic component. A micro light emitting diode can form a pixel or a subpixel and emit light of a selected colour, such as for example a RGB-Pixel.

In some aspects, the electric bridging element comprises at least one conductor path to interconnect the conductor layer segments of two adjacent layer segments. The electric bridging elements then interconnect the conductor layer segments of two adjacent layer segments.

In some aspects, at least one contact pad is arranged on a top surface of the optoelectronic component. Said top surface is facing away from the respective layer segment, on which the optoelectronic component is arranged. The at least one contact pad is coupled to the conductor layer segment of the respective layer segment. Thus, the conductor layer segment extends from a surface of the respective layer segment to the contact pad arranged on the top surface of the optoelectronic component. Such a connection can for example be achieved by placing the optoelectronic component on the layer segment, before arranging the conductor layer segment on the layer segment and on the contact pad.

In some aspects, at least one contact pad is arranged on a bottom surface of the optoelectronic component. Said bottom surface is facing the respective layer segment, on which the optoelectronic component is arranged. The at least one contact pad is coupled to the conductor layer segment of the respective layer segment. Thus, the conductor layer segment is arranged on a surface of the respective layer segment and the optoelectronic component is arranged on the layer segment, such that the contact pad arranged on the bottom surface of the optoelectronic component faces the conductor layer segment. Such a connection can for example be achieved by placing the optoelectronic component on the layer segment, after arranging the conductor layer segment on the layer segment.

In some aspects, the joint region between adjacent layer segments, in particular the gap between adjacent layer segments, is filled with a filler material, in particular filled with an adhesive. Thus, the mechanical connection between the layer segments can for example be provided by the filler material.

In some aspects, the cover layer forms a planarization layer, in which the at least one optoelectronic component is embedded into. The optoelectronic device can therefore have at least a planar upper surface.

In some aspects, a method of manufacturing an optoelectronic device comprises the steps:
  arranging a first and a second layer segment of a plurality of layer segments adjacent to each other on a carrier layer along a first direction;
  optionally arranging a third layer segment of the plurality of layer segments adjacent to the first layer segment along a second direction;
  wherein the second direction is different, in particular perpendicular, to the first direction;
  wherein at least one optoelectronic component is arranged on at least one of the layer segments;
  mechanically connecting the adjacent layer segments with each other;
  arranging at least one electric bridging element, such that the bridging element extends between two of the adjacent layer segments, wherein each of the two layer segments comprises a conductor layer segment, and the electric bridging element interconnects the conductor layer segments of the two layer segments, and
  arranging a cover layer on the layer segments.

In some aspects, the step of mechanically connecting the adjacent layer segments with each other is performed before arranging at least one electric bridging element such that the bridging element extends between two of the adjacent layer segments. Thus, a mechanically connection between adjacent layer segments is made before an electrically interconnection is made between two of the adjacent layer segments.

In some aspects, the step of mechanically connecting the adjacent layer segments with each other comprises a step of filling a joint region, particularly a gap, between adjacent layer segments with a filler material, in particular with an adhesive.

In some aspects, the step of arranging the at least one electric bridging element, such that the bridging element extends between two of the adjacent layer segments comprises a step of providing a liquid metal onto a joint region between adjacent layer segments. Thus, at least one conductor path to interconnect the conductor layer segments of two adjacent layer segments can be provided. Such a process can for example be similar to so called "Laser induced metal drops—additive manufacturing" (LIFT-Technology). With such a process aluminum (Al) can for example be deposited on a PET substrate at rather low temperatures, while rather complex 3D structures, particularly an electric bridging element and/or conductor layer segments, can be provided.

In some aspects, the step of arranging the at least one electric bridging element, such that the bridging element extends between two of the adjacent layer segments comprises a step of printing or ink-jetting at least one conductor path onto a joint region between adjacent layer segments. Thus, the conductor layer segments of two adjacent layer segments can be interconnected. Such a process can for example be similar to a 3D laser shaping process. With such a process for example copper (Cu) can accurately been deposited onto a desired area by use of laser light.

The step of printing or ink-jetting at least one conductor path onto a joint region between adjacent layer segments can however also be similar to a photolithographic structuring of a photo-sensitive functional paste, transferring the structured paste, particularly onto the layer segment, and subsequently curing the paste.

In some aspects, the step of arranging the at least one electric bridging element, such that the bridging element extends between two of the adjacent layer segments comprises a step of gluing the at least one electric bridging element onto a joint region between adjacent layer segments.

In some aspects, the electric bridging element can comprise or consist of a conductive material.

In some aspects, the electric bridging element can for example be of the type of a jumper or a bridge.

In some aspects, the step of mechanically connecting the adjacent layer segments with each other and the step of arranging the at least one electric bridging element, such that the bridging element extends between two of the adjacent layer segments is performed within one step. The combined step comprises a step of crimping the adjacent layer segments together with the electric bridging element. The electric bridging element can for example comprise or consist of a stamped and/or stamped bent part to interconnect the conductor layer segments of the two layer segments.

In some aspects, a joint region, particularly a gap, between adjacent layer segments is not filled with a filler material and a mechanical connection of adjacent layer segments is provided by the electric bridging element and/or a fixation of the layer segments on the carrier layer.

Further embodiments of the invention provide an optoelectronic device comprising a plurality of layer segments, in particular intermediate layer segments, arranged between a cover layer and a carrier layer. At least one optoelectronic component is arranged on at least one of the plurality of layer segments and a first and a second layer segment of the plurality of the layer segments are overlapping each other along a first direction. Each of the first and the second layer segment are thereby forming a respective boundary region. The first layer segment comprises at least one first contact pad and the second layer segment comprises at least one second contact pad, wherein the at least one first and the at least one second contact pad are arranged in the respective boundary region facing each other and being mechanically and electrically connected. Further the at least one first and the at least one second contact pad each comprises a plurality of nanowires, which are at least partially made of a conductive material such as for example copper, gold or nickel.

In some aspects, a third layer segment of the plurality of layer segments is overlapping the first layer segment along a second direction, wherein the second direction is different to the first direction, in particular, the first and the second direction are oriented perpendicular to each other. Each of the first and the third layer segment are thereby forming a respective boundary region. The first layer segment comprises at least one first contact pad and the third layer segment comprises at least one third contact pad being arranged in the respective boundary region and facing each other. The at least one first contact pad arranged in the respective boundary region is mechanically and optionally electrically connected with the at least one third contact pad facing the at least one first contact pad. The at least one first and the at least one third contact pad facing each other each comprise a plurality of nanowires, which are at least partially made of a conductive material such as for example copper, gold or nickel.

The layer segments allow forming a larger layer, for example a so-called intermediate layer, between a cover layer and a carrier layer. Thus, a large surface area that corresponds to the larger layer can be formed by use of the layer segments that are overlapping each other in a first and/or a second direction.

The layer segments can be rather thin and flexible. Thus, they can consist of a more sensitive material, such as a foil material. Using smaller layer segments and building up a larger layer from the layer segments allows simplifying the production process, since smaller size layers segments are easier to handle than a larger layer. Furthermore, it can be easier to arrange layer segments on a curved surface, of for example a carrier layer, than a larger single layer. Using smaller layer segments and building up a larger layer on the carrier layer from the layer segments also simplifies a possible reworking in case of failure segments or makes reworking superfluous if only "good" segments are used for final assembly.

At least one optoelectronic component can be arranged on at least one of the layer segments. In some aspects, at least one optoelectronic component is arranged on each layer segment, on a number of layer segments, or on only one layer segment. Hence, there may be layer segments with no optoelectronic component arranged on it and/or layer segments with one or more optoelectronic components arranged on it.

In some aspects, the optoelectronic device forms an at least partially transparent pane of a vehicle, particularly a windshield or a window of a vehicle. Accordingly, the pane and particularly the windshield or window comprises at least one optoelectronic component to enlighten the pane at least partially and/or to display information on at least parts of the pane.

The optoelectronic device can be part of any other surface, as for example the headliner or the outer surface of for example a vehicle. Accordingly, the optoelectronic device can have a 3-dimensional shape and/or it can be arranged on a surface that is curved. The headliner or the outer surface thus comprises at least one optoelectronic component to enlighten the headliner or the outer surface at least partially and/or to display information on at least parts of the headliner or the outer surface.

The manufacturing of small layer segments, in particular compared to complete layers of the size of for example the size of a windshield of a vehicle can be easier and more cost effective. Thus, by overlapping two or more layer segments and thus arranging them adjacent to each other on for example a carrier layer it is possible to provide a simpler and cost-effective method to manufacture an optoelectronic device with particularly large dimensions. Further, it can be easier to arrange layer segments adjacent to each other on a carrier layer, which has for example a 3-dimensional shape, as if the layer segments would be of the same size as the carrier layer.

The nanowires can extend primarily in a direction, which is perpendicular to a base area of the respective contact pad. The base area of the contact pad can be arranged in a plane, which is oriented in parallel to the respective layer segment. Particularly, the nanowires resemble a metallic lawn that is grown on the base area of the respective contact pad.

The at least one first, the at least one second and optionally the at least one third contact pad can each comprise a plurality of lines and spaces between the lines, wherein each line comprises a portion of the plurality of nanowires. The nanowires can extend primarily in a direction, which is perpendicular to a base area of the respective contact pad and can form the lines with spaces between the lines.

The lines can have a thickness of at least approximately 1-100 μm and the spaces between the lines have a thickness of at least approximately 10-1000 μm. Thus, each line can for example be formed by a single row of nanowires, or can be formed by a portion of the plurality of nanowires, wherein several rows of nanowires can be arranged adjacent to each other within each line.

In some aspects, the thickness ratio of the lines of the at least one first contact pad can be different to the thickness ratio of the lines of the at least one second contact pad and/or the lines of the at least one third contact pad. Further, the thickness ratio of the spaces of the at least one first contact pad can be different to the thickness ratio of the spaces of the at least one second contact pad and/or the spaces of the at least one third contact pad.

In some aspects, the distance between one of two lines and two spaces of the at least one first contact pad is different to the corresponding distance between one of two lines and two spaces of the at least one second and/or third contact pad.

The nanowires are of particular use to connect two substrates prepared with nanowires instantaneously at room temperature by only compression and optionally heating. This technique is for example also known as KlettWelding or KlettSintering.

Base areas of the at least one first, the at least one second and optionally the at least one third contact pad can have the same shape and/or size and/or orientation to each other. The base areas can for example be quadratic, rectangular, polygonal or circular.

In some aspects, the base area of the at least one first and the base area of the at least one second and/or third contact pad differs in at least one of the following:
shape;
size; and
orientation to each other.

In some aspects, the orientation of the lines and spaces of the at least one first contact pad is different to the orientation of the lines and spaces of the at least one second and/or third contact pad.

Thus, when connecting two contact pads facing each other, the need of a high positioning accuracy can be reduced. Due to the different arrangement, orientation and pattern of lines and spaces of the two contact pads, the chance that at least one of the facing lines of nanowires of each contact pad become in physical contact is increased. In addition, a distributed, irregular physical contact area may gain less attention by the human eye compared to regular patterns, especially edges of regular patterns, which catch the attention of the human eye more easily. Thus, the perceived transparency of the optoelectronic device can be increased.

The layer segments can at least be partially transparent and comprise or consist of a material, such as polyethylene terephthalate (PET), polyethylene naphtalate (PEN), ethylene vinyl acetate (EVA) or polyvinyl butyral (PVB), polycarbonate (PC), polymethlmethacylate (PMMA), silicone, polyamide (PA), polyimide (PI). Particularly the layer segments comprise or consist of a foil, which comprises or consist of a material such as PET, PEN, EVA or PVB, PC, PMMA, Silicone, PA, PI.

The cover layer and the carrier layer can at least be partially transparent and comprise or consist of a material, such as glass, PET, PC and polyvinyl chloride (PVC).

In some aspects, the at least one optoelectronic component can be an LED that is a volume emitter or surface emitter. The at least one optoelectronic component can be controlled individually. Thus, a light distribution can be controlled in the optoelectronic device. The individual control of the at least one optoelectronic component can for example be achieved by individually controlling the electric current that is provided to each optoelectronic component. An LED can form a pixel or a subpixel and emit light of a selected colour, such as for example an RGB-Pixel.

In some aspects, the at least one optoelectronic component, in particular LED, can be smaller than 300 µm, in particular smaller than 150 µm. With these spatial extensions, at least one optoelectronic component is invisible for the human eye.

In some aspects, a micro LED, also called µLED, or a µLED-chip is used as optoelectronic component. A µLED is a small LED, for example, with edge lengths of less than 50 µm, in particular down to less than 20 µm, in particular in the range from 1 µm to 10 µm. Another range is between 10-30 µm. This can result in a surface area from a few hundred µm$^2$ to a few tens of µm$^2$. For example, a µ-LED can have a surface area of approximately 60 µm$^2$ with an edge length of approximately 8 µm. In some cases, a µ-LED has an edge length of 5 µm or less, which results in a surface area size of less than 30 µm$^2$. Typical heights of such µ-LEDs are, for example, in the range of 1.5 µm to 10 µm.

A micro light emitting diode chip, also called µLED-chip, can be used as optoelectronic component. A micro light emitting diode can form a pixel or a subpixel and emit light of a selected colour, such as for example a RGB-Pixel.

In some aspects, the at least one optoelectronic component can be a sensor, in particular a photosensitive sensor such as a photodiode.

Each layer segment of the plurality of layer segments can comprise a conductor layer segment, particularly a structured conductor layer segment, being coupled to the respective contact pad of the layer segment. Each conductor layer segment comprises one or more conductor paths, which are, when seeing perpendicular to the base area of the respective contact pad, thin compared to the base area of the respective contact pads. Conductor paths are metal stripes on the layer with a thickness of a few 10 µm to about 200 µm and used to provide data signals and power lines. To increase the transparency of the optoelectronic device, the conductor layer segment and thus the conductor paths can also comprise or consist of a conductive material such as for example indium tin oxide (ITO).

In some aspects, the first layer segment comprises a plurality of first contact pads and the second layer segment comprises a plurality of second contact pads arranged in the respective boundary region. The plurality of first contact pads can be arranged in a first pattern and the plurality of second contact pads can be arranged in a second pattern.

The first and the second pattern can match with each other and can each be formed as a regular pattern on the respective surface of the layer. In some aspects however, the first and the second pattern can match with each other but can both be formed as an irregular pattern.

When connecting the contact pads facing each other, an irregular pattern can be suitable, as regular patterns, especially edges of regular patterns are preferred recognized by the human eye. Therefore, a distributed, randomly designed no-regular pattern gains less attention by the human eye and thus can increase the perceived transparency of the optoelectronic device.

Further embodiments of the invention provide a method of manufacturing an optoelectronic device. The method comprises a step of overlapping a first and a second layer segment of a plurality of layer segments along a first direction such that the first and the second layer segment are forming a respective overlapping boundary region. At least one optoelectronic component is arranged on at least one of the layer segments. The first layer segment comprises at least one first contact pad and the second layer segment comprises at least one second contact pad. The at least one first and the at least one second contact pad are arranged in the respective boundary region facing each other and each comprise a plurality of nanowires, which are at least partially made of a conductive material such as for example copper, gold or nickel. The method further comprises a step of mechanically and electrically connecting the overlapping layer segments.

According to some aspects, the method further comprises a step of overlapping a third layer segment of the plurality of layer segments and the first layer segment along a second direction such that the first and the third layer segment are forming a respective boundary region, wherein the second direction is different, in particular perpendicular, to the first direction.

According to some aspects, the method further comprises a step arranging a cover layer and a carrier layer such that the plurality of layer segments is arranged between the cover layer and the carrier layer.

The step of mechanically and electrically connecting the overlapping layer segments can be performed by pressing together the respective facing contact pads.

This can for example be done by applying a local pressure to the respective contact pads facing each other. Alternatively, an area pressure can be applied to the whole outer surface of the cover layer and/or the carrier layer or an area pressure can be applied to the cover layer and/or the carrier layer in an area which corresponds to the respective boundary regions. Further embodiments of the invention provide an optoelectronic device comprising an at least partially transparent substrate, in particular a flexible foil, being arranged between a carrier layer and a cover layer. At least one optoelectronic component, in particular an LED and optionally a sensor, is arranged on the substrate as well as at least one structured first conductor, wherein the at least one structured first conductor is coupled to the at least one optoelectronic component. At least one first inductive element is arranged between the carrier layer and the cover layer and is electrically coupled to the at least one structured first conductor. The inductive element is configured to generate a power signal for operating the at least one optoelectronic component when excited by a magnetic field. Thus, a contactless, and more particular inductive, transfer of for example electrical power supply for operating the at least one optoelectronic component can be achieved.

The optoelectronic device can for instance be a window or a surface of a vehicle and can for instance be movable as for example a side window of a car, which has the ability of being opened and closed. A solid connection in between an electrical power supply of the car and the window can thus be difficult. Therefore, the optoelectronic device can comprise a first inductive element for a contactless, more particular inductive, transfer of electrical power supply from the electrical power supply of the car to the window. Further to that, openings and/or connectors to supply electrical power to the optoelectronic device can weaken the device, support delamination of the transparent substrate between the carrier layer and the cover layer, support aging of the at least one optoelectronic component and/or support an interconnect of the at least one optoelectronic component and the at least one structured first conductor. Therefore, a contactless, and more particular inductive, transfer of electrical power supply can be advantageously to reduce such deterioration of the optoelectronic device.

In some aspects, a first intermediate layer is arranged between the carrier layer and the substrate and/or a second intermediate layer is arranged between the cover layer and the substrate. The first and/or the second intermediate layer can preferably comprise or consist of an at least partially transparent material such as ethylene vinyl acetate (EVA) or polyvinyl butyral (PVB).

The at least partially transparent substrate can for example comprises or consists of a material such as polyethylene terephthalate (PET) or polycarbonates (PC).

In some aspects, the carrier layer and/or the cover layer comprise or consist of an at least partially transparent material such as glass.

In some aspects, the optoelectronic device forms an at least partially transparent pane of a vehicle, particularly a windshield or a window of a vehicle. Accordingly, the pane and particularly the windshield or window comprises at least one optoelectronic component to enlighten the pane at least partially and/or to display information on at least parts of the pane.

The optoelectronic device can be part of any other surface, as for example the headliner or the outer surface of for example a vehicle. Accordingly, the optoelectronic device can have a 3-dimensional shape and/or it can be arranged on a surface that is curved. The headliner or the outer surface thus comprises at least one optoelectronic component to enlighten the headliner or the outer surface at least partially and/or to display information on at least parts of the headliner or the outer surface.

In some aspects, the at least one optoelectronic component can be an LED that is a volume emitter or surface emitter. The at least one optoelectronic component can be controlled individually. Thus, a light distribution can be controlled in the optoelectronic device. The individual control of the at least one optoelectronic component can for example be achieved by individually controlling the electric current that is provided to each optoelectronic component. An LED can form a pixel or a subpixel and emit light of a selected colour, such as for example red, green and blue and can thus form a so-called RGB-Pixel.

In some aspects, the at least one optoelectronic component, in particular LED, can be smaller than 300 µm, in particular smaller than 150 µm. With these spatial extensions, at least one optoelectronic component is invisible for the human eye.

In some aspects, a micro LED, also called µLED, or a µLED-chip is used as optoelectronic component. A µLED is a small LED, for example, with edge lengths of less than 70 µm, in particular down to less than 20 µm, in particular in the range from 1 µm to 10 µm. Typical heights of such µ-LEDs are, for example, in the range of 1.5 µm to 10 µm.

A micro light emitting diode chip, also called µLED-chip, can be used as optoelectronic component. A micro light emitting diode can form a pixel or a subpixel and emit light of a selected colour, such as for example a RGB-Pixel.

In some aspects, the at least one optoelectronic component can be a flip chip, particularly a sapphire flip chip (SFC), comprising at least one of an LED a µ-LED and a horizontal µ-LED. The flip chip can form a pixel or a subpixel and emit light of a selected colour, such as for example red, green and blue and can thus form a so-called TripLED.

In some aspects, the at least one optoelectronic component can be a sensor, in particular a photosensitive sensor such as a photodiode.

In some aspects, the sandwich of all layers and components between the carrier layer and the cover layer is hermetically sealed. The contactless, and more particular inductive, transfer of electrical power to the optoelectronic device can therefore be advantageously as it can be easier to manufacture a hermetically sealed product which has no connections through its outer surfaces.

The at least one first inductive element can comprise or consist of a material such as silver, copper, iron, nickel and/or gold. Particularly, the at least one first inductive element can comprise or consist of a conductive and/or a magnetically excitable material.

In some aspects, the at least one first inductive element is formed as a metallic coil comprising a plurality of coil turns arranged in a single plane. Within the plane, particularly viewed in a direction perpendicular to the plane, the coil turns comprise a square, hexagonal, octagonal, or circular form.

The at least one first inductive element can however also comprises a plurality of layers each being arranged in a plane of a plurality of parallel planes. The layers and thus the parallel planes are stacked on top of each other, particularly in a direction perpendicular to the planes. Each layer comprises a metallic conductor having, particularly when viewed in a direction perpendicular to the respective plane, at least one turn of a square, hexagonal, octagonal, or circular form.

In some aspects, the at least one first inductive element can be generated by for example an additive technique, as for example printing and/or inkjetting a conductive material onto the at least partially transparent substrate, or by a subtractive technique, as for example sputtering, evaporation and/or structured etching of a respective material.

In some aspect, the coil turns and/or the conductive turns/wires can be structured very filigree, particularly smaller than 10 μm, to be almost invisible to the human eye. In some aspects, the at least one first inductive element can be arranged in an area, in which the carrier layer and/or the cover layer comprise a tinted glass as for example an upper area of a windshield or tinted side windows of a vehicle. This can for example be advantageously if the transmissivity of the optoelectronic device is reduced in an area of the at least one first inductive element, but the at least one first inductive element is however invisible to the human eye due to the tinted glass.

To further increase the transparency of the optoelectronic device, the at least one first inductive element can comprise or consist of a conductive and at least partially transparent material as for example indium tin oxide (ITO).

In some aspects, the connections of the inductive element can be realized by a transparent conductor layer such as for example ITO. In that way, the transparency of the optoelectronic device can be increased. It can however be advantageously to provide a transparent conductor layer with a wide line, as the transparent conductor layer itself can have a high specific ohmic resistivity and thus, a suitable low resistance can be achieved by the wide line.

In some aspects, the optoelectronic device further comprises at least one controller and/or at least one micro integrated circuit to control the at least one optoelectronic component. In particular, the controller can be configured to rectify an alternating power signal from the at least one first inductive element to operate the at least one optoelectronic component.

In some aspects, the optoelectronic device further comprises at least one second inductive element arranged between the carrier layer and the cover layer being electrically coupled to the at least one structured first conductor. The at least one second inductive element is configured to excite a magnetic field in response to a data signal generated by at least one integrated circuit (IC) and/or the at least one optoelectronic component. Thus, in some aspects, the optoelectronic device can comprise at least one optoelectronic component as for example an LED or μLED and at least one optoelectronic component as for example a photosensitive sensor. The photosensitive sensor can for example generate a desired data signal, which can optionally be reinforced by an IC to excite a magnetic field in the at least one second inductive element in response to the data signal.

In some aspects, the optoelectronic device can however comprise a sensor different to an optoelectronic sensor, as for example a temperature sensor, a mechanical sensor, a magnetic sensor, an acoustic sensor or an acceleration sensor. The sensor can for example generate a desired data signal, which is then optionally reinforced by an IC to excite a magnetic field in the at least one second inductive element in response to the data signal.

In some aspects, the optoelectronic device comprises two or more first inductive elements. The first inductive elements can be arranged adjacent to each other in a matrix. Thus, for example two or more independent circuits to operate two or more optoelectronic components can be realized with for example only one magnetic field to excite the at least two first inductive elements.

Further embodiments of the invention provide an optoelectronic system comprising an optoelectronic device according to any one of the aforementioned optoelectronic devices as well as at least one third inductive element. The at least one third inductive element is configured to excite a magnetic field in the first inductive element in response to a power signal through the at least one third inductive element. The power signal can for example be an alternating current through the at least one third inductive element. Thus, the at least one third inductive element can be the power signal transmitting element and the at least one first inductive element can be the power signal receiving element.

In some aspects, the at least one third inductive element is arranged adjacent to the carrier layer opposite to the at least partially transparent substrate. The at least one third inductive element is arranged such that at least one third inductive element at least partly overlaps the at least one first inductive element when viewed along a direction perpendicular to a plane in which the at least one first inductive element is arranged. In other words, the at least one third inductive element is arranged such that at least one third inductive element at least partly overlaps the at least one first inductive element when viewed along a direction substantially parallel to a magnetic field excited by the at least one third inductive element.

In some aspects, the at least one third inductive element is arranged such that at least one third inductive element and the at least one first inductive element are concentric to each other when viewed along a direction perpendicular to a plane in which the at least one first inductive element is arranged.

If the optoelectronic device comprises two or more first inductive elements arranged adjacent to each other in a matrix, the at least one third inductive element is arranged such that the center of the at least one third inductive element matches with the center of the matrix, when viewed along a direction perpendicular to a plane in which the first inductive elements are arranged.

In some aspects, the optoelectronic system is further comprising at least one fourth inductive element configured to generate a data signal in response to a magnetic field, excited by the at least one second inductive element. Thus, the at least one second inductive element can be the data signal transmitting element and the at least one fourth inductive element can be the data signal receiving element.

In some aspects, the at least one fourth inductive element is arranged adjacent to the carrier layer opposite to the at least partially transparent substrate. The at least one fourth inductive element can however be arranged such that the at least one fourth inductive element at least partly overlaps the at least one second inductive element when viewed along a direction substantially perpendicular to a plane in which the at least one second inductive element is arranged.

In some aspects, the at least one fourth inductive element is arranged such that at least one second inductive element and the at least one fourth inductive element are concentric to each other when viewed along a direction perpendicular to a plane in which the at least one second inductive element is arranged.

In some aspects, the optoelectronic system is further comprising at least one sensor coupled to at least one fourth inductive element, wherein the sensor is configured to measure the data signal transmitted by the at least one second inductive element.

In some aspects, the optoelectronic system is further comprising at least one controller and/or a converter for generating an alternating power signal for the third inductive element.

In some embodiments, the optoelectronic array, display module, arrangement, optoelectronic device, or window of a vehicle comprises a first layer, also referred to as dielectric layer, at least partially transparent substrate, or first layer segment and/or second layer segment, as well as a first window layer and a second window layer, also referred to as carrier layer and cover layer. The first layer can be arranged between the first window layer and the second window layer. The first layer can carry the at least one optoelectronic component and/or the at least one optoelectronic component can be partially or completely embedded in the first layer.

In some embodiments, the first layer can at least be partially transparent and comprise or consist of a material, such as high or low grade polyethylene terephthalate (PET), polyethylene naphthalate (PEN), polycarbonates (PC), (colorless) polyimide (PI), polyurethane (PU), poly(methyl methacrylate) (PMMA), polycyclic aromatic hydrocarbons (PAK), or any other suitable material. Particularly, the first layer can comprise or consist of an at least partially transparent plastic, in particular an at least partially transparent foil, in particular a flexible foil.

Each of the first and second window layer may be made of a glass material, a plastic material and/or any other suitable material. Each of the first and second window layer may contain only one layer or several layers of the same or different materials.

In some embodiments, the optoelectronic array, display module, arrangement, optoelectronic device, or window of a vehicle further comprises at least one auxiliary layer, which also is referred to as dielectric layer, carrier layer, cover layer, carrier foil, or intermediate layer. A first auxiliary layer can be arranged between the first layer and the first window layer and optionally a second auxiliary layer can be arranged between the first layer and the second window layer.

The at least one auxiliary layer can be formed by one of the following:
 a molten material layer or
 an adhesive layer, in particular a hot-melt adhesive layer, a resin, such as Ethylene Vinyl Acetate (EVA), Polyvinyl Butyral (PVB), or
 a ionomer based system.

In some embodiments, the at least one auxiliary layer can enclose the first layer in the same layer. The at least one auxiliary layer can have the same height as the first layer, however the at least one auxiliary layer can also have a height which is different, in particular larger, than the height of the first layer. The at least one auxiliary layer can enclose the first layer not only in a circumferential direction, since the first layer segment can be completely embedded in the at least one auxiliary layer.

In some embodiments, the at least one auxiliary layer can at least be partially transparent. In some embodiments, the at least one auxiliary layer can be blackened, resulting in an at least partially transparent auxiliary layer. If the optoelectronic array, display module, arrangement, optoelectronic device, or window of a vehicle comprises more than one auxiliary layer, none, one, a selection of the auxiliary layers, or all auxiliary layers can be blackened.

In some embodiments, the at least one optoelectronic component, in particular LED, can be smaller than 300 µm, in particular smaller than 150 µm. With these spatial extensions, at least one optoelectronic component is almost invisible for the human eye.

In some embodiments, the at least one optoelectronic component is a LED. A LED can in particular be referred to as a mini LED, which is a small LED, for example, with edge lengths of less than 200 µm, in particular down to less than 40 µm, in particular in the range from 200 µm to 10 µm. Another range is between 150 µm to 40 µm.

The LED also can be referred to as a micro LED, also called µLED, or a µLED-chip, in particular for the case of the edge lengths being in a range of 100 µm to 10 µm. In some embodiments, the LED can have spatial dimensions of 90×150 µm or the LED can have spatial dimensions of 75×125 µm.

The mini LED or µLED-chip can in some embodiments be an unpackaged semiconductor chip. Unpackaged can mean that the chip is without a housing around its semiconductor layers such as for example an unpacked semiconductor die. In some embodiments, unpackaged can mean that the chip is free of any organic material. Thus, the unpackaged device does not contain organic compounds, which contain carbon in covalent bonding.

In some embodiments, each optoelectronic component can comprise a mini LED or a µLED-chip configured to emit light of a selected color. In some embodiments, each optoelectronic component can comprises one or more mini LEDs, or µLED-chips, such as for example a RGB-Pixel, which comprises three mini LEDs or µLED-chips. A RGB-Pixel can for example emit light of the colors red, green and blue as well as any mixed color.

In some embodiments, an RGB-Pixel can further comprise one or more integrated circuits (IC), in particular small integrated circuits as for example micro integrated circuits (µIC).

In some embodiments, the optoelectronic array, display module, arrangement, optoelectronic device, or window of a vehicle comprises at least one conductor line and preferably two conductor lines, also referred to as structured conductor, printed circuit, structured supply line, structured contact line, or ground potential line, particularly to supply electric energy and/or a data signal to the at least one optoelectronic component.

In some embodiments, the first layer carries the at least one conductor line. However in some embodiments, at least one auxiliary layer can carry the at least one conductor line.

In some embodiments, the at least one conductor line can be of a conductive material, such as for example copper. The at least one conductor line can be coated and/or blackened to reduce the reflectance of the outer surface area of the at least one conductor line. The coating can for example be a palladium or molybdenum coating. In some embodiments, the at least one conductor line can have a width in the range between 5 µm to 50 µm.

In some embodiments, the at least one conductor line can be formed as a conductive mesh, particularly a metallic mesh. The mesh can be coated and/or blackened, in particular to reduce the reflectance of the outer surface area of the conductive mesh. The coating can for example be a palladium or molybdenum coating.

In some embodiments, an optoelectronic device comprises a layer stack, which includes a first layer as well as a first window layer and a second window layer. The first layer is in particular an intermediate layer, which is arranged between the first window layer and the second window layer. At least one optoelectronic component, in particular an optoelectronic light source, is arranged on the first layer and at least one layer of the layer stack and preferably all layers of the layer stack are at least partially transparent. The layer stack comprises at least one electrically conductive layer, which is arranged between two adjacent layers of the layer stack or embedded in a layer.

In some embodiments, the at least one electrically conductive layer comprises at least one conductive line which is electrically connected to a contact pad of the optoelectronic light source. The at least one electrically conductive layer can be of a good electrically and thermally conductive material such as for example copper, silver, gold and aluminum. The at least one electrically conductive layer and particularly the at least one conductive line can be coated and/or blackened to reduce the reflectance of the outer surface area of the at least one conductive line. The coating can for example be a palladium or molybdenum coating. In some embodiments, the at least one electric line can have a width in the range between 5 μm to 50 μm.

The at least one electrically conductive layer can comprise an electrically conductive mesh, for example a metallic mesh, in particular a copper mesh. The mesh can have nodes and interconnects between the knots, wherein, preferably, at least the majority of the interconnects are not interrupted. The at least one electrically conductive layer can thus be structured and comprise a plurality of conductive lines being connected with each other.

The mesh can have a regular or an irregular pattern, wherein an irregular pattern can be preferred, as an irregular pattern can increase the transparency of the electrically conductive layer. The reason for this can be that an irregular pattern can be more difficult to perceive by the human eye.

In some embodiments, the conductive mesh is coated and/or blackened, in particular to reduce the reflectance of the outer surface area of the conductive mesh. The coating can for example be a palladium or molybdenum coating.

At least some embodiments the optoelectronic array, display module, arrangement, optoelectronic device, or window of a vehicle as described herein can be arranged on non-flat or curved surfaces, for example on the outside or in the interior of a vehicle or a building. This is in particular possible as at least some embodiments of the optoelectronic array, display module, arrangement, optoelectronic device, or window of a vehicle as described herein can be built on the basis of a layer structure which is flexible.

The invention therefore also relates to a larger entity, such as a vehicle or building, which comprises on its exterior or interior, in particular on an exterior or interior surface, at least one optoelectronic optoelectronic array, display module, arrangement, optoelectronic device, or window of a vehicle.

The description with the aid of the exemplary embodiments does not limit the invention thereto. Rather, the invention comprises any new feature and any combination of features, which in particular includes any combination of features in the patent claims, even if this feature or this combination is not itself explicitly stated in the patent claims or exemplary embodiments.

BRIEF DESCRIPTION OF THE DRAWINGS

In the following, embodiments of the invention will be explained in more detail with reference to the accompanying drawings. It is shown schematically in FIG. 1 a side view of an embodiment of a window of a vehicle according to the present invention, FIG. 2 a top view of a window of an embodiment of a vehicle according to the present invention, FIGS. 3A and 3B a side view of other embodiments of a window of a vehicle, FIG. 4 an isometric view of another embodiment of a window of a vehicle, FIGS. 5A and 5B embodiments of an optoelectronic circuit including diagrams of the characteristics of the filters used, FIG. 6 an embodiment of an optoelectronic circuit for Power Line Communication, FIG. 7 an embodiment of an optoelectronic circuit build up as a Daisy chain, FIG. 8 an embodiment of an optoelectronic circuit of a window of a vehicle made by thin film technology, FIG. 9 an embodiment of an optoelectronic circuit with an RGB optoelectronic component and a μ-controller, FIG. 10 diagrams of the data transfer and the colour mixing of an optoelectronic circuit with an RGB optoelectronic component and a μ-controller, FIG. 11 an embodiment of an optoelectronic array according to the present invention, FIGS. 12 to 14 further embodiments of an optoelectronic array, FIG. 15 an embodiment of an integrated circuit of an optoelectronic array, FIGS. 16A and 16B an embodiment of a display module according to the present invention, FIG. 17A to 20C top and side views of embodiments of an electrical module of a display module, FIG. 21A to 21D side views of embodiments of the mechanical interconnection of two optoelectronic arrays, FIG. 22A to 22D steps of a method to manufacture an embodiment of a 3D-shaped display, FIGS. 23 and 24 an isometric view of steps of a method to manufacture an embodiment of a display module, FIG. 25 a side view of steps of a method to manufacture an embodiment of a display module, FIG. 26 an isometric view of steps of a method to manufacture another embodiment of a display module, FIG. 27 a side view of steps of a method to manufacture another embodiment of a display module, FIG. 28A to 29B a top and a side view of steps of a method to manufacture another embodiment of a display module, wherein the optoelectronic array comprises a carrier tape, FIG. 30A to 30C a side view of embodiments of a method to remove the carrier tape, FIG. 31 an embodiment of a display module comprising at least one optoelectronic array, FIG. 32 an embodiment of an integrated circuit comprising an optoelectronic component, FIG. 33A to 33C embodiments of an integrated circuit connected to at least one optoelectronic component, FIG. 34 an embodiment of a section of an optoelectronic array showing one arrangement according to the present disclosure and one pixel, FIGS. 35 and 36A further embodiments of a section of an optoelectronic array showing one arrangement and one pixel, FIG. 36B a top view of an embodiment of an optoelectronic array comprising at least one arrangement, FIG. 37 an embodiment of a section of an optoelectronic array showing one arrangement and one pixel, FIGS. 38 to 41A embodiments of a section of an optoelectronic array showing one arrangement and 2 pixels, FIG. 41B a top view of an embodiment of an optoelectronic array comprising at least one arrangement, FIG. 42 an embodiment of a section of an optoelectronic array showing one arrangement and 6 pixels, FIG. 43A to 43C embodiments of a wafer comprising a plurality of integrated circuits, FIG. 44 a further embodiment of a section of an optoelectronic array showing one arrangement and 6 pixels, FIG. 45A to 45C embodiments of a 3-dimensional shaped optoelectronic array, FIGS. 46 to 48 side view of embodiments of an arrangement according to the present disclosure, FIG. 49A to 54B embodiments of a method to repair an arrangement or an optoelectronic array according to the present disclosure, FIG. 55 a cross sectional view of an exemplary embodiment of an optoelectronic device in accordance with the present invention, FIG. 56 a cross sectional view of another exemplary embodiment of an optoelectronic device in accordance with the present invention, FIG. 57 an exemplary embodiment of a 3D printed conductor layer segment, FIG. 58 steps of an exemplary printing or ink-jetting process, FIG. 59 a cross sectional view of an exemplary embodiment of an optoelectronic device in accordance with the present invention, FIG. 60 a cross sectional view as well as a top view of an exemplary embodiment of an intermediate product when manufacturing an optoelectronic device in accordance with the present invention, FIG. 61 a top view of an exemplary embodiment of a layer segment in accordance with the present invention, FIG. 62A to 62C top views of exemplary embodiments of two facing contact pads in accordance with the present invention, FIG. 63 a cross sectional view as well as a top view of another exemplary embodiment of an intermediate product when manufacturing an optoelectronic device in accordance with the present invention, FIG. 64 a cross sectional view of an exemplary step of mechanically and electrically connecting two overlapping layer segments in accordance with the present invention, FIG. 65 a cross sectional view of another exemplary step of mechanically and electrically connecting two overlapping layer segments in accordance with the present invention, FIG. 66 a cross sectional view of another exemplary step of mechanically and electrically connecting two overlapping layer segments in accordance with the present invention, FIG. 67 an embodiment of an optoelectronic device having a solid interconnect to an outer power source, FIG. 68 an embodiment of an optoelectronic system FIG. 69 an isometric view of a transmitting and a receiving inductive element to demonstrate the basic principle of a touchless power transfer, FIG. 70A to 70C top views of embodiments of the arrangement of transmitting and receiving inductive elements, FIG. 71A to 71B embodiments of various designs of an inductive element, FIG. 72 another embodiment of an optoelectronic system in accordance with the present invention, and FIG. 73 another embodiment of an optoelectronic system in accordance with the present invention.

DETAILED DESCRIPTION

Figure 1:
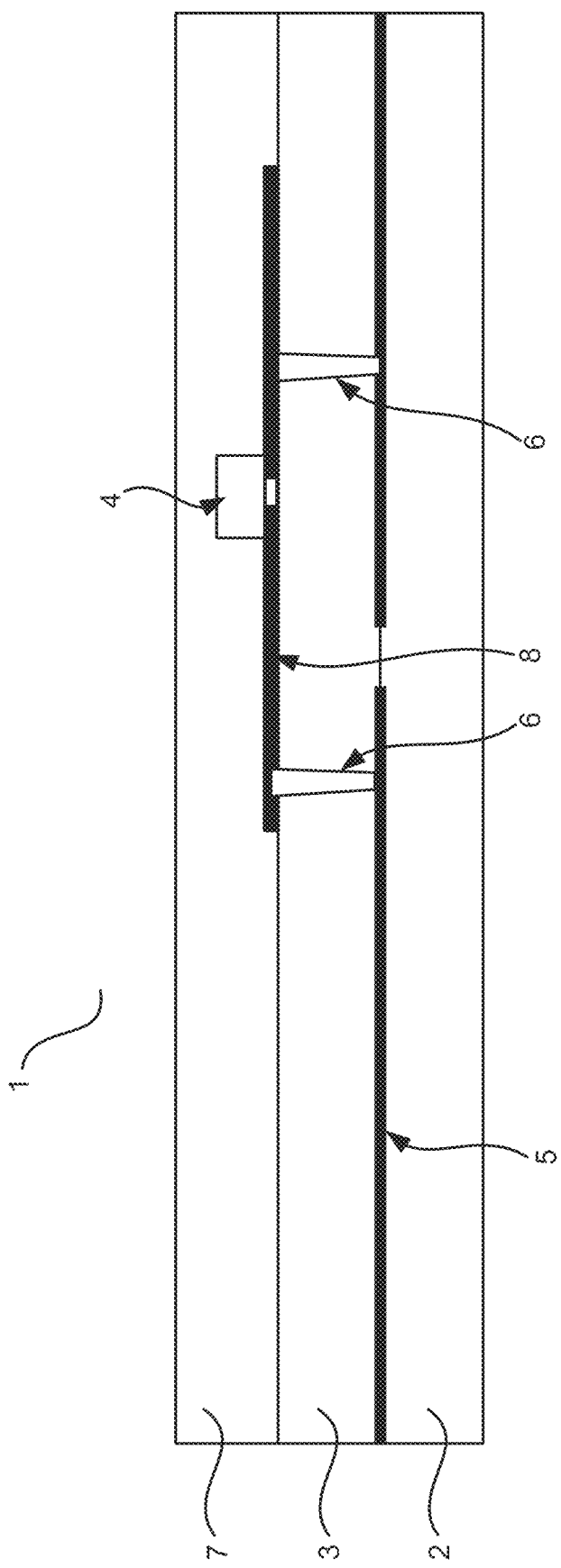

The present disclosure will now be described more fully hereinafter with reference to the accompanying drawings, in which exemplary embodiments of the disclosure are shown. The disclosure may, however, be embodied in many different forms and should not be construed as limited to the embodiments set forth herein; rather, these embodiments are provided for thoroughness and completeness. Like reference characters refer to like elements throughout the description. The drawings are not necessarily to scale and certain features may be exaggerated in order to better illustrate and explain the exemplary embodiments of the present disclosure.

Referring now to FIG. 1, there is shown a window of a vehicle (1) according to the present invention comprising a transparent carrier layer (2), a transparent dielectric layer (3) arranged on the carrier layer (2), at least one first structured conductor (5) arranged in between the carrier layer (2) and the dielectric layer (3), and at least one optoelectronic component (4) arranged on the surface of the dielectric layer (3) opposite to the carrier layer (2). The optoelectronic component (4) can thereby be a LED or more particular a Micro-LED mountable as a Flip-Chip. The optoelectronic component (4) is further electrically coupled to the first structured conductor (5) through the at least one conductive via (6) through the dielectric layer (3). To protect the optoelectronic component (4) from external influences, it is completely covered by a transparent covering layer (7), which is arranged on the surface of the dielectric layer (3) opposite to the carrier layer (2).

Transparent in this case means, that at least half of the light, shining on one of the layers passes the layers and thus a viewer of the layer would be able to look through it. In other words, more than 50% and up to 100% of the light, shining on one of the layers passes the layers and thus a viewer of the layer would be able to look through it.

The optoelectronic component can further be a pixel of at least 3 subpixels, wherein each subpixel is a µLED and the subpixel is configured to emit one of the colours red, green and blue. Hence, an aforementioned optoelectronic component can form a so called RGB pixel.

By the term vehicle, the window of a vehicle may be a window of a car, a bus, a truck, a train, an airplane, a motorbike, a ship or any of this kind.

The electrical connection between the conductive via (6) with the optoelectronic component (4) can be extended with at least one second structured conductor (8), which can be arranged in between the dielectric layer (3) and the covering layer (7). The second structured conductor (8) can thereby differ in the material, and/or the structure and/or the shape as the first structured conductor (5). The second structured conductor (8) and the first structured conductor (5) can be formed for example as a trace, a wire, or as a thin film conductor.

The at least one first structured conductor (5) can for instance be sputtered, spined, or laminated on the carrier layer (2) and the dielectric layer (3) can be laminated, molded, or sprayed on this arrangement afterwards.

The carrier layer (2) can be made of one of the following materials:
Glass,
Acrylic glass,
Aluminiumoxynitride and
Polymer,
to on the one hand give a mechanical stability to the window (1), and/or a sufficient evenness on its surface to arrange the at least one first structured conductor (5), and to ensure the transparent characteristic of the layer.

Figure 2:
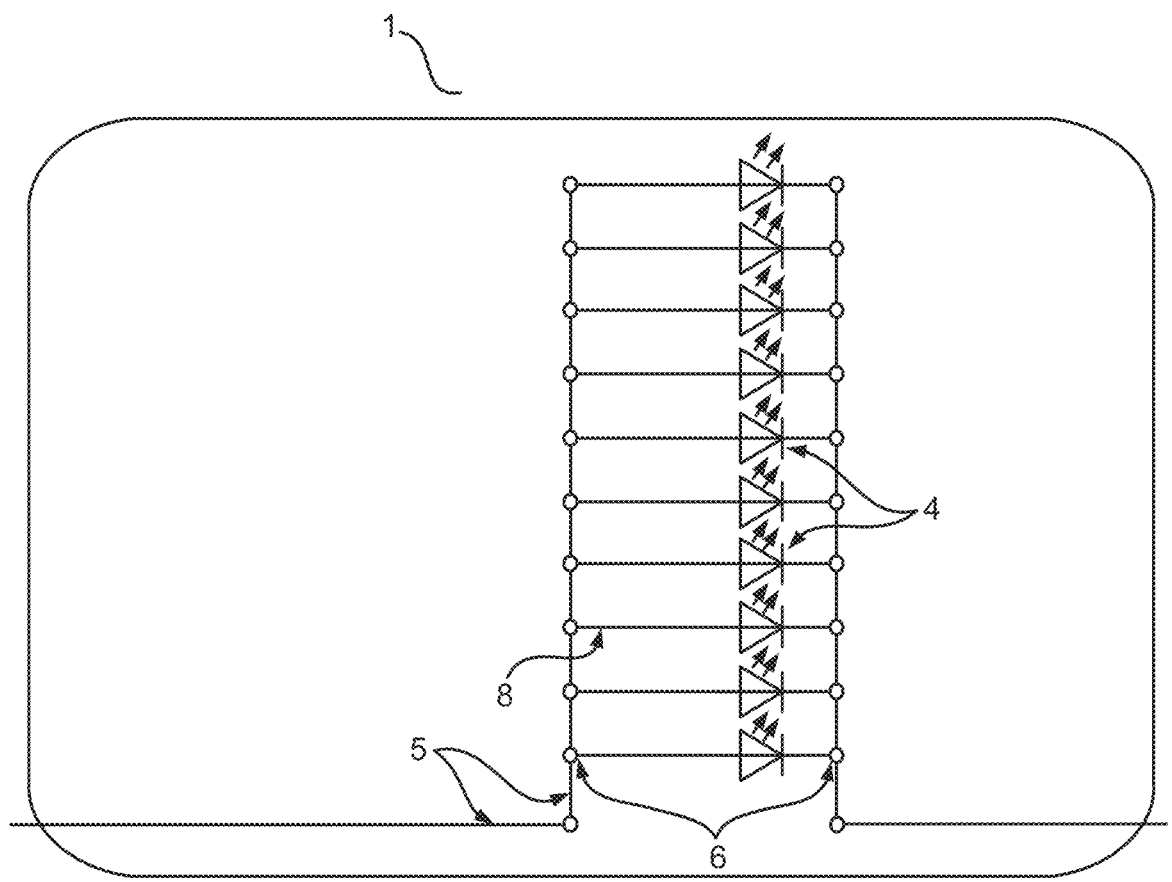

The window (1) as shown in FIGS. 1 and 2 can for instance be a window of a car, or even more particular a windshield of a car. According to FIGS. 3A and 3B, the window (1) can thereby further comprise a first window layer (9), wherein the covering layer (7) is attached to said first window layer (9). Thus, the first window layer (9) and the carrier layer (2) would form the outermost layers of the window (1). The window (1) however can further comprise a second window layer (10) attached to the carrier layer (2) opposite to the dielectric layer (3). Thus, the first window layer (9) and the second window layer (10) would form the outermost layers of the window (1).

The at least one first structured conductor (5) can for instance also have the function of heating the windshield in winter due to its electrical resistance and therefore replace the heating wiring which might already be present in a commercial windshield. Thus, it might not be necessary to provide separate heating wires in the window or in particular the windshield to heat up the window.

Figure 4:
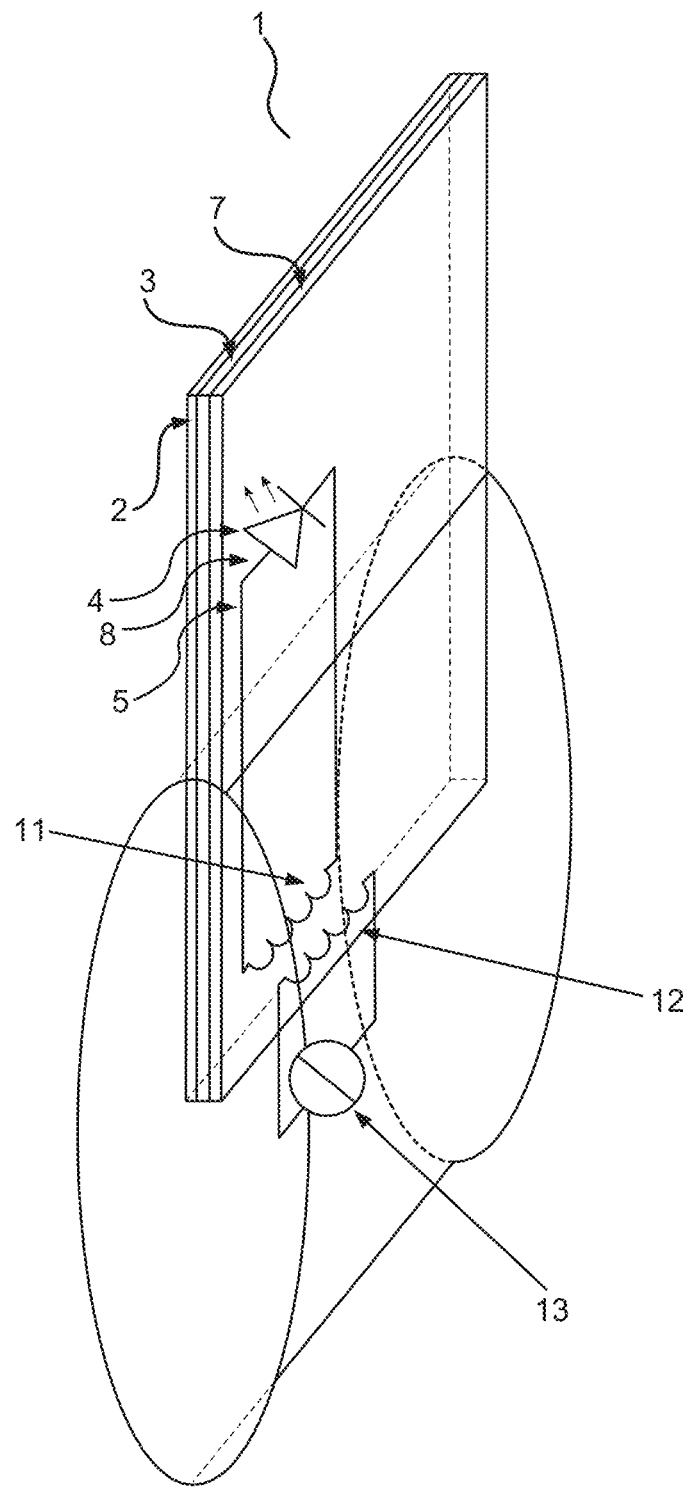

The window (1) as shown in FIGS. 1 and 2 can for instance also be a side window of a car, as shown in FIG. 4. As the side window however has the ability of being opened and closed, and coming with this is moveable, a solid connection in between the electrical power supply (13) of the car and the window (1) tends to be difficult. Therefore as shown in FIG. 3, the window (1) can further comprise a first inductive (11) electrically connected to the at least one first structured conductor (5) for a contactless, more particular inductive, transfer of electrical power supply from the electrical power supply (13) of the car to the window (1). Of course this assumes, that in closed, or in at least partly closed state of the side window, a second inductive element (12) electrically connected to the electrical power supply (13) of the car is arranged next to the first inductive element (11) of the window (1) in the side door of a vehicle and a corresponding control for contactless power transmission between the two inductive elements (11&12) is provided. The window (1) as shown in FIG. 4 can thereby further comprise a first window layer (9), wherein the covering layer (7) is attached to said first window layer (9). Thus, the first window layer (9) and the carrier layer (2) would form the outermost layers of the window (1). The window (1) however can further comprise a second window layer (10) attached to the carrier layer (2) opposite to the dielectric layer (3). Thus, the first window layer (9) and the second window layer (10) would form the outermost layers of the window (1).

Referring now to FIGS. 5A and 5B, there is shown an optoelectronic circuit (100), in particular an optoelectronic circuit in a window of a vehicle according to FIG. 1, 2, 3A, 3B or 4 comprising at least two optoelectronic components (400), in particular two LEDs and even more particular two μ-LEDs, which are interconnected in parallel. The optoelectronic circuit (100) is further comprising at least two filters (200), each coupled with one of the LEDs (400). The at least two filters each have a characteristic where one filter flank is sufficiently flat to enable a frequency dependent dimming of the optoelectronic component.

In other words, the two filters (200) can each control the regarding LED (400) with the states on and off and can dim the LED (400) by filtering out a corresponding signal of an incoming modulated electrical signal.

The modulated electrical signal can thereby for instance be any kind of modulated electrical signal and in particular, it can be a Pulse Width Modulation (PWM) signal or a sinusoidal signal.

According to FIG. 5A, the two filters (200) are high pass filters to enable a frequency dependent dimming of the optoelectronic component (400). According to a predefined value, the high-pass filter passes an electric current with a corresponding frequency or blocks the LED. According to this optoelectronic circuit (100), all LEDs use the same high pass filters (200) for a global on and off state and a global dimming of the LEDs.

Referring to FIG. 5B however, the two filters (200) are band pass filters, which can differentiate in the frequency band the filter passes. In other words, the two band pass filters have a different centre frequency so that different frequencies can pass the filter (200). In this case, the modulated electrical signal cannot be a Pulse Width Modulation (PWM) signal, but for instance a sinusoidal signal.

As shown in the two diagrams of FIG. 5B, the two band pass filters each letting pass a different frequency band and a dimming of the LEDs is realized by the time until a predefined slope of the falling edge of the transmitted signal is reached. According to this embodiment of the optoelectronic circuit (100), some of the LEDs, but not necessarily all of the LEDs use different band pass filters (200) for an individual on and off state and an individual dimming of the LEDs. This means in other words that at least two of the band pass filters (200) have a different centre frequency so that different frequencies can pass the filter (200). However, it is also possible, that all of the band pass filters (200) have a different centre frequency.

Figure 6:
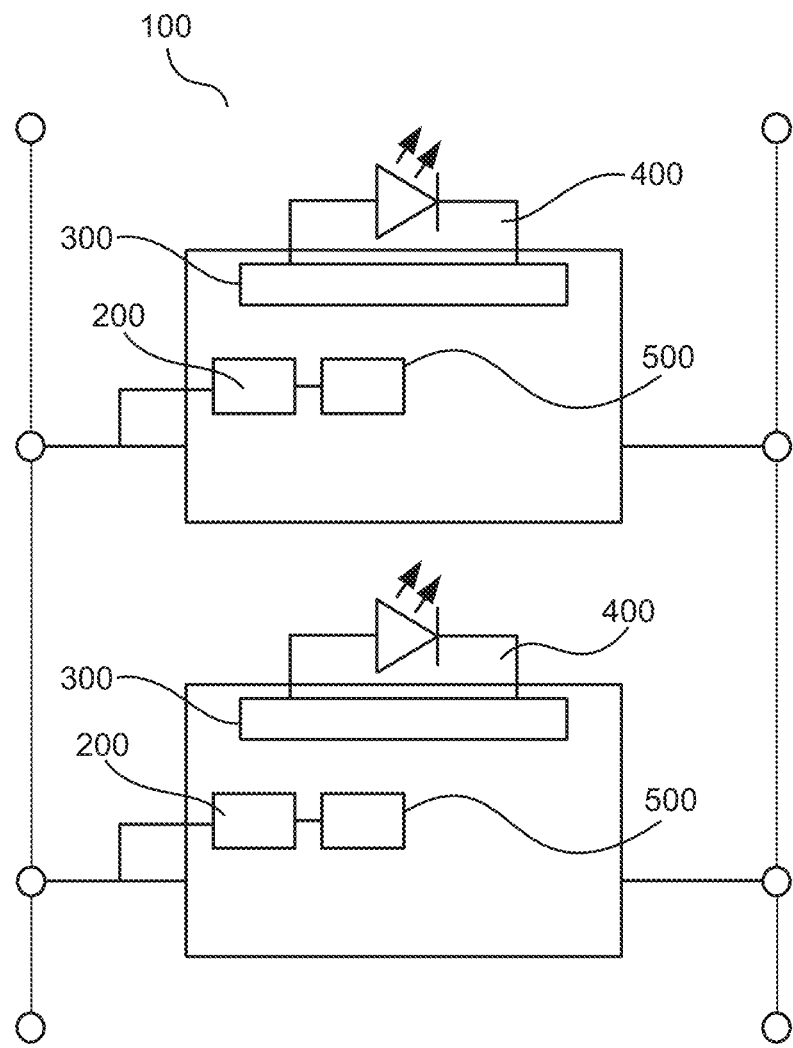

Referring now to FIG. 6, there is shown another embodiment of the optoelectronic circuit (100), which in addition to the optoelectronic circuit (100) in FIGS. 5A and 5B further comprises an IC LED driver (300) and a data storage (500). With these two additional components, it is possible to do a full addressing, dimming and colour control of each optoelectronic component (400) with the help of Power Line Communication (PLC). Thus, the optoelectronic component (400) can be for instance a pixel of at least three subpixels, wherein each subpixel is a LED or a μLED and the subpixel is configured to emit one of the colours red, green and blue. Hence, one pixel can form a RGB LED and the emitting light colour can be controlled individually for each pixel.

Figure 7:
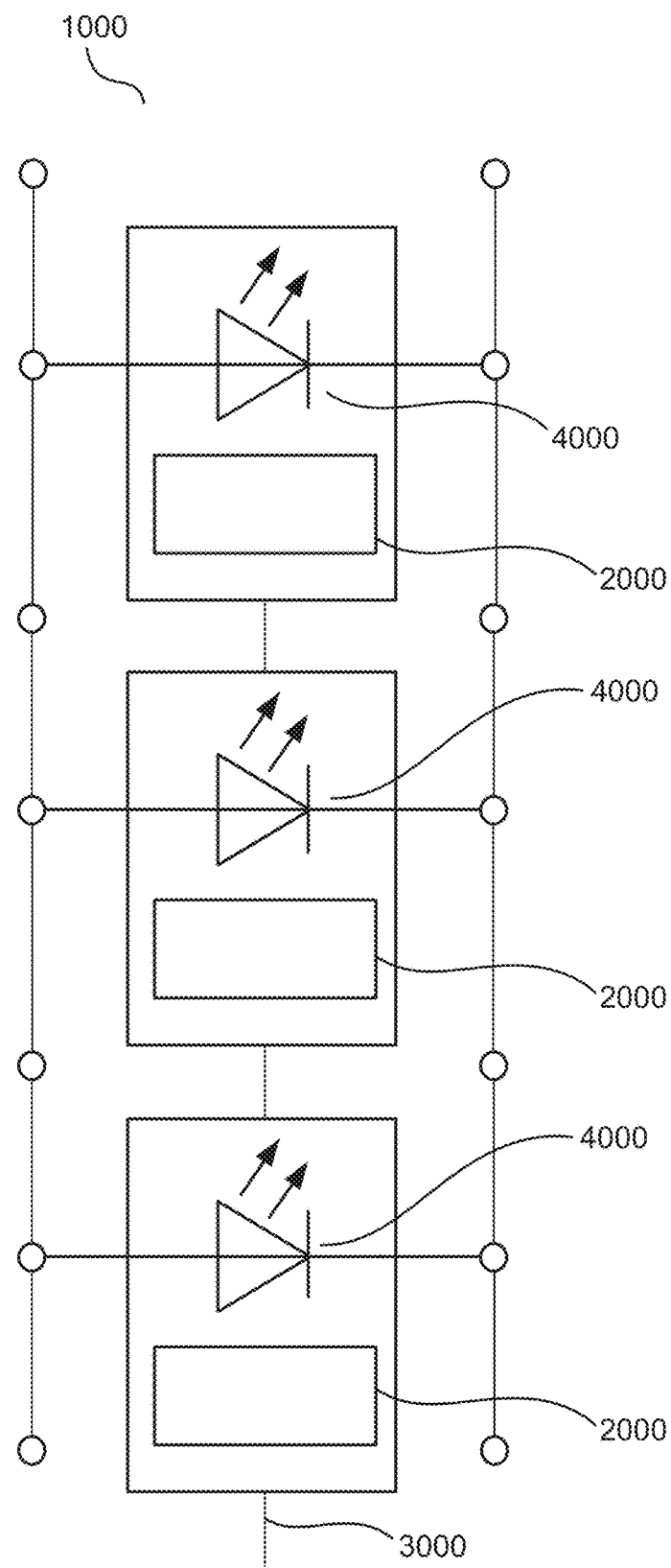

FIG. 7 shows yet another embodiment of an optoelectronic circuit (1000), in particular an optoelectronic circuit in a window of a vehicle according to FIG. 1, 2, 3A, 3B or 4. An optoelectronic circuit (1000) thereby comprises at least two optoelectronic components (4000), in particular two LEDs, which are interconnected in parallel, at least one conductor for the transfer of data (3000), and at least two logic circuits (2000) each connected to one of the at least two optoelectronic components (4000) and the at least one conductor (3000). Thereby an optoelectronic component (4000) and a logic circuit (2000) form a module, and similar to a Daisy chain, these modules are connected in series in regards of Power and Data supply. The at least two logic circuits (2000) can thereby be so called shift registers. This means, that once a signal with a defined number of bits is sent through the conductor for the transfer of data (3000), the shift registers are filled up with the bits and once the shift register of each LED is filled up, the regarding optoelectronic component (4000) receives a signal in which intensity it should glow. If another signal is sent through the conductor for the transfer of data (3000), each of the bits that are first in place of the registers are "kicked" out and the registers are filled up again with "new" bits.

This optoelectronic circuit (1000) has the advantage that an addressing of each optoelectronic component (4000) becomes unnecessary, as it is only necessary to know how many bits one must send through the conductor for the transfer of data (3000) to fill up the correct register with bits to provide the correct information. In addition to that, due to the serial circuit, only two first structured conductors are necessary for powering all optoelectronic components and only two conductor for the transfer of data (3000) are necessary for a communication between the optoelectronic components.

Figure 8:
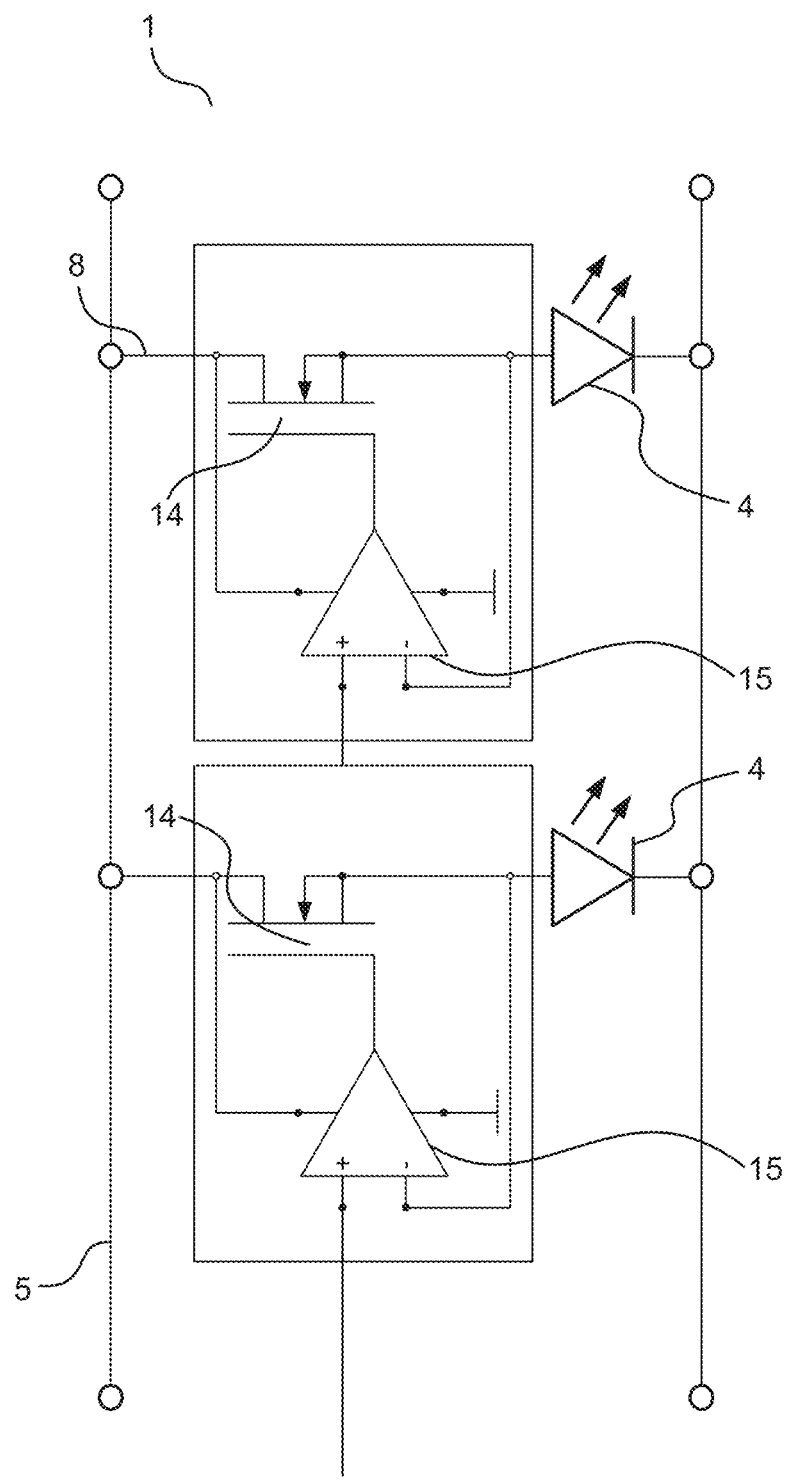

The window (1) as shown in FIG. 1, 2, 3A, 3B or 4 can also comprise a circuit as shown in FIG. 8. The window thereby comprises besides the at least one first structured conductor (5), the at least one second structured conductor (8) and the at least one optoelectronic component (4), a current source (14) and a feedback circuitry (15). Each one current source (14) is thereby coupled in series with one optoelectronic component (4) and a feedback circuitry (15) is connected in parallel to this. With this arrangement, each LED can be controlled individually in respect to the current running through it. The current source (14) can be for instance a transistor and more particular a MOSFET.

To reduce the thickness of this arrangement to place it into the window (1) it can be advantageous to have the feedback circuitry (15) and/or the current source (14) made of thin film technology. Thus, it can be possible to place this arrangement on the surface of the dielectric layer (3) opposite to the carrier layer (2) and cover it by the transparent covering layer (7), which is arranged on the surface of the dielectric layer (3) opposite to the carrier layer (2) to protect the arrangement from external influences. However it can also be an option to locate the at least one current source (14), which is producing the most heat of this components, outside the window (1) to have the possibility to dimension the current source big enough to avoid overheating.

Figure 9:
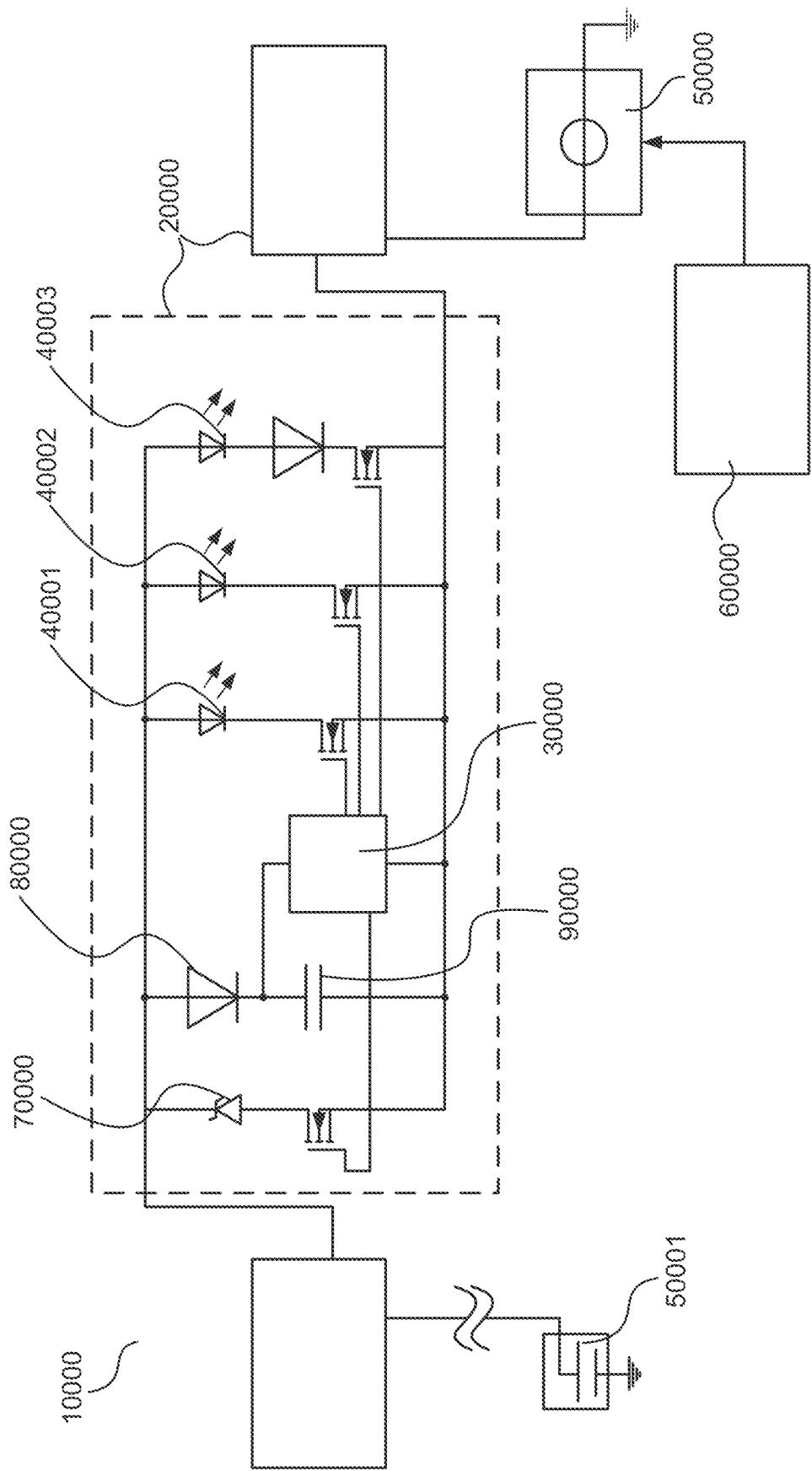

Another embodiment of an optoelectronic circuit (10000) is shown in FIG. 9. According to this, the optoelectronic circuit (10000) comprise at least two modules (20000) connected in series, wherein each module comprises at least one µ-controller (30000) and three optoelectronic components (40001, 40002, 40003) for emitting red, green and blue light each switchable arranged in a current path. The optoelectronic circuit (10000) further comprises a controllable current source (50000) coupled to the modules (20000) for providing a supply current and a data generation source (60000) connected to the current source (50000). The µ-controller (30000) is thereby configured to receive a data signal in response to a variation of the supply current and can thus address each of the three optoelectronic components (40001, 40002, 40003) for emitting red, green and blue light.

To ensure a supply current is running through each module, even though none of the three optoelectronic components (40001, 40002, 40003) is running, at least one first diode (70000) can be arranged switchable in a current path in each module (20000). The first diode (70000) can for instance be a so called "Zener" diode, with a "Zener" voltage that is approximately the same supply voltage as the optoelectronic components for emitting blue and green light. Hence, if none of the three optoelectronic components (40001, 40002, 40003) is running, the voltage at the "Zener" diode reaches the "Zener" voltage, and the following modules in series are farther supplied with current.

Figure 10:
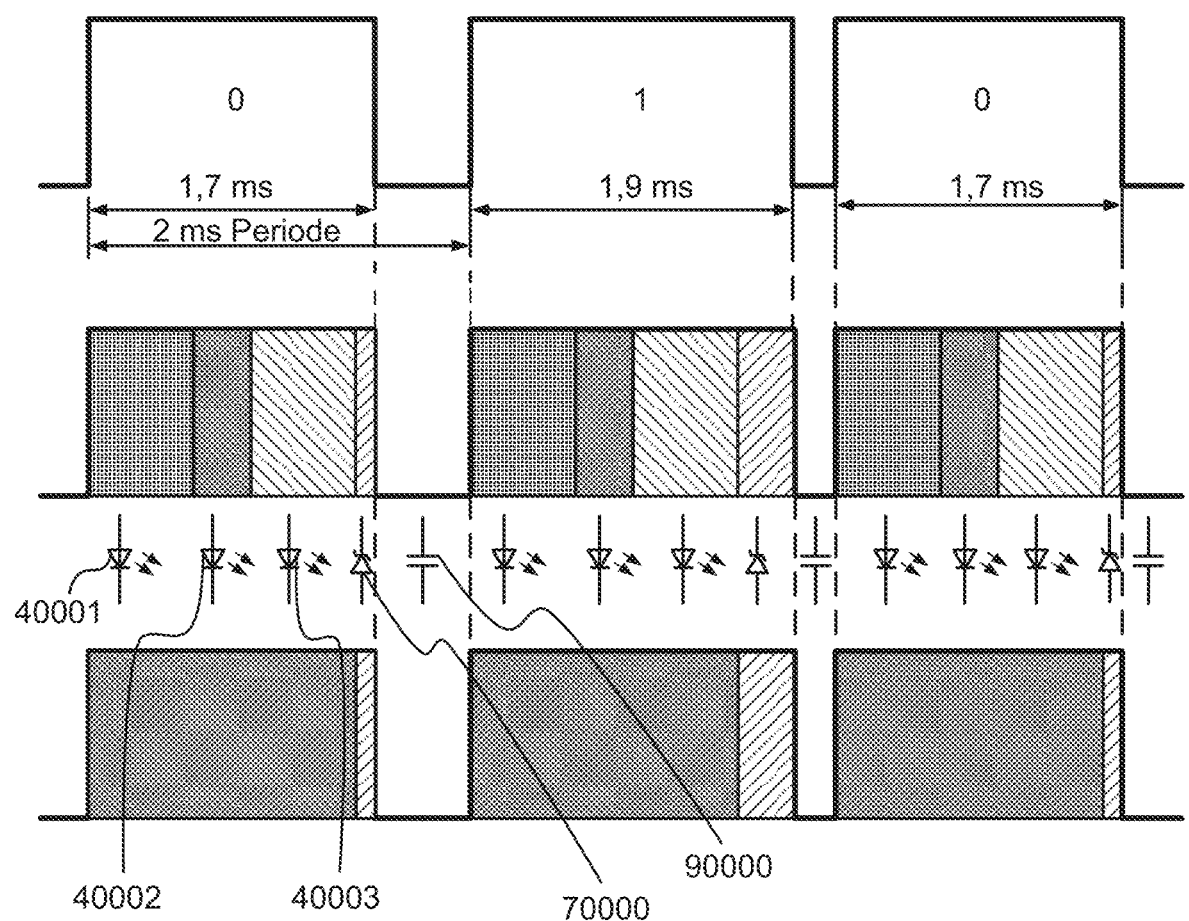

As the supply voltage of the optoelectronic component for emitting red light might be lower as of the optoelectronic components for emitting blue and green light, it might be advantageous to arrange an additional diode into the current path of the optoelectronic component for emitting red light, so that the combined supply voltage meets the supply voltage of the optoelectronic components for emitting blue and green light. This means in other words, that it can be advantageously to ensure, that the three current paths of the three optoelectronic components and the current path of the "Zener" diode within each module meets an approximately identical need of supply voltage. The data generation source (60000) connected to the current source (50000) generates a modulated supply current and thus generates data signal which can be evaluated by the µ-controllers. The supply current can thereby for instance be modulated as a Pulse Width Modulation (PWM) signal as shown in FIG. 10 in the first diagram. Indeed the supply current can also be modulated as any other kind of modulated electrical signal as for example a sinusoidal signal.

To bridge the "down time/programming time" of every period of the PWM signal as shown in FIG. 10, it can be advantageous to arrange at least one capacitor (80000) and at least one second diode (90000) connected in series in the current path of the µ-controller of each module. This has the advantage that the capacitor (80000) stores energy to keep the µ-controller running when no current is running due to the "down time" of the modulated supply current. In combination with the second diode (90000) it is ensured, that the energy stored in the capacitor (80000) is only used by the µ-controller and not by any other electrical consumer of the module (20000).

During each period of the PWM signal, as shown in FIG. 10 in the first diagram, the µ-controller addresses each of the three optoelectronic components (40001, 40002, 40003) to switch them on or off in the order how the signal is provided by the data generation source (60000). This means, that at a time only one of the three optoelectronic components (40001, 40002, 40003) can be switched on while the other two has to be switched off. However, it can also be that all of the tree optoelectronic components (40001, 40002, 40003) can be switched off and thus the current "breaks through" the "Zener" diode. According to the PWM signal, the colour mixing and the intensity of the three optoelectronic components (40001, 40002, 40003) can be individually addressed and be programmed on the µ-controller during the "down time" of the PWM signal.

The ratio between the length of a period and the time when the current is at a specified constant value defines a logical 1 or a logical 0 as shown in the first diagram of FIG. 10. With this logical 1 or 0 it is possible to program the µ-controller which is carried out during the "down time" of the PWM signal.

Thus, it is possible to generate a colour mixing as shown in FIG. 10 in the second diagram where the first block represents the time of the blue optoelectronic component running, the second block represents the time of the green optoelectronic component running, the third block represents the time of the red optoelectronic component running and the last hatched block represents the time the Zener diode is running. As another example it is also possible that the colour mixing is programmed as shown in FIG. 10 in the third diagram where the first block represents the time of the blue optoelectronic component is running and the second hatched block represents the time the Zener diode is running. This would mean that the module is emitting only blue light in this period of the PWM signal.

Regarding the voltage network (50001) the optoelectronic circuit (10000) is connected with, it might be advantageously to implement a step-up converter into the optoelectronic circuit (10000), to ensure, that the correct voltage is provided for the circuit.

Figure 11:
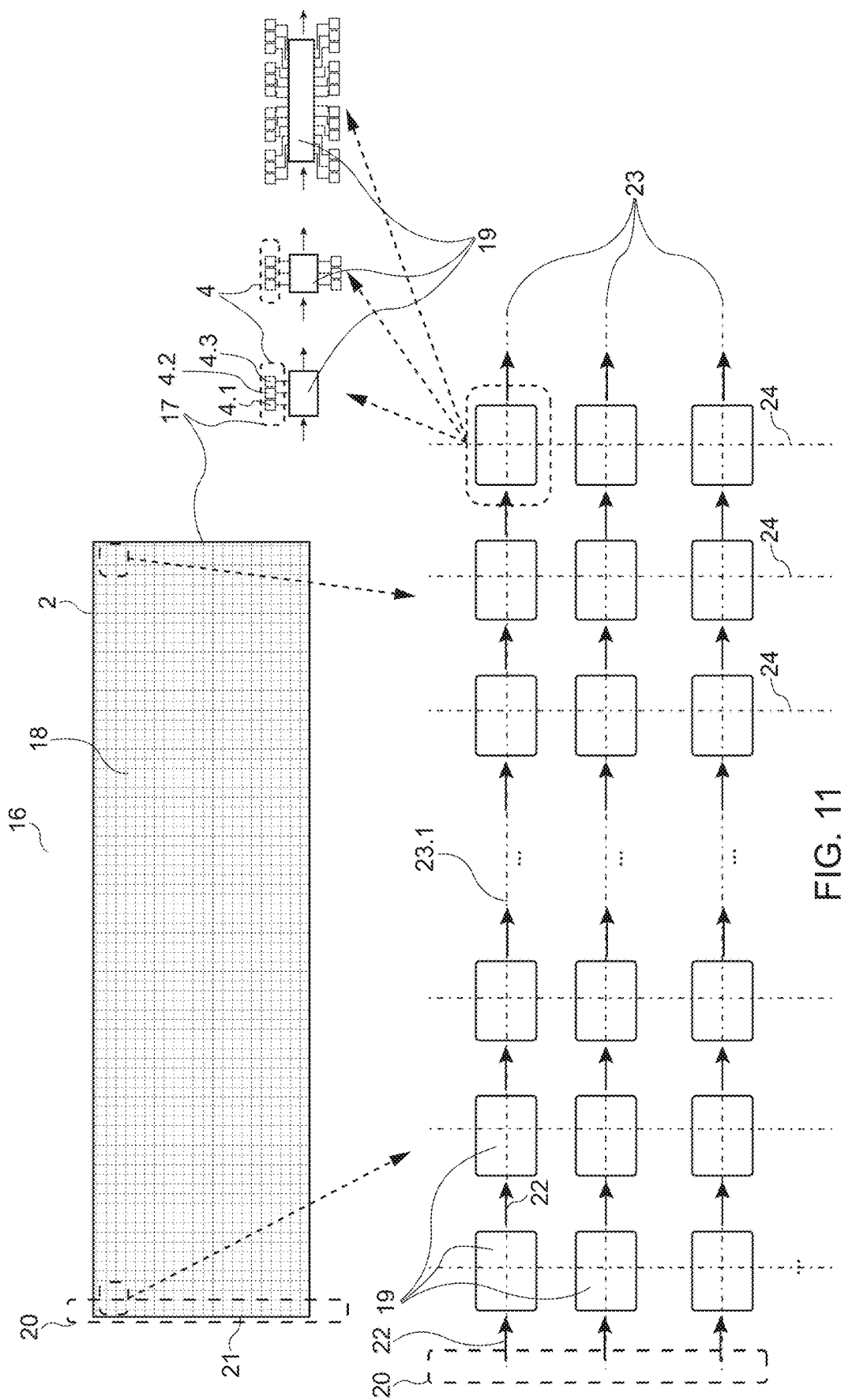

Referring now to FIG. 11, there is shown an optoelectronic array (16) according to some aspects of the present disclosure, which may be part of a display module according to the present disclosure.

The optoelectronic array (16) comprises a transparent carrier layer (2) with a plurality of optoelectronic components (4) arranged on a first surface (18) of the transparent carrier layer in a first matrix. Each of the plurality of optoelectronic components (4) is associated with a pixel (17). The optoelectronic array (16) with the plurality of optoelectronic components (4) arranged in a first matrix and thus the associated pixels (17) are schematically shown in the upper left of the FIG. with the help of a grid.

According to the upper right of FIG. 11 each optoelectronic component (4) comprises three, subcomponents (4.1, 4.2, 4.3), in particular μLEDs. The three subcomponents are thereby for example adapted to emit one of the colours red, green and blue. In other words, one of the three subcomponents is for example adapted to emit red light, one of the three subcomponents is for example adapted to emit green light and one of the three subcomponents is for example adapted to emit blue light. Hence, an aforementioned optoelectronic component can for example form a so-called RGB pixel. However, it may also be conceivable that the optoelectronic components or the subcomponents can comprise for example a Flip-Chip mountable LED, a Flip-Chip mountable μ-LED, or the like.

The pixels have a size of less than 1 square millimeter, preferably less than 0.5 square millimeter and even more preferably less than 0.25 square millimeter. Hence, an optoelectronic array may comprise a number of pixels and with it optoelectronic components greater than 10,000, preferably greater than 100,000 and even more preferably greater than 1 million.

The optoelectronic array and with it the transparent carrier layer has a planar and rectangular shape. However it may also be conceivable that the optoelectronic array and with it the transparent carrier layer has the shape of a polygon and more particular the shape of a triangle, hexagon, or the like.

The transparent carrier layer may be of an inexpensive, transparent and deformable, thermoplastic plastic as for example PET, PEN, PVC, or the like. However, Thermosets and non-thermoformable plastics are also conceivable as for example silicone, polyurethane, or the like.

The optoelectronic array is further comprising at least two integrated circuits (19), in particular μICs, arranged on the first surface (18) of the transparent carrier layer (2).

Each integrated circuit (19) is thereby, according to the upper right of FIG. 11, connected to at least one of the plurality of optoelectronic components (4). However, FIG. 11 shows in the upper right further embodiments, as each integrated circuit (19) can be connected to more than one optoelectronic component (4) as it can for example be connected to 2 or 8 optoelectronic components (4).

The at least two integrated circuits (19) are, according to FIG. 11, arranged in a second matrix with a plurality of rows (23) and columns (24), indicated by the horizontal and vertical dotted lines. The second matrix can thereby, depending on the proportion of optoelectronic components (4) to integrated circuits (19), match with the first matrix, partially match with the first matrix or not match with the first matrix. In other words, this means, that if each integrated circuit (19) is associated to only one optoelectronic component (4), the first and the second matrix may match. However, if the proportion of optoelectronic components (4) to integrated circuits (19) is not equal to 1, the second matrix may only partially or not match with the first matrix.

A first contact area (20) is situated along a short edge (21) of the transparent carrier layer (2) allowing to electrically contact the optoelectronic components (4) and the integrated circuits (19) of the optoelectronic array (16). However, the first contact area (20) is also adapted to provide a connection for programming the optoelectronic components (4) and the integrated circuits (19).

According to the Figure, the optoelectronic array (16) is further comprising three first data lines (22) to each connect at least three integrated circuits (19) with the first contact area (20) in series. However, as indicated by the dots, the number of first data lines (22) (rows) and the number of integrated circuits (19) (columns) connected in series with the first contact area (20) by each a first data line (22) is not limited to this. Rather it may be conceivable to connect several integrated circuits (19), as for example 1000 integrated circuits (19), of a row in series via a first data line similar to a daisy chain with a serial bus.

The integrated circuits (19) within one row can comprise so called shift registers. This means, that once a signal with a defined number of bits is sent through the at least one first data line, the shift registers are filled up with the bits and once the shift register of each integrated circuit is filled up, the regarding optoelectronic component receives a signal in which intensity it should glow. Once another signal is sent through the at least one first data line, each of the bits that are first in place of the registers are "kicked" out and the registers are filled up again with "new" bits.

This has the advantage that an addressing of each integrated circuit becomes unnecessary, as it is only necessary to know how many bits one must send through the at least one first data line to fill up the correct register with bits to provide the correct information.

Figure 12:
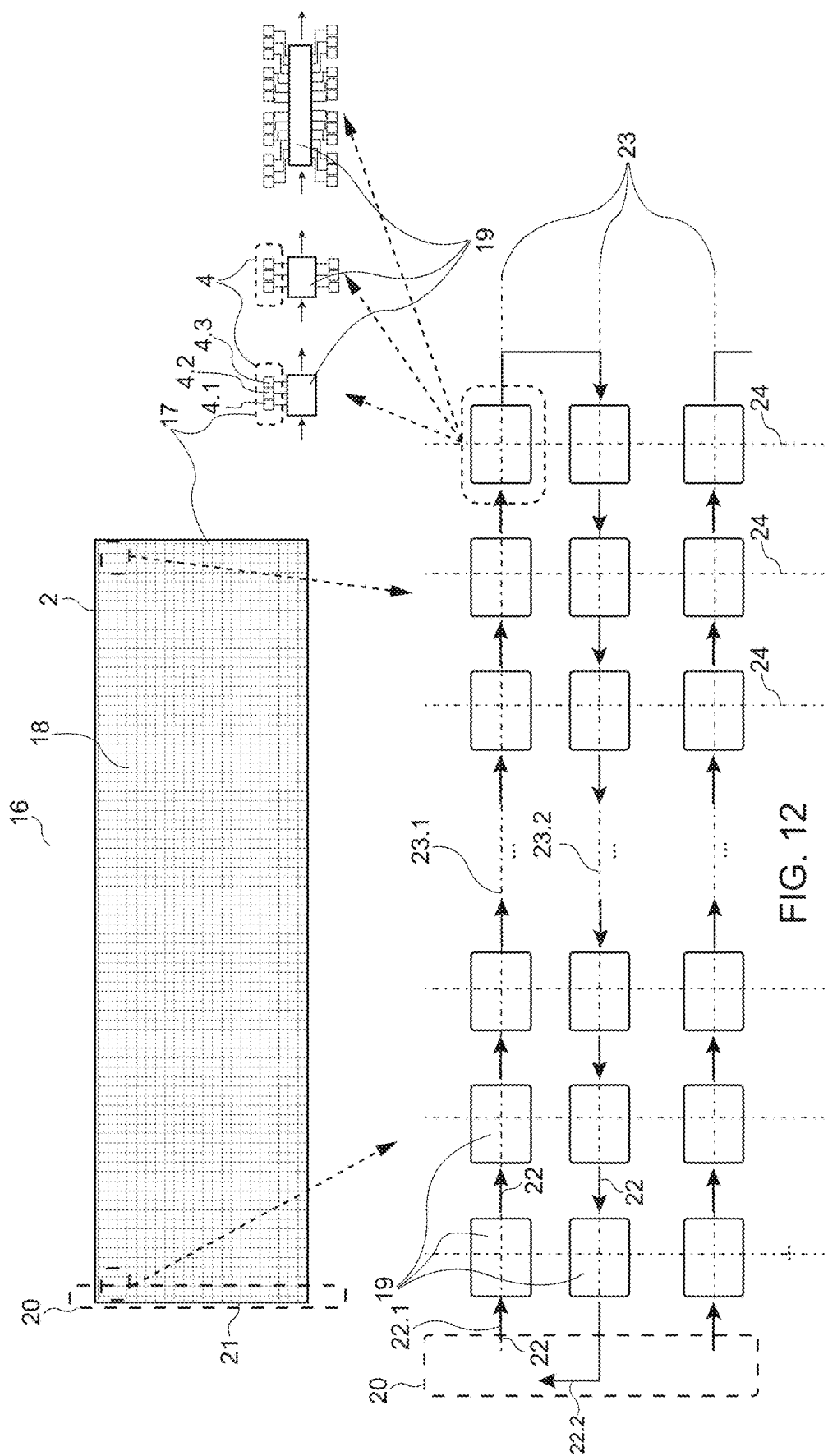

With this, it can be possible to address a whole row of integrated circuits with only one serial driver unit connected to the first contact area (20). At for example 1000 integrated circuits (19) per row and 8 optoelectronic components (4) per integrated circuit (19) it would be possible to control approximately 8000 optoelectronic components (4) and thus pixels (17) with only one serial driver unit. At for example 1.2 million pixels (17) and thus optoelectronic components (4) per optoelectronic array (16), this would lead to only 150 serial driver units necessary to control all optoelectronic components (4) and thus pixels (17) of the optoelectronic array (16). Referring now to FIG. 12, it is shown another embodiment of an optoelectronic array (16). Compared to the optoelectronic array (16) shown in FIG. 11 each first data line (22) connects the integrated circuits (19) of two adjacent rows (23.1, 23.2) in series with the first contact area (20). Hence, the integrated circuits (19) within the two adjacent rows (23.1, 23.2) are connected in series with the first contact area (20) similar to a daisy chain with a serial bus. However, it can also be conceivable if the number of adjacent rows is greater than two and even more particular is an even number greater than 2.

With this, it can be possible to address at least two whole rows of integrated circuits with only one serial driver unit connected to the first contact area (20). Thus, the number of necessary serial driver units to control all optoelectronic components (4) and thus pixels (17) of an optoelectronic array (16) can be further reduced.

In order to check whether the information sent through the first data lines (22) has arrived correctly at the integrated circuits (19) a feedback loop is provided by returning each first data line to their starting point.

first data lines (22) connect the integrated circuits (19) of each row in parallel to the first contact area (20), and second data lines (25) connect the integrated circuits (19) of each column in parallel to the first contact area (20). Thus, a cross matrix programming of the integrated circuits (19) is possible. With this it is possible to address each row (23) of integrated circuits (19), and with it all the associated optoelectronic components (4), with the help of for example each a row driver connected to the first contact area (20). The columns of integrated circuits (19), and with it all the associated optoelectronic components (4), can however be addressed with the help of for example each a column driver connected to the first contact area (20).

Figure 13:
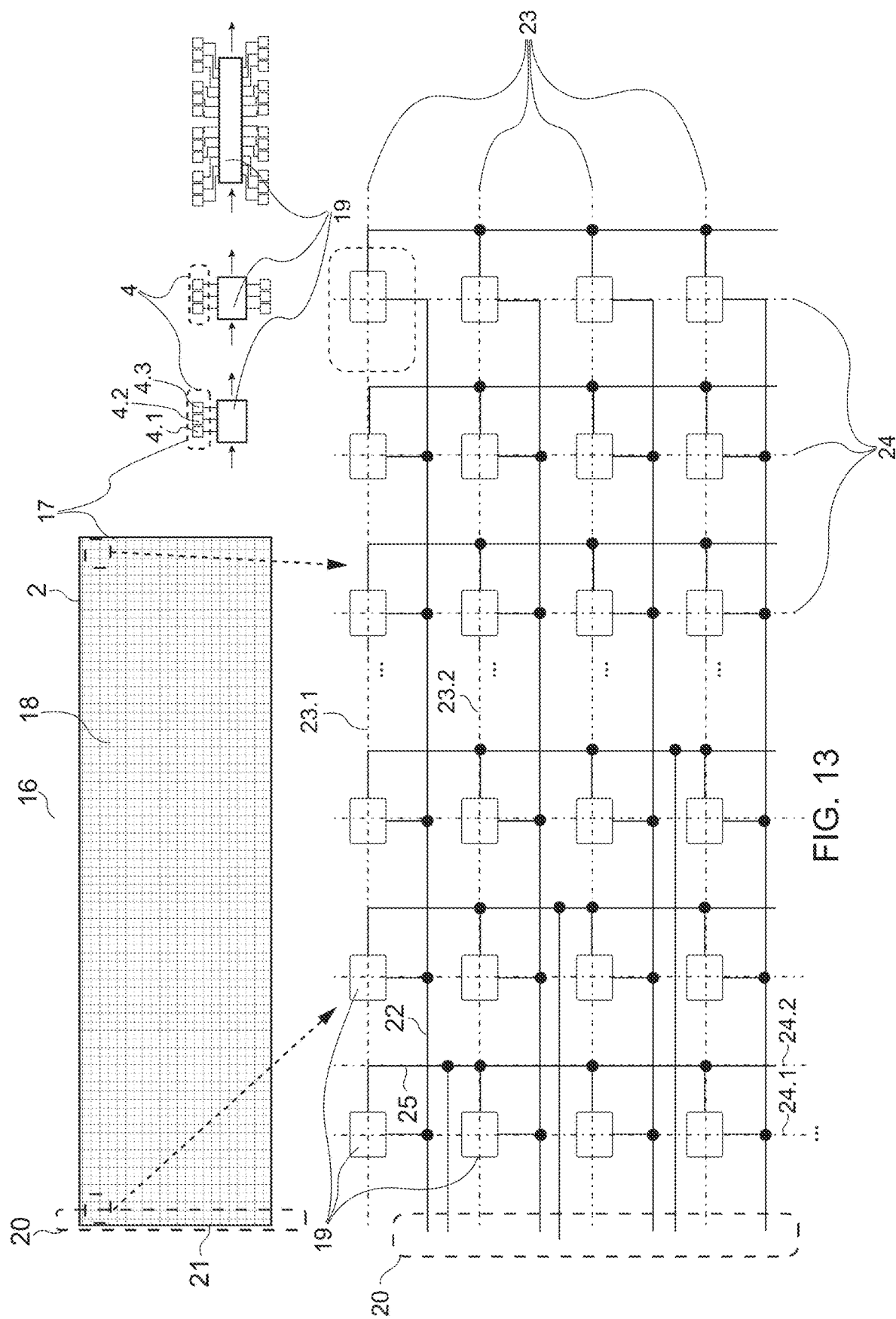

In general, column drivers of a cross matrix circuit and thus the data line to address each integrated circuit of a column would be arranged in direct extension of each column. However, as shown in FIG. 13, a routing of the second data lines (25) is suggested to connect all first and second data lines (22, 25) to the first contact area (20). Thus, the optoelectronic array (16) has the advantage of only having one contact area to provide a signal to address all integrated circuits (19) of the optoelectronic array (16).

To provide such a cross matrix circuit at least a two-layer wiring with at least one insulating layer between is necessary to avoid unwanted connections between rows and columns on the transparent carrier layer.

Figure 14:
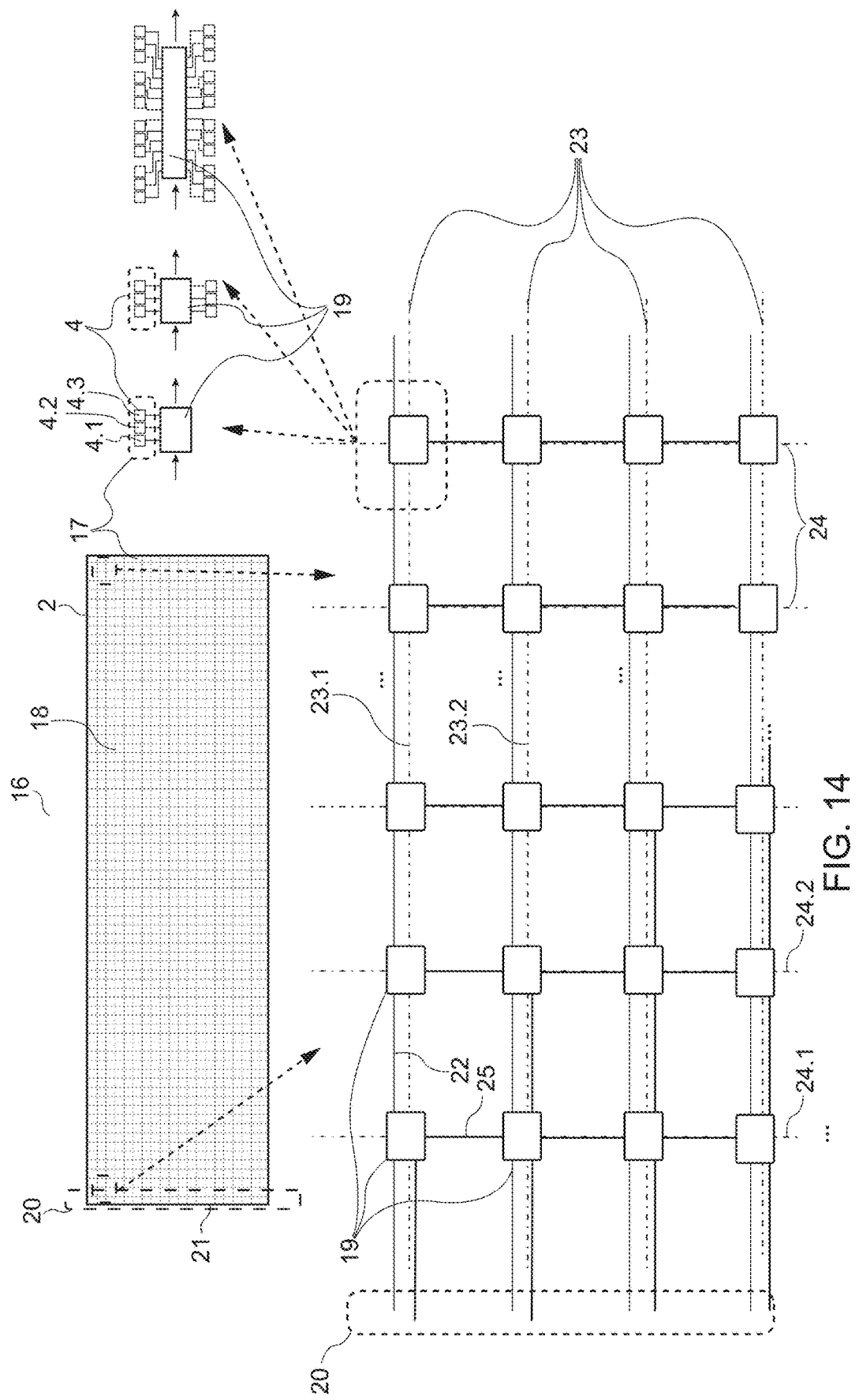

This however can be tackled, according to FIG. 14, by placing the crossing points of the first data lines (22) and the second data lines (25) in the integrated circuits (19). The integrated circuits (19) can therefore have several metallization levels that can be used for this wiring. This means that a metallization of the transparent carrier layer (2) can be carried out in only one metallization layer and without an insulating layer.

Figure 15:
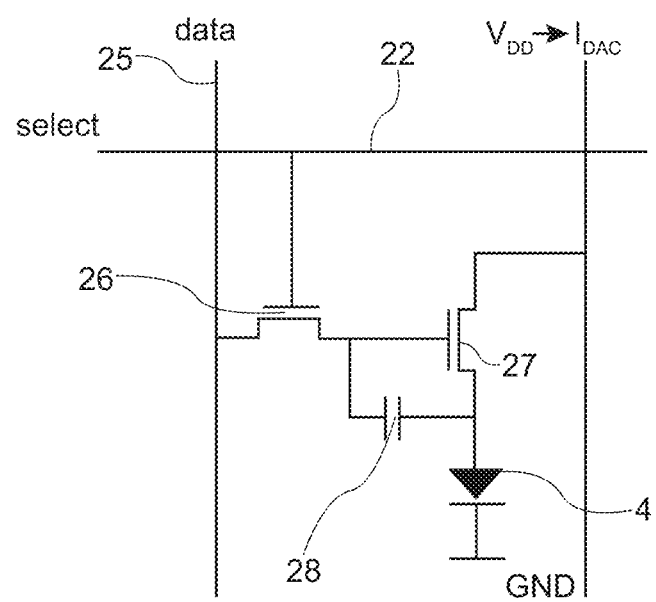

Referring now to FIG. 15, each integrated circuit (19) comprises a first transistor (26), a second transistor (27) and a capacitor (28). The first transistor (26) and the capacitor (28) are configured to control a current through the second transistor (27). Thus, the second transistor (27) is adapted to work as a current source and the first transistor (26) and the capacitor (28) are configured to control the current source. The first transistor (26), is for example addressed by a select signal of the first data line (22) and programmed by a data signal of the second data line (25). Thus, the capacitor (28) gets charged based on the data signal in the second data line (25) to buffer the programmed signal and the second transistor (27) provides an appropriate current to the optoelectronic component (4). The second transistor (28) is therefore connected on the one hand to the voltage $V_{DD}$ and on the other hand to ground GND.

The integrated circuits (19) and in particular the first and the second transistors (26, 27) can be formed by thin-film technology (TFT), in particular as thin film transistors. Since TFTs need at least two metal levels, the crossing points of the first data lines (22) and the second data lines (25) can be placed within the integrated circuits (19) without any additional effort or problem.

As shown in FIGS. 16A and 16B it is further provided a display module (160) comprising at least one optoelectronic array (16) according to any of the above-described aspects. The display module (160) is further comprising a programming area (29) coupled to the first contact area (20) to program the integrated circuits (19) of the at least one optoelectronic array (16) as well as provided power to the integrated circuits and thus all associated optoelectronic components. Adjacent to the programming area (29) opposite the first contact area (20) a connector area (30) is located to electrically connect the display module (160). As shown in the Figures, the connector area is formed as a flat connector with a plurality of contacts for the supply of energy and for data exchange with the environment of the display module (160).

The programming area (29) may comprise at least one of the above-mentioned serial driver units and/or row drivers and/or column drivers to address the integrated circuits (19) and thus the associated optoelectronic components (4) of the optoelectronic array (16) either in serial or in cross matrix manner.

The at least one serial driver unit may thereby be used to address/program the integrated circuits (19) connected in series. Referring back to FIG. 12, a first end (22.1) of the first data line (22) can be connected to the at least one serial driver unit and a second end (22.2) of the first data line (22) can be connected to the same serial driver unit to provide a feedback loop, in order to check whether the information sent through the first data line (22) has arrived correctly at the integrated circuits (19) connected in series.

The at least one row driver unit may however be used to address/program the integrated circuits (19) within a row (22) connected to the at least one row driver unit and the at least one column driver unit may be used to address/program the integrated circuits (19) within a column (25) connected to the at least one column driver unit, to provide a cross matrix programming of the integrated circuits (19).

A display module (16) can be manufactured as a whole with just one optoelectronic array (16) according to FIG. 16A or it can be modularly composed of a plurality, in particular 2-10, optoelectronic arrays (16) according to FIG. 16B. Hence, the production of such a display module (16) can take place on a large panel or in a roll-to-roll process.

As shown in FIG. 16B the display module (160) comprises three optoelectronic arrays (16.1, 16.2, 16.3) according to any of the above-described aspects facing each other along a short edge (21) of each of their transparent carrier layer (2). The optoelectronic arrays (160) are coupled within their first contact area (20) with at least one electrical module (34) to electrically interconnect the optoelectronic arrays (16.1, 16.2, 16.3). The joint of the optoelectronic arrays (16.1, 16.2, 16.3) is thereby advantageously on a pixel boundary of each optoelectronic array, as most of the space is available there.

For providing an electrically connection between the optoelectronic arrays (16.1, 16.2, 16.3), the optoelectronic arrays (16.1, 16.2, 16.3) each comprise a plurality of electrical contact pads (35) on their transparent carrier layer (2) along each facing short edge (21) of optoelectronic arrays (16.1, 16.2, 16.3) and/or along each facing short edge (21) of an optoelectronic array (16.1) with a programming area (29). Thus, the optoelectronic arrays comprise a first contact area (20) with each a plurality of electrical contact pads (35) at least along the short edges (21) where there is an optoelectronic array adjacent to the programming area (29) and/or another optoelectronic array.

Figure 17A:
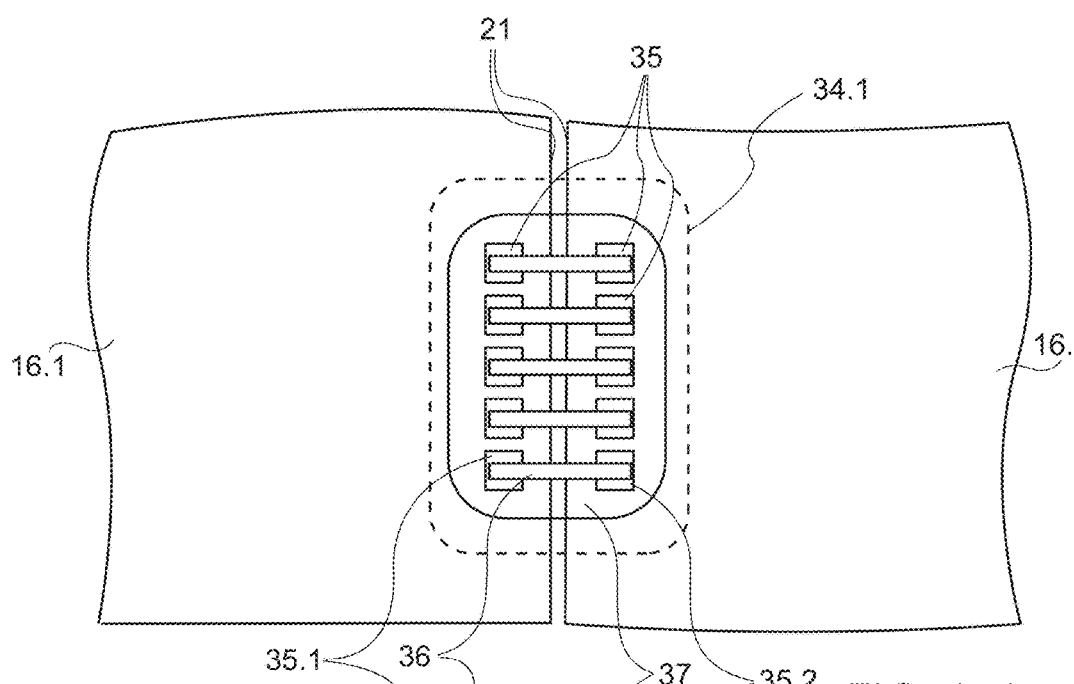
Figure 17B:

In FIGS. 17A and 17B a top and a side view of a first embodiment of an electrical module (34.1) connecting two optoelectronic arrays (16.1, 16.2) is shown. The electrical module (34.1) comprises at least one first bonding wire (36), to couple at least one of the plurality of electrical contact pads (35) of each of the two optoelectronic arrays (16.1, 16.2) with one another. The electrical module (34.1) further comprises a first encapsulating material (37) covering the first bonding wires (36), the electrical contact pads (35) of each of the two optoelectronic arrays (16.1, 16.2), which are coupled with the first bonding wires (36), as well as at least partially the two optoelectronic arrays (16.1, 16.2). The first bonding wires (36) can comprise a material like gold, aluminum, or the like to be conceivable as an electrical connection. The encapsulating material (37) is to protect the first bonding wires (36) from mechanical influences and can for example be molded, potted, or the like.

The encapsulating material (37) can further be adapted to mechanically interconnect the at least two optoelectronic arrays (16.1, 16.2) and can therefore, as shown in FIG. 17B, be arranged as a filler/glue between the two optoelectronic arrays (16.1, 16.2).

Figures 18A, 18B:
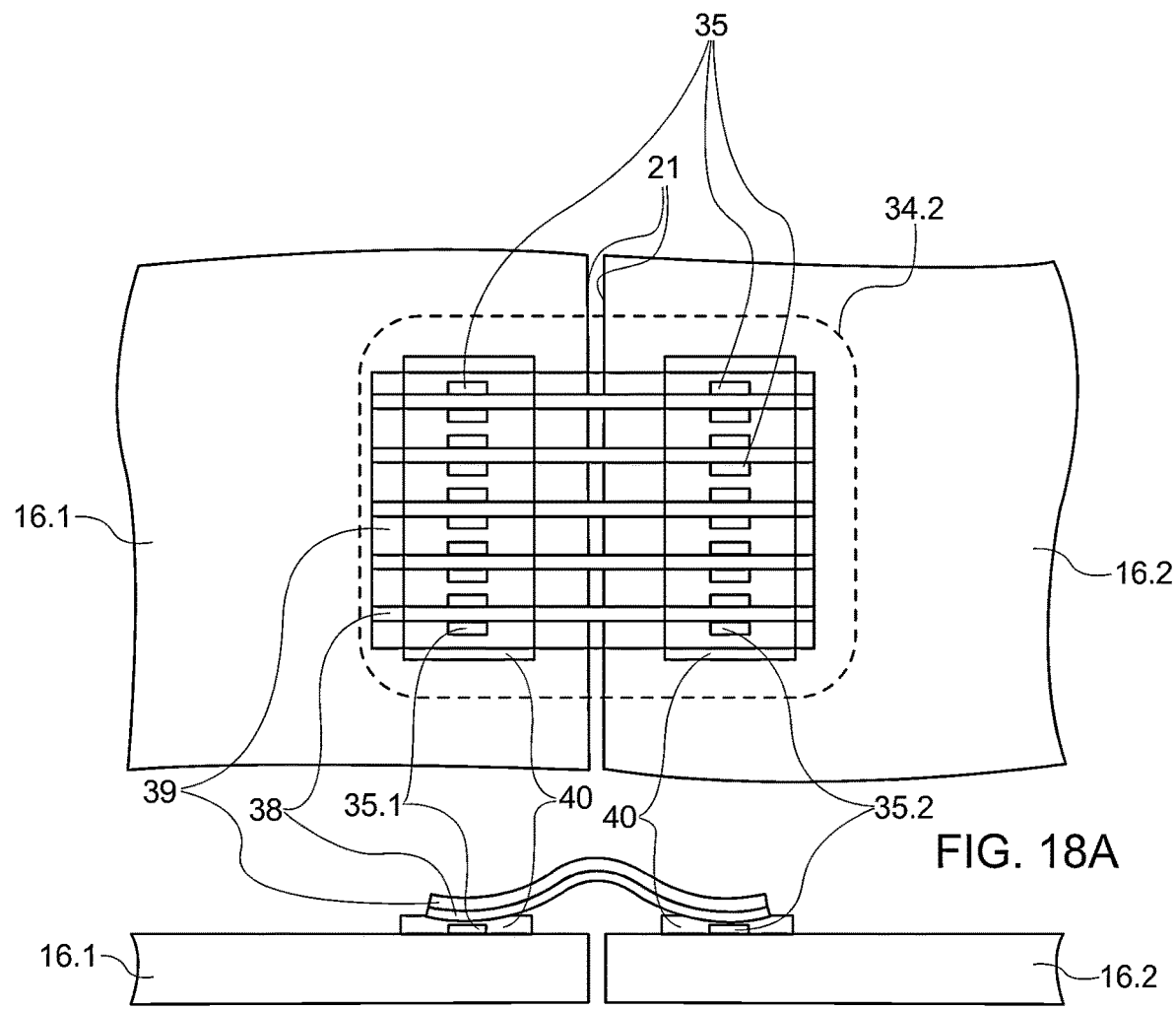

According to FIGS. 18A and 18B a second embodiment of an electrical module (34.2) comprises at least one first printed circuit (38) to couple at least one of the plurality of electrical contact pads (35) of each of the two optoelectronic arrays (16.1, 16.2) with one another. In addition the first printed circuits (38) are stabilized by the help of a flextape (39) arranged on a surface of the first printed circuits (38) opposite to the contact pads (35). In the broadest sense, a flextape can comprise a flexible dielectric substrate as for example PEN, PET, PI, or the like with a structured metallization comprising Cu, Ni, Au, or the like. However, a rigid plate as for example made of epoxy, glass fiber composite, or the like could also be used.

The electrical connection can for example be made using adhesives as for example an anisotropic conductive film (40) to glue the first printed circuits (38) and the flextape (39) onto the optoelectronic arrays (16.1, 16.2). As shown in FIGS. 18A and 18B the adhesive film (40) is arranged around the electrical contact pads (35) of each of the two optoelectronic arrays (16.1, 16.2), which are coupled with the first printed circuits (38), but not on the upper surface of the electrical contact pads (35), to glue the first printed circuits (38) and the flextape (39) onto the optoelectronic arrays (16.1, 16.2) and thus ensure a mechanical and electrical connection. However, the electrical connection and or the mechanical connection can be made using low-temperature solders, or the like.

Figures 19A, 19B:
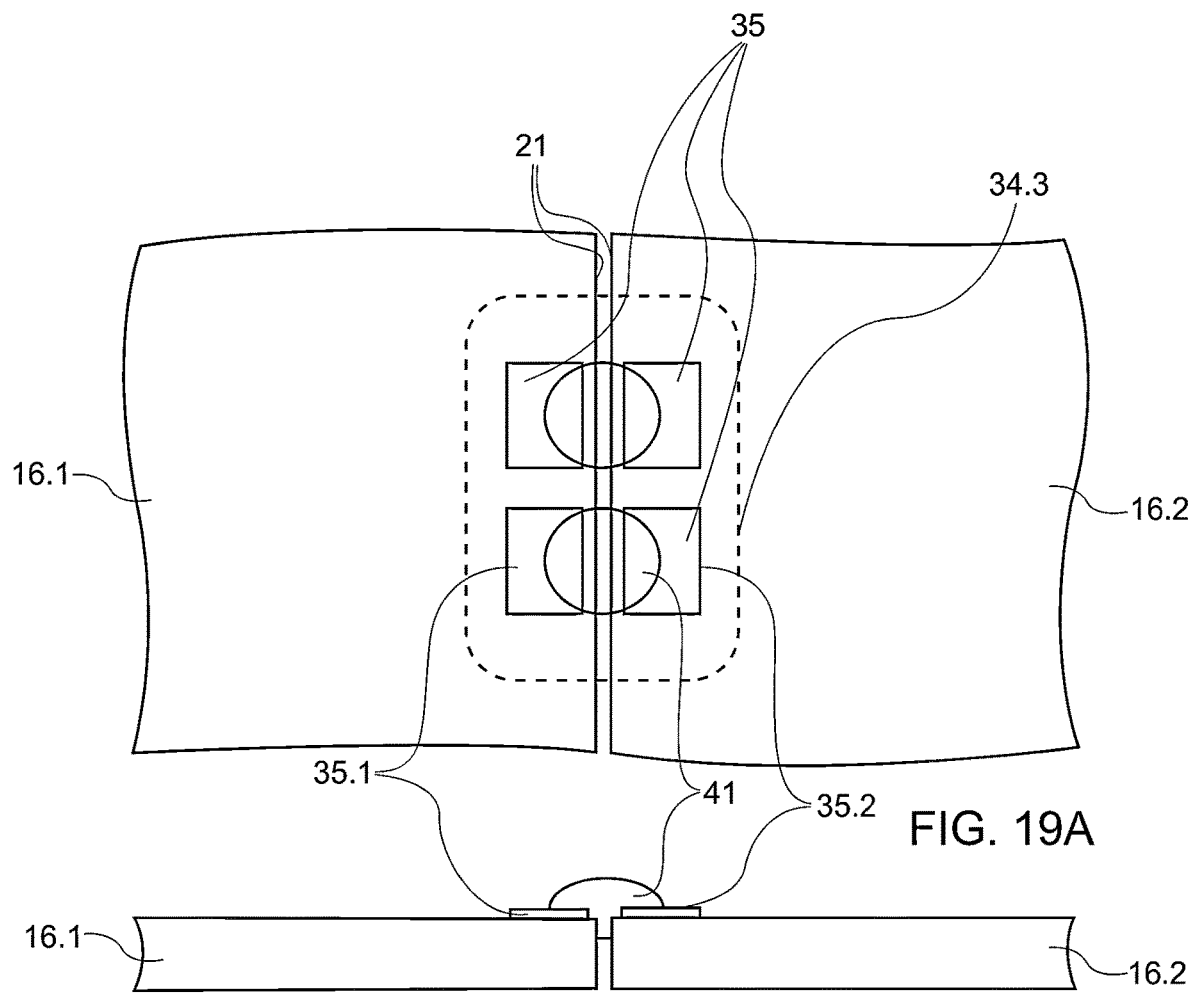

In FIGS. 19A and 19B a top and a side view of a third embodiment of an electrical module (34.3) connecting two optoelectronic arrays (16.1, 16.2) is shown. The electrical module (34.3) comprises at least one solder ball (41) to couple at least one of the plurality of electrical contact pads (35.1, 35.2) of each of the two optoelectronic arrays (16.1, 16.2) with one another. With the solder balls (41) a direct contact between the two optoelectronic arrays (16.1, 16.2) can be provided. The solder can thereby contain any material as for example indium or bismuth with melting points below 180° C.

Figures 20A, 20B, 20C:
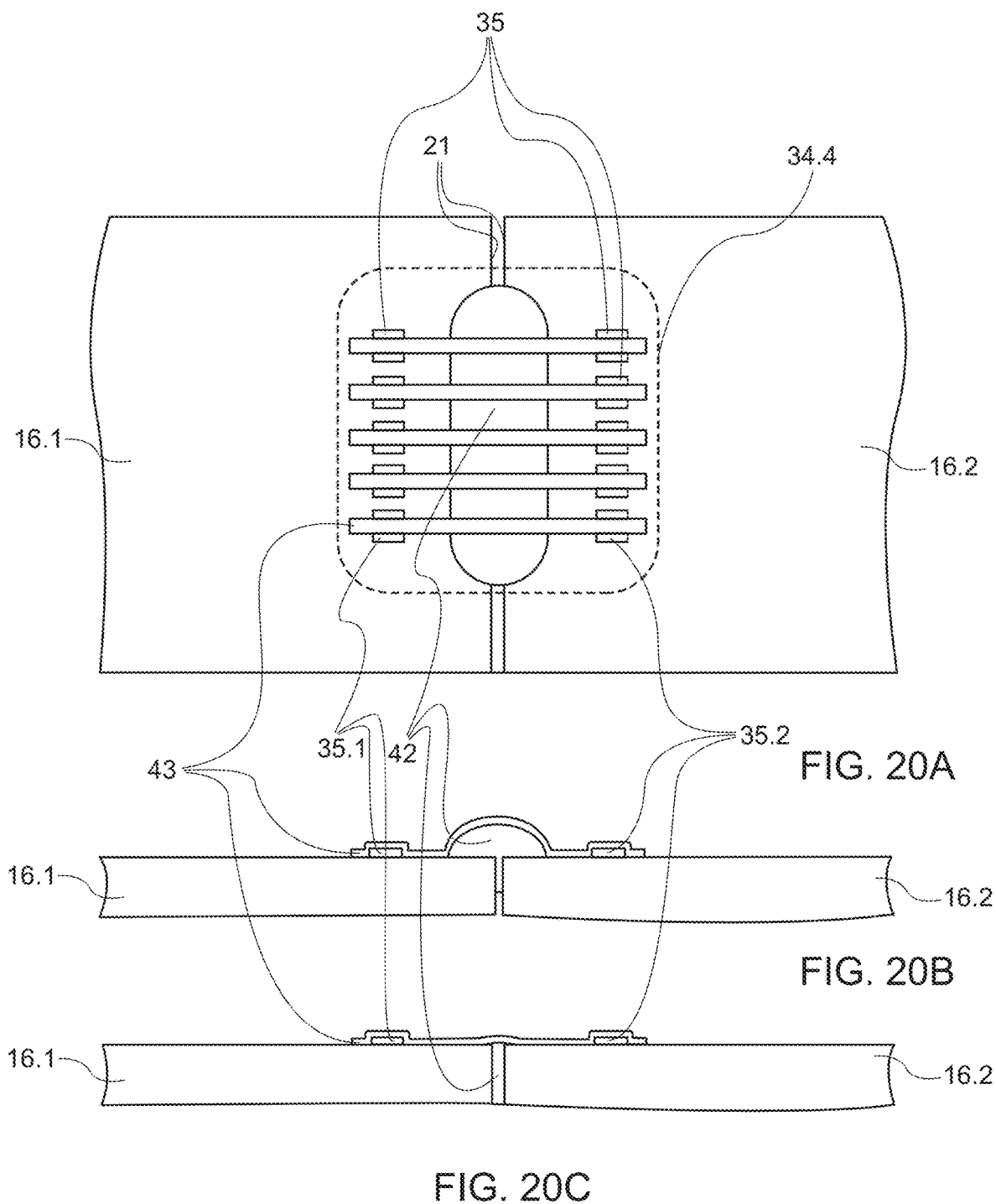

According to FIGS. 20A, 20B and 20C a fourth embodiment of an electrical module (34.4) comprises a filler (42) arranged on and/or between two optoelectronic arrays (16.1, 16.2). The electrical module (34.4) further comprises at least one second printed circuit (43) to electrically couple at least one of the plurality of electrical contact pads of each of the two optoelectronic arrays (16.1, 16.2) with one another. The second printed circuits (43) are thereby arranged on the filler (42) and/or partially on the two optoelectronic arrays (16.1, 16.2). The second printed circuits (43) can for example comprise Ag or the like and can be applied precisely with for example an aerosol jetting or ink jetting process. However, the second printed circuits (43) can for example also comprise Cu or the like and can be specifically transferred using LIFT processes. The filler (42) can according to FIGS. 20B and 20C be adapted to fill the gap between the two optoelectronic arrays (16.1, 16.2) at least partly in order to enable the second printed circuits (43) to be applied properly. The filler (42) can form either a concave, flush (see FIG. 20C) or convex (see FIG. 20B) shape between and/or on top of the at least two optoelectronic arrays (16.1, 16.2). The electrical module (34.4) can thereby not only be to electrically interconnect the at least two optoelectronic arrays but can be adapted to mechanically interconnect the at least two optoelectronic arrays (16.1, 16.2).

To ensure a mechanical interconnection apart the electrical interconnection, FIGS. 21A to 21D show further embodiments of a mechanical interconnection between two optoelectronic arrays (16.1, 16.2). According to FIG. 21A, an electrical module (34.5) according to any of the above-described aspects can therefore be formed on the first surface (18) of each of the transparent carrier layers (2) of the optoelectronic arrays (16.1, 16.2) and/or on the surface opposite to the first surface (18) of the transparent carrier layer (2) of the optoelectronic arrays (16.1, 16.2). Thus the electrical module (35.5) can be formed between the two optoelectronic arrays (16.1, 16.2) and form a concave shape on top of the first surface (18) of each of the transparent carrier layers (2) of the optoelectronic arrays (16.1, 16.2) and/or on the surface opposite to the first surface (18) of the transparent carrier layer of the optoelectronic arrays (16.1, 16.2). Hence, a mechanical connection of the optoelectronic arrays (16.1, 16.2) is for example provided by gluing the transparent carrier layers (2) along their facing short edge. However, it is also possible to for example weld the transparent carrier layers (2) along their facing short edge.

Figure 21D:
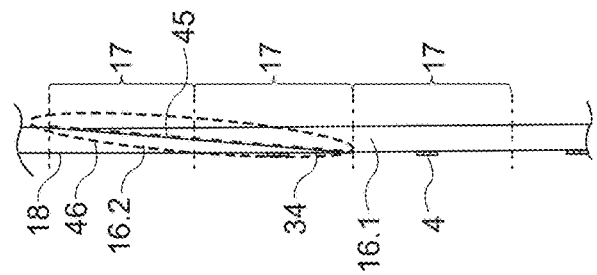
Figure 21C:
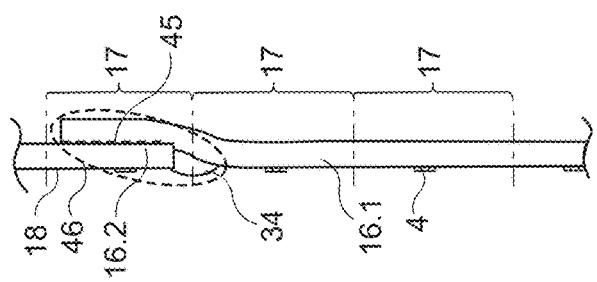
Figure 21B:
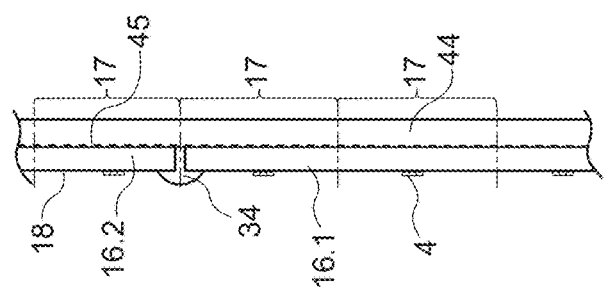
Figure 21A:
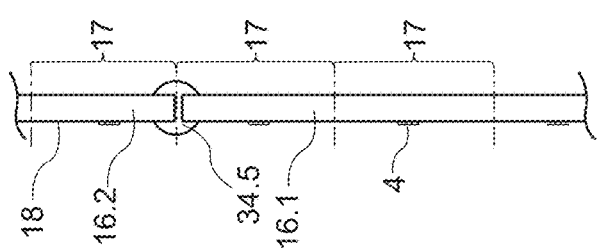

According to FIG. 21B the display module (160) is further comprising a carrier foil (44) arranged on a surface of the transparent carrier layers (2) of the optoelectronic arrays (16.1, 16.2) opposite to the first surfaces (18). By for example a lamination of the carrier foil (44) onto the optoelectronic arrays a good connection quality by means of a mechanical connection between the optoelectronic arrays can be provided because of the large joining surfaces. In addition, the process of lamination is a rather simple and inexpensive process.

Between the carrier foil (44) and the transparent carrier layer (2) the display module (160) further comprises an adhesive (45). The adhesive (45) may for instance be conceivable as it improves the connection quality of the carrier foil (44) and the optoelectronic arrays.

However, a mechanical connection between the optoelectronic arrays can also be provided by for example welding or gluing the optoelectronic arrays together by overlapping the two optoelectronic arrays partly, as shown in FIG. 21C. Thus, the optoelectronic arrays facing each other are overlapping each other, and an adhesive (45) is arranged between the overlapping parts (46). Such approach is technically easy to implement, but locally thickens the display module (160). As shown in the FIG. it can be conceivable to arrange the optoelectronic arrays (16.1, 16.2) in such, that the overlapping parts (46) are matching the size of a pixel (17) and thus the first matrixes of optoelectronic components of the optoelectronic arrays (16.1, 16.2) are also still matching together without any gap.

To avoid local thicknesses of the display module (160) the overlapping parts (46) of the optoelectronic arrays (16.1, 16.2) are brought into a tapered/sharpened shape, as it is shown in FIG. 21D.

display (1600) comprising at least one display module (160) according to any of the above-described aspects. According to FIG. 22C the display has a three-dimensional shape (3D-shape) and can be arranged on or in a 3D-shaped chassis (50), as shown in FIG. 22D, of for example a vehicle. However, the display (1600) can also be arranged on or in a window, in particular between two glass layers of a window, in particular of a window of a vehicle.

FIG. 22A shows, that before joining or 3D-forming the display modules (160), they are cut into an appropriate shape to ensure, that the later 3D-formed display (1600) is without kinks and waves. In addition, the shift of the optoelectronic components (4) during the subsequent 3D-forming into the 3D-shape must already be taken into consideration in the planar processing of the optoelectronic arrays (16) in order to achieve an even distribution of the optoelectronic components (4) and thus pixels (17) after 3D-forming display (1600).

FIGS. 22A to 27 show steps of a method to manufacture an embodiment of a 3D-shaped display module (160). The method thereby comprises the steps of:
providing at least two optoelectronic arrays according to any of the above described aspects,
cutting the at least two optoelectronic arrays into an appropriate shape,
arranging the at least two optoelectronic arrays next to each other with each the first surface facing into the same direction,
laminating a carrier foil on a surface of the at least two optoelectronic arrays opposite to the first surface,
interconnecting the at least two optoelectronic arrays electrically,
deep drawing the at least two optoelectronic arrays to obtain a 3D-shape display module.

The order of the above given steps is however not limited to how it is shown.

Figure 23:
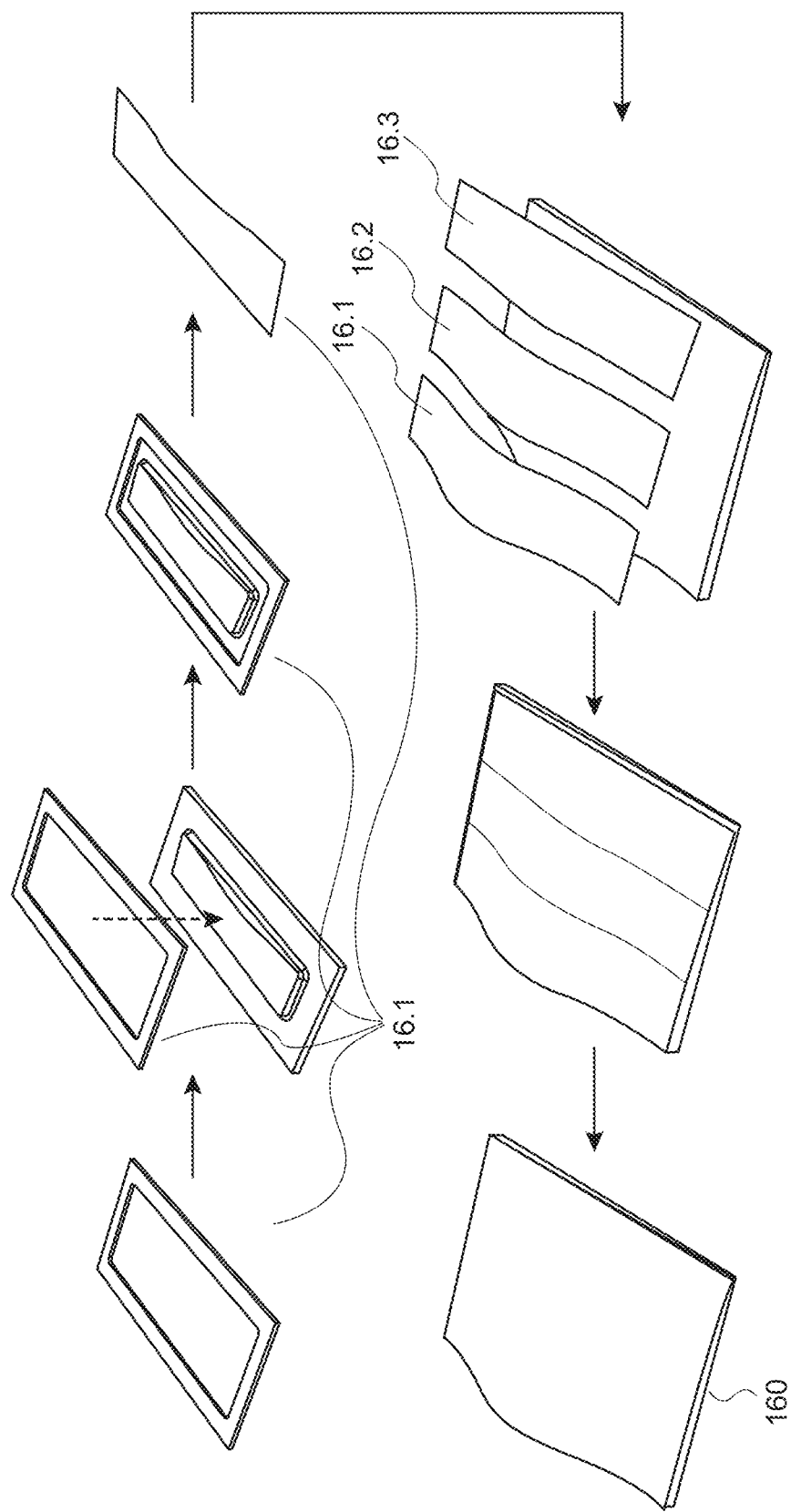

According to FIG. 23, an optoelectronic array (16.1) is assembled onto a frame before the optoelectronic array (16.1) is deep drawn with the help of a forming tool. The step of deep drawing is then followed by a step of cutting the optoelectronic array (16.1) into an appropriate shape. In particular, the frame applied to or around the optoelectronic array (16.1) is cut off. In a next step three, 3D-shaped optoelectronic arrays (16.1, 16.2, 16.3) are arranged adjacent to each other on for example a 3D-shaped chassis or a 3D-shaped carrier and can for example be glued to the 3D-shaped chassis. The step of arranging is then followed by a step of interconnecting the three 3D-shaped optoelectronic arrays (16.1, 16.2, 16.3). The step of interconnecting can thereby be performed by the help of an electrical module according to any of the above-described aspects. In other words, this means that the optoelectronic arrays are first 3D-shaped using a deep drawing tool/process, before being assembled (arranging+interconnecting). As due to the deep drawing process the position of the optoelectronic components of the at least two optoelectronic arrays and the thickness of the at least two optoelectronic arrays may change and as due to the deep drawing process excess material of the optoelectronic arrays may be in some locations, the optoelectronic arrays may be cut out into an appropriate shape before assembling the optoelectronic arrays onto/into a frame and rather simple 3 dimensional shapes are preferred.

Figure 24:
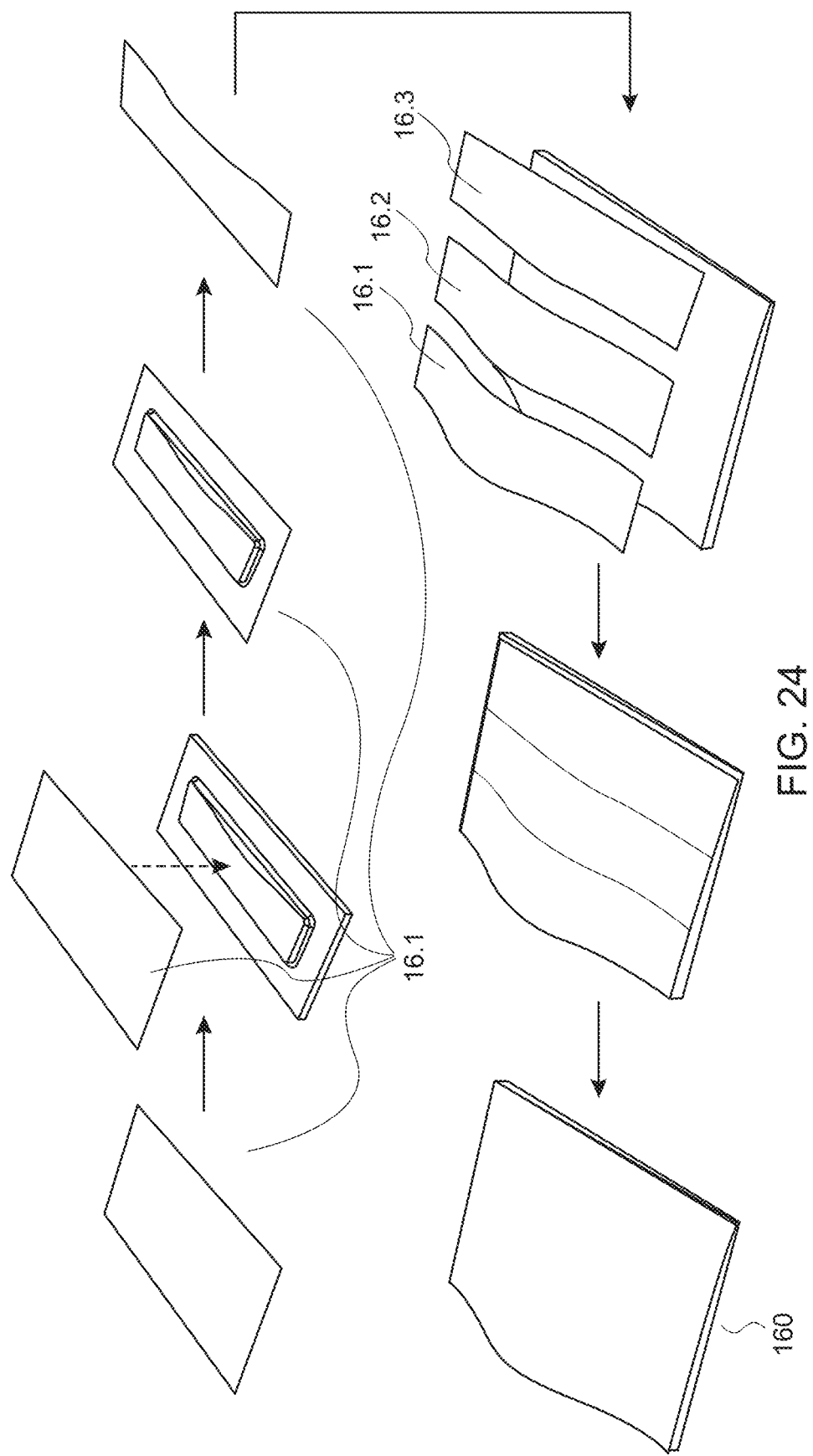

As shown in FIG. 24 the method of manufacturing a 3D-shaped display module (160) varies to the method shown in FIG. 23 in such, that the deep drawing process is performed without an additional frame on or around the optoelectronic array (16.1). Thus, after the step of deep drawing the step of cutting the optoelectronic array (16.1) into an appropriate shape may be redundant as there is no frame applied to or around the optoelectronic array (16.1) to be cut off.

Figure 25:
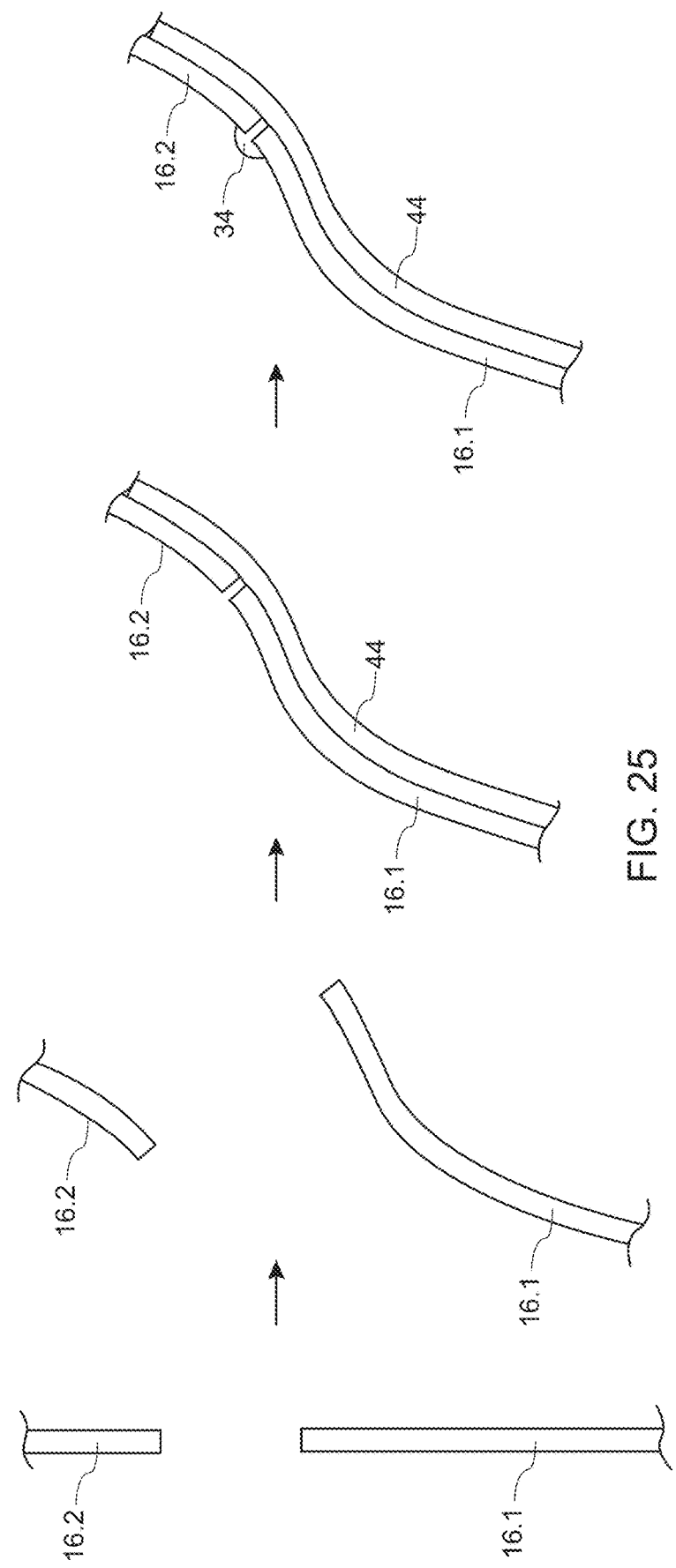

FIG. 25 shows a side view of a method to manufacture a 3D-shaped display module (160). As in the above-described two methods, two optoelectronic arrays (16.1, 16.2) are first being 3D-shaped using a deep drawing tool/process, before being assembled (arranging+laminating+interconnecting). The 3D-shaped optoelectronic arrays (16.1, 16.2) are arranged adjacent to each other on either a preformed carrier foil (44) or the carrier foil (44) is laminated to the surface of the optoelectronic arrays (16.1, 16.2) opposite to the first surface (18). This is then followed by a step of a 3D interconnect which may provide a purely mechanical and/or electrical connection. 'However it is also conceivable that only gaps between the optoelectronic arrays (16.1, 16.2) are closed in order to make the appearance homogeneous.

Figure 26:
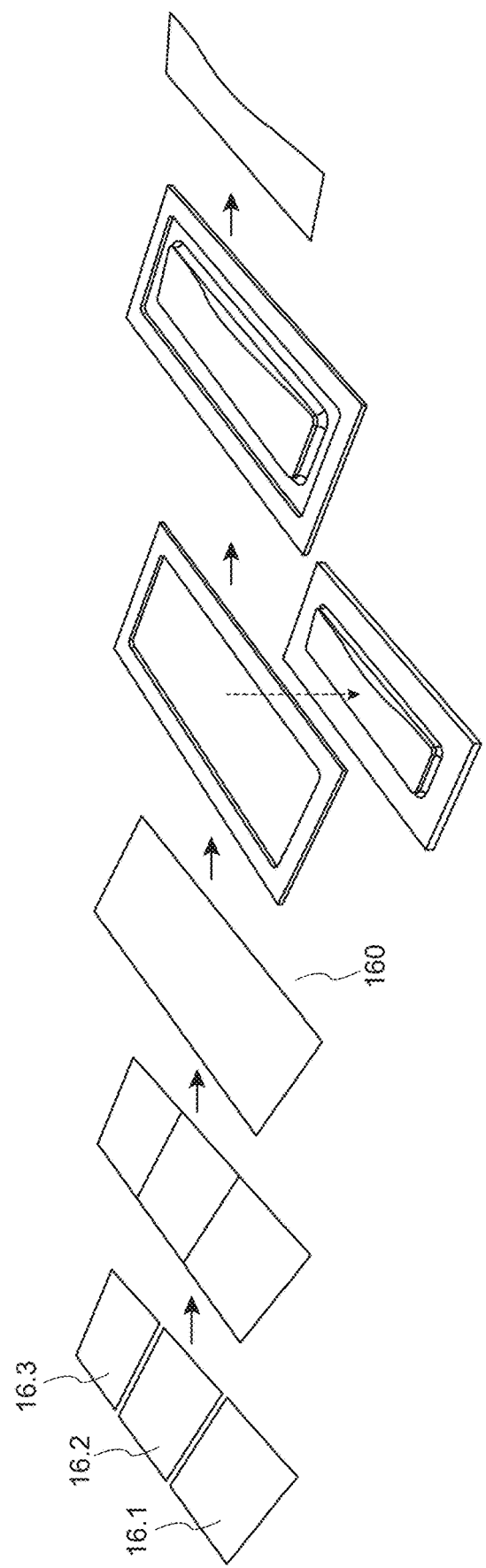
Figure 27:
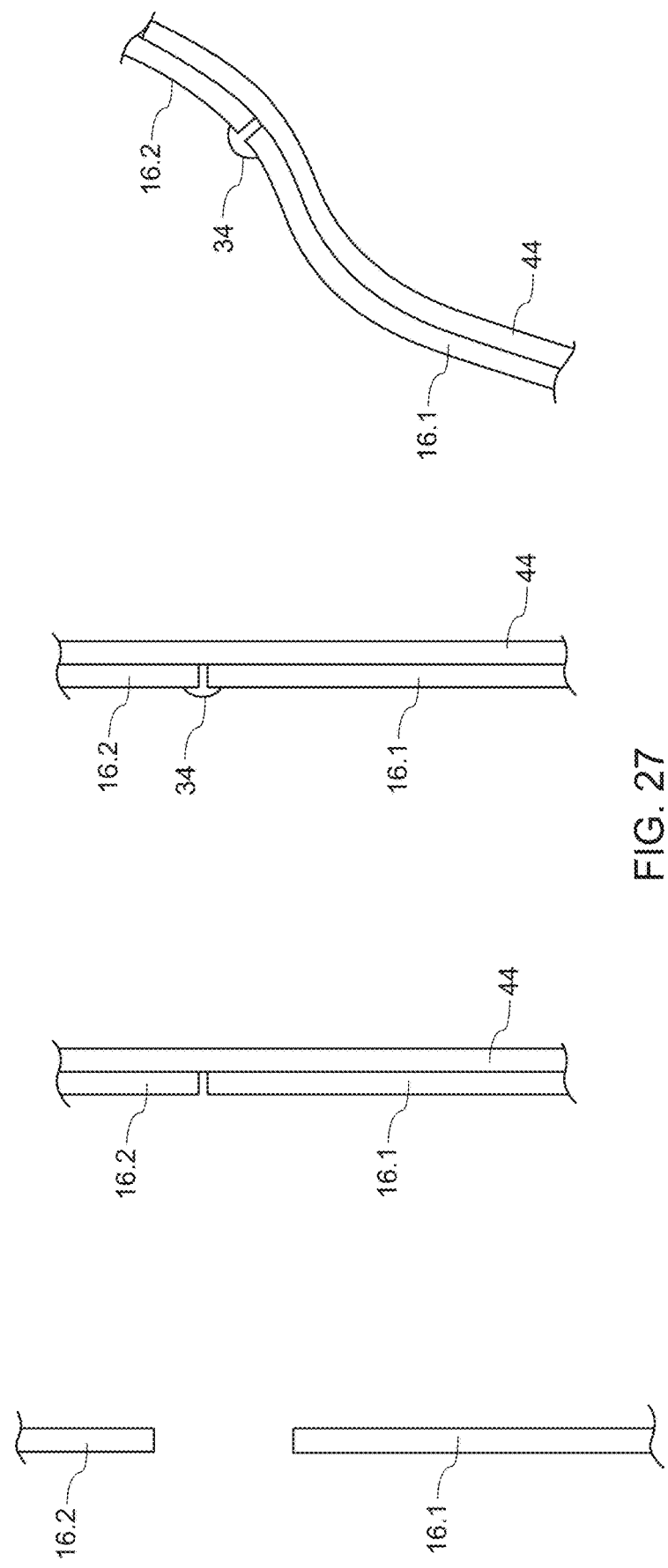

According to FIG. 26, a method for manufacturing a 3D-shaped display module (160) is shown, according to which the at least two optoelectronic arrays are first assembled (arranging+laminating+interconnecting) before giving the assembled display module a 3D-shape with the help of a deep drawing process. In other words, the step of arranging for example is followed by the step of laminating, the step of laminating is then followed by the step of interconnecting and the step of interconnecting is followed by the step of deep drawing. This order of steps might be conceivable as the at least two optoelectronic arrays can be joined more easily in a planar state than in a preformed state. The preforming thus might result in tolerances that make exact joining the at least two optoelectronic arrays difficult. The step of deep drawing is according to the figure be performed using a frame, which is applied to or around the assembled optoelectronic arrays (16.1, 16.2, 16.3). However, it may also be conceivable to dispense the frame and do the deep drawing without it. After the step of deep drawing, the 3D-shaped display module (160) is then cut into an appropriate shape. In particular, it can be conceivable to remove at least the frame applied to the optoelectronic arrays (16.1, 16.2, 16.3) and cut the 3D-shaped display module (160) into an appropriate shape.

FIG. 25 shows a side view of at least parts of the method to manufacture a 3D-shaped display module (160) as it was shown in FIG. 26. The two optoelectronic arrays (16.1, 16.2) are arranged adjacent to each other in a planar state and then laminated with a carrier foil (44) and interconnected with at least on electrical module (34). The assembled (arranged+laminated+interconnected) display module (160) is then 3D-shaped by the help of for example a deep drawing process or the like.

Figures 28A, 28B:
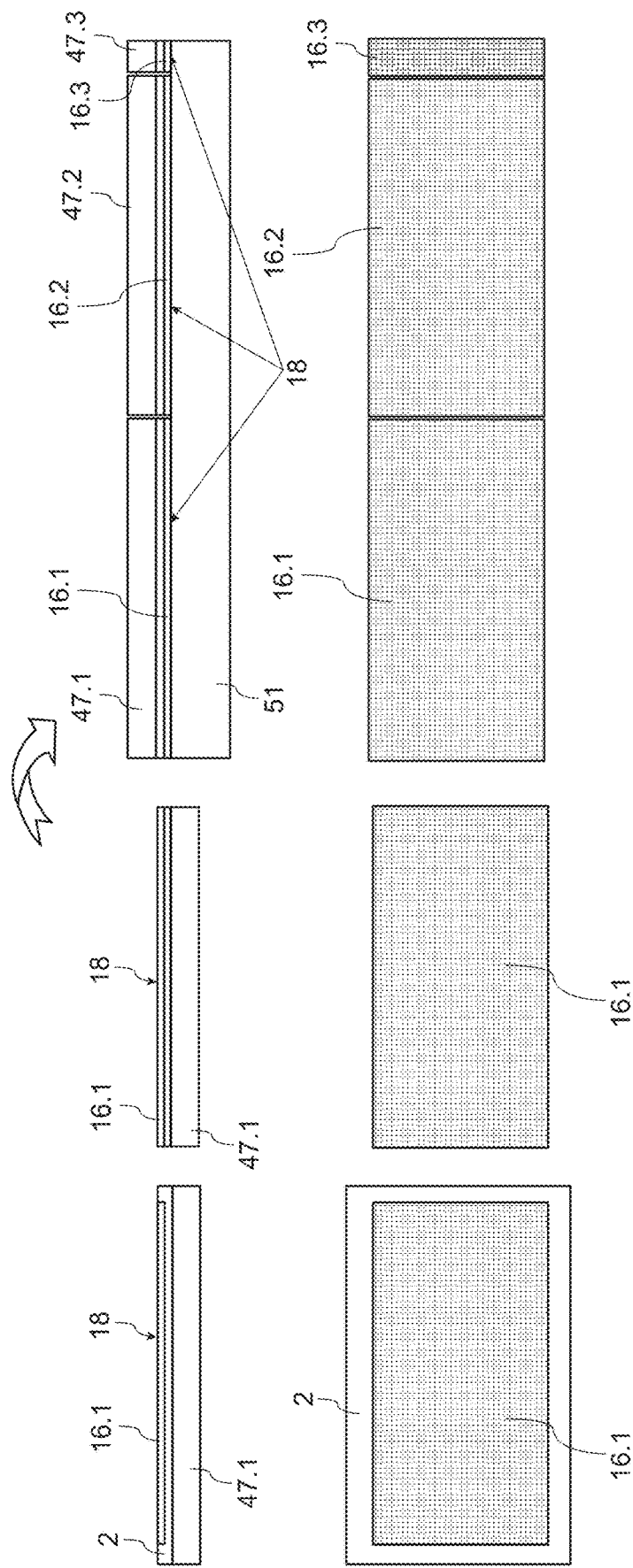

As shown in FIGS. 28A and 28B the optoelectronic arrays (16.1, 16.2, 16.3) can each be provided arranged on a carrier tape (47.1, 47.2, 47.3). Thus, an equipping of the pixel area of each of the optoelectronic arrays with the optoelectronic components and integrated circuits on the transparent carrier layer (2) has been performed on the carrier tape (47.1, 47.2, 47.3). Optoelectronic arrays arranged on a carrier tape (47.1, 47.2, 47.3) are first being provided and then being cut into an appropriate shape. In particular, cutting the optoelectronic arrays into an appropriate shape may be understood as cutting off an edge area of the carrier tape comprising for example adjustment structures, test structures and markings for panel identification. This edge area is cut off by means of for example a laser, a blade, or the like. However it is preferred that the step of cutting is carried out very precisely and for example an image process is monitoring the cutting simultaneously. The step of cutting is then be followed by the step of arranging the optoelectronic arrays (16.1, 16.2, 16.3) next to each other with each the carrier tape (47.1, 47.2, 47.3) facing into the same direction. This includes, that the optoelectronic arrays (16.1, 16.2, 16.3) are flipped and mounted with the first surface (18) down onto a fixing table (51). The flip, transfer and mounting on the fixing of the at least two optoelectronic arrays table can be for example performed by vacuum. Before mounting the optoelectronic arrays (16.1, 16.2, 16.3) to the fixing table (51), it can be preferred, that the optoelectronic arrays are adjusted to each other by means of an image process. The mounting on the fixing table ensures that the at least two optoelectronic arrays do not warp when further processing them.

Figure 29A:
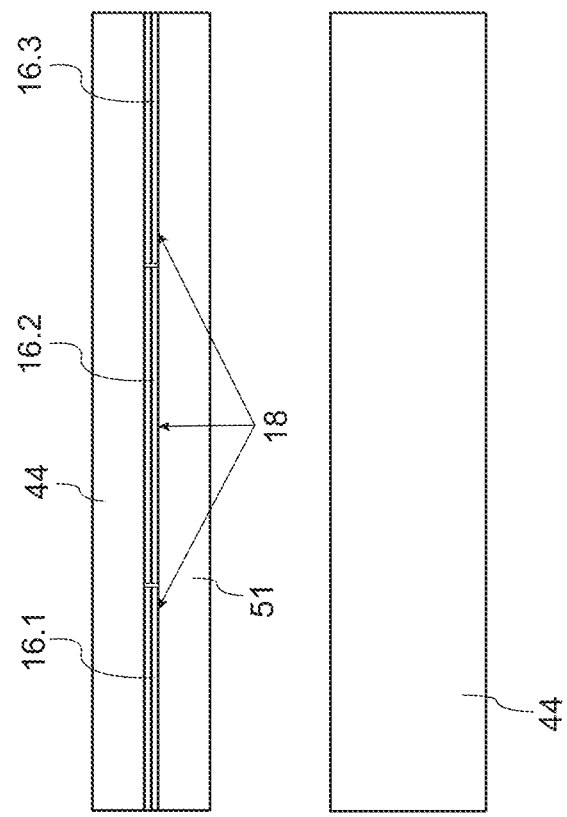
Figure 29B:
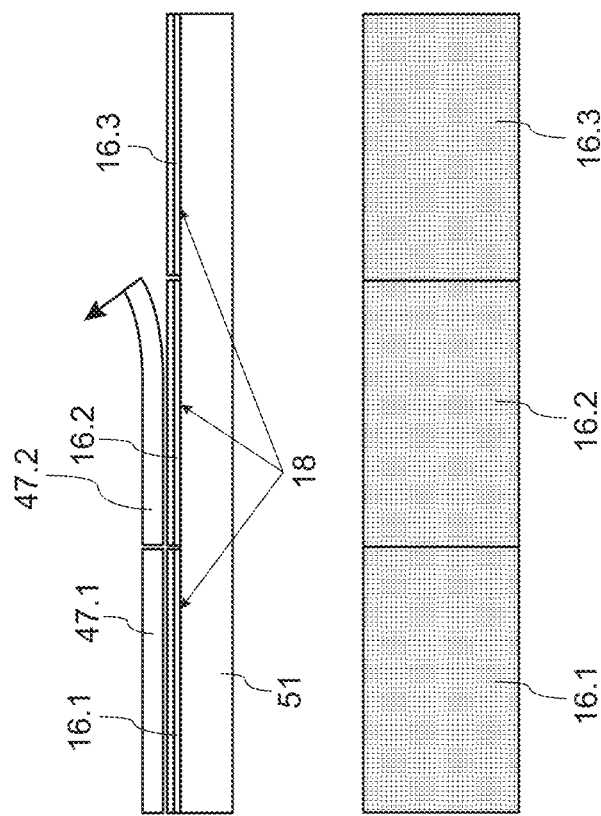
Figure 30A:
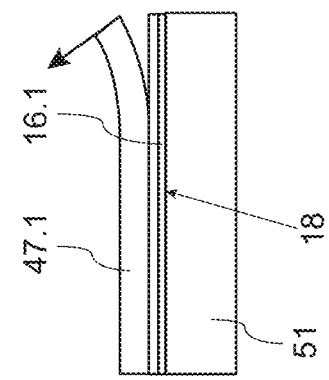
Figure 30B:
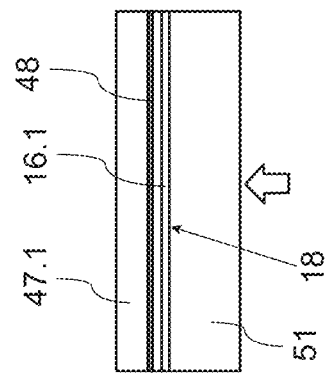
Figure 30C:
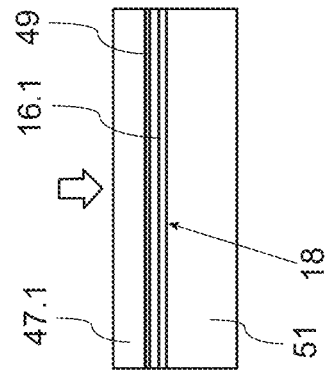

The step of mounting is then be followed by a step of removing the carrier tape (47.1, 47.2, 47.3) as shown in FIGS. 29A and 29B. This step can thereby be performed by peeling off the carrier tape (47.1) (see FIG. 30A), by heating a thermal release film (48) arranged between the carrier tape (47.1) and the optoelectronic arrays (16.1) (see FIG. 30B), or by illuminating a laser release layer (49) arranged between the carrier tape (47.1) and the optoelectronic arrays (16.1) with a laser (see FIG. 30C). The methods shown in FIGS. 30B and 30C have the advantage that no shear forces act on the optoelectronic arrays (16.1). However due to a thermal expansion, in the case of a thermal release film (48), there is a higher risk of warping of the optoelectronic arrays (16.1) during thermal removal than in the case of a laser release layer (49).

Referring back to FIGS. 29a and 29B the step of removing the carrier tape (47.1, 47.2) is then followed by laminating a carrier foil (44) on a surface of the optoelectronic arrays (16.1, 16.2, 16.3) opposite to the first surface (18). The vacuum fixation can be released after the step of removing the carrier tape (47.1, 47.2) or after the step of laminating a carrier foil (44) onto the optoelectronic arrays (16.1, 16.2, 16.3). The assembled at least optoelectronic arrays can then be removed from the fixing table and be 3D-shaped within the step of deep drawing the optoelectronic arrays to obtain a 3D-shape display module.

Figure 31:
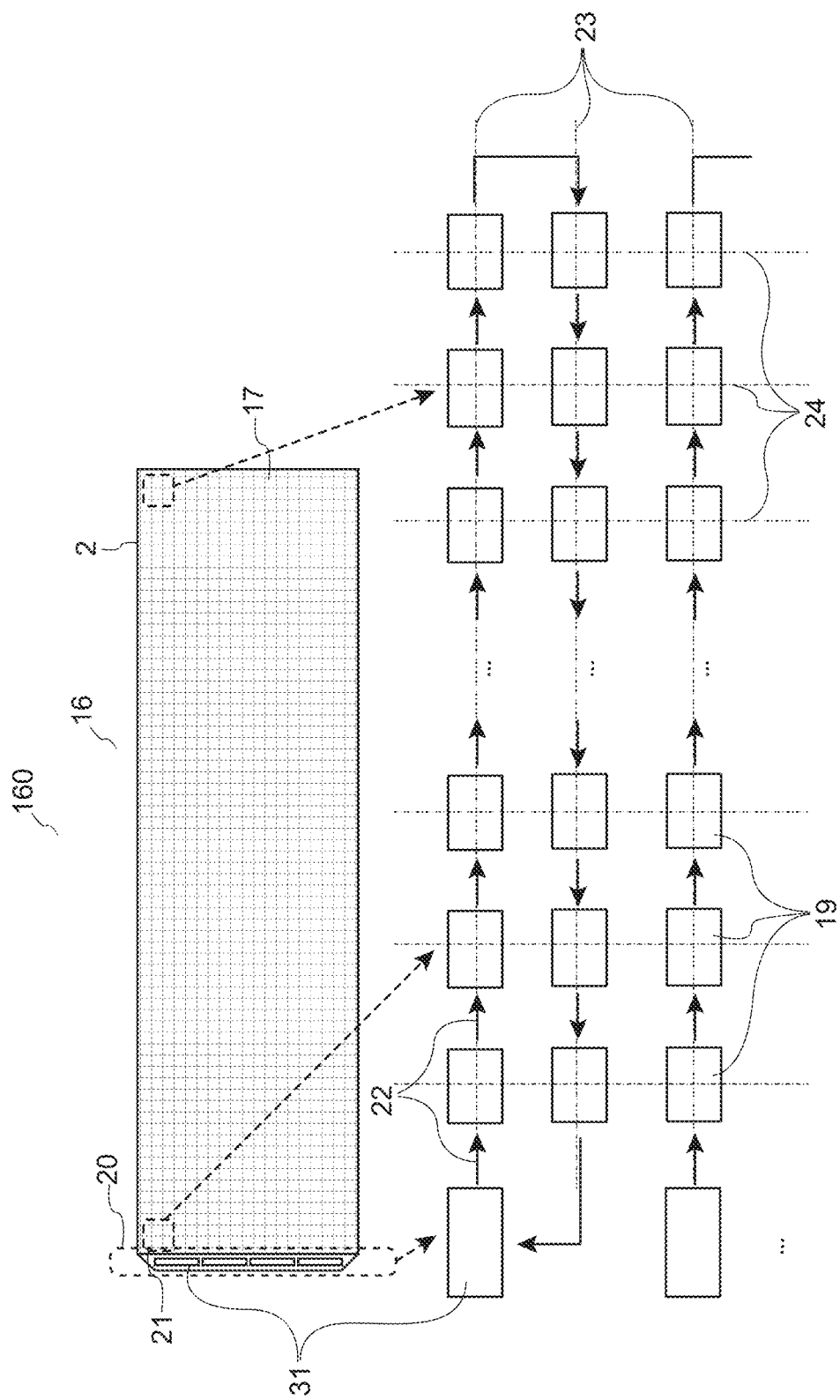

Referring now to FIG. 31, there is shown a display module (160) comprising at least one optoelectronic array (16), wherein the optoelectronic array (16) comprises at least one arrangement to control at least one optoelectronic component according to the present disclosure. The control of the display module (160) takes thereby preferably place from only one side (21) of the display module. The area (20) with the required control elements and plugs can then advantageously be hidden in an application. According to the Figure, the control of the display module is provided via a daisy chain network. Individual integrated circuits (19), which can drive one or more optoelectronic components and thus pixels (17) associated with the optoelectronic components, are arranged on a transparent carrier layer (2) in a linear arrangement and are connected with a serial bus driver (31) by a first data line (22). Additionally a return channel is provided and connected to the serial bus driver (31).

FIGS. 32 to 33C show embodiments of an integrated circuit (19) connected to 1, 2 and 8 optoelectronic components (4). The optoelectronic components (4) are thereby each comprising three subcomponents (4.1, 4.2, 4.3), wherein each subcomponent is a µLED, and wherein the three subcomponents are for example adapted to emit one of the colours red, green and blue. In other words, one of the three subcomponents (4.1) is for example adapted to emit red light, one of the three subcomponents (4.2) is for example adapted to emit green light and one of the three subcomponents (4.3) is for example adapted to emit blue light. Hence, an aforementioned optoelectronic component (4) forms a so-called RGB pixel. However, the optoelectronic components (4) may also comprise for example a Flip-Chip mountable LED or a Flip-Chip mountable µ-LED. The integrated circuits (19) are further each arranged within two portions of a first data line (22) and connected to them to connect several integrated circuits (19) with one another.

The embodiment of FIG. 32 shows an integrated circuit (19), wherein one optoelectronic component (4), particularly an optoelectronic component (4) comprising three subcomponents (4.1, 4.2, 4.3), is arranged on or integrated in the integrated circuit (19).

FIGS. 33A to 33C however show embodiments of an integrated circuit (19) connected to 1, 2 or 8 optoelectronic components (4), wherein the optoelectronic components (4) are each comprising three subcomponents (4.1, 4.2, 4.3) and are arranged adjacent to the integrated circuit (19).

Figure 34:
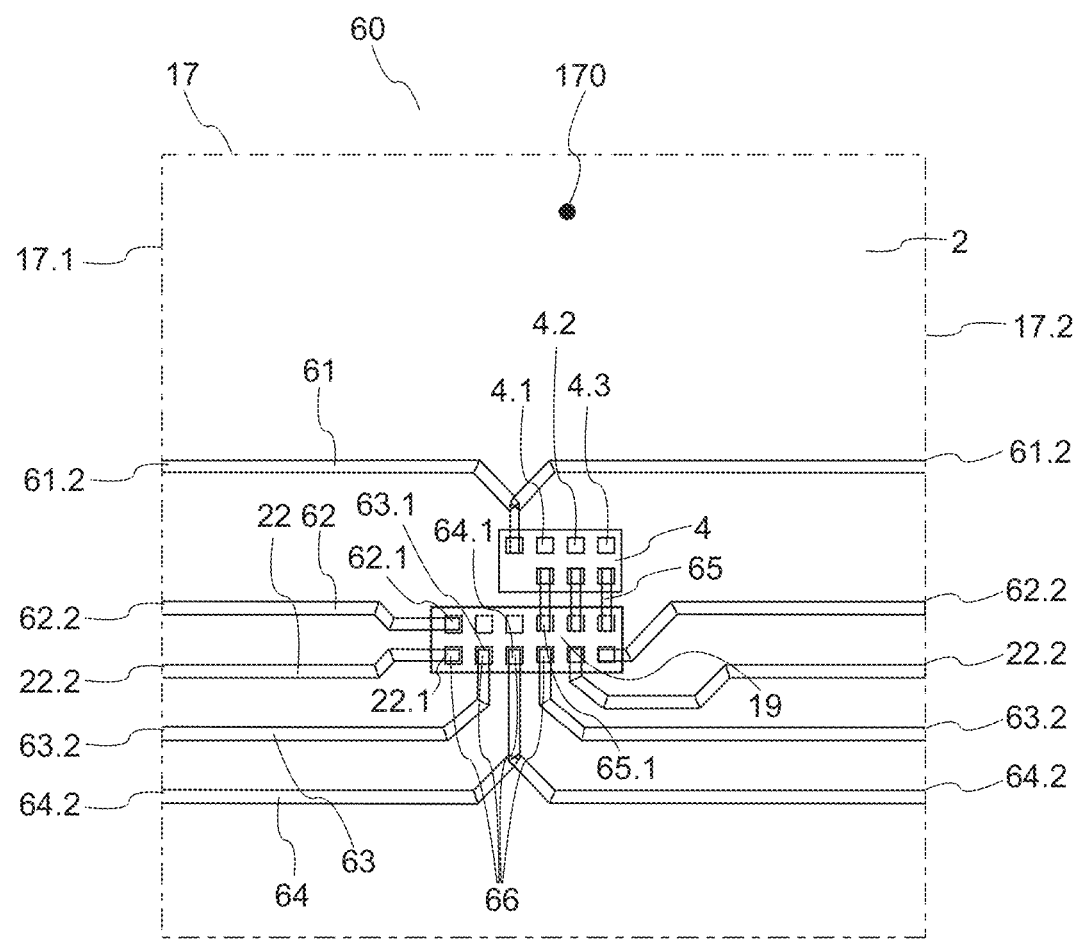

FIG. 34 shows a section of an optoelectronic array (16) particularly a pixel (17) of an optoelectronic array (16), wherein an arrangement (60) to control at least one optoelectronic component according to the present disclosure is arranged within a pixel area (170) of the pixel (17). The arrangement is thereby comprising a transparent carrier layer (2), an optoelectronic component (4) comprising three subcomponents (4.1, 4.2, 4.3) and an integrated circuit (19), in particular a µIC. The integrated circuit (19) as well as the optoelectronic component (4) are arranged on an upper surface of the transparent carrier layer (2) and are connected to each other by structured second supply lines (65). The arrangement is further comprising a structured first supply line (61), in particular to provide an electrical supply (VDDLED) to the optoelectronic component (4), which is arranged on the transparent carrier layer (2) and is electrically coupled to the optoelectronic component (4). A structured second supply line (62) is also arranged on the transparent carrier layer (4) and is electrically coupled to the integrated circuit (19). The structured second supply line (62) is in particular adapted to provide an electrical supply (VDDIC) to the integrated circuit (19). To provide a ground potential (GND) to the integrated circuit, the integrated circuit (19) is further electrically coupled to a structured ground potential line (63) which is also arranged on the transparent carrier layer (4). In addition, a first data line (22) is arranged on the transparent carrier layer (2) and coupled to the integrated circuit (19) to provide a data signal (DAT) to the integrated circuit (19), as well as a clock line (64) which is also arranged on the transparent carrier layer (4) and coupled to the integrated circuit (19) to provide a clock signal (CLK) to the integrated circuit (19).

Contact portions (62.1, 63.1, 22.1, 64.1, 65.1) of the second supply line (62), the ground potential line (63), the first data line (22), the clock line (64) and the contact lines (65) are coupled to a plurality of contact pads (66) arranged on the integrated circuit (19) by for example a planar or flip chip interconnect. Thus, a connection to the integrated circuit (19) can be provided. According to FIG. 34, the integrated circuit (19) comprises 12 contact pads (66) wherein two contact pads (66) are not in use. However, one of the spare contact pads can be used to provide a connection to the optoelectronic component (4) to also provide the ground potential to the optoelectronic component (4).

End portions (61.2, 62.2, 63.2, 22.2, 64.2) of each of the structured first supply line (61), the structured second supply line (62), the structured ground potential line (63), the first data line (22) and the clock line (64) are distributed along two opposite edges (17.1, 17.2) of the pixel (17). This is particularly expedient, as thus the connection to an adjacent pixel can be provided and an area covered by the elements of the arrangement (60) can be reduced to ensure a best possible visibility through the optoelectronic array (16).

According to FIG. 34 the end portions (61.2, 62.2, 63.2, 22.2, 64.2) are distributed in a central region on the two opposite edges (17.1, 17.2), wherein the central region is formed by less than 50% of the edges' (17.1, 17.2) length.

For a pixel area (170) of for example 500 µm×500 µm and respective sizes of the integrated circuit (19), the optoelectronic component (4), the first supply line (62), the second supply line (62), the ground potential line (63), the first data line (22), the clock line (64) and the contact lines (65) the occupied space within the pixel area (170) could for example be 12% or less of the pixel area (170). However the size of the pixel area can differ and have a size in the range of 0.1 mm×0.1 mm to 2 mm×2 mm, more particularly in the range of 250 µm×250 µm to 1 mm×1 mm and even more particularly smaller than 1 mm×1 mm.

Figure 35:
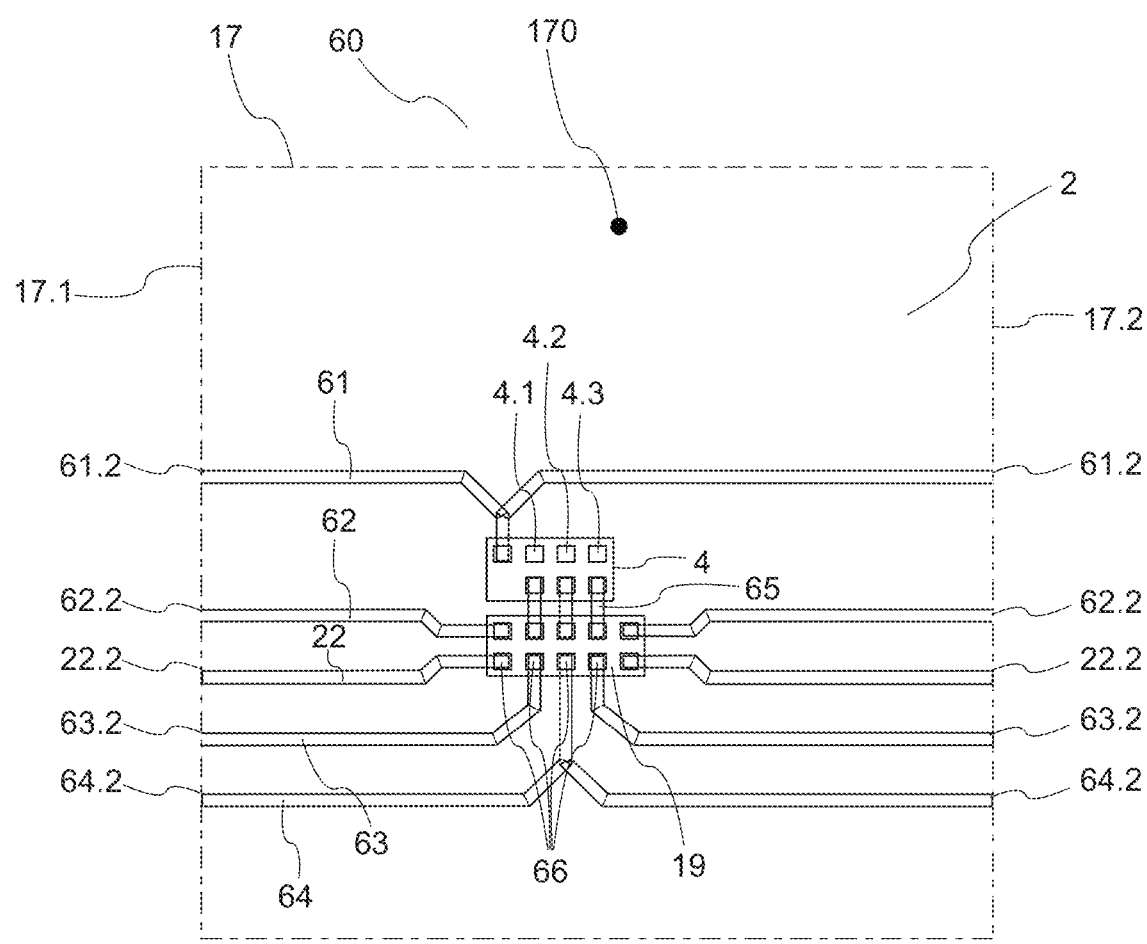

To reduce the occupied space, FIG. 35 shows an embodiment of an arrangement (60), wherein compared to the embodiment of shown in FIG. 34 the integrated circuit (19) is reduced and the spare contact pads are removed.

Figures 36A, 36B:
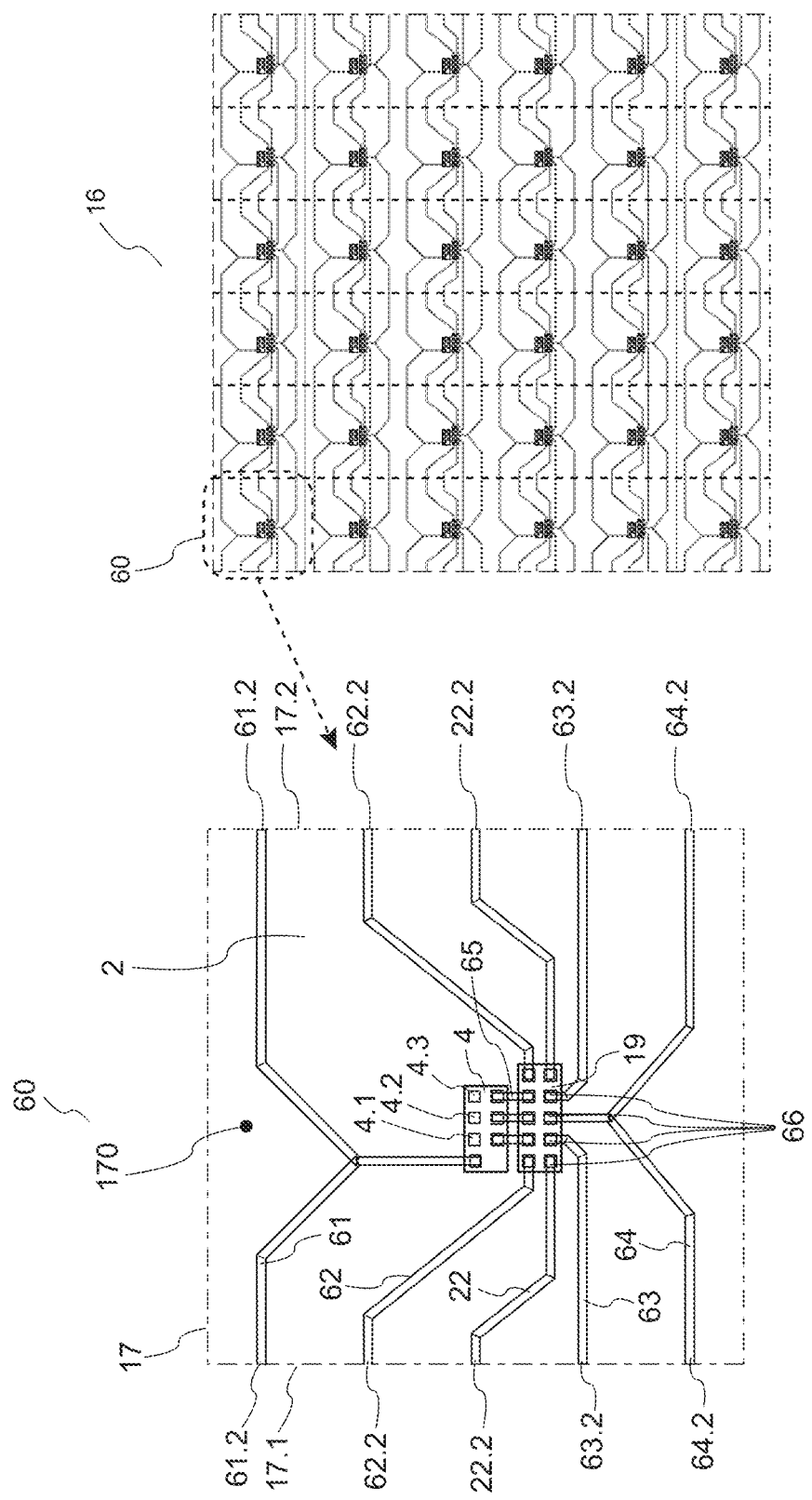

FIG. 36A however shows an embodiment of an arrangement (60), wherein the visibility through the optoelectronic array (16) is improved by distributing the end portions (61.2, 62.2, 63.2, 22.2, 64.2) along the two opposite edges (17.1, 17.2) in such, that each two adjacent end portions are arranged with an substantially equal spacing along the two opposite edges (17.1, 17.2). Thus, the macroscopic appearance of the distributed conductor lines (61, 62, 63, 64, 22) can be designed as homogeneously as possible over the whole optoelectronic array (16).

FIG. 36B shows the respective appearance over a section of an optoelectronic array (16) comprising a plurality of pixels (17) and thus arrangements (60). The arrangements (60) of each row of pixels (17) are thereby connected in series.

To further reduce the occupied space of the pixel area (170), FIG. 37 shows an embodiment of an arrangement, wherein compared to the embodiment of shown in FIG. 34 the optoelectronic component (4) is arranged on or integrated in the integrated circuit (19). Doing a similar estimate as shown above for a pixel area (170) of for example 500 µm×500 µm and respective sizes of the integrated circuit (19) with the integrated optoelectronic component (4), the first supply line (62), the second supply line (62), the ground potential line (63), the first data line (22) and the clock line (64) the occupied space within the pixel area (170) could for example be 10% or less of the pixel area (170).

FIG. 38 shows a section of an optoelectronic array (16) particularly two pixels (17) of an optoelectronic array (16), wherein an arrangement (60) to control at least one optoelectronic component according to the present disclosure is arranged within the combined pixel area (170) of the two pixels (17). The arrangement is thereby comprising two optoelectronic components (4) with each optoelectronic component (4) comprising three subcomponents (4.1, 4.2, 4.3) and each optoelectronic component (4) is associated with one pixel (17) and arranged within the pixel area (170) of the respective associated pixel (17). The integrated circuit (19) is according to FIG. 38 arranged on the adjacent edges of the two adjacent pixels and particularly is arranged in the center of the combined area of the two pixels (17). The orientation of the integrated circuit (19) is thereby perpendicular to a long edge (17.1) of the combined area of the two adjacent pixels (17) and the structured conductors (61, 62, 63, 64, 22) are oriented substantially in a same direction compared to the orientation of the integrated circuit (19).

End portions (61.2, 62.2, 63.2, 22.2, 64.2) of each of the structured first supply line (61), the structured second supply line (62), the structured ground potential line (63), the first data line (22) and the clock line (64) are distributed along two opposite edges (17.1, 17.2) of the pixels (17), wherein the two opposite edges (17.1, 17.2) are formed by the two opposite long edges (17.1, 17.2) of the combined area of the two pixels (17).

The end portions (62.2, 63.2, 22.2, 64.2) of each of the structured second supply line (62), the structured ground potential line (63), the first data line (22) and the clock line (64) are even more particularly distributed in a central region on the two opposite edges (17.1, 17.2), wherein the central region is formed by less than 20% of the edges' (17.1, 17.2) length and arranged in the center of the edges' (17.1, 17.2) length.

Doing a similar estimate as shown above for a pixel area (170) of for example 500 µm×500 µm and respective sizes of the integrated circuit (19), the two optoelectronic components (4), the first supply line (62), the second supply line (62), the ground potential line (63), the first data line (22), the clock line (64) and the contact lines (65) the occupied space within the pixel area (170) could for example be 9% or less of the combined area of the two pixels (17).

FIGS. 39 and 40 show further embodiments of a section of an optoelectronic array (16) particularly two pixels (17) of an optoelectronic array (16), wherein an arrangement (60) to control at least one optoelectronic component according to the present disclosure is arranged within the combined pixel area (170) of the two pixels (17). Compared to FIG. 38 the structured conductors (61, 62, 63, 64, 22) are oriented substantially in a vertical direction compared to the orientation of the integrated circuit (19). Thus, the structured conductors (61, 62, 63, 64, 22) traverse the combined area of the two pixels (17) in an orientation similar to the orientation of a long edge of the combined area of the two adjacent pixels (17). The arrangement is comprising two optoelectronic components (4) with each optoelectronic component (4) comprising three subcomponents (4.1, 4.2, 4.3) and each an optoelectronic component (4) is associated with one pixel (17) and arranged within the pixel area (170) of the respective associated pixel (17). The integrated circuit (19) is arranged on the adjacent edges of the two adjacent pixels and particularly is arranged in the center of the combined area of the two pixels (17).

End portions (61.2, 62.2, 63.2, 22.2, 64.2) of each of the structured first supply line (61), the structured second supply line (62), the structured ground potential line (63), the first data line (22) and the clock line (64) are distributed along two opposite edges (17.1, 17.2) of the adjacent pixels (17) in such, that each two adjacent end portions are arranged with an substantially equal spacing along the edges (17.1, 17.2).

The plurality of contact pads of the integrated circuit shown in FIG. 40 are arranged on the integrated circuit in a single row. Thus, the integrated circuit can comprise the shape of a rectangular with two sides being much longer compared to the other two sides and particularly the shape of a bar. Arranging the contact pads on the integrated circuit in only one row can be expedient, as parasitic capacities in the integrated circuit can be reduced in such structure. In addition, arranging the contact pads on the integrated circuit in only one row can be expedient, as the visibility through the optoelectronic array (16) can be improved by a more homogeneous distribution of the structured conductors (61, 62, 63, 64, 65, 22) across the area of the two pixels (17).

FIG. 41A shows a section of an optoelectronic array (16) particularly 4 adjacent pixels (17) of an optoelectronic array (16), wherein an arrangement (60) to control at least one optoelectronic component according to the present disclosure is arranged within the combined pixel area (170) of the 4 pixels (17). The arrangement is thereby comprising 4 optoelectronic components (4) with each optoelectronic component (4) comprising three subcomponents (4.1, 4.2, 4.3) and each optoelectronic component (4) is associated with one pixel (17) and arranged within the pixel area (170) of the respective associated pixel (17).

The adjacent pixels (17) are arranged in a matrix of 2×2, pixels (17) and the integrated circuit (19) is arranged in the center of the matrix and thus in the center of the combined area of the 4 adjacent pixels (17).

Similar to FIG. 38, end portions (61.2, 62.2, 63.2, 22.2, 64.2) of each of the structured first supply line (61), the structured second supply line (62), the structured ground potential line (63), the first data line (22) and the clock line (64) are distributed along two opposite edges (17.1, 17.2) of the pixels (17), wherein the end portions (62.2, 63.2, 22.2, 64.2) of each of the structured second supply line (62), the structured ground potential line (63), the first data line (22) and the clock line (64) are even more particularly distributed in a central region on the two opposite edges (17.1, 17.2), wherein the central region is formed by less than 20% of the edges' (17.1, 17.2) length and arranged in the center of the edges' (17.1, 17.2) length.

The structured contact lines (65) are arranged on the transparent carrier layer (2) in form of an "X" and are substantially symmetric to each an axis horizontally through the integrated circuit (19) and vertically through the integrated circuit (19).

Figure 42:
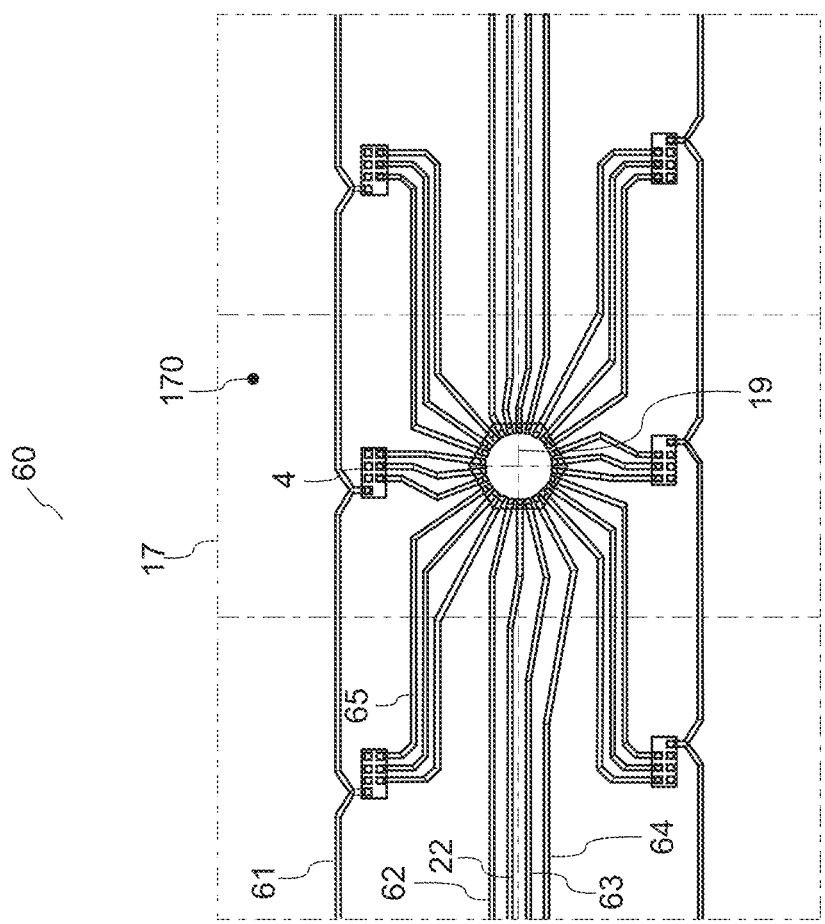

The respective appearance over a section of an optoelectronic array (16) comprising a plurality of pixels (17) and thus arrangements (60) is shown in FIG. 41B. The arrangements (60) of each row of pixels (17) are thereby connected in series. FIG. 42 shows a section of an optoelectronic array (16) particularly 6 adjacent pixels (17) of an optoelectronic array (16), wherein an arrangement (60) to control at least one optoelectronic component according to the present disclosure is arranged within the combined pixel area (170) of the 6 pixels (17). The arrangement is thereby comprising 6 optoelectronic components (4) with each optoelectronic component (4) comprising three subcomponents (4.1, 4.2, 4.3) and each optoelectronic component (4) is associated with one pixel (17) and arranged within the pixel area (170) of the respective associated pixel (17).

The adjacent pixels (17) are arranged in a matrix of 3×2, pixels (17) and the integrated circuit (19) is arranged in the center of the matrix and thus in the center of the combined area of the 6 adjacent pixels (17).

To accommodate a respective number of contact pads (66), the integrated circuit (19) comprises the shape of a regular polygon and more particular the shape of a regular polygon with 6 corners. The contact pads (66) are thereon arranged in a single row in form of a circle to ensure, that the interconnect of the contact pads and the second supply line, the ground potential line, the first data line, the clock line and the contact lines can be provided without an additional contact layer that connects for example contact pads in an inner area of the integrated circuit and bridges contact pads in an outer area of the integrated circuit (19).

Figure 43A:
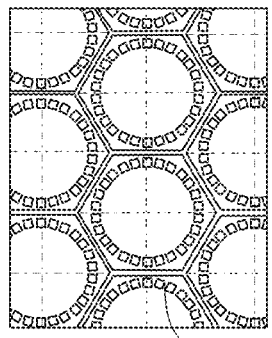
Figure 43B:
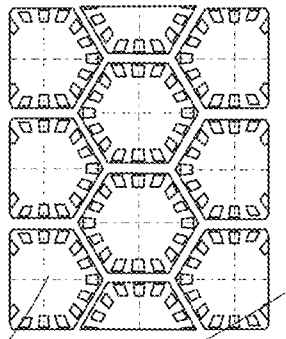
Figure 43C:
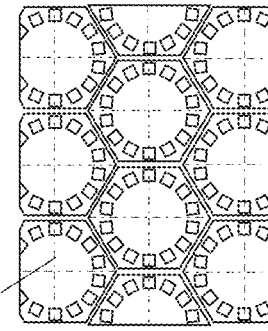

The respective integrated circuits (19) can be provided/manufactured on a wafer as shown in the FIGS. 43A to 43C. Due to the shape of a regular polygon, a plurality of integrated circuits can be arranged adjacent without any waste of space and thus material. The contact pads (66) are arranged on the integrated circuits (19) in a single row in form of a circle or following the edges of the polygon.

Figure 44:
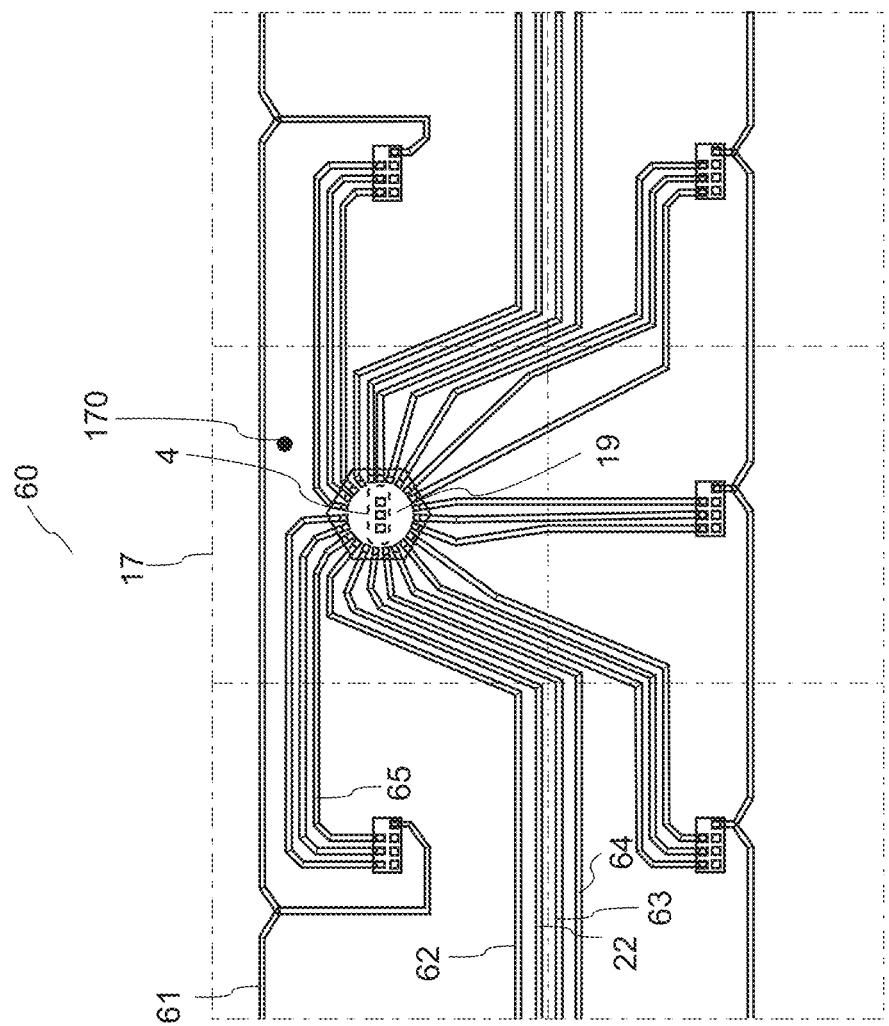

Referring to FIG. 44 a section of an optoelectronic array (16) particularly 6 adjacent pixels (17) of an optoelectronic array (16) is shown, wherein an arrangement (60) to control at least one optoelectronic component according to the present disclosure is arranged within the combined pixel area (170) of the 6 pixels (17). Compared to the embodiment shown in FIG. 42, the integrated circuit (19) is arranged within the pixel area (170) of only one of the 6 adjacent pixels (17). To reduce the occupied space of the pixel area (170), one optoelectronic component (4) and particularly the optoelectronic component (4) within the pixel area, in which the integrated circuit is arranged, is arranged on or integrated in the integrated circuit (19).

Figure 45C:
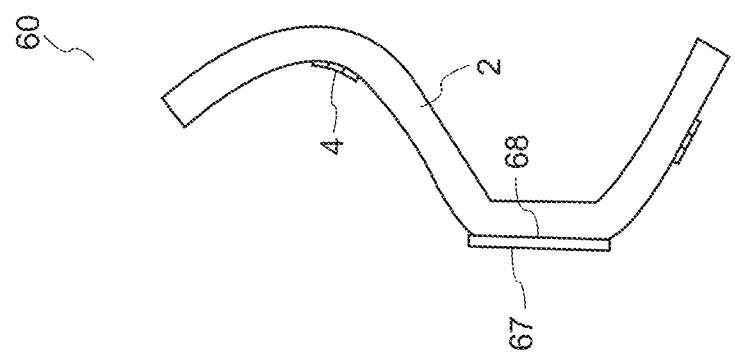
Figure 45B:
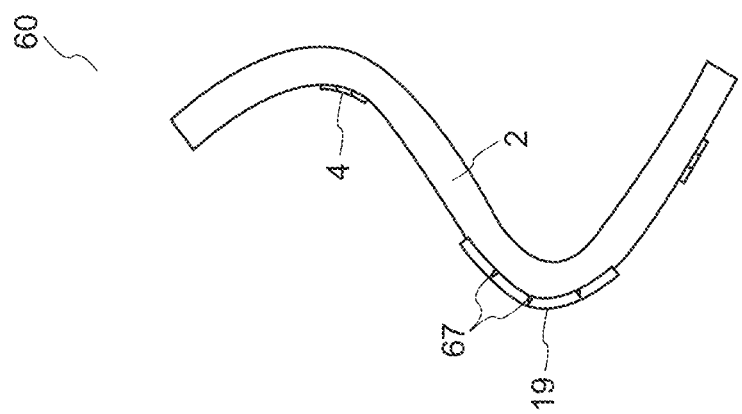
Figure 45A:
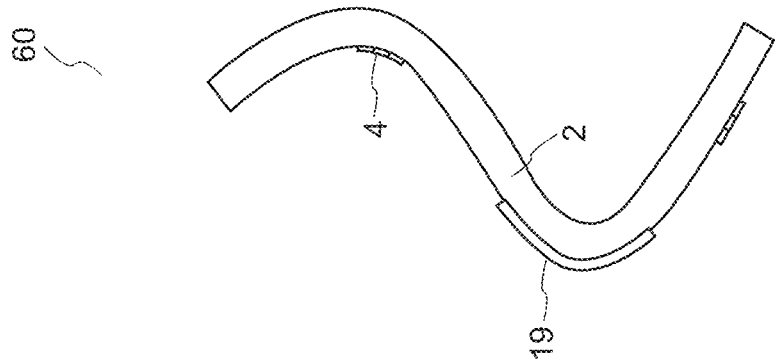

FIGS. 45A to 45C show embodiments of an arrangement with a 3-dimensional shape as the arrangement can be part of an optoelectronic array, which may be part of a display module of a display, wherein the display can be adapted to display information in or on a 3D-shaped surface of for example a vehicle. According to the Figures, the transparent carrier layer (2) can therefore comprise a 3-dimensional shape, and the integrated circuit arranged on the transparent carrier layer (2) may therefore have a respective bended shape to follow the 3-dimensional shape of the transparent carrier layer. Such an embodiment is for example shown in FIG. 45A.

To prevent a breakage of the integrated circuit (19) due to a bending, the integrated circuit (19) can comprise grooves (67) on the surface facing the transparent carrier layer (2), as shown in FIG. 45B, on the surface opposing the transparent carrier layer (2) (not shown), or on both surfaces (not shown). Such grooves (67) can be expedient in order to reduce stresses that can arise in the integrated circuit (19) due to a bending of it.

However, according to FIG. 45C the 3-dimensional shaped transparent carrier layer (2) can also comprise at least one plateau (68), or a flat/planar surface, wherein the integrated circuit (19) is arranged on the at least one plateau (68) or the flat surface. Such a plateau or flat surface may be expedient, as the integrated circuit (19) does not need to comprise a bended shape as it is arranged on a flat/planar surface.

Figure 46:
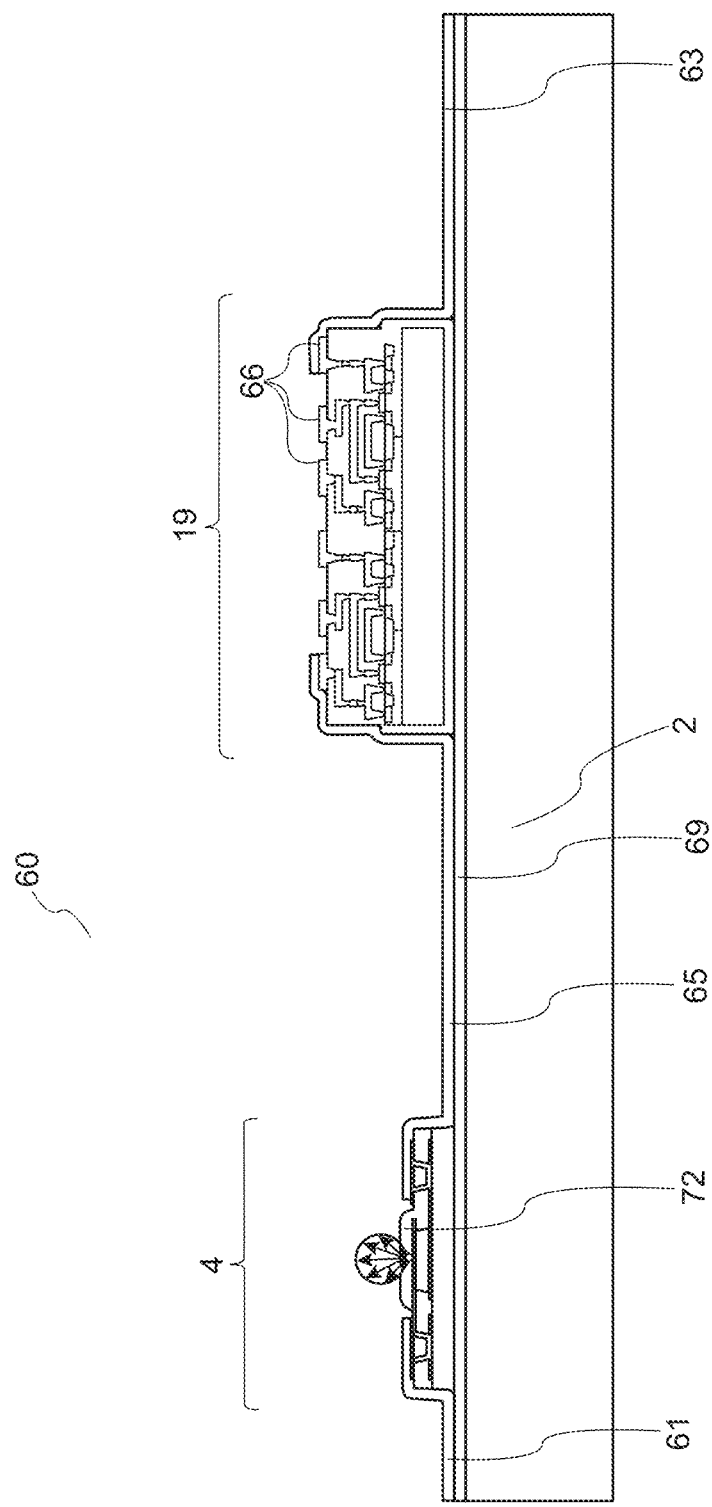
Figure 47:
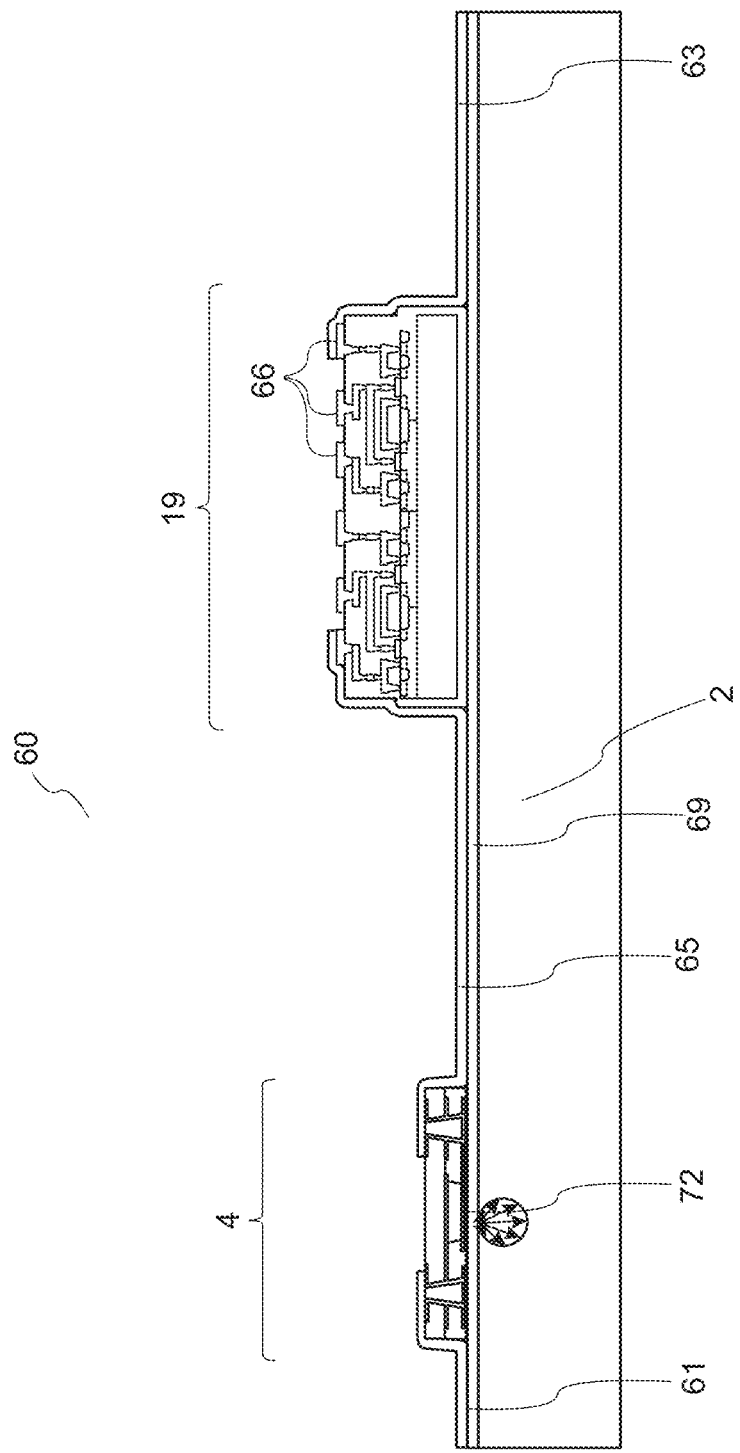

As shown in FIGS. 46 and 47 the arrangement (60) is comprising an adhesive (69), that is fixing the at least one optoelectronic component (4) and the integrated circuit (19) to the transparent carrier layer (2). The adhesive (69) is therefore arranged between the transparent carrier layer (2) and the at least one optoelectronic component (4) as well as between the transparent carrier layer (2) and the integrated circuit (19). In addition, the adhesive (69) is also arranged between the transparent carrier layer (2) and at least one of the at least one structured first supply line (61), the at least one structured second supply line (62), the at least one structured ground potential line (63), the at least one first data line (22), the at least one clock line (64) and the at least one structured contact line (65).

The structured conductors (61, 62, 63, 64, 65, 22) are for example adapted as so called "Planar Interconnect on Substrate" (PICOS) contacts. Such PICOS contacts may be provided with a method according to a PICOS process. Through such a process, the at least one optoelectronic component (4) and the integrated circuit (19) are "framed" by structured contact lines to ensure both a mechanical stability and an electrical interconnect of the at least one optoelectronic component (4) and the integrated circuit (19).

To allow the use of such a PICOS process, it can be expedient that the side flanks of the at least one optoelectronic component (4) and the integrated circuit (19) are electrically insulated and thus passivated. Hence, it can be expedient to prevent a short within for example an electrically conductive Si-layer of the at least one optoelectronic component (4) and/or the integrated circuit (19). Although a passivation to prevent a short can be provided on the substrate level, a passivation of the component is preferable as the costs at the substrate level are higher than on component level. This is due to the larger area per pixel on the substrate compared to the chip size.

According to FIG. 46, the optoelectronic component (4) is arranged on the transparent carrier layer (2) with a light emitting surface (72) facing away from the transparent carrier layer. However, the optoelectronic component (4) can also be switched as shown in FIG. 47 with its light emitting surface (72) facing the transparent carrier layer (2).

In case, that the optoelectronic component (4) is formed as a TripLED, meaning, that the optoelectronic component (4) is comprising 3 subcomponents (4.1, 4.2, 4.3) being arranged on an intermediate layer, the intermediate layer can comprise vias, to allow a interconnect of the optoelectronic component (4) by help of a PICOS process as shown in FIG. 47.

Figure 48:
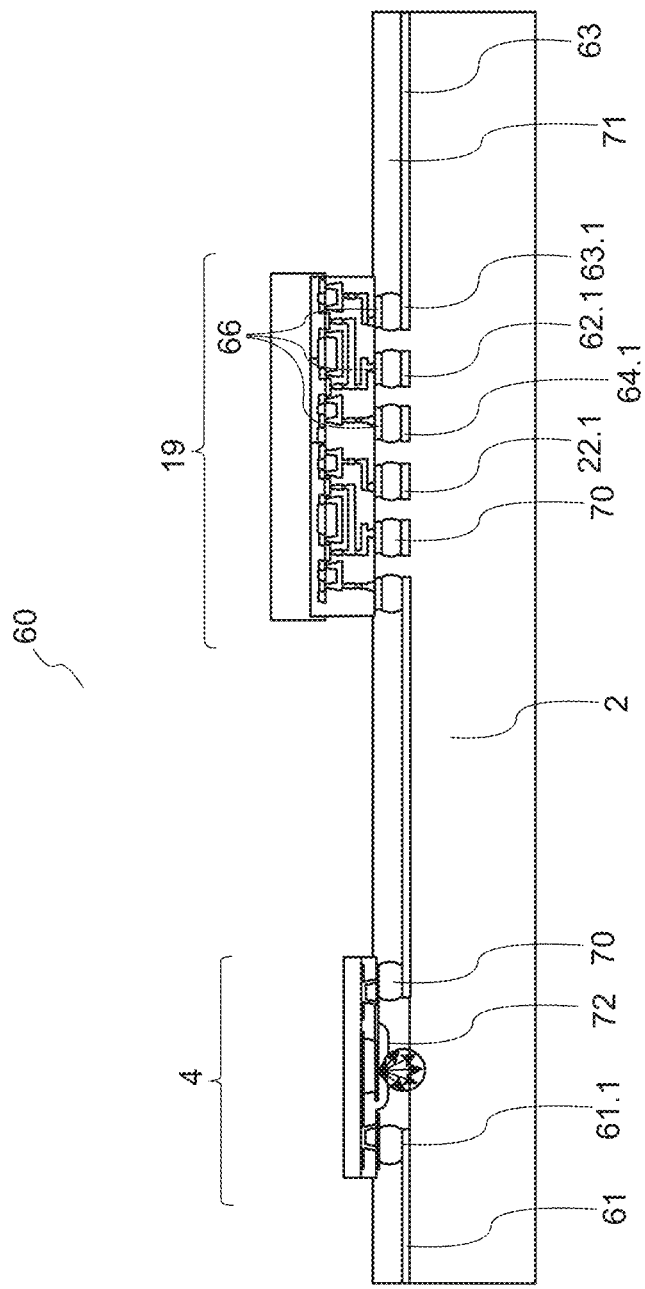

The at least one optoelectronic component (4) and/or the integrated circuit (19) can however also be arranged above contact portions (61.1, 62.1, 63.1, 64.1, 65.1, 22.1) of at least one of the at least one structured first supply line (61), the at least one structured second supply line (62), the at least one structured ground potential line (63), the at least one first data line (22), the at least one clock line (64) and the at least one structured contact line (65) and mechanically and electrically coupled to the contact portions (61.1, 62.1, 63.1, 64.1, 65.1, 22.1) by solder bumps (70) as shown in FIG. 48. The solder bumps (70) can thereby for example be Indium bumps, SnBi-µPillars or Si—Au-Spikes.

For an additional mechanical stability the arrangement (60) according to the FIG. 48 is further comprising an underfill material (71) surrounding the solder bumps (70). Hence the underfill material (71) is arranged between the solder bumps (70) as well as between the at least one optoelectronic component (4), the integrated circuit (19), the at least one structured first supply line (61), the at least one structured second supply line (62), the at least one structured ground potential line (63), the at least one first data line (22), the at least one clock line (64), the at least one structured contact line (65) and the transparent carrier layer (2).

FIGS. 49A to 54B show steps of embodiments of a method to repair an arrangement according to any of the above-mentioned aspects or an optoelectronic array according to any of the above-mentioned aspects.

In case of a defective optoelectronic component or integrated circuit, the method can comprise the steps of either removing and replacing the defective component or adding a redundant component to a corresponding position of the arrangement or the optoelectronic array.

According to FIGS. 49A to 49D the steps of removing and replacing a defective integrated circuit (19) are comprising a removing of the defective integrated circuit (19) including the adjacent conductor tracks (second supply line, ground potential line, first data line, clock line and contact lines) by cutting it out with a laser (FIG. 49A). Then a new material (74), for example a plastic and/or an adhesive, is filled into the arisen gap (73) (FIGS. 49B&49C) and a new integrated circuit (19) is placed on a corresponding position. The integrated circuit (19) is then connected to the adjacent conductor tracks by for example an additive process as for example a LIFT-off process (FIG. 49D).

Figure 50D:
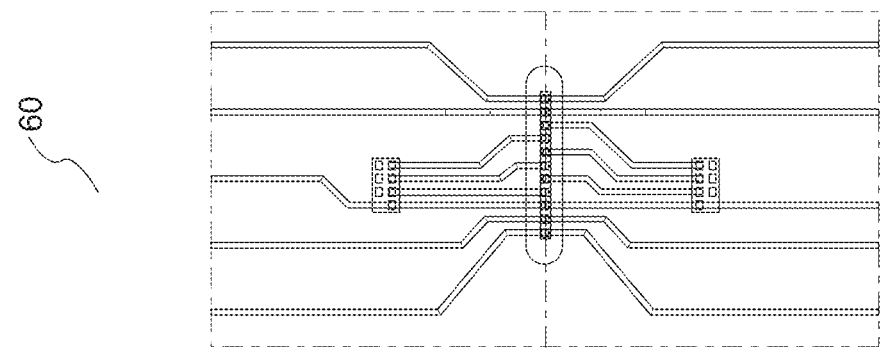
Figure 50C:
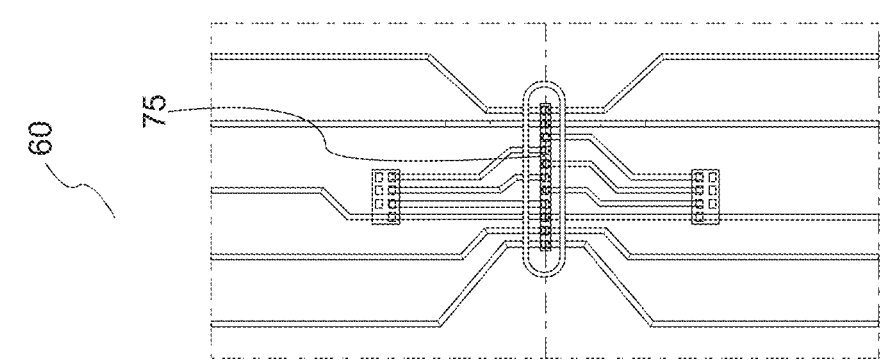
Figure 50B:
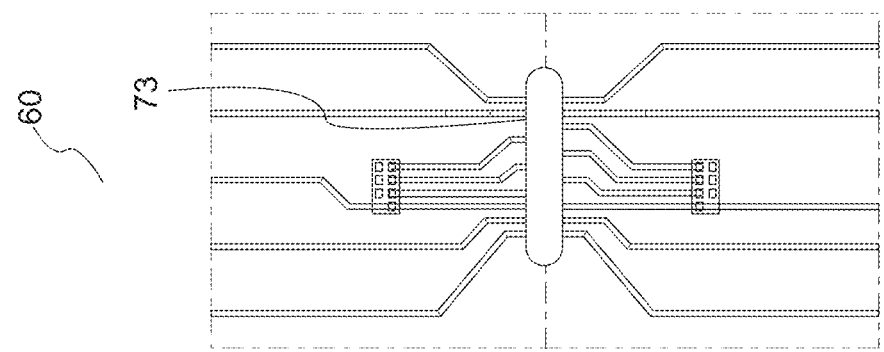
Figure 50A:
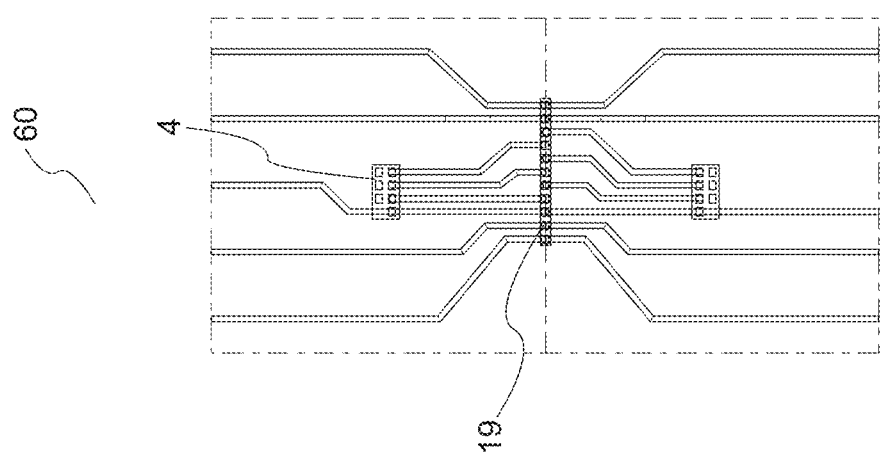

FIGS. 50A to 50D show another embodiment of a method to repair an arrangement or an optoelectronic array. The steps of removing a defective integrated circuit (19) are thereby comparable to those shown in FIGS. 49A and 49A, but the arisen gap (73) is instead filled with a subassembly (75) of a patch including a new component (19) and respective junction points of conductor tracks. The patch is arranged in the arisen gap (73) as shown in FIG. 50C and fixed with the help of for example an adhesive. The junction points of the conductor tracks are then connected to the adjacent conductor tracks by for example an additive process as for example a LIFT-off process.

As shown in FIGS. 51A to 52C it can also be expedient to not remove and replace the defective component but adding a redundant component to a corresponding position of the arrangement (60) or the optoelectronic array (16).

Figure 51D:
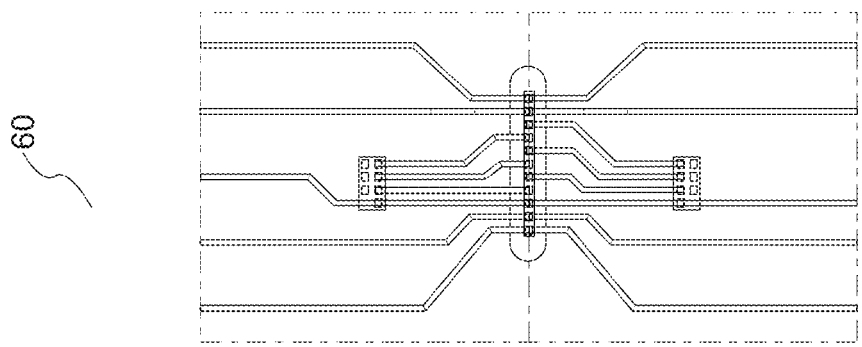
Figure 51C:
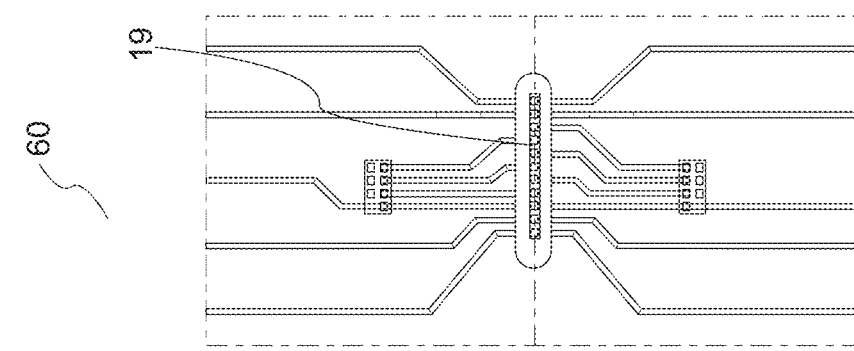
Figure 51B:
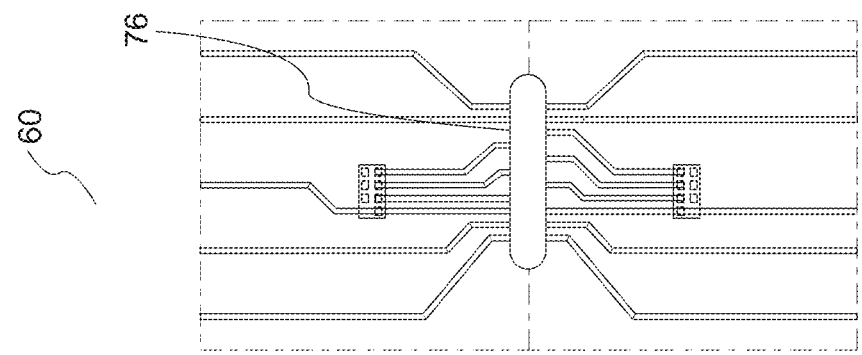
Figure 51A:
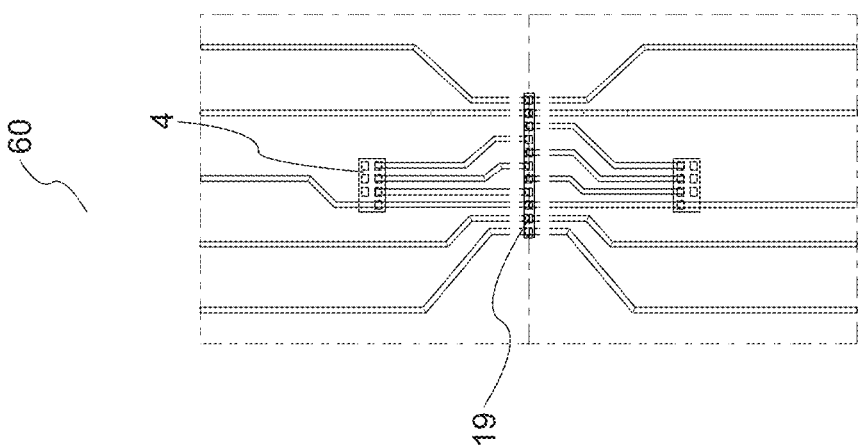

As shown in FIG. 51A the respective conductor tracks of a defective integrated circuit (19) are cut off by for example a laser. A layer of an adhesive (56) is according to FIG. 51B arranged on the defective integrated circuit (19) and a new integrated circuit (19) is placed on the adhesive at the corresponding position as shown in FIG. 51C. The new integrated circuit (19) is then according to FIG. 51D connected to the adjacent conductor tracks by for example an additive process as for example a LIFT-off process.

As shown in FIGS. 52A to 52C, the respective conductor tracks close to a defective optoelectronic component (4) are removed by for example a laser and a new optoelectronic component (4) is placed as a redundant optoelectronic component (4) adjacent to the defective optoelectronic component (4). The new optoelectronic component (4) is then connected to the adjacent conductor tracks by for example an additive process as for example a LIFT-off process.

Figures 54A, 54B:
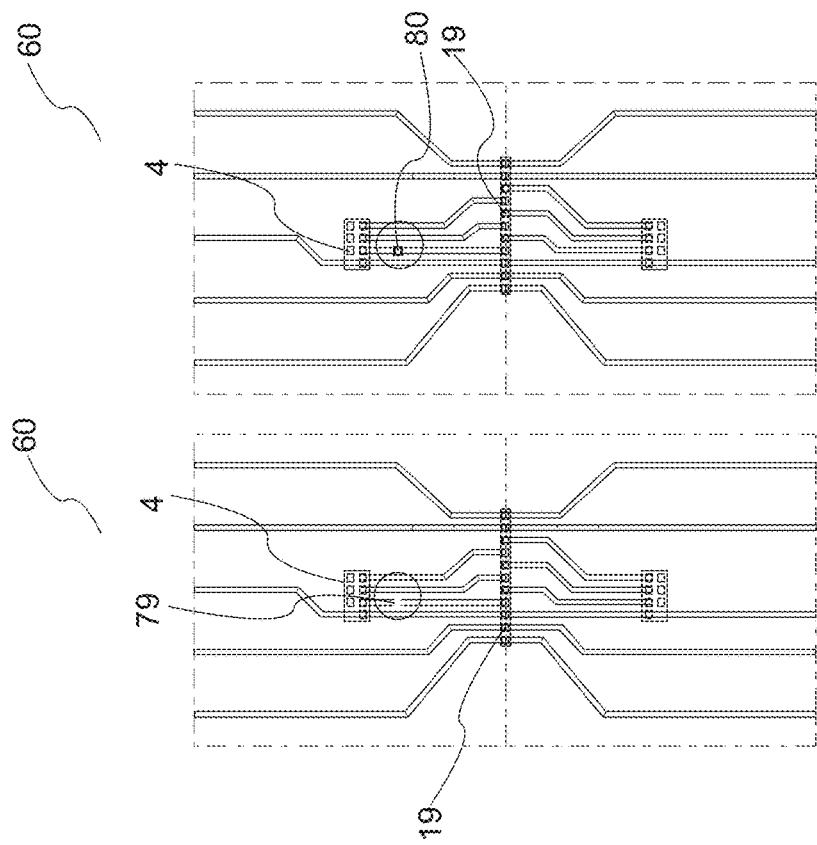
Figures 53A, 53B:
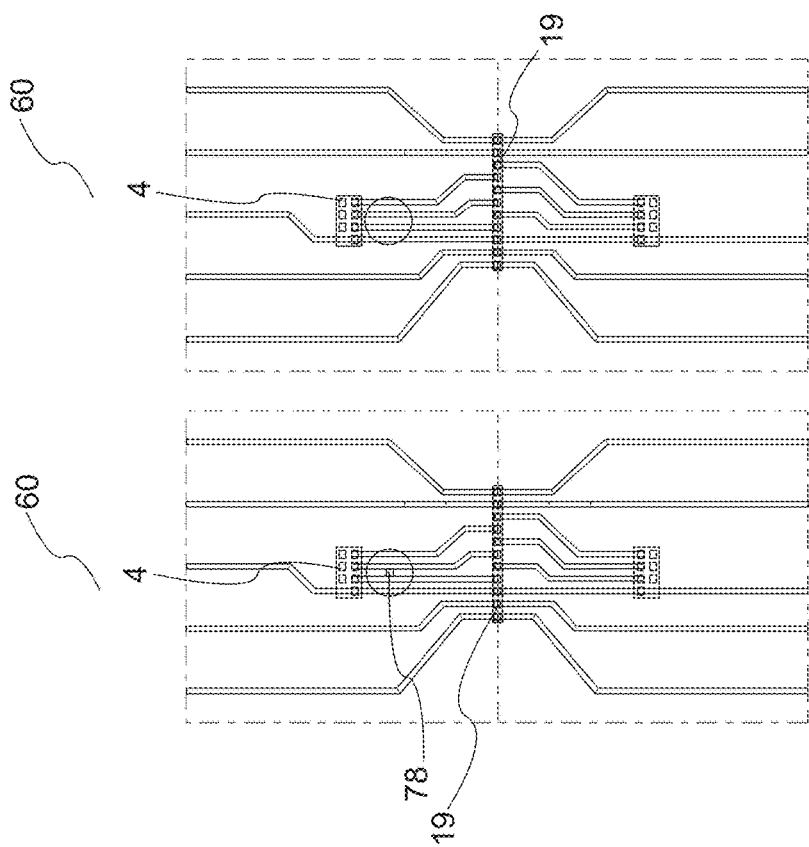

To repair a defective conductor track (first supply line, second supply line, ground potential line, data line, clock line, contact lines) FIGS. 53A to 54B show two respective methods. According to FIGS. 53A to 53B the method comprises a step of a laser ablation of an existing conductor track as for example in the case of a short (78) whereas FIGS. 54A to 54B show a step of an additive manufacturing of a small missing piece (80) of a conductor track using a LIFT-off process to close the gap (79) in the conductor track.

Figure 55:
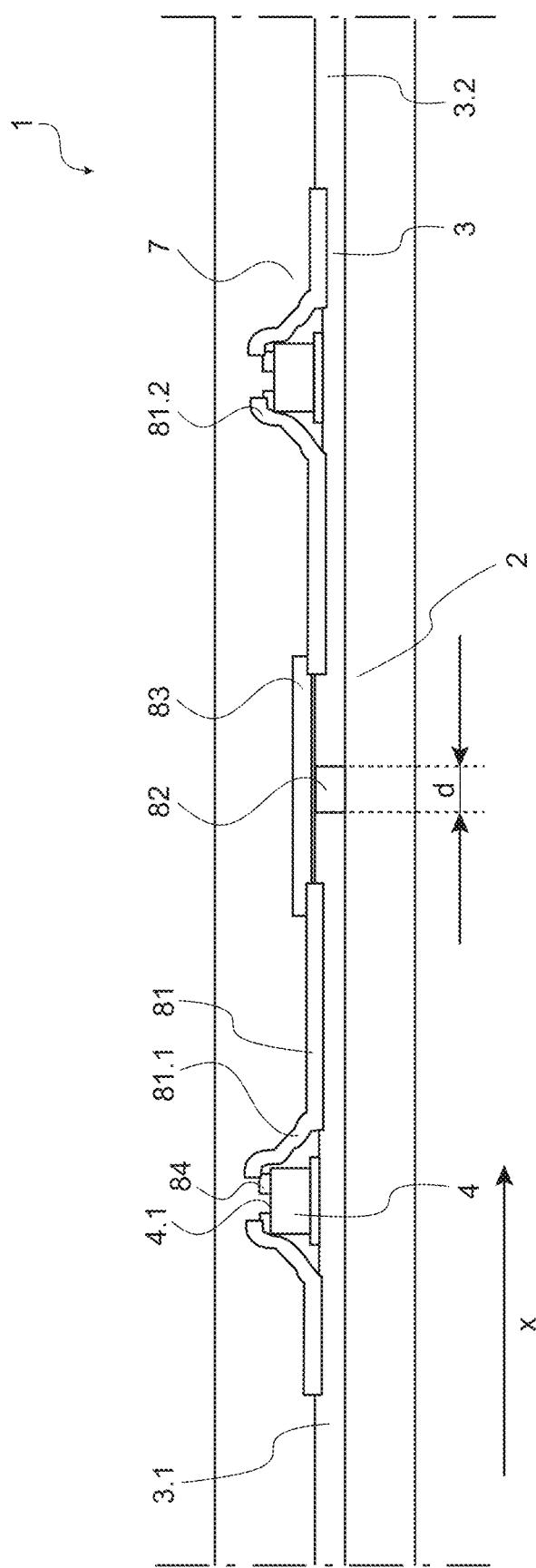

Referring now to FIG. 55 a cross sectional view of an exemplary embodiment of an optoelectronic device 1 is shown. The optoelectronic device 1 comprises a carrier layer 2 and at least a first and a second layer segment 3.1, 3.2, which are arranged adjacent to each other on the carrier layer 2 along a first direction x. The two layer segments 3.1, 3.2 are spaced apart such that a joint region between the layer segments forms a gap, in particular a gap with a distance d between the two adjacent layer segments 3.1, 3.2. The distance d can for example be in a range from 0-750 µm.

On each of the layer segments 3.1, 3.2 one optoelectronic component 4, particularly an LED that can emit light at a selected color, in particular either red, green, blue or white, or a sensor element, particularly a photodiode chip, is arranged and connected by a conductor layer segment 81. However, on each of the layer segments 3.1, 3.2, three or more optoelectronic components 4, particularly LEDs that can emit light at a selected color, in particular either red, green, blue or white and/or a sensor element, particularly a photodiode chip, can be arranged. Three optoelectronic components 4, particularly LEDs that can emit light at a selected color, in particular either red, green or blue can form an RGB pixel. Four or more optoelectronic components 4 can form an RGB(X) pixel, whereas (X) can be a further RGB pixel and/or an LED that can emit light at a selected color, in particular white, and/or a sensor element, particularly a photodiode chip.

The joint region between the adjacent layer segments 3.1, 3.2, in particular the gap between the adjacent layer segments 3.1, 3.2, is filled with a filler material 82. The filler material 82 particularly comprises or consists of an adhesive. The filler material 82 can for example provide a mechanical connection between the layer segments 3.1, 3.2.

By filling the joint region between the adjacent layer segments 3.1, 3.2 with the filler material, a largely homogeneous and planar layer 3 can be formed.

The optoelectronic device 1 further comprises an electric bridging element 83, which extends between the two adjacent layer segments 3.1, 3.2, particularly above the joint region between the adjacent layer segments 3.1, 3.2, and electrically interconnects the conductor layer segments 81, which are arranged on the layer segments 3.1, 3.2. In other words, the electric bridging element 83 extends between the first layer segment 3.1 and the second layer segment 3.2, which is adjacent to the first layer segment 3.1. The first layer segment 3.1 comprises a first conductor layer segment 81.1 and the second layer segment 3.2 comprises a second conductor layer segment 81.2. The electric bridging 83 element interconnects the first conductor layer segment 81.1 with the second conductor layer segment 81.2.

By use of the electric bridging element 83, electric current can be provided to each layer segment 3.1, 3.2 and thus to the optoelectronic components 4. The layer segments 3.1, 3.2 can be connected in parallel or in serial with respect to each other.

At least one contact pad 84 is arranged on each top surface 4.1 of the optoelectronic components 4. Said top surface 4.1 is facing away from the respective layer segment 3.1, 3.2, on which the optoelectronic component 4 is arranged. The contact pads 84 are coupled to the conductor layer segment 81.1, 81.2 of the respective layer segment 3.1, 3.2. Thus, the conductor layer segments 81 extends from a top surface of the respective layer segment 3.1, 3.2 to the contact pads 84 arranged on the top surface 4.1 of the optoelectronic components 4. Such a connection can for example be achieved by placing the optoelectronic components 4 on the layer segments 3.1, 3.2, before arranging the conductor layer segments 81 on the layer segments 3.1, 3.2 and on the contact pads 84.

The optoelectronic device 1 further comprises a cover layer 7, which is arranged on the layer segments 3.1, 3.2. The cover layer 7 forms a planarization layer, in which the optoelectronic components 4 are embedded into. The optoelectronic device 1 can therefore have at least a planar upper surface. The optoelectronic device 1 can also comprise a planar upper surface and a planar bottom surface.

Figure 56:
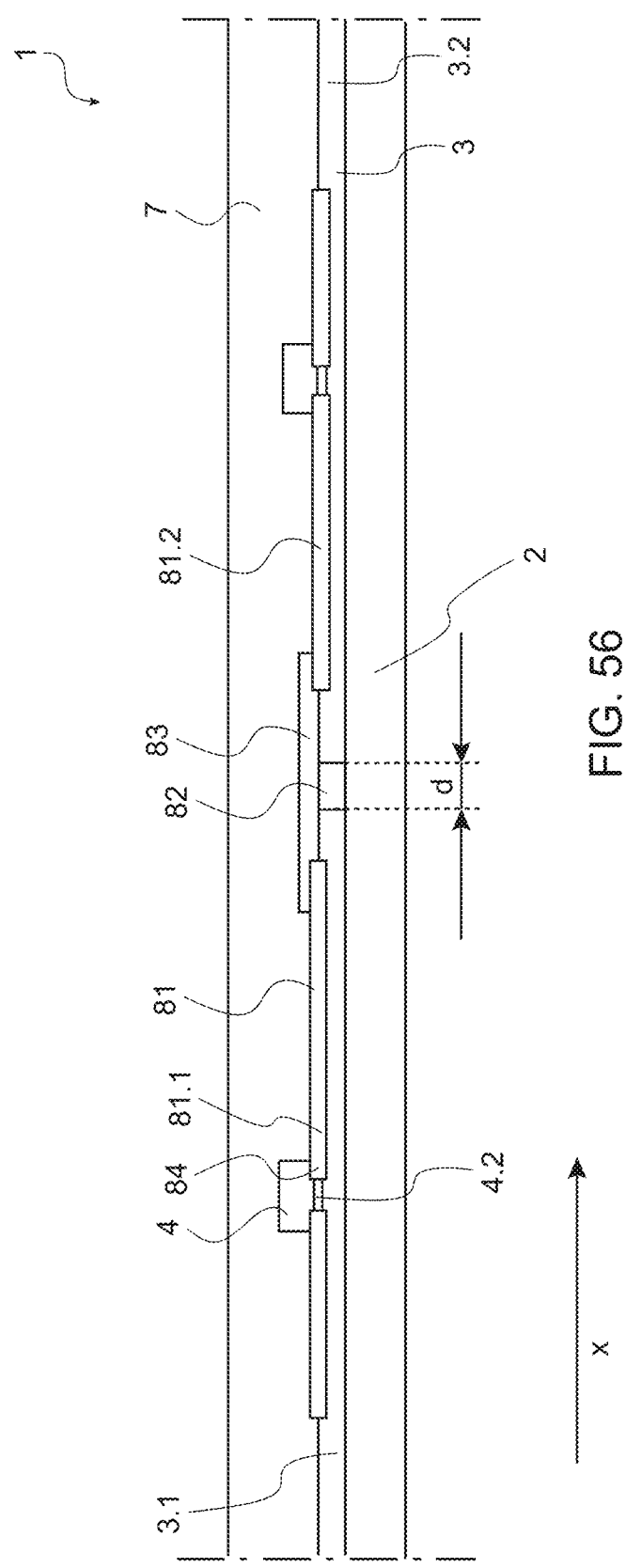
Figure 57:
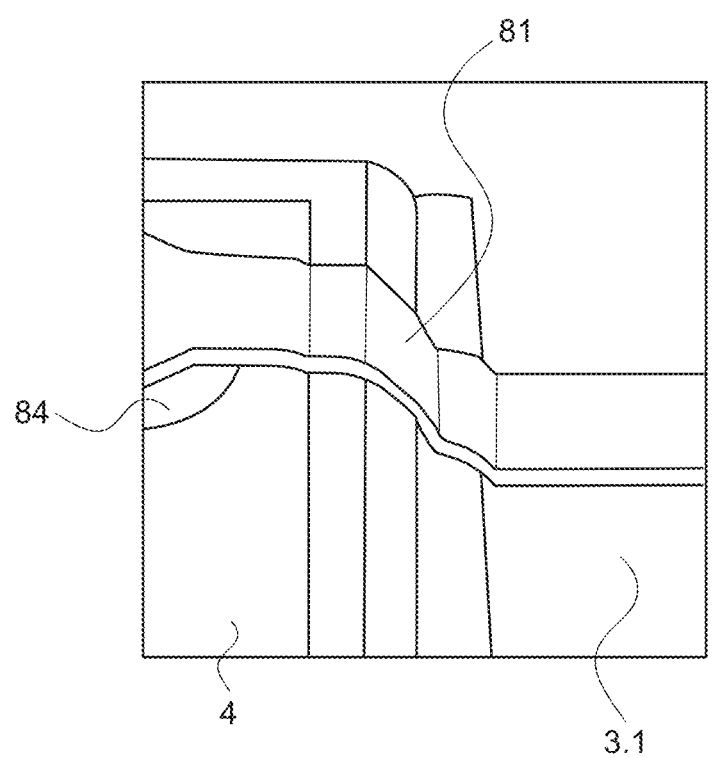

Referring now to FIG. 56 another exemplary embodiment of an optoelectronic device 1 is shown. Compared to the optoelectronic device of FIG. 55, the optoelectronic components 4 are turned upside down, such that the at least one contact pad 84 is arranged on a bottom surface 4.2 of the optoelectronic components 4. Said bottom surface 4.2 is facing the respective layer segments 3.1, 3.2, on which the optoelectronic components 4 are arranged. The contact pads 84 are coupled to the conductor layer segment 81.1, 81.2 of the respective layer segment 3.1, 3.2, with the difference, that the conductor layer segments 81.1, 81.2 are arranged on an upper surface of the respective layer segment 3.1, 3.2 and the optoelectronic components 4 are arranged on the layer segments 3.1, 3.2, such that the contact pads 84 are facing the conductor layer segments 81.1, 81.2. Such a connection can be achieved by placing the optoelectronic components 4 on the layer segments 3.1, 3.2, after arranging the conductor layer segments 81 on the layer segments 3.1, 3.2. FIG. 57 shows an exemplary embodiment of a 3D printed conductor layer segment 81 on a contact pad 84 of an optoelectronic component 4. The conductor layer segment 81 extends from extends from a top surface of a respective layer segment 3.1 to the contact pad 84 arranged on the top surface 4.1 of the optoelectronic component 4. Such a conductor layer segment 81 can for example be provided by so called "Laser induced metal drops-additive manufacturing" (LIFT-Technology). With such a process liquid aluminum (Al) can for example be deposited on onto the contact pad 84, the optoelectronic component 4 and the layer segment 3.1 to form the conductor layer segment 81.

In some aspects, a similar technique can be used to form the electric bringing elements 83, which extend between two adjacent layer segments 3.1, 3.2.

Figure 58:
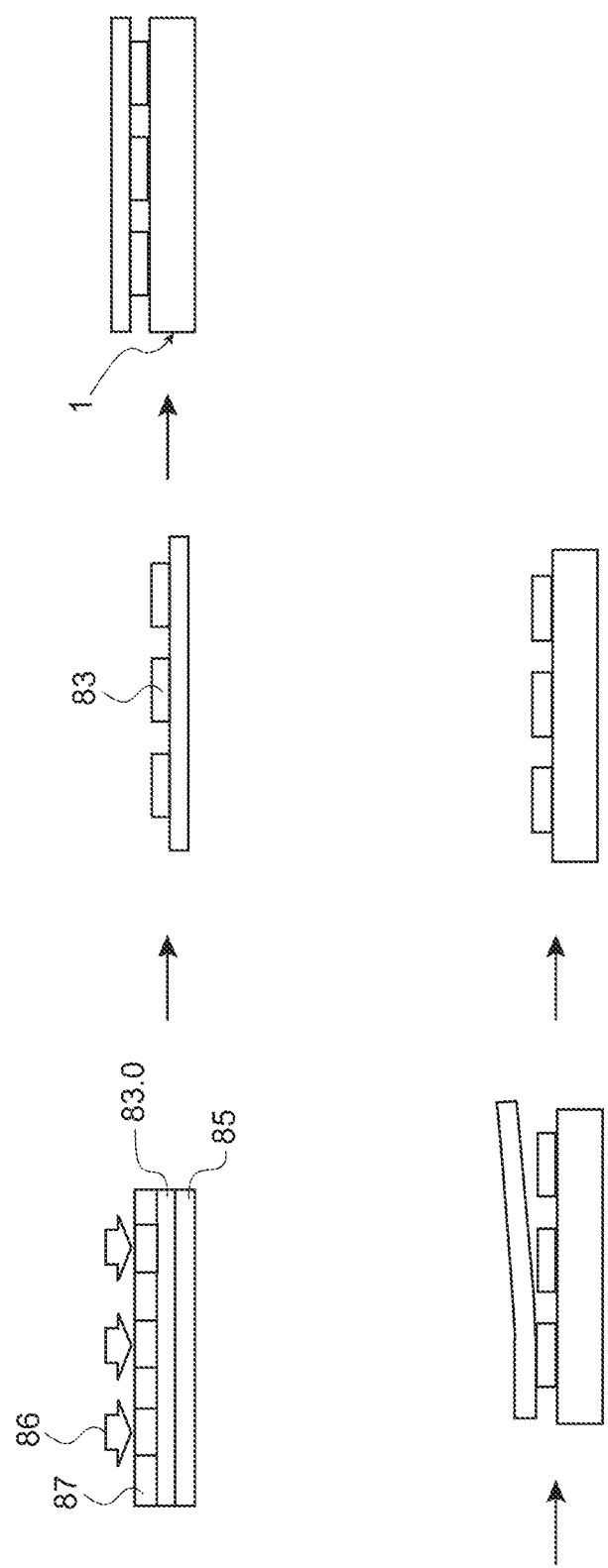

FIG. 58 shows steps of an exemplary process for printing or ink-jetting at least one conductor path onto a joint region between adjacent layer segments to form an electric bridging element 83. In a first step, a stack of a release film 85 and a photo-sensitive functional paste 83.0, particularly RAYBRID™, is exposed to light 86 by use of a photomask 87 to generate a desired structure of the photosensitive functional paste 83.0. The photomask is then removed and the photosensitive functional paste 83.0 is developed to obtain the desired structure of the electric bridging element 83. The release film 85 with the electric bridging element 83 is then arranged on a desired position in the optoelectronic device 1 to transfer the electric bridging element 83 to the optoelectronic device 1. The release film is then removed by for example peeling it off and the electric bridging element 83 is cured at a desired temperature.

Figure 59:
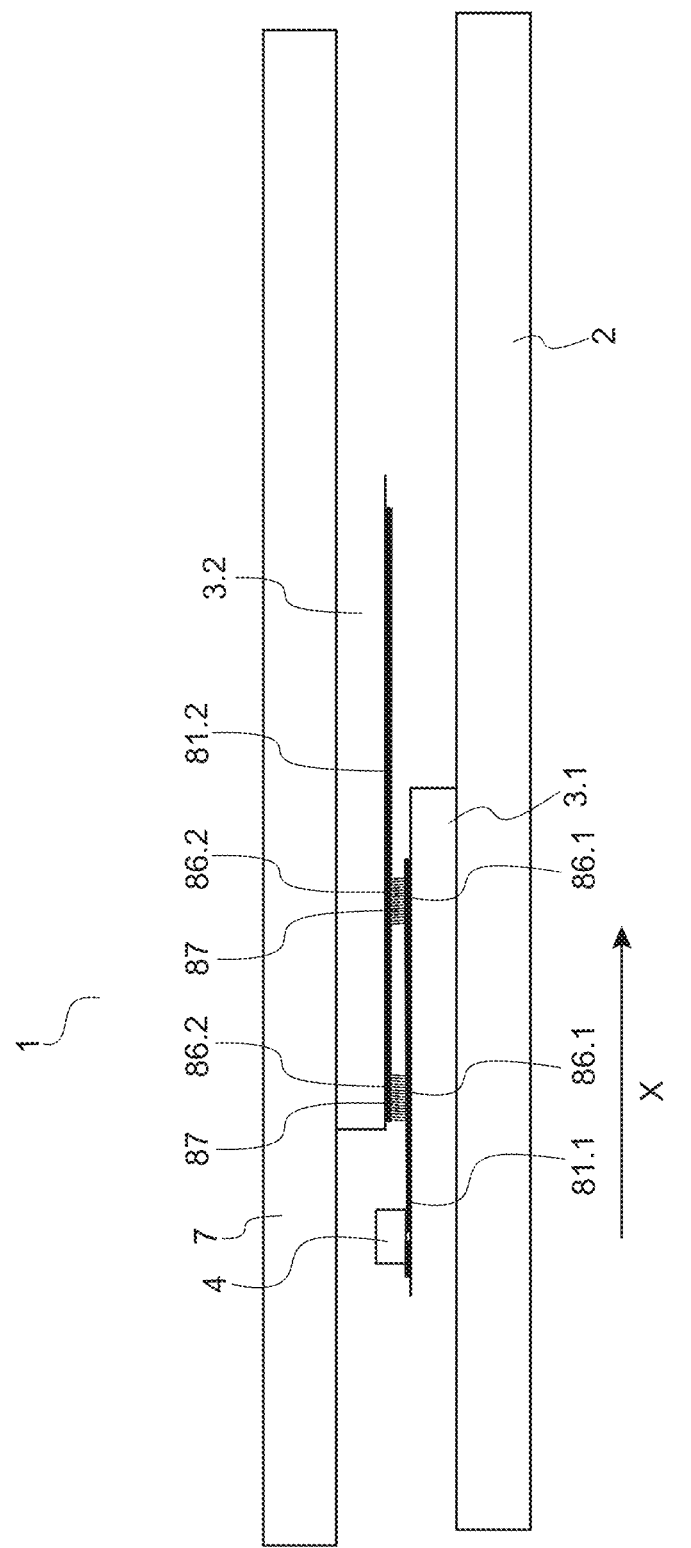

Referring now to FIG. 59 a cross sectional view of an exemplary embodiment of an optoelectronic device is shown. The optoelectronic device (1) comprises a number of layer segments (3.1, 3.2) arranged between a cover layer (7) and a carrier layer (2). The number of layer segments shown in the figure here is 2—a first (3.1) and a second layer segment (3.2)—but can be any number greater than 2 as for example 10, 50 100 or more.

Exemplarily one optoelectronic component (4)) is arranged on one of the plurality of layer segments (3.1), however one or more optoelectronic components (4) can be arranged on each layer segment, on a number of layer segments, or as shown on only one layer segment. Hence, there may be layer segments with no optoelectronic component (4) arranged on it and/or layer segments with one or more optoelectronic components arranged on it.

Figure 60:
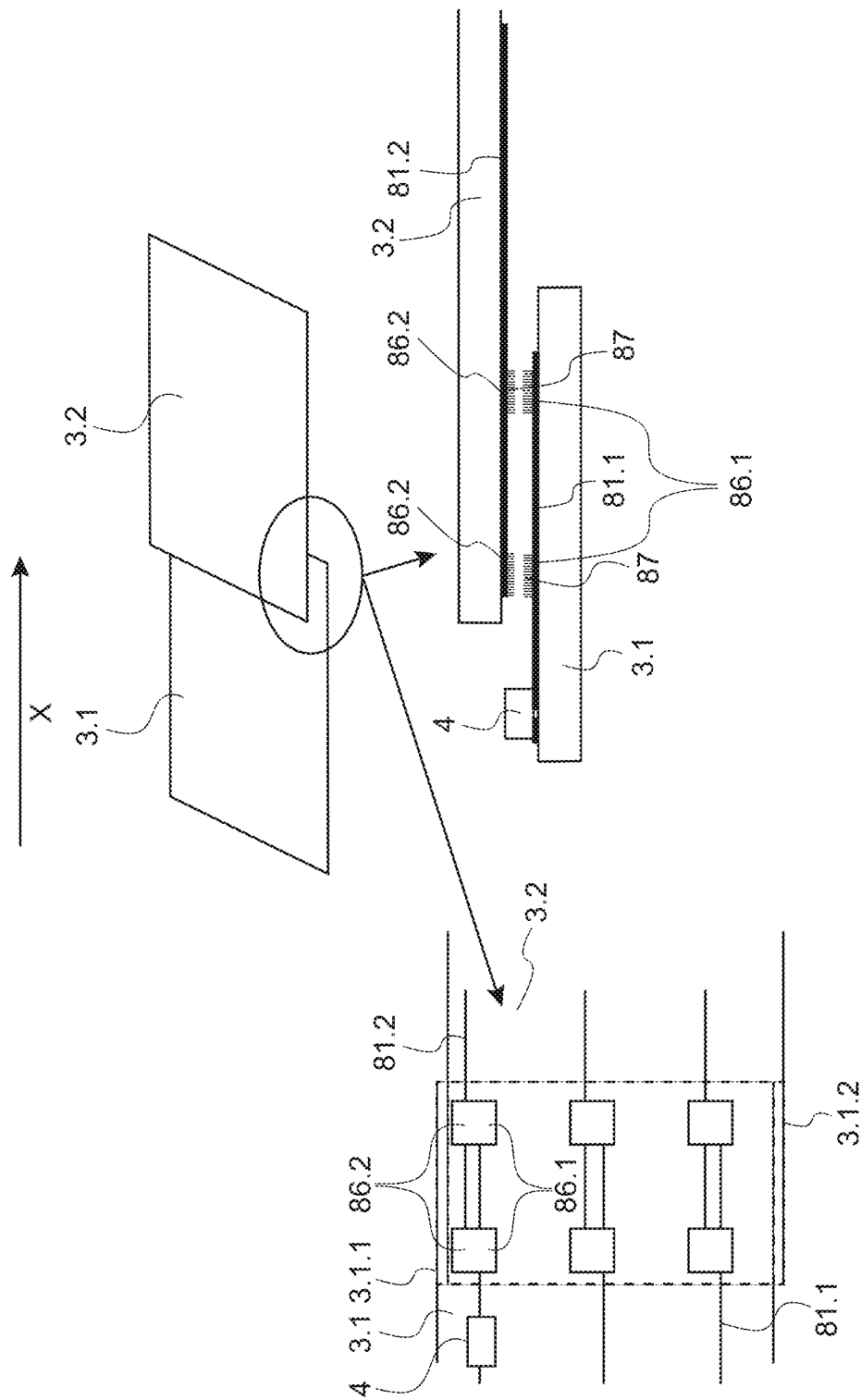

The first (3.1) and the second layer segment (3.2) of the plurality of the layer segments are overlapping each other along a first direction (x) each of the layer segments forming a respective boundary region (3.1.1, 3.2.1) (see also FIG. 60). The respective boundary region (3.1.1, 3.2.1) is particularly formed by the overlapping region of the first (3.1) and a second layer segment (3.2).

The first layer segment (3.1) comprises a number of first contact pads (86.1) and the second layer segment (3.2) comprises a number of second contact pads (86.2), wherein the first (86.1) and the second (86.2) contact pads are arranged in the respective boundary region (3.1.1, 3.2.1) facing each other. The number of first and second contact pads (86.1, 86.2) shown in the figure is each two but can be any smaller or greater number as needed.

The first (3.1) and the second layer segment (3.2) are mechanically and electrically connected via the first and second contact pads (86.1, 86.2). Thus, the first and the second contact pads (86.1, 86.2) are mechanically and electrically connected.

For mechanical and electrical connection of the first and the second contact pads (86.1, 86.2) each of the contact pads comprises a plurality of nanowires (87), which are at least partially made of a conductive material such as for example copper, gold or nickel. Each nanowire can for example have a length of approximately 25 μm and a diameter of approximately 1 μm.

The nanowires extend primarily in a direction, which is perpendicular to a base area of the respective contact pad. The base area of the contact pad is arranged in a plane, which is oriented in parallel to the respective layer segment. Particularly the nanowires resemble a metallic lawn that is grown on the base area of the respective contact pad.

By pressing the first and the second contact pads (86.1, 86.2) together, a mechanical and electrical connection can be achieved, as the individual nanowires jam and intensify and, due to their small diameter, connect at their surfaces.

Each layer segment (3.1, 3.2) further comprises a conductor layer segment (81.1, 81.2), particularly a structured conductor layer segment, being coupled to the respective contact pads (86.1, 86.2) of the layer segments (3.1, 3.2). Each conductor layer segment comprises conductor paths, which are, when seeing perpendicular to the base area of the respective contact pad, thin compared to the base area of the respective contact pads (see for example FIG. 60).

Referring now to FIG. 60 a cross sectional view as well as a top view of an exemplary embodiment of an intermediate product of the manufacturing process of an optoelectronic device is shown. The intermediate product is compared to the optoelectronic device shown in FIG. 59 missing the cover layer and the carrier layer.

As shown in the lower left of the figure, the number of first and second contact pads (86.1, 86.2) is six. Here the first contact pads (86.1) are arranged in a first pattern, particularly a 2×3 matrix, and the second contact pads (86.2) are arranged in a second pattern, particularly a 2×3 matrix, wherein the first and the second pattern are matching with each other. The pattern can however be of any other type, as it will for example be shown in the following figures.

As shown in FIG. 61, the number of first contact pads (86.1) can be greater as 6 (see left side of the figure). Here the number of contact pads (86.1) is 12, wherein the contact pads are arranged in a regular pattern, particularly a 2×6 matrix. The contact pads (86.1) can however be arranged in an irregular pattern as shown on the right of FIG. 61.

Such an arrangement of the contact pads (86.1) can increase the perceived transparency of the optoelectronic device (1), as a distributed, no-regular pattern gains less attention by the human eye compared to regular patterns, especially edges of regular patterns, which are preferred recognized by the human eye.

As shown in FIG. 62A to 62C a first and a second contact pad (86.1, 86.2) each comprise a plurality of lines (87.1) and spaces (87.2) between the lines (87.1). Each line comprises a portion of the plurality of nanowires (87). Thus, all lines of one contact pad includes the plurality of nanowires. The nanowires extend primarily in a direction which is perpendicular to a base area of the respective contact pad and form the lines with spaces between the lines.

The lines can have a thickness of at least approximately 1-100 μm and the spaces between the lines have a thickness of at least approximately 10-1000 μm or greater than 1000 μm. Thus, each line can for example be formed by a single row of nanowires, or can be formed by a portion of the plurality of nanowires, wherein several rows of nanowires can be arranged adjacent to each other within each line.

As shown in FIG. 62A the thickness ratio of the lines (87.1) of the first contact pad (86.1) can be different to the thickness ratio of the lines (87.1) of the second contact pad (86.2) and/or the thickness ratio of the spaces (87.2) of the first contact pad (86.1) can be different to the thickness ratio of the spaces (87.2) of the second contact pad (86.2).

Additionally or alternatively, the distance between one of two lines (87.1) and two spaces (87.2) of the first contact pad (86.1) is different to the corresponding distance between one of two lines (87.1) and two spaces (87.2) of the second (86.2) contact pad.

Thus, when connecting contact pads of two layers facing each other, the need of a high positioning accuracy can be reduced. Due to the different distance and thicknesses of lines and spaces of the two facing contact pads, the chance of a physical contact of at least one of the facing lines of nanowires is increased. In addition, a distributed, irregular physical contact area gains less attention by the human eye compared to regular patterns, especially edges of regular patterns, which are preferred recognized by the human eye. Thus, the perceived transparency of the optoelectronic device can be increased.

For the same reason as given above, the orientation of the lines and spaces of the first contact pad can be different to the orientation of the lines and spaces of the second contact pad.

Another or an additional approach to reduce the need of a high positioning accuracy and/or to increase the perceived transparency of the optoelectronic device is to vary the shape and/or size of the contact pads and/or the orientation to each other (see FIG. 62B). As shown in FIGS. 62A and 62B compared to FIG. 62C, the base areas of the first and the second contact pad can for example be rectangular or circular. The base areas of contact pads can however differ in for example shape and/or size (not shown in the figures). Thus, a first contact pad can for example have a circular base area and is connected to a second contact pad with a rectangular base area, or the two base areas can vary in size or in size and shape.

Figure 63:
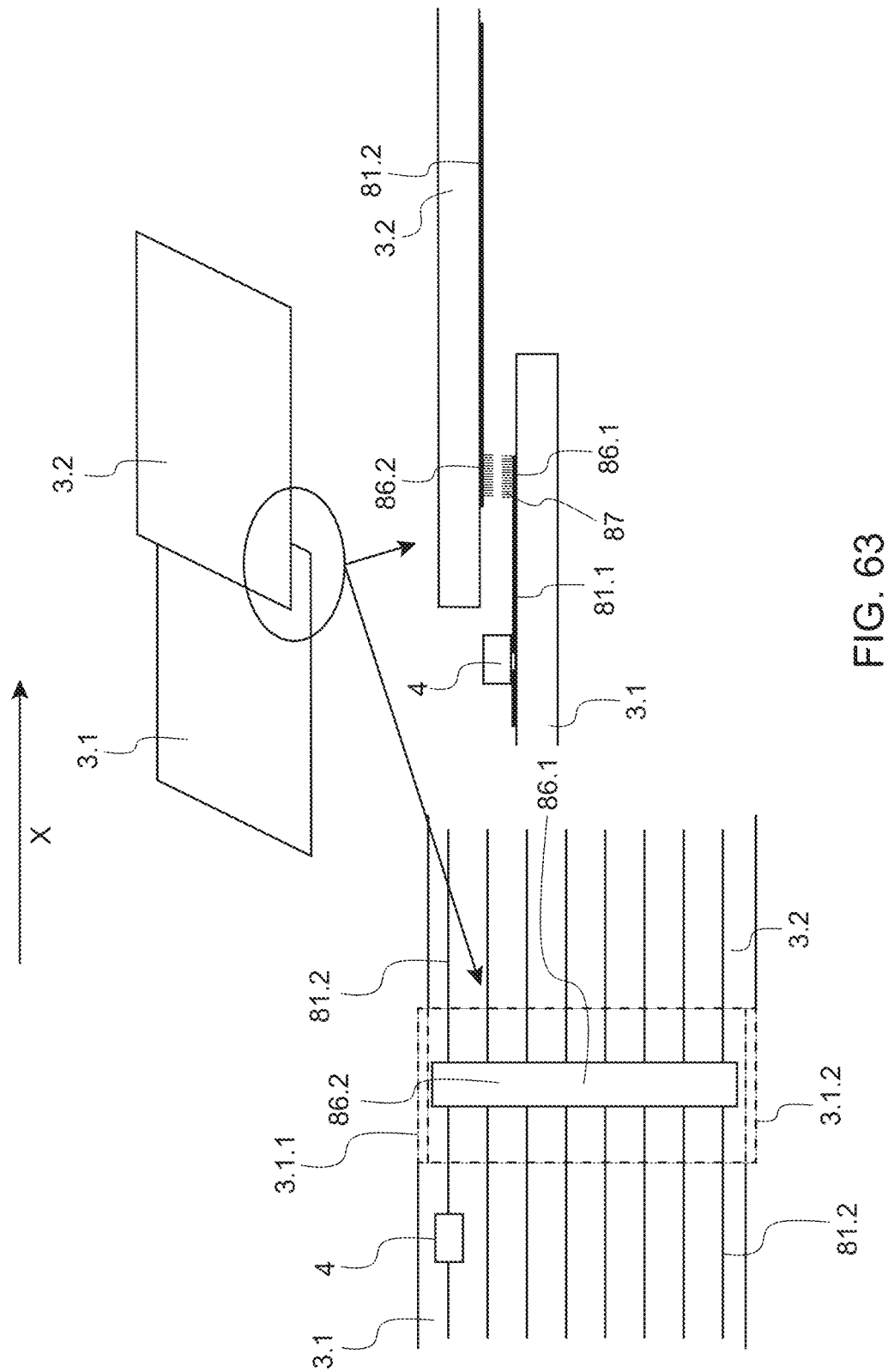

Referring now to FIG. 63, a cross sectional view as well as a top view of another exemplary embodiment of an intermediate product of the manufacturing process of an optoelectronic device is shown. The intermediate product comprises compared to the optoelectronic device shown in FIG. 60 only one first (86.1) and one second contact pad (86.2). The first and the second contact pad extend over almost the whole width of the corresponding layer segment (3.1, 3.2), wherein the width is particularly oriented perpendicular to the first direction (x).

The conductor layer segments (81.1, 81.2) being coupled to the respective contact pad (86.1, 86.2) comprise a plurality of conductor paths which are, when seeing perpendicular to the base area of the respective contact pad, thin compared to the base area of the respective contact pads. Thus, at least the conductor layer segments (81.1, 81.2) can be invisible for the human eye.

Figure 64:
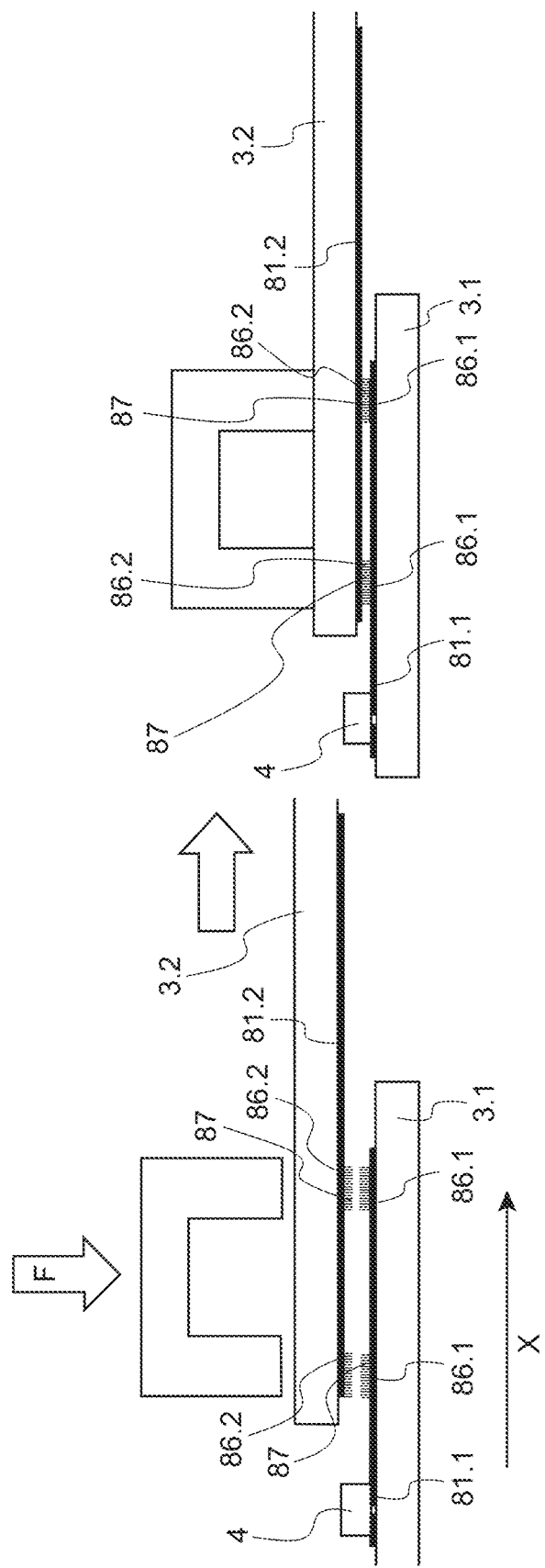

FIG. 64 shows a cross sectional view of an exemplary step of mechanically and electrically connecting two overlapping layer segments (3.1, 3.2) by applying a local pressure to the respective facing contact pads (86.1, 86.2). Particularly the local pressure is applied to the outer surfaces of the layer segments (3.1, 3.2) in an area above the respective contact pads. However, the local pressure can also be applied to the outer surface of for example the carrier layer and the cover layer, depending on the order of assembly. The local pressure can therefore be applied by for example a stamp of the same pattern and size as the base areas of the contact pads.

Figure 65:
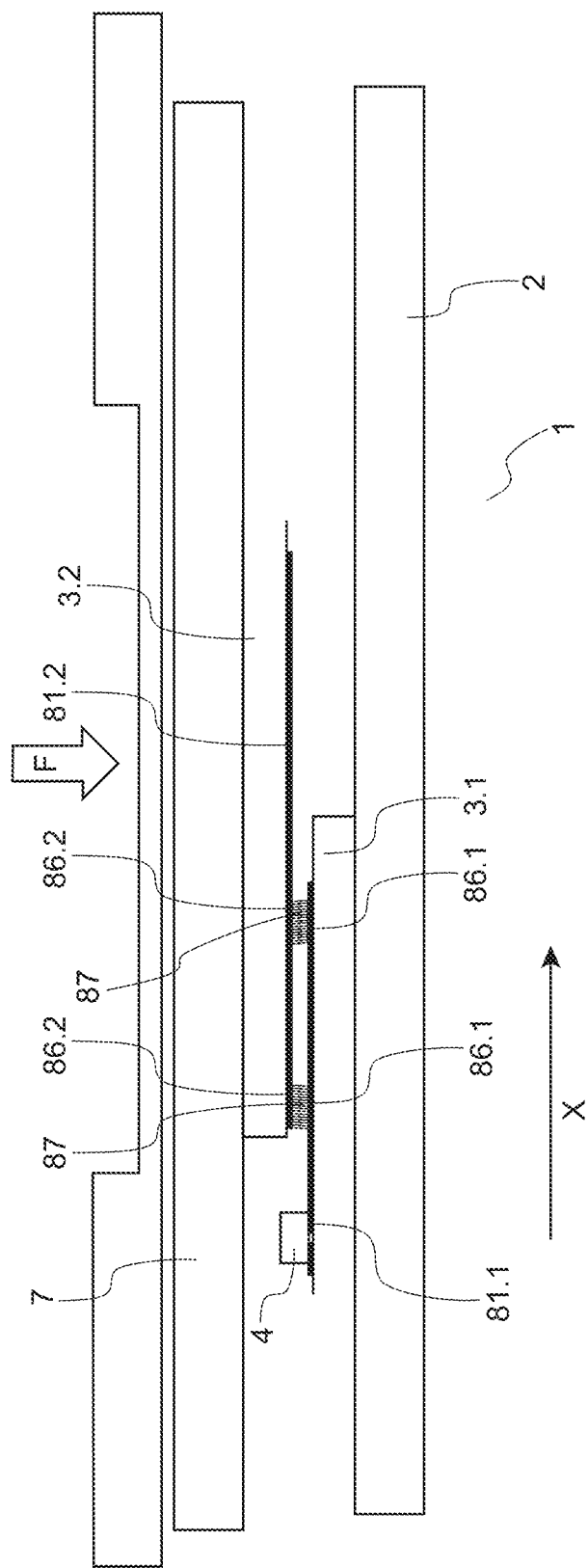

To avoid brakeage or damage of one of the layer segments, the carrier layer and/or the caver layer, an area pressure can be applied to the cover layer (7) and/or the carrier layer (2) as shown in FIG. 65. Thus, the local stresses in any one of the aforementioned components can be reduced. Such a step can for example be performed while the cover layer (7) and or carrier layer (2) is laminated on the layer segments.

Figure 66:
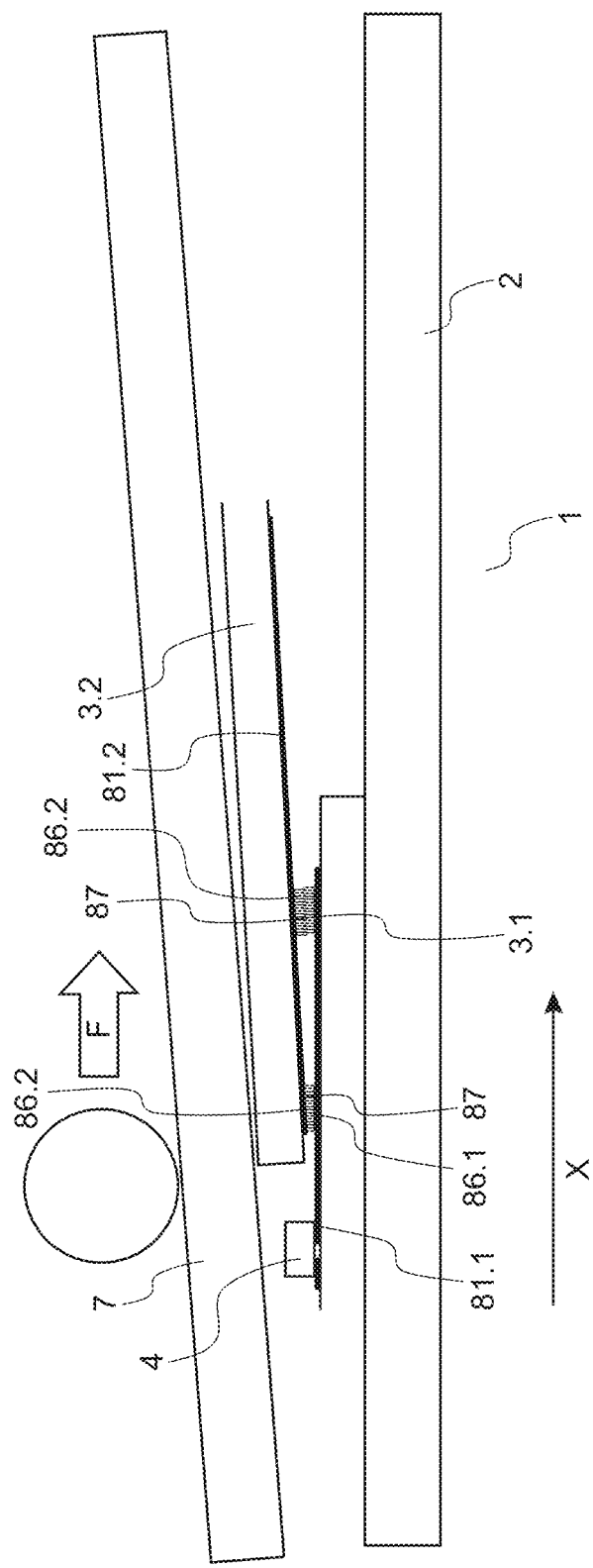

The area pressure can therefore be applied by for example a stamp of the size of the carrier and/or cover layer, as shown in FIG. 65 or by a roller moving into the first direction and thus pressing the carrier layer and the cover layer together as shown in FIG. 66.

Figure 67:
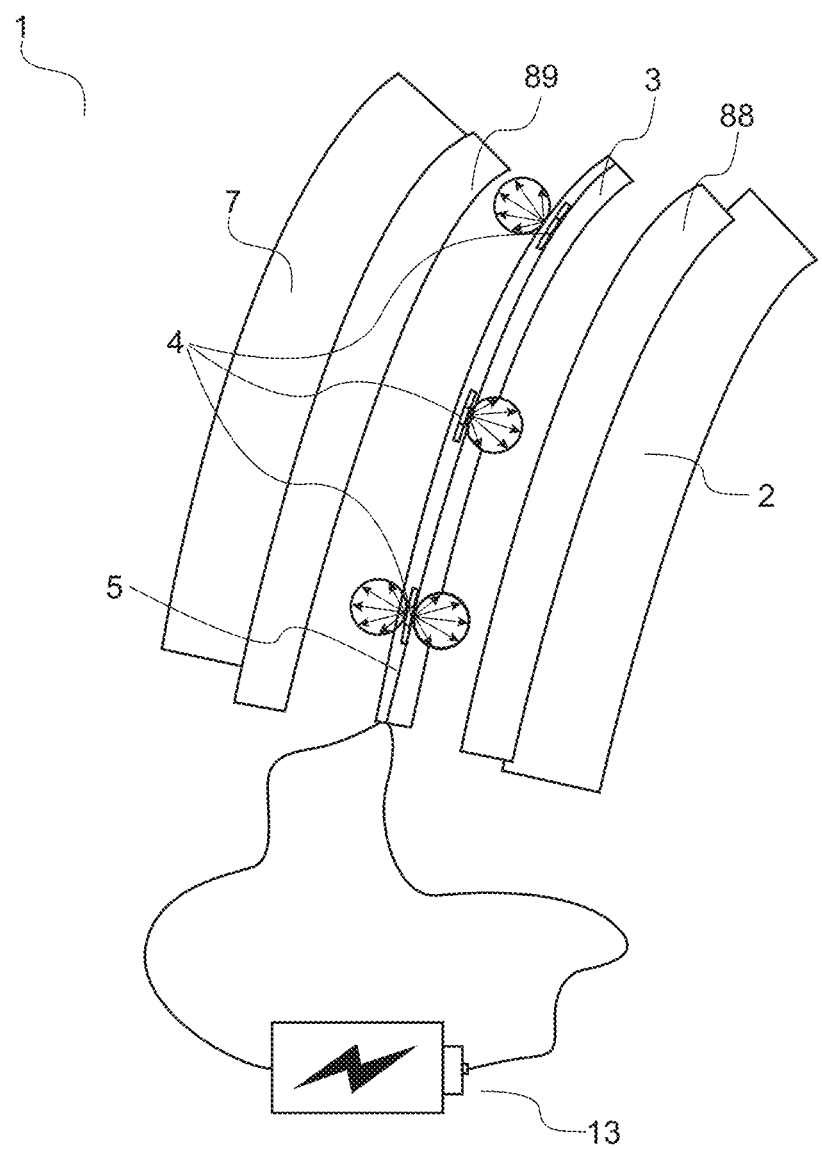

Referring now to FIG. 67 an optoelectronic device having a solid interconnect to an outer power source is shown. The device comprises an at least partially transparent substrate (3) being arranged between a carrier layer 2 and a cover layer 7 and a number of optoelectronic components 4, in particular LEDs, being arranged on the substrate 3. Here the number is three but any other desired number of optoelectronic components can be chosen. Exemplarily, the optoelectronic components 4 comprise LEDs, which are either volume emitters or surface emitters, the type of emitter characterized by the rays emanating from the optoelectronic components 4.

A first intermediate layer 88 is further arranged between the carrier layer 2 and the substrate 3 and a second intermediate layer 89 is arranged between the cover layer 7 and the substrate 3. The first 88 and the second 8 intermediate layer can preferably comprise or consist of a material such as PVB or EVA each being laminated onto the carrier layer 2 and the cover layer 7.

A structured first conductor 5 is arranged on the substrate 3 being coupled to the optoelectronic components 4 as well as being coupled to an electrical power supply 13 arranged outside the optoelectronic device. The connection between optoelectronic device and the electrical power supply 13 is realised by a solid interconnect.

In some cases, a solid connection between an electrical power supply and the optoelectronic device can be difficult and/or openings and/or connectors to supply electrical power to the optoelectronic device can weaken the device. Thus, in some cases it can be advantageously to provide a touchless power transfer for the optoelectronic device.

Figure 68:
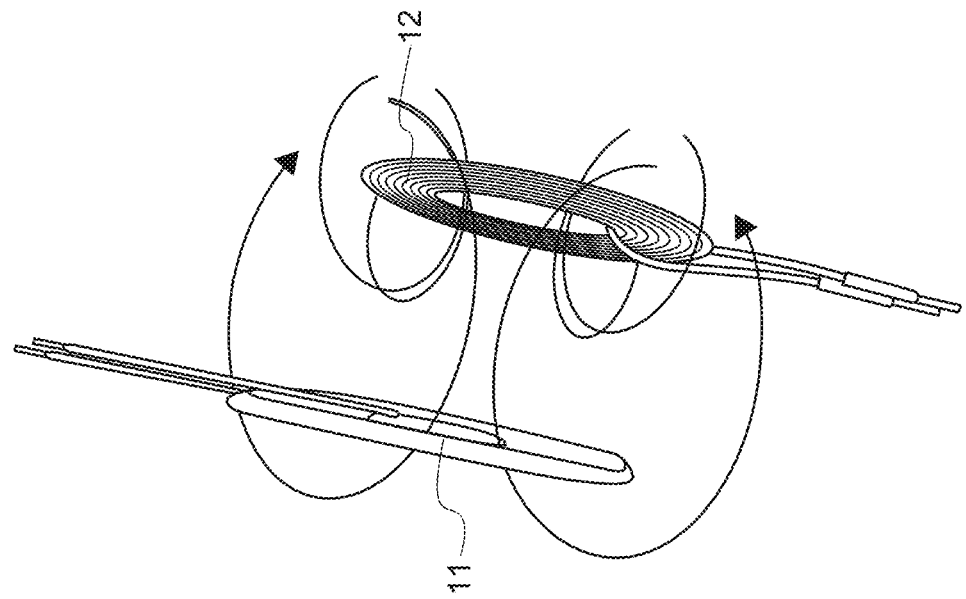

A corresponding optoelectronic system 0 is shown in FIG. 68. Compared to the device shown in FIG. 67, the system comprises a first inductive element 11 arranged between the carrier layer 2 and the cover layer 7. Inductive element 11 is electrically coupled to the structured first conductor 5.

The first inductive element 11 is configured to generate a power signal for operating the optoelectronic components 4 when excited by a magnetic field. The magnetic field is preferably generated by a third inductive element 13 which is in turn configured to excite a magnetic field in the first inductive element 11 in response to a power signal through the third inductive element 12.

The third inductive element 12 is arranged adjacent to the carrier layer 2 opposite to the at least partially transparent substrate 3, such that the third inductive element 12 at least partly overlaps the first inductive element 11 when viewed along a direction perpendicular to a plane in which the first inductive element 11 is arranged. In other words, the third inductive element 12 is arranged on the carrier layer 2 opposite to the at least partially transparent substrate 3, such that the third inductive element 12 at least partly overlaps the first inductive element 11 when viewed along a direction perpendicular to a base area of the first inductive element 11.

As shown in the figure, the third inductive element 12 is arranged such that the third inductive element 12 and the first inductive element 11 are concentric to each other when viewed along a direction perpendicular to the base area of the first inductive element 11.

Figure 69:
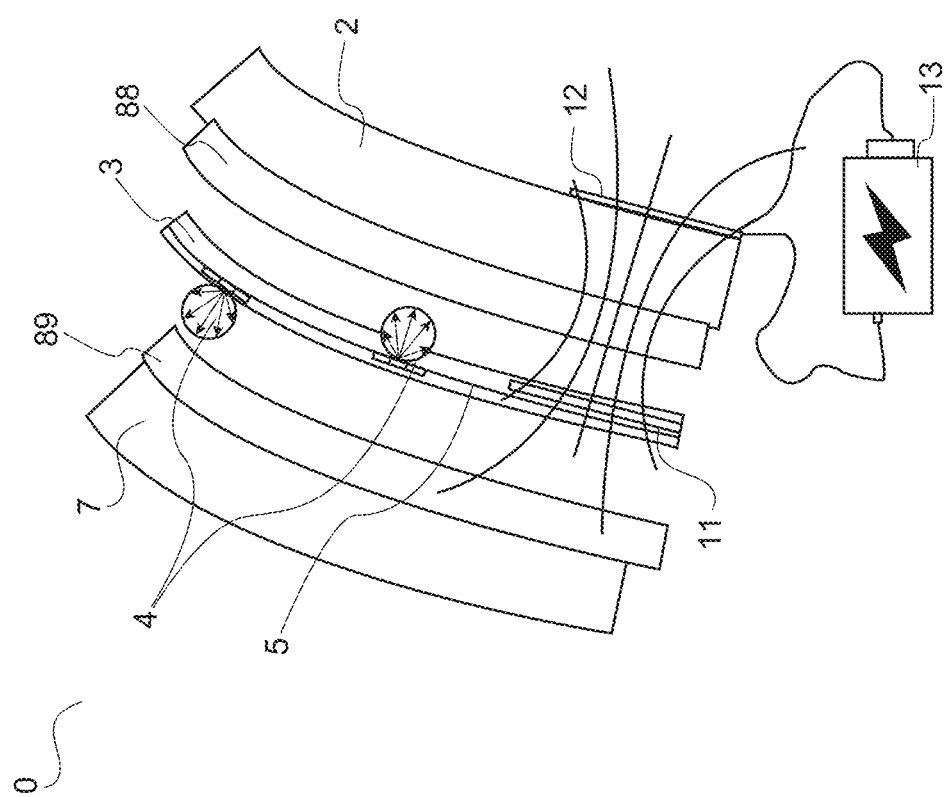

The third inductive element 12 and the first inductive element 11 are substantially parallel to each other and the magnetic field excited by the third inductive element penetrates the first inductive element 11 and induces the power signal on the first inductive element 11 as for example shown in FIG. 69.

Hence, a touchless, particularly inductive, power transfer is provided for the optoelectronic device and no solid interconnect between the optoelectronic device and an outer electrical power supply 13 is needed.

The sandwich of all layers and components between the carrier layer 2 and the cover layer 7 can further be hermetically sealed, as it can be easier to manufacture a hermetically sealed product, which has no connections through its outer surfaces.

FIG. 69 shows the basic function principle of touchless energy transmission in accordance with the faraday law of induction. A current flowing through the third inductive element 12 generates a magnetic flux which in return generates an induction voltage in the first inductive element 11. However only a part of the magnetic flux generated by the third inductive element 11 penetrates the first inductive element 11 and induces voltage in the first inductive element 11. The first inductive element 11 and the third inductive element 12 are physically disconnected. To optimize the power transmission, the current through the third inductive element 12 can be modulated in typical frequencies from 87 to 205 kHz. Thus, the electric field generated by the third inductive element 12 can be modulated in a respective way and a power transmission between the third and the first inductive element of up to 15 W can be generated.

Figures 70A, 70B:
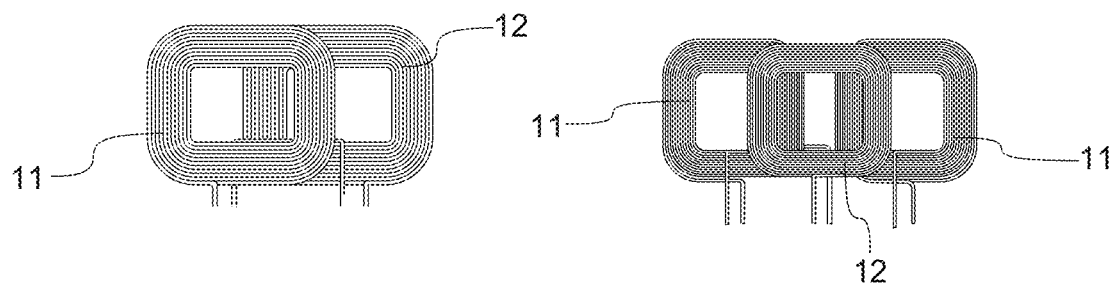
Figure 70C:
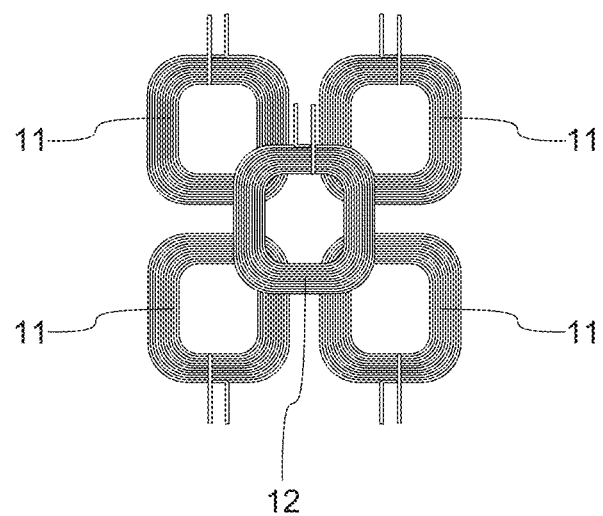

Referring now to FIGS. 70A to 70C, top views of embodiments of the arrangement of transmitting and receiving inductive elements are shown. FIG. 70A, shows an arrangement, in which the first inductive element 11 and the third inductive element are not concentric to each other but overlapping each other in a common boundary area. Thus, only a part of the magnetic field excited by the third inductive element 12 penetrates the first inductive element 11 and induces the power signal on the first inductive element 11.

As shown in FIGS. 70B and 70C, the optoelectronic device can comprises two or more first inductive elements 11. The first inductive elements are preferably arranged adjacent to each other in a matrix and the third inductive element is arranged such that the center of the third inductive element matches with the center of the matrix, when viewed along a direction perpendicular to the base area of the first inductive elements.

Thus, for example two or more independent circuits to operate two or more optoelectronic components can be realized with only one third inductive element to excite the at least two first inductive elements.

As shown in FIG. 71A the inductive elements can be formed as a coil comprising a plurality of coil turns arranged in a single plane, wherein the coil turns comprise a square, hexagonal, octagonal, or circular form. However, a coil comprising coil turns of a circular form can be the preferred design.

Further to that, the inductive elements can comprise a plurality of layers each being arranged in a plane of a plurality of parallel planes which are stacked on top of each other as shown in FIG. 71B. Each layer comprises a metallic conductor having at least one turn of a square, hexagonal, octagonal, or circular form. The layers can be spaced by for example a dielectric material and be connected with each other by vias through the dielectric material.

Figure 72:
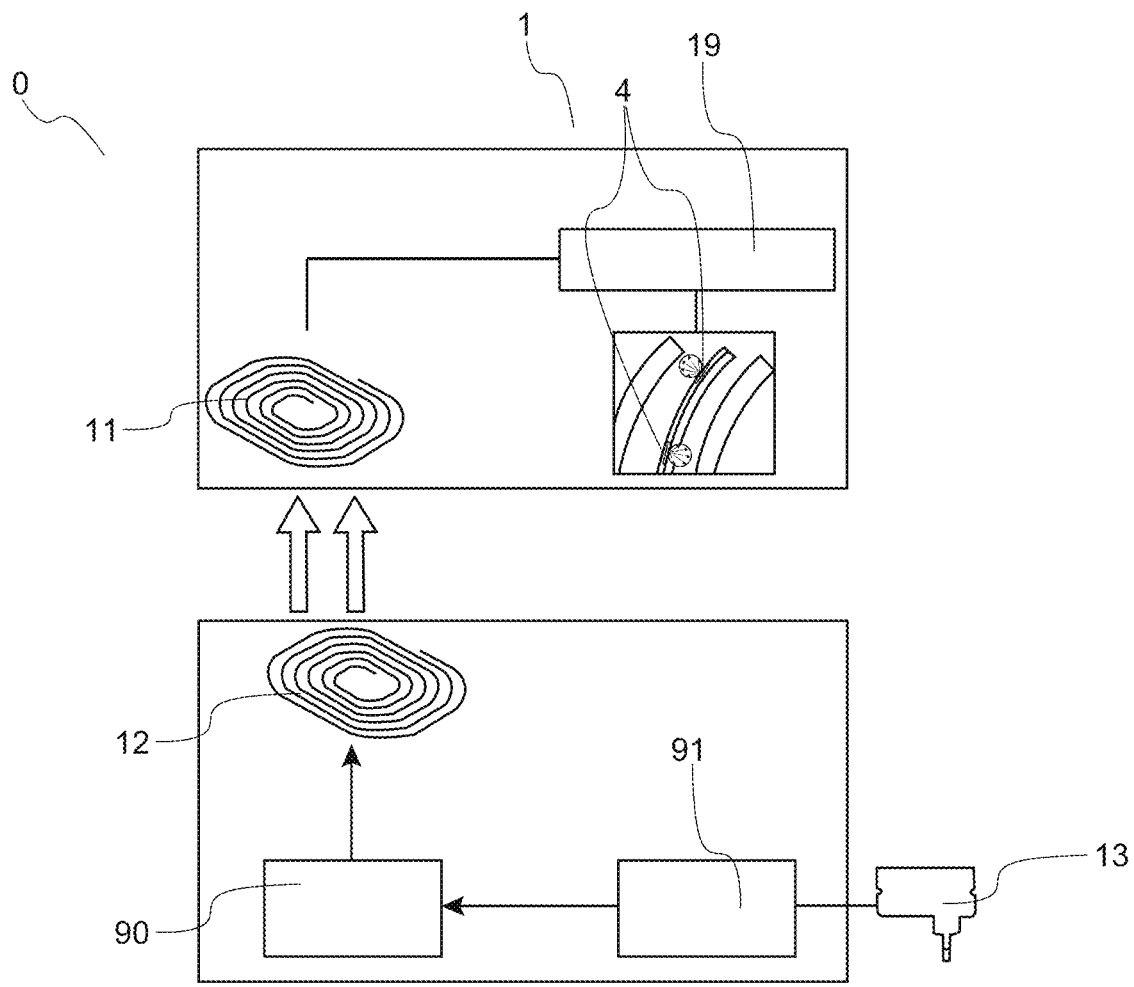

Referring now to FIG. 72, a top view of an embodiment of the optoelectronic system is shown. Compared to the embodiment shown in FIG. 69 the optoelectronic device 1 is spatially separated from the third inductive element 12. Thus, for example an air gap can be arranged between the optoelectronic device 1 and the third inductive element 12.

The optoelectronic device 1 further comprises a micro integrated circuit 19 coupled to the first inductive element to control the optoelectronic components 4. In addition to this, the optoelectronic device 1 can optionally comprise a controller 90 coupled between the first inductive element and the micro integrated circuit 19.

The optoelectronic system 0 further comprises controller 90 and a converter 91 coupled to the third inductive element for generating an alternating power signal for the third inductive element 12. The converter 91 is coupled to an external power supply 13 and can for example be configured to convert a direct current into an alternating current or the other way around.

Figure 73:
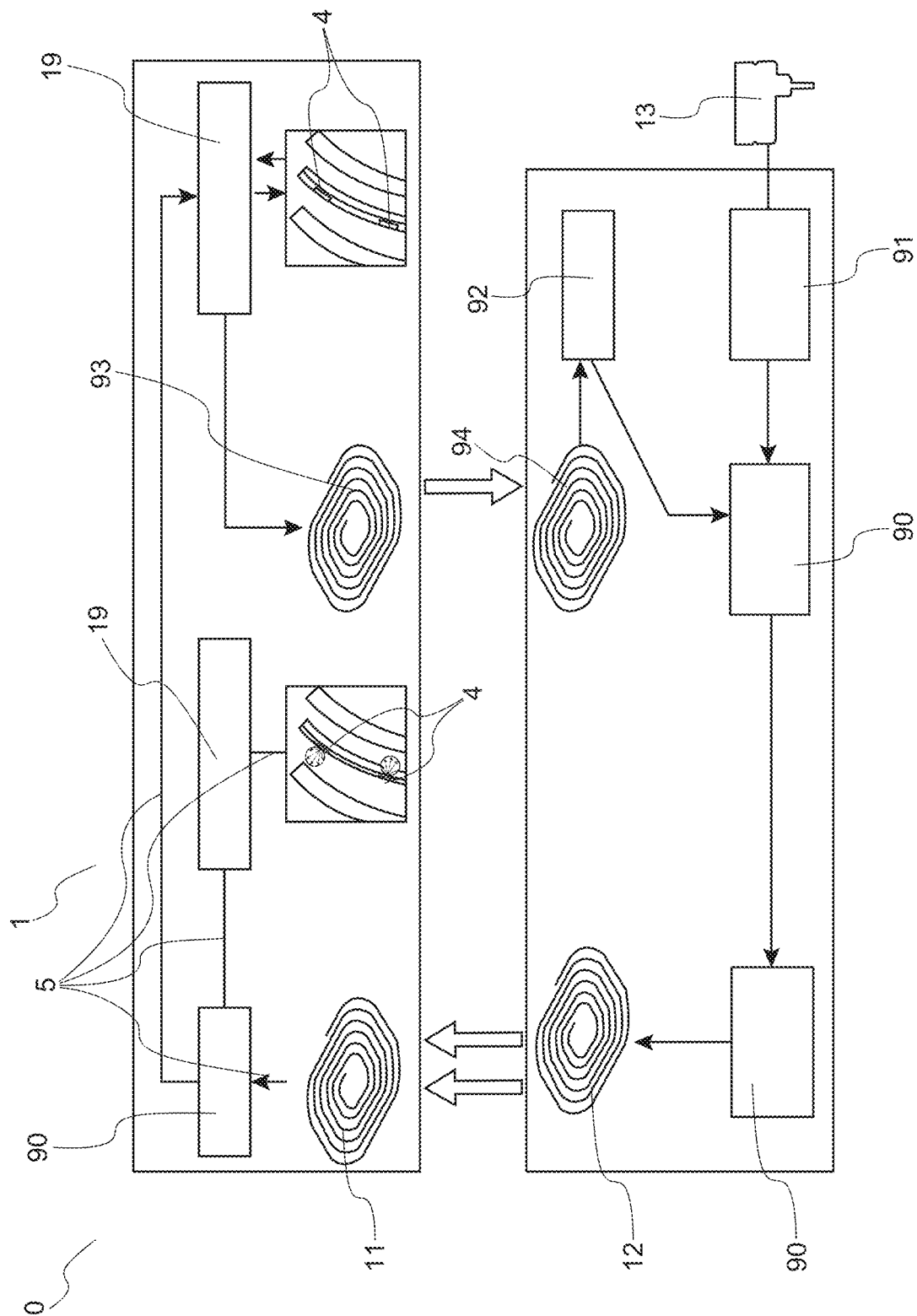

As shown in FIG. 73, the optoelectronic system 0 can be expanded by a second 93 and a fourth inductive element 94 as well as at least one optoelectronic component 4, particularly a photosensitive senor, and a sensor 92.

The second inductive element 93 is arranged between the carrier layer 2 and the cover layer 7 being electrically coupled to the structured first conductor 5. The second inductive element 93 is configured to excite a magnetic field in response to a data signal generated by the integrated circuit 19 and/or the optoelectronic component 4, particularly a photosensitive sensor. A desired data signal generated the optoelectronic component 4 can for example be amplified or processed by the IC, which in turn excite the second inductive element to generate a magnetic field in response to the data signal.

The fourth inductive element 94 is further configured to generate a data signal in response to the magnetic field, excited by the at least one second inductive element 93. Thus, the second inductive element is the transmitting element and the fourth inductive element 94 is the receiving element in regards to the transmission of the data signal.

The sensor 92 is coupled to the fourth inductive element 94 and configured to measure and/or evaluate the received data signal.

In response to the received data signal, the controller 90 can vary the power signal and thus the optoelectronic components can be controlled in response to the data signal.

In the following, various devices and arrangements as well as methods for manufacturing, processing and operating are listed as Items again. The following items present various aspects and implementations of the proposed principles and concepts, which can be combined in different ways. Such combinations are not limited to those given below:

1. A window of a vehicle (1), comprising:
    a transparent carrier layer (2);
    a transparent dielectric layer (3) arranged on the carrier layer (2);
    at least one first structured conductor (5) arranged in between the carrier layer (2) and the dielectric layer (3);
    at least one optoelectronic component (4), in particular a LED, arranged on the surface of the dielectric layer (3) opposite to the carrier layer (2);
    at least one conductive via (6) through the dielectric layer (3) electrically connecting the at least one first structured conductor (5) with the at least one optoelectronic component (4); and
    a transparent covering layer (7) arranged on the surface of the dielectric layer (3) opposite to the carrier layer (2), wherein the covering layer (7) covers the at least one optoelectronic component (4) completely.

2. The window of a vehicle (1) according to item 1, further comprising;
    a first window layer (9), wherein the covering layer (7) is attached to said first window layer (9).

3. The window of a vehicle (1) according to item 2, further comprising;
    a second window layer (10) attached to the carrier layer (2) opposite to the dielectric layer (3).

4. The window of a vehicle (1) according to one of the preceding items,
    wherein the carrier layer (2) comprises at least one of the following materials:
    Glass;
    Acrylic glass;
    Aluminiumoxynitride; and
    Polymer; and
    combinations thereof.

5. The window of a vehicle (1) according to one of the preceding items,
    further comprising at least one second structured conductor (8) arranged in between the dielectric layer (3) and the covering layer (7), wherein the at least one second structured conductor (8) electrically connects the at least one conductive via (6) with the at least one optoelectronic component (4).

6. The window of a vehicle (1) according to item 5,
    wherein the at least one second structured conductor (8) comprises a transparent material.

7. The window of a vehicle (1) according to one of the preceding items,
    wherein the at least one optoelectronic component (4) is a Flip-Chip mountable LED or a Flip-Chip mountable μ-LED.

8. The window of a vehicle (1) according to one of the preceding items,
    wherein the at least one optoelectronic component (4) forms a pixel of at least 3 subpixels, wherein each subpixel is a μLED and the subpixel is configured to emit one of the colours red, green and blue.

9. The window of a vehicle (1) according to one of the preceding items,
    further comprising at least one third structured conductor for the transfer of data.

10. The window of a vehicle (1) according to one of the preceding items,
    wherein the window (1) is a windshield, and/or a side window, and/or a rear window of a vehicle.

11. The window of a vehicle (1) according to one of the preceding items, wherein the vehicle is one of the following:
    Car;
    Bus;
    Truck;
    Train;
    Airplane;
    Motorbike; and
    Ship.

12. The window of a vehicle (1) according to one of the preceding items, further comprising
a first inductive element (11) electrically connected to the at least one first structured conductor (5) for a contactless transfer of electrical power supply.

13. The window of a vehicle (1) according to item 12, wherein the first inductive element (11) is arranged in a non-visible part of the window;
and/or further comprising a transducer being arranged in a non-visible part of the window as to provide energy to the first inductive element (11).

14. The window of a vehicle (1) according to item 12, further comprises a second inductive element adapted to receive a control signal for controlling the emission behaviour of the at least one optoelectronic component (4).

15. An optoelectronic circuit (100), in particular an optoelectronic circuit in a window of a vehicle according to one of the preceding items, comprising:
at least two optoelectronic components (400), in particular two LEDs, which are interconnected in parallel;
at least two filters (200), each coupled with one of the at least two optoelectronic components (400),
wherein the at least two filters (200) have one filter flank which is sufficiently flat to enable a frequency dependent dimming of the optoelectronic component (400).

16. The optoelectronic circuit (100) according to item 15, wherein the at least two filters (200) are high pass filters.

17. The optoelectronic circuit according to item 15, wherein the at least two filters (200) are band pass filters.

18. The optoelectronic circuit according to item 17, wherein the at least two band pass filters have a different centre frequency.

19. The optoelectronic circuit according to item 15, further comprising an IC LED driver (300).

20. The optoelectronic circuit according to item 15, further comprising a data storage (500).

21. The optoelectronic circuit (1000), in particular an optoelectronic circuit in a window of a vehicle according to one of the items 1-14, comprising:
at least two optoelectronic components (4000), in particular two LEDs, which are interconnected in parallel;
at least one conductor for the transfer of data (3000);
at least two logic circuits (2000) connected each to one of the at least two optoelectronic components (4000) and the at least one conductor (3000),
wherein the at least two logic circuits (2000) are shift registers.

22. A window of a vehicle (1) according one of the items 1-14,
further comprising:
a current source (14);
a feedback circuitry (15);
wherein the feedback circuitry (15) is made of thin film technology.

23. The window of a vehicle according to item 22, wherein the current source (14) is made of thin film technology.

24. An optoelectronic circuit (10000), in particular an optoelectronic circuit in a window of a vehicle according to one of the items 1-14, comprising:
at least two modules (20000) connected in series, each module comprising:
at least one μ-controller (30000);
three optoelectronic components (40001, 40002, 40003) for emitting red, green and blue light, each switchable arranged in a current path;
a controllable current source (50000) coupled to the modules (20000) for providing supply current; and
a data generation source (60000) connected to the current source (60000);
wherein the μ-controller (30000) is configured to receive a data signal in response to a variation of the supply current.

25. The optoelectronic circuit (10000) according to item 24, further comprising:
at least one first diode (70000) in each module (20000), switchable arranged in a current path.

26. The optoelectronic circuit (10000) according to item 25,
wherein the at least one first diode (70000) is a Zener diode.

27. The optoelectronic circuit (10000) according to item 25,
wherein the three current paths of the three optoelectronic components (40001, 40002, 40003) and the current path of the first diode (70000) have an approximately identical need of supply voltage.

28. The optoelectronic circuit (10000) according to item 24, further comprising:
at least one capacitor (80000) and at least one second diode (90000) connected in series in each module (20000).

29. An optoelectronic array (16), comprising:
a transparent carrier layer (2),
a plurality of optoelectronic components (4) arranged on a first surface (18) of the transparent carrier layer (2) in a first matrix,
wherein each optoelectronic component (4) is associated with a pixel (17),
at least two integrated circuits (19), in particular μICs, arranged on the first surface (18) of the transparent carrier layer (2),
wherein each integrated circuit (19) is connected to at least one of the plurality of optoelectronic components (4),
a first contact area (20) along a short edge (21) of the transparent carrier layer (2),
at least one first data line (22) to connect the at least two integrated circuits (19) with the first contact area (20).

30. The optoelectronic array (16) according to item 29, characterized in that
each of the plurality of optoelectronic components (4) comprises three subcomponents (4.1, 4.2, 4.3), wherein the three subcomponents each comprise a μLED, which are adapted to emit red, green and blue light.

31. The optoelectronic array (16) according to item 29 or 30,
characterized in that
the at least two integrated circuits (19) are arranged in a second matrix with a plurality of rows (23) and columns (24).

32. The optoelectronic array (16) according to item 31, characterized in that
the at least one first data line (22) connects the integrated circuits (19) of one row (23.1) in series with the first contact area (20).
33. The optoelectronic array (16) according to item 31, characterized in that
the at least one first data line (22) connects the integrated circuits (19) of at least two adjacent rows (23.1, 23.2) in series with the first contact area (20).
34. The optoelectronic array (16) according to item 31, characterized in that
the at least one first data line (22) connects the integrated circuits (19) of one row (23.1) in parallel to the first contact area (20),
and an at least one second data line (25) connects the integrated circuits (19) of one column (24.1) in parallel to the first contact area (20).
35. The optoelectronic array (16) according to any one of the items 29 to 34, characterized in that
the at least two integrated circuits (19) are formed utilizing thin-film technology, in particular thin film transistors.
36. The optoelectronic array (16) according to any one of the items 29 to 35, characterized in that
each integrated circuit (19) comprises a first transistor (26), a second transistor (27) and a capacitor (28), wherein the first transistor (26) and the capacitor (28) are configured to control a current through the second transistor (27).
37. A display module (160) comprising:
an optoelectronic array (16) according to any one of the items 29 to 36,
a programming area (29) coupled to the first contact area (20) to program the at least two integrated circuits (19),
a connector area (30) located adjacent to the programming area (29) opposite the first contact area (20) to electrically connect the display module (160).
38. The display module (160) according to item 37, characterized in that
the programming area (29) comprises at least one serial driver unit (31) to program the integrated circuits (19) connected in series.
39. The display module (160) according to item 38, characterized in that
a first end (22.1) of the at least one first data line (22) is connected to the at least one serial driver unit (31) and a second end (22.2) of the at least one first data line (22) is connected to the at least one serial driver unit (31) to provide a feedback loop.
40. The display module (160) according to item 37, characterized in that
the programming area (29) comprises at least one row driver unit (32) and at least one column driver unit (33),
wherein the integrated circuits (19) of a row (23.1) are connected to the at least one row driver unit (32) and the integrated circuits (24.1) of a column are connected to the at least one column driver unit (33).
41. The display module (160) according to any one of the items 37-40, characterized in that
the display module (160) comprises at least two optoelectronic arrays (16.1, 16.2) according to any one of the items 29 to 36 facing each other along a short edge (21) of their transparent carrier layer (2),
wherein the at least two optoelectronic arrays (16) are coupled with at least one electrical module (34) to electrically interconnect the at least two optoelectronic arrays (16.1, 16.2).
42. The display module (160) according to item 41, characterized in that
the at least two optoelectronic arrays (16.1, 16.2) are each comprising a plurality of electrical contact pads (35) on the transparent carrier layer (2) along the facing short edge (21) of the at least two optoelectronic arrays (16).
43. The display module (160) according to item 42, characterized in that
the least one electrical module (34.1) comprises:
at least one first bonding wire (36),
wherein the at least one first bonding wire (36) is coupled to at least one of the plurality of electrical contact pads (35.1, 35.2) of each of the at least two optoelectronic arrays (16.1, 16.2);
a first encapsulating material (37),
wherein the encapsulating material (37) covers the at least one first bonding wire (36), the at least one of the plurality of electrical contact pads (35.1, 35.2) of each of the at least two optoelectronic arrays (16.1, 16.2), which are coupled with the at least one first bonding wire (36) and at least partially the at least two optoelectronic arrays (16.1, 16.2).
44. The display module (160) according to item 42, characterized in that
the least one electrical module (34.2) comprises:
at least one first printed circuit (38) to couple at least one of the plurality of electrical contact pads (35.1, 35.2) of each of the at least two optoelectronic arrays (16.1, 16.2);
a flextape (39) arranged on the at least one first printed circuit (38) opposite to the contact pads (35.1, 35.2);
45. The display module (160) according to item 44, characterized in that
the electrical module (34.2) is further comprising an anisotropic conductive film (40) arranged on the at least one of the plurality of electrical contact pads (35.1, 35.2) of each of the at least two optoelectronic arrays (16.1, 16.2), which are coupled with the at least one first printed circuit (38).
46. The display module (160) according to item 42, characterized in that
the least one electrical module (34.3) comprises:
at least one solder ball (41) to couple at least one of the plurality of electrical contact pads (35.1, 35.2) of each of the at least two optoelectronic arrays (16.1, 16.2).
47. The display module (160) according to item 42, characterized in that
the least one electrical module (34.4) comprises:
a filler (42) arranged on and/or between the at least two optoelectronic arrays (16.1, 16.2);
at least one second printed circuit (43) to couple at least one of the plurality of electrical contact pads (35.1, 35.2) of each of the at least two optoelectronic arrays (16.1, 16.2), wherein the at least one second printed circuit (43) is arranged on the filler (42) and/or partially on the at least two optoelectronic arrays (16.1, 16.2).

48. The display module (160) according to any one of the items 42 to 47,
characterized in that
the least one electrical module (34.5) is adapted to mechanically interconnect the at least two optoelectronic arrays (16.1, 16.2).

49. The display module (160) according to any one of the items 42 to 48,
characterized in that
the least one electrical module (34.5) is formed on the first surface (18) and/or on the surface opposite to the first surface (18) of the transparent carrier layer (2).

50. The display module (160) according to any one of the items 37 to 49,
characterized in that
the display module (160) is further comprising a carrier foil (44) arranged on a surface of the transparent carrier layer (2) opposite to the first surface (18).

51. The display module (160) according to item 50,
characterized in that
the display module (160) is further comprising an adhesive (45) between the carrier foil (44) and the transparent carrier layer (2).

52. The display module (160) according to any one of the items 37 to 43,
characterized in that
the at least two optoelectronic arrays (16.1, 16.2) facing each other are overlapping each other, wherein an adhesive (45) is arranged between the overlapping parts (46).

53. A display (1600) comprising at least one display module (160) according to any one of the items 37 to 52.

54. The display (1600) according to the item 53,
characterized in that
the display (1600) has a 3D-shape.

55. Use of a display (1600) according to any one of the items 53 or 54 as a part of a 3D-shaped chassis (50) or between two glass layers of a window.

56. Method for manufacturing a display module (160) comprising the steps:
providing at least two optoelectronic arrays (16.1, 16.2) according to any one of the items 29 to 36,
cutting the at least two optoelectronic arrays 0 into an appropriate shape,
arranging the at least two optoelectronic arrays (16.1, 16.2) next to each other with each the first surface (18) facing into the same direction,
laminating a carrier foil on a surface of the at least two optoelectronic arrays (16.1, 16.2) opposite to the first surface (18),
interconnecting the at least two optoelectronic arrays (16.1, 16.2) electrically,
deep drawing the at least two optoelectronic arrays (16.1, 16.2) to obtain a 3D-shape display module (160).

57. Method for manufacturing a display module (160) according to item 56,
characterized in that
the step of arranging is followed by the step of laminating, the step of laminating is followed by the step of interconnecting and the step of interconnecting is followed by the step of deep drawing.

58. Method for manufacturing a display module (160) according to item 56,
characterized in that
the step of deep drawing is followed by the step of arranging, the step of arranging is followed by the step of laminating and the step of laminating is followed by the step of interconnecting.

59. Method for manufacturing a display module (160) according to any one of the items 56 to 58,
characterized in that
the step of deep drawing is performed with the help of a frame around the at least two optoelectronic arrays (16.1, 16.2) or around the interconnected at least two optoelectronic arrays (16.1, 16.2).

60. Method for manufacturing a display module (160) according to item 59,
characterized in that
the step of deep drawing is followed by the step of cutting.

61. Method for manufacturing a display module (160) according to any one of the items 56 to 60,
characterized in that
the provided at least two optoelectronic arrays (16.1, 16.2) are each arranged on a carrier tape (47).

62. Method for manufacturing a display module (160) according to item 61,
characterized in that
the method further comprises a step of removing the carrier tape (47), wherein the step of removing is performed by peeling off the carrier tape (47), by heating a thermal release film (48) arranged between the carrier tape (47) and the at least two optoelectronic arrays (16.1, 16.2), or by illuminating a laser release layer (49) arranged between the carrier tape (47) and the at least two optoelectronic arrays (16.1, 16.2) with a laser.

63. Arrangement (60) to control at least one optoelectronic component (4) comprising:
a transparent carrier layer (2),
at least one optoelectronic component (4) one integrated circuit (19), in particular a micro integrated circuit, arranged on the transparent carrier layer (2) and connected to the at least one optoelectronic component (4),
at least one structured first supply line (61) arranged on the transparent carrier layer (2) and electrically coupled to the at least one optoelectronic component (4),
at least one structured second supply line (62) arranged on the transparent carrier layer (2) and electrically coupled to the integrated circuit (19),
at least one structured ground potential line (63) arranged on the transparent carrier layer (2) and electrically coupled to the integrated circuit (19),
at least one first data line (22) arranged on the transparent carrier layer (2) to provide a data signal to the integrated circuit (19), and
at last one clock line (64) arranged on the transparent carrier layer (2) to provide a clock signal to the integrated circuit (19).

64. Arrangement according to item 63,
characterized in that
the at least one optoelectronic component (4) comprises three subcomponents (4.1, 4.2, 4.3),
wherein, optionally, the three subcomponents are adapted to emit red, green, blue, or yellow light.

65. Arrangement according to any one of the items 63 to 64,
characterized in that
the integrated circuit (19) comprises the shape of a regular polygon with 3, 4, 6, or 8 corners.
66. Arrangement according to any one of the items 63 to 65,
characterized in that
at least one structured contact line (65) electrically connects the at least one optoelectronic component (4) and the integrated circuit (19).
67. Arrangement according to any one of the items 63 to 66,
characterized in that
the integrated circuit (19) comprises a plurality of contact pads (66) coupled to at least one of:
the at least one structured second supply line (62);
the at least one structured ground potential line (63);
the at least one first data line (22);
the at least one clock line (64); and
the at least one structured contact line (65).
68. Arrangement according to item 67,
characterized in that
the plurality of contact pads (66) are arranged in a single row.
69. Arrangement according to any one of the items 63 to 68,
characterized in that
one of the at least one optoelectronic component (4) is arranged on or integrated in the integrated circuit (19).
70. Arrangement according to any one of the items 63 to 69,
characterized in that
the transparent carrier layer (2) has a 3-dimensional shape.
71. Arrangement according to any one of the items 63 to 70,
characterized in that
the integrated circuit (19) has a bended shape.
72. Arrangement according to any one of the items 63 to 71,
characterized in that
the integrated circuit (19) has grooves (67) in a surface facing the transparent carrier layer (2).
73. Arrangement according to item 70,
characterized in that
the 3-dimensional shaped transparent carrier layer (2) comprises at least one plateau (68), or a flat area,
wherein the integrated circuit (19) is arranged on the at least one plateau (68) or the flat area.
74. Arrangement according to any one of the items 63 to 73,
characterized in that
an adhesive (69) is fixing the at least one optoelectronic component (4) and the integrated circuit (19) to the transparent carrier layer (2).
75. Arrangement according to any one of the items 63 to 74,
characterized in that
the at least one structured first supply line (61) and/or the at least one structured second supply line (62) and/or the at least one structured ground potential line (63) and/or the at least one first data line (22) and/or the at least one clock line (64) are adapted as planar interconnect on substrate contacts.

76. Arrangement according to any one of the items 63 to 75,
characterized in that
the at least one optoelectronic component (4) and/or the integrated circuit (19) are arranged above contact portions (61.1, 62.1, 63.1, 22.1, 64.1, 65.1) of at least one of:
the at least one structured first supply line (61);
the at least one structured second supply line (62);
the at least one structured ground potential line (63);
the at least one first data line (22);
the at least one clock line (64); and
the at least one structured contact line (65);
and are mechanically and/or electrically coupled to the contact portions by solder bumps (70), µ-pillars, or metalized spikes.
77. Arrangement according to item 76,
characterized in that
the arrangement is further comprising an underfill material (71) surrounding the solder bumps (70), µ-pillars, or metalized spikes.
78. Arrangement according to any one of the items 63 or 77,
characterized in that
the at least one optoelectronic component (4) is arranged on the transparent carrier layer (2) with its light emitting surface (72) facing the transparent carrier layer (2).
79. An optoelectronic array (16) comprising:
at least one arrangement (60) according to any one of the items 63 or 78,
at least one pixel (17) comprising a pixel area (170), wherein the at least one optoelectronic component (4) of the at least one arrangement (60) is associated with the at least one pixel (17) and is arranged within the pixel area (170).
80. Optoelectronic array according to item 79,
characterized in that
each optoelectronic component (4) of the at least one arrangement (60) is associated with a respective pixel (17) and is arranged within the pixel area (170) of the associated respective pixel (17).
81. Optoelectronic array according to item 79 or 80,
characterized in that
each pixel area has a size in the range of 0.1 mm×0.1 mm to 30 mm×30 mm and particularly in the range of 250 µm×250 µm to 1 mm×1 mm and particularly smaller than 1 mm×1 mm.
82. Optoelectronic array according to any one of the items 79 to 81,
characterized in that
an area covered by the elements of the at least one arrangement ( ) except of the transparent carrier layer ( ) occupy a space within the pixel area (170) that is less than 13% of the pixel area (170).
83. Optoelectronic array according to any one of the items 79 to 82,
characterized in that
the integrated circuit (19) of the at least one arrangement (60) is associated with one pixel (17) and is arranged within the pixel area (170).
84. Optoelectronic array according to item 83,
characterized in that
end portions (61.2, 62.2, 63.2, 22.2, 64.2) of each of the at least one structured first supply line (61), the at least one structured second supply line (62), the at least one structured ground potential line (63), the at least one first data line (22) and the at least one clock line (64) of the arrangement (60) are distributed along two opposite edges (17.1, 17.2) of the pixel (17).

85. Optoelectronic array according to item 84,
characterized in that
the end portions (61.2, 62.2, 63.2, 22.2, 64.2) are distributed in a central region on the edges (17.1, 17.2), wherein the central region is formed by less than 50% of the edges' (17.1, 17.2) length.

86. Optoelectronic array according to item 84,
characterized in that
the end portions (61.2, 62.2, 63.2, 22.2, 64.2) are distributed along the two opposite edges (17.1, 17.2) of the pixel (17) in such, that each two adjacent end portions are arranged with an substantially equal spacing along the edges (17.1, 17.2).

87. Optoelectronic array according to any one of the items 79 to 82,
characterized in that
the integrated circuit (19) of the at least one arrangement (60) is associated with two adjacent pixels (17) and thus is arranged within the area of two adjacent pixels (17).

88. Optoelectronic array according to item 86,
characterized in that
the integrated circuit (19) of the at least one arrangement (60) is arranged on the adjacent edges of the two adjacent pixels (17).

89. Optoelectronic array according to item 87 or 88,
characterized in that
end portions (61.2, 62.2, 63.2, 22.2, 64.2) of each of the at least one structured first supply line (61), the at least one structured second supply line (62), the at least one structured ground potential line (63), the at least one first data line (22) and the at least one clock line (64) of the arrangement (60) are distributed along two opposite edges (17.1, 17.2) of the two adjacent pixels (17).

90. Optoelectronic array according to item 89,
characterized in that
the end portions (62.2, 63.2, 22.2, 64.2) of the least one structured second supply line (62), the at least one structured ground potential line (63), the at least one first data line (22) and the at least one clock line (64) are distributed in a central region on the edges (17.1, 17.2), wherein the central region is formed by less than 20% of the edges' (17.1, 17.2) length.

91. Optoelectronic array according to item 89,
characterized in that
the end portions (61.2, 62.2, 63.2, 22.2, 64.2) are distributed along the two opposite edges (17.1, 17.2) of the two adjacent pixels (17) in such, that each two adjacent end portions are arranged with an substantially equal spacing along the edges (17.1, 17.2).

92. Optoelectronic array according to any one of the items 79 to 82,
characterized in that
the integrated circuit (19) of the at least one arrangement (60) is associated with 4, 6, or 8 adjacent pixels (17),
wherein the adjacent pixels (17) are arranged in a matrix of 2×2, 2×3, or 2×4 pixels (17), and
wherein the integrated circuit (19) of the at least one arrangement (17) is arranged in the centre of the matrix.

93. Optoelectronic array according to any one of the items 79 to 82,
characterized in that
the integrated circuit (19) of the at least one arrangement (60) is associated with 4, 6, or 8 adjacent pixels (17),
wherein the adjacent pixels (17) are arranged in a matrix of 2×2, 2×3, or 2×4 pixels (17), and
wherein the integrated circuit (19) of the at least one arrangement (60) is arranged in the pixel area (170) of only one of the 4, 6, or 8 adjacent pixels (17).

94. Method to repair an arrangement (60) according to any one of the items 63 to 78 or an optoelectronic array (16) according to any one of the items 79 to 93.

95. An optoelectronic device (1) comprises:
a carrier layer (2),
a cover layer (7)
a plurality of layer segments (3.1, 3.2) arranged between the cover layer (7) and the carrier layer (2),
wherein at least one optoelectronic component (4) is arranged on at least one of the plurality of layer segments (3.1, 3.2),
wherein a first (3.1) and a second layer segment (3.2) of the plurality of the layer segments are arranged adjacent to each other on the carrier layer (2) along a first direction and
wherein the first and second layer segment (3.1, 3.2) are mechanically and electrically connected with each other along the first direction.

96. The optoelectronic device according to item 95,
characterized in that,
a third layer segment (3.3) of the plurality of layer segments is arranged adjacent to the first layer segment (3.1) along a second direction,
wherein the third layer segment (3.2) is mechanically and optional electrically connected to the first layer segment (3.1) along the second direction,
wherein the second direction is different, in particular perpendicular, to the first direction.

97. The optoelectronic device according to item 95 or 96,
characterized in that,
an electric bridging element (83) extends between two adjacent layer segments (3.1, 3.2) to at least electrically connect the two layer segments,
wherein each of the two layer segments comprises a conductor layer segment (81.1, 81.2), and the electric bridging element (83) interconnects the conductor layer segments (81.1, 81.2) of the two layer segments.

98. The optoelectronic device according to any one of the items 95 to 97,
characterized in that,
an electric bridging element (83) extends between any of two adjacent layer segments to at least electrically connect the layer segments, and the electric bridging element (83) interconnects conductor layer segments (81), which are arranged on the layer segments.

99. The optoelectronic device according to any one of the items 95 to 98,
characterized in that,
the layer segments are at least partially transparent.

100. The optoelectronic device according to any one of the items 95 to 99,
characterized in that,
the layer segments comprise or consist of a material, such as PET.

101. The optoelectronic device according to any one of the items 95 to 100,
characterized in that,
the carrier layer (2) and/or the cover layer (7) is at least partially transparent.
102. The optoelectronic device according to any one of the items 95 to 101,
characterized in that,
the carrier layer (2) and/or the cover layer (7) comprise or consist of a material, such as EVA or PVB.
103. The optoelectronic device according to any one of the items 95 to 102,
characterized in that,
the at least one optoelectronic component (4) is an LED or μLED.
104. The optoelectronic device according to any one of the items 96 to 103,
characterized in that
the electric bridging element (83) comprises at least one conductor path to interconnect the conductor layer segments (3.1, 3.2) of two adjacent layer segments.
105. The optoelectronic device according to any one of the items 96 to 104,
characterized in that,
at least one contact pad (84) is arranged on a top surface (4.1) of the optoelectronic component (4), said top surface (4.1) is facing away from the respective layer segment (3.1, 3.2) and the at least one contact pad (84) is coupled to the conductor layer segment of the respective layer segment (81.1, 81.2).
106. The optoelectronic device according to any one of the items 96 to 104,
characterized in that,
at least one contact pad (84) is arranged on a bottom surface (4.2) of the optoelectronic component (4), said bottom surface (4.2) is facing the respective layer segment (3.1, 3.2) and the at least one contact pad (84) is coupled to the conductor layer segment (81.1, 81.2) of the respective layer segment (3.1, 3.2).
107. The optoelectronic device according to any one of the items 95 to 106,
characterized in that,
a joint region between adjacent layer segments (3.1, 3.2) is filled with a filler material (82), in particular filled with an adhesive.
108. The optoelectronic device according to any one of the items 95 to 107,
characterized in that
the cover layer (7) forms a planarization layer, in which the at least one optoelectronic component (4) is embedded into.
109. A method of manufacturing an optoelectronic device (1) comprises:
arranging a first (3.1) and a second layer segment 3.2) of a plurality of layer segments adjacent to each other on a carrier layer (2) along a first direction,
optionally arranging a third layer segment (3.3) adjacent to the first layer (3.1) segment along a second direction,
wherein the second direction is different, in particular perpendicular, to the first direction
wherein at least one optoelectronic component (4) is arranged on at least one of the layer segments (3.1, 3.2),
mechanically connecting the adjacent layer segments (3.1, 3.2) with each other,
arranging at least one electric bridging element (83), such that the bridging element (83) extends between two of the adjacent layer segments (3.1, 3.2), each of the two layer segments (3.1, 3.2) comprises a conductor layer segment (81.1, 81.2), and the electric bridging element (83) interconnects the conductor layer segments (81.1, 81.2) of the two layer segments (3.1, 3.2), and
arranging a cover layer (7) on the layer segments (3.1, 3.2).
110. The method according to item 109,
characterized in that
the step of mechanically connecting the adjacent layer segments (3.1, 3.2) with each other comprises a step of filling a joint region between adjacent layer segments (3.1, 3.2) with a filler material (82), in particular an adhesive.
111. The method according to item 109 or 110,
characterized in that
the step of arranging the at least one electric bridging element (83), such that the bridging element (83) extends between two of the adjacent layer segments (3.1, 3.2) comprises a step of providing a liquid metal onto a joint region between adjacent layer segments (3.1, 3.2) to provide at least one conductor path to interconnect the conductor layer segments (81.1, 81.2) of two adjacent layer segments (3.1, 3.2).
112. The method according to item 109 or 110,
characterized in that
the step of arranging the at least one electric bridging element (83), such that the bridging element (83) extends between two of the adjacent layer segments (3.1, 3.2) comprises a step of printing or ink-jetting at least one conductor path onto a joint region between adjacent layer segments (3.1, 3.2) to interconnect the conductor layer segments (81.1, 81.2) of two adjacent layer segments (3.1, 3.2).
113. The method according to item 109 or 110,
characterized in that
the step of arranging the at least one electric bridging element (83), such that the bridging element (83) extends between two of the adjacent layer segments (3.1, 3.2) comprises a step of gluing the at least one electric bridging element (83) onto a joint region between adjacent layer segments (3.1, 3.2).
114. The method according to item 109,
characterized in that
the step of mechanically connecting the adjacent layer segments (3.1, 3.2) with each other and arranging the at least one electric bridging element (83), such that the bridging element (83) extends between two of the adjacent layer segments (3.1, 3.2) is performed within one step, wherein the step comprises a step of crimping the adjacent layer segments (3.1, 3.2) together with the electric bridging element (83).
115. An optoelectronic device (1) comprises:
a plurality of layer segments (3.1, 3.2), in particular intermediate layer segments, arranged between a cover layer (7) and a carrier layer (2),
wherein at least one optoelectronic component (4) is arranged on at least one of the plurality of layer segments (3.1, 3.2),
wherein a first (3.1) and a second layer segment (3.2) of the plurality of the layer segments are overlapping each other along a first direction (x) each forming a respective boundary region (3.1.1, 3.2.1),
wherein the first layer segment (3.1) comprises at least one first contact pad (86.1) and the second layer segment (3.2) comprises at least one second contact pad (86.2),
wherein the at least one first (86.1) and the at least one second (86.2) contact pad are arranged in the respective boundary region (3.1.1, 3.2.1) facing each other and being mechanically and electrically connected, and wherein the at least one first (86.1) and the at least one second contact (86.2) pad each comprises a plurality of nanowires (87) at least partially made of a conductive material such as for example copper, gold or nickel.

116. The optoelectronic device according to item 115, characterized in that,
the nanowires (87) extend primarily in a direction, which is perpendicular to a base area of the respective first and second contact pad, particularly the nanowires resemble a metallic lawn that is grown on the base area of the respective first and second contact pad.

117. The optoelectronic device according to item 115 or 116,
characterized in that,
the at least one first (86.1) and the at least one second (86.2) contact pad are each comprising a plurality of lines (87.1) and spaces (87.2) between the lines (87.1), each line comprising a portion of the plurality of nanowires (87).

118. The optoelectronic device according to item 117, characterized in that,
the lines (87.1) have a thickness of at least approximately 1-100 µm and the spaces (87.2) between the lines (87.1) have a thickness of at least approximately 10-1000 µm or greater than 1000 µm.

119. The optoelectronic device according to item 117 or 118,
characterized in that,
the distance between one of two lines (87.1) and two spaces (87.1) of the at least one first contact pad (86.1) is different to the corresponding distance between one of two lines (87.1) and two spaces (87.1) of the at least one second contact pad (86.2).

120. The optoelectronic device according to any one of the items 115 to 119,
characterized in that,
base areas of the at least one first (86.1) and the at least one second (86.2) contact pad have the same shape and/or size and/or orientation to each other.

121. The optoelectronic device according to any one of the items 115 to 119,
characterized in that,
a base area of the at least one first (86.1) and the at least one second (86.2) contact pad differs in at least one of the following:
shape;
size; and
orientation to each other.

122. The optoelectronic device according to any one of the items 117 to 121,
characterized in that,
the orientation of the lines (87.1) and spaces (87.2) of the at least one first contact pad (86.1) is different to the orientation of the lines (87.1) and spaces (87.2) of the at least one second contact pad (86.2).

123. The optoelectronic device according to any one of the items 115 to 122,
characterized in that,
the layer segments (3.1, 3.2) are at least partially transparent.

124. The optoelectronic device according to any one of the items 115 to 123,
characterized in that,
the layer segments (3.1, 3.2) comprise or consist of a material, such as PET, PEN, PI, EVA or PVB, particularly the layer segments (3.1, 3.2) comprise or consist of a foil, which comprises or consist of a material such as PET, PEN, PI, EVA or PVB.

125. The optoelectronic device according to any one of the items 115 to 124,
characterized in that,
the at least one optoelectronic component (4) is an LED, a µLED, or a sensor.

126. The optoelectronic device according to any one of the items 115 to 125,
characterized in that,
the first layer segment (3.1) comprises a plurality of first contact pads (86.1) and the second layer segment (3.2) comprises a plurality of second contact pads (86.2) arranged in the respective boundary region (3.1.1, 3.2.1),
wherein the plurality of first contact pads (86.1) is arranged in a first pattern and the plurality of second contact pads (86.2) is arranged in a second pattern, and wherein the first and the second pattern are matching with each other.

127. The optoelectronic device according to item 126, characterized in that,
the first and the second pattern each form an irregular pattern.

128. A method of manufacturing an optoelectronic device (1) comprises:
overlapping a first (3.1) and a second layer segment 3.2) of a plurality of layer segments along a first direction (x) such that the first (3.1) and the second (3.2) layer segment are forming a respective overlapping boundary region (3.1.1, 3.2.1),
wherein at least one optoelectronic component (4) is arranged on at least one of the layer segments (3.1, 3.2),
wherein the first layer segment (3.1) comprises at least one first contact pad (86.1) and the second layer segment (3.2) comprises at least one second contact pad (86.2),
wherein the at least one first (86.1) and the at least one second (86.2) contact pad are arranged in the respective boundary region (3.1.1, 3.2.1) facing each other,
wherein the at least one first (86.1) and the at least one second (86.2) contact pad each comprises a plurality of nanowires (87) at least partially made of a conductive material such as for example copper, gold or nickel, and
wherein the method is further comprising a step of mechanically and electrically connecting the overlapping layer segments (3.1, 3.2).

129. The method according to item 128,
further comprising a step of:
arranging a cover layer (7) and a carrier layer (2) such that the plurality of layer segments (3.1, 3.2) is arranged between the cover layer (7) and the carrier layer (2).

130. The method according to any one of the items 128 to 129,
characterized in that,
the step of mechanically and electrically connecting the overlapping layer segments (3.1, 3.2) is performed by pressing together the respective facing contact pads (86.1, 86.2).

131. The method according to item 130,
characterized in that,
a local pressure is applied to the respective facing contact pads (86.1, 86.2).

132. The method according to item 130,
characterized in that,
an area pressure is applied to the cover layer (7) and/or the carrier layer (2).

133. An optoelectronic device (1), comprising:
an at least partially transparent substrate (3), in particular a flexible foil, being arranged between a carrier layer (2) and a cover layer (7);
at least one optoelectronic component (4), in particular an LED and optionally a sensor, arranged on the substrate (3);
at least one structured first conductor (5) arranged on the substrate (3) being coupled to the at least one optoelectronic component (4); and
at least one first inductive element (11) arranged between the carrier layer (2) and the cover layer (7) being electrically coupled to the at least one structured first conductor (5),
wherein the at least one first inductive element (11) is configured to generate a power signal for operating the at least one optoelectronic component (4) when excited by a magnetic field.

134. The optoelectronic device according to item 133,
characterized in that,
a first intermediate layer (88) is arranged between the carrier layer (2) and the substrate (3) and/or a second intermediate layer (89) is arranged between the cover layer (7) and the substrate (3),
wherein the first (88) and/or the second (89) intermediate layer preferably comprise or consist of a material such as PVB or EVA.

135. The optoelectronic device according to item 133 or 134,
characterized in that,
the at least partially transparent substrate (3) comprises or consists of a material such as PET or PC.

136. The optoelectronic device according to any one of the items 133 to 135,
characterized in that,
the carrier layer (2) and/or the cover layer (7) comprise or consist of a material such as glass.

137. The optoelectronic device according to any one of the items 133 to 136,
characterized in that,
the at least one optoelectronic component (4) is at least one of an LED, a μLED, a TripLED, a SFC and a photosensitive sensor.

138. The optoelectronic device according to any one of the items 133 to 137,
characterized in that,
the sandwich of all layers and components between the carrier layer (2) and the cover layer (7) is hermetically sealed.

139. The optoelectronic device according to any one of the items 133 to 138,
characterized in that,
the at least one first inductive element (11) comprises or consist of a material such as silver, copper, iron, nickel and/or gold.

140. The optoelectronic device according to item 139,
characterized in that,
the at least one first inductive element (11) is formed as a metallic coil comprising a plurality of coil turns arranged in a single plane, wherein the plurality of coil coil turns comprise a square, hexagonal, octagonal, or circular form.

141. The optoelectronic device according to any one of the items 133 to 138,
characterized in that,
the at least one first inductive element (11) comprises a plurality of layers each being arranged in a respective plane of a plurality of parallel planes being stacked on top of each other,
wherein each layer comprises a metallic conductor having at least one turn of a square, hexagonal, octagonal, or circular form.

142. The optoelectronic device according to any one of the items 133 to 141,
further comprising at least one controller (90) and/or at least one micro integrated circuit (19) to control the at least one optoelectronic component (4).

143. The optoelectronic device according to any one of the items 133 to 142,
further comprising at least one second inductive element (93) arranged between the carrier layer (2) and the cover layer (7) being electrically coupled to the at least one structured first conductor (5),
wherein the at least one second inductive element (93) is configured to generate a magnetic field in response to a data signal generated by at least one integrated circuit (19) and/or the at least one optoelectronic component (4).

144. The optoelectronic device according to any one of the items 133 to 143,
characterized in that,
the optoelectronic device comprises at least two first inductive elements (11),
wherein the at least two first inductive elements are arranged adjacent to each other in a matrix.

145. An optoelectronic system comprising:
an optoelectronic device (1) according to any one of the items 133 to 144, and
at least one third inductive element (12) being configured to excite a magnetic field in the first inductive element (11) in response to a current through the at least one third inductive element (12).

146. The optoelectronic system according to item 145,
characterized in that,
the at least one third inductive element (12) is arranged adjacent to the carrier layer (2) opposite to the at least partially transparent substrate (3), such that the at least one third inductive element (12) at least partly overlaps the at least one first inductive element (11) when viewed along a direction perpendicular to a plane in which the at least one first inductive element (11) is arranged.

147. The optoelectronic system according to any one of the items 145 to 146,
further comprising at least one fourth inductive element (94) configured to generate a data signal in response to a magnetic field, excited by the at least one second inductive element (93).
148. The optoelectronic system according to item 147, characterized in that,
the at least one fourth inductive element (94) is arranged adjacent to the carrier layer (2) opposite to the at least partially transparent substrate (3), such that the at least one fourth inductive element (94) at least partly overlaps the at least one second inductive element (93) when viewed along a direction substantially perpendicular to a plane in which the at least one second inductive element (93) is arranged.
149. The optoelectronic system according to any one of the items 147 to 148,
further comprising at least one sensor (92) coupled to at least one fourth inductive element (94) and configured to measure the data signal.
150. The optoelectronic system according to any one of the items 145 to 149,
further comprising at least one controller(90) and/or an converter (91) for generating an alternating power signal for the third inductive element (12).

The description with the aid of the exemplary embodiments does not restrict the various embodiments shown to these. Rather, the disclosure depicts several aspects that can be combined with one another.

The invention thus encompasses any features and any combination of features, in particular including any combination of features in the items and claims, even if this feature or this combination is not explicitly specified in the exemplary embodiments.

The invention claimed is:

1. An optoelectronic device, comprising:
a plurality of layer segments, in particular intermediate layer segments, arranged between a cover layer and a carrier layer;
wherein at least one optoelectronic component is arranged on at least one of the plurality of layer segments;
wherein a first and a second layer segment of the plurality of the layer segments are overlapping each other along a first direction each forming a respective boundary region;
wherein the first layer segment comprises at least one first contact pad and the second layer segment comprises at least one second contact pad;
wherein the at least one first and the at least one second contact pad are arranged in the respective boundary region facing each other and being mechanically and electrically connected; and
wherein the at least one first and the at least one second contact pad each comprises a plurality of nanowires at least partially made of a conductive material comprising copper, gold, or nickel.

2. The optoelectronic device according to claim 1, wherein the nanowires extend primarily in a direction which is perpendicular to a base area of the respective first and second contact pad, particularly the nanowires resemble a metallic lawn that is grown on the base area of the respective first and second contact pad.

3. The optoelectronic device according to claim 1, wherein the at least one first and the at least one second contact pad are each comprising a plurality of lines and spaces between the lines, each line comprising a portion of the plurality of nanowires.

4. The optoelectronic device according to claim 3, wherein the lines have a thickness of at least approximately 1 μm-100 μm and the spaces between the lines have a thickness of at least approximately 10 μm-1000 μm or greater than 1000 μm.

5. The optoelectronic device according to claim 3, wherein a distance between one of two lines and two spaces of the at least one first contact pad is different than a corresponding distance between one of two lines and two spaces of the at least one second contact pad.

6. The optoelectronic device according to claim 1, wherein base areas of the at least one first and the at least one second contact pad have a same shape and/or size and/or orientation to each other.

7. The optoelectronic device according to claim 1, wherein a base area of the at least one first and the at least one second contact pad differs in at least one of:
a shape;
a size; or
an orientation to each other.

8. The optoelectronic device according to claim 3, wherein an orientation of the lines and spaces of the at least one first contact pad is different than an orientation of the lines and spaces of the at least one second contact pad.

9. The optoelectronic device according to claim 1, wherein the layer segments are at least partially transparent.

10. The optoelectronic device according to claim 1, wherein the layer segments comprise or consist of a material including PET, PEN, PI, EVA, or PVB, particularly the layer segments comprise or consist of a foil, which comprises or consists of a material including PET, PEN, PI, EVA, or PVB.

11. The optoelectronic device according to claim 1, wherein the at least one optoelectronic component is an LED, a μLED, or a sensor.

12. The optoelectronic device according to claim 1, wherein the first layer segment comprises a plurality of first contact pads and the second layer segment comprises a plurality of second contact pads arranged in the respective boundary region;
wherein the plurality of first contact pads is arranged in a first pattern and the plurality of second contact pads is arranged in a second pattern; and
wherein the first and the second pattern are matching with each other.

13. The optoelectronic device according to claim 12, wherein the first and the second pattern each form an irregular pattern.

14. A method of manufacturing an optoelectronic device, comprising:
overlapping a first and a second layer segment of a plurality of layer segments along a first direction such that the first and the second layer segment are forming a respective overlapping boundary region;
wherein at least one optoelectronic component is arranged on at least one of the layer segments;
wherein the first layer segment comprises at least one first contact pad and the second layer segment comprises at least one second contact pad;
wherein the at least one first and the at least one second contact pad are arranged in the respective boundary region facing each other;
wherein the at least one first and the at least one second contact pad each comprises a plurality of nanowires at least partially made of a conductive material including copper, gold, or nickel; and mechanically and electrically connecting the overlapping layer segments.

15. The method according to claim 14, further comprising:
arranging a cover layer and a carrier layer such that the plurality of layer segments is arranged between the cover layer and the carrier layer.

16. The method according to claim 14, wherein mechanically and electrically connecting the overlapping layer segments is performed by pressing together the respective facing contact pads.

17. The method according to claim 16, wherein a local pressure is applied to the respective facing contact pads.

18. The method according to claim 15, wherein an area pressure is applied to the cover layer and/or the carrier layer.

19. A window of a vehicle, comprising:
a transparent carrier layer;
a transparent dielectric layer arranged on the carrier layer;
at least one first structured conductor arranged in between the carrier layer and the dielectric layer;
at least one optoelectronic component, in particular a LED, arranged on the surface of the dielectric layer opposite to the carrier layer;
at least one conductive via through the dielectric layer electrically connecting the at least one first structured conductor with the at least one optoelectronic component; and
a transparent covering layer arranged on the surface of the dielectric layer opposite to the carrier layer, wherein the covering layer covers the at least one optoelectronic component completely, or
an optoelectronic array, comprising:
a transparent carrier layer, a plurality of optoelectronic components arranged on a first surface of the transparent carrier layer in a first matrix,
wherein each optoelectronic component is associated with a pixel,
at least two integrated circuits, in particular μICs, arranged on the first surface of the transparent carrier layer,
wherein each integrated circuit is connected to at least one of the plurality of optoelectronic components,
a first contact area along a short edge of the transparent carrier layer,
at least one first data line to connect the at least two integrated circuits with the first contact area,
or
an optoelectronic device comprising:
a plurality of layer segments, in particular intermediate layer segments, arranged between a cover layer and a carrier layer,
wherein at least one optoelectronic component is arranged on at least one of the plurality of layer segments,
wherein a first and a second layer segment of the plurality of the layer segments are overlapping each other along a first direction each forming a respective boundary region,
wherein the first layer segment comprises at least one first contact pad and the second layer segment comprises at least one second contact pad,
wherein the at least one first and the at least one second contact pad are arranged in the respective boundary region facing each other and being mechanically and electrically connected, and
wherein the at least one first and the at least one second contact pad each comprises a plurality of nanowires at least partially made of a conductive material such as for example copper, gold or nickel,
or
an at least partially transparent substrate, in particular a flexible foil, being arranged between a carrier layer and a cover layer,
at least one optoelectronic component, in particular an LED and optionally a sensor, arranged on the substrate,
at least one structured first conductor arranged on the substrate being coupled to the at least one optoelectronic component, and
at least one first inductive element arranged between the carrier layer and the cover layer being electrically coupled to the at least one structured first conductor,
wherein the at least one first inductive element is configured to generate a power signal for operating the at least one optoelectronic component when excited by a magnetic field.

* * * * *